(12) United States Patent
Ieda et al.

(10) Patent No.: US 10,388,670 B2
(45) Date of Patent: Aug. 20, 2019

(54) SEMICONDUCTOR DEVICE

(71) Applicant: Semiconductor Energy Laboratory Co., Ltd., Atsugi-shi, Kanagawa-ken (JP)

(72) Inventors: Yoshinori Ieda, Fuchu (JP); Atsuo Isobe, Isehara (JP); Yutaka Shionoiri, Isehara (JP); Tomoaki Atsumi, Hadano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/447,672

(22) Filed: Mar. 2, 2017

(65) Prior Publication Data

US 2017/0179132 A1 Jun. 22, 2017

Related U.S. Application Data

(63) Continuation of application No. 14/816,440, filed on Aug. 3, 2015, now Pat. No. 9,773,810, which is a
(Continued)

(30) Foreign Application Priority Data

Apr. 29, 2011 (JP) .................................. 2011-102569
Apr. 29, 2011 (JP) .................................. 2011-102571
(Continued)

(51) Int. Cl.
*H01L 27/105* (2006.01)
*H01L 27/12* (2006.01)
(Continued)

(52) U.S. Cl.
CPC ........ *H01L 27/1207* (2013.01); *H01L 27/092* (2013.01); *H01L 27/105* (2013.01);
(Continued)

(58) Field of Classification Search
CPC ............. H01L 29/7869; H01L 27/1207; H01L 27/092; H01L 27/105; H01L 27/1225; H01L 27/1255; H01L 27/10805
See application file for complete search history.

(56) References Cited

U.S. PATENT DOCUMENTS

| 4,347,448 A | 8/1982 | Plachno |
| 5,204,558 A | 4/1993 | Kumaki et al. |
(Continued)

FOREIGN PATENT DOCUMENTS

| CN | 001151591 A | 6/1997 |
| CN | 001224219 A | 7/1999 |
(Continued)

OTHER PUBLICATIONS

U.S. Appl. No. 13/356,012.
(Continued)

*Primary Examiner* — Walter H Swanson
(74) *Attorney, Agent, or Firm* — Robinson Intellectual Property Law Office; Eric J. Robinson

(57) ABSTRACT

Provided is a semiconductor device which has low power consumption and can operate at high speed. The semiconductor device includes a memory element including a first transistor including crystalline silicon in a channel formation region, a capacitor for storing data of the memory element, and a second transistor which is a switching element for controlling supply, storage, and release of charge in the capacitor. The second transistor is provided over an insulating film covering the first transistor. The first and second transistors have a source electrode or a drain electrode in common.

13 Claims, 52 Drawing Sheets

Related U.S. Application Data continuation of application No. 13/444,124, filed on Apr. 11, 2012, now Pat. No. 9,111,795.

(30) Foreign Application Priority Data

| May 20, 2011 | (JP) | ................................ | 2011-113237 |
| May 20, 2011 | (JP) | ................................ | 2011-113238 |

(51) Int. Cl.

| H01L 29/16 | (2006.01) |
| H01L 29/04 | (2006.01) |
| H01L 29/423 | (2006.01) |
| H01L 29/49 | (2006.01) |
| H01L 29/78 | (2006.01) |
| H01L 29/786 | (2006.01) |
| H01L 27/092 | (2006.01) |
| H01L 27/108 | (2006.01) |
| H01L 27/115 | (2017.01) |
| H01L 49/02 | (2006.01) |
| H01L 29/24 | (2006.01) |
| H01L 27/1156 | (2017.01) |
| H01L 27/11551 | (2017.01) |

(52) U.S. Cl.
CPC .... *H01L 27/1052* (2013.01); *H01L 27/10805* (2013.01); *H01L 27/115* (2013.01); *H01L 27/1225* (2013.01); *H01L 27/1255* (2013.01); *H01L 27/1259* (2013.01); *H01L 28/40* (2013.01); *H01L 29/04* (2013.01); *H01L 29/16* (2013.01); *H01L 29/24* (2013.01); *H01L 29/42384* (2013.01); *H01L 29/4908* (2013.01); *H01L 29/78* (2013.01); *H01L 29/7869* (2013.01); *H01L 29/78648* (2013.01); *H01L 27/1156* (2013.01); *H01L 27/11551* (2013.01)

(56) References Cited

U.S. PATENT DOCUMENTS

| 5,528,032 | A | 6/1996 | Uchiyama |
| 5,623,442 | A | 4/1997 | Gotou et al. |
| 5,731,856 | A | 3/1998 | Kim et al. |
| 5,744,864 | A | 4/1998 | Cillessen et al. |
| 6,091,277 | A | 7/2000 | Fujii |
| 6,153,458 | A * | 11/2000 | Zamanian ............... H01L 21/82 257/E21.602 |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,042,789 | B2 | 5/2006 | Bangert |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,071,040 | B2 | 7/2006 | Matsunaga et al. |
| 7,105,868 | B2 | 9/2006 | Nause et al. |
| 7,189,992 | B2 | 3/2007 | Wager, III et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,339,187 | B2 | 3/2008 | Wager, III et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,692,223 | B2 | 4/2010 | Isobe et al. |
| 7,732,819 | B2 | 6/2010 | Akimoto et al. |
| 7,888,207 | B2 | 2/2011 | Wager, III et al. |
| 7,955,925 | B2 | 6/2011 | Okada et al. |
| 7,999,800 | B2 | 8/2011 | Iwabuchi et al. |
| 8,030,643 | B2 | 10/2011 | Asami et al. |
| 8,093,589 | B2 | 1/2012 | Sugihara et al. |
| 8,124,325 | B2 | 2/2012 | Speakman |
| 8,238,152 | B2 | 8/2012 | Asami et al. |
| 8,314,637 | B2 | 11/2012 | Kato et al. |
| 8,415,198 | B2 * | 4/2013 | Itagaki ............... H01L 29/7869 257/E21.411 |
| 8,420,441 | B2 | 4/2013 | Yamazaki et al. |
| 8,492,764 | B2 | 7/2013 | Yamazaki et al. |
| 8,526,216 | B2 | 9/2013 | Asami et al. |
| 8,546,811 | B2 | 10/2013 | Godo et al. |
| 8,748,878 | B2 | 6/2014 | Yamaguchi et al. |
| 8,804,404 | B2 | 8/2014 | Asami et al. |
| 8,809,992 | B2 | 8/2014 | Yamazaki et al. |
| 8,860,108 | B2 | 10/2014 | Yamazaki et al. |
| 8,878,173 | B2 | 11/2014 | Yamazaki |
| 8,896,049 | B2 | 11/2014 | Isobe et al. |
| 8,941,112 | B2 | 1/2015 | Yamazaki |
| 8,946,066 | B2 | 2/2015 | Noda et al. |
| 9,012,905 | B2 | 4/2015 | Yamazaki |
| 9,023,684 | B2 | 5/2015 | Suzawa et al. |
| 9,024,313 | B2 | 5/2015 | Yamazaki et al. |
| 9,064,884 | B2 | 6/2015 | Kato |
| 9,093,538 | B2 | 7/2015 | Yamazaki |
| 9,129,866 | B2 | 9/2015 | Asami et al. |
| 9,337,321 | B2 | 5/2016 | Yamazaki |
| 9,362,416 | B2 | 6/2016 | Yamazaki et al. |
| 9,786,669 | B2 | 10/2017 | Asami et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0130006 | A1 | 7/2004 | Fung |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0044903 | A1 | 3/2006 | Forbes |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0267141 | A1 | 11/2006 | Saito |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |

(56) References Cited

U.S. PATENT DOCUMENTS

| | | |
|---|---|---|
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0135910 A1 | 6/2008 | Youn |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0273027 A1* | 11/2009 | Adan .............. H01L 21/823828 257/334 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0193912 A1 | 8/2010 | Speakman |
| 2010/0295037 A1 | 11/2010 | Hironaka |
| 2011/0037068 A1 | 2/2011 | Yamazaki et al. |
| 2011/0084264 A1 | 4/2011 | Yamazaki et al. |
| 2011/0089417 A1 | 4/2011 | Yamazaki et al. |
| 2011/0147737 A1 | 6/2011 | Yamazaki et al. |
| 2011/0148463 A1 | 6/2011 | Kato et al. |
| 2011/0175090 A1 | 7/2011 | Sugihara et al. |
| 2011/0298057 A1 | 12/2011 | Kato |
| 2012/0132908 A1 | 5/2012 | Sugihara et al. |
| 2012/0256177 A1 | 10/2012 | Yamazaki |
| 2013/0057315 A1 | 3/2013 | Kato et al. |
| 2013/0134418 A1 | 5/2013 | Hayashi et al. |
| 2013/0292671 A1 | 11/2013 | Yamazaki et al. |
| 2014/0014954 A1 | 1/2014 | Godo et al. |
| 2014/0167041 A1 | 6/2014 | Yamazaki et al. |
| 2014/0175431 A1 | 6/2014 | Yamazaki et al. |
| 2014/0340953 A1 | 11/2014 | Yamazaki et al. |
| 2015/0037932 A1 | 2/2015 | Yamazaki et al. |
| 2015/0108477 A1 | 4/2015 | Tokunaga |
| 2015/0137121 A1 | 5/2015 | Noda et al. |
| 2015/0228802 A1 | 8/2015 | Suzawa et al. |
| 2015/0236049 A1 | 8/2015 | Kato |
| 2015/0287832 A1 | 10/2015 | Hayashi et al. |
| 2015/0364477 A1 | 12/2015 | Yamazaki et al. |
| 2016/0247939 A1 | 8/2016 | Yamazaki |
| 2016/0268359 A1 | 9/2016 | Yamazaki et al. |

FOREIGN PATENT DOCUMENTS

| | | |
|---|---|---|
| CN | 001656618 A | 8/2005 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 07-121444 A | 5/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-310799 A | 11/2006 |
| JP | 2007-318112 A | 12/2007 |
| JP | 2008-277665 A | 11/2008 |
| JP | 2009-135350 A | 6/2009 |
| JP | 2009-260004 A | 11/2009 |
| JP | 2009-283793 A | 12/2009 |
| JP | 2010-073894 A | 4/2010 |
| JP | 2010-205987 A | 9/2010 |
| JP | 2010-272663 A | 12/2010 |
| JP | 2011-049549 A | 3/2011 |
| JP | 2011-054941 A | 3/2011 |
| JP | 2012-169605 A | 9/2012 |
| JP | 2012-227522 A | 11/2012 |
| KR | 2004-0016411 A | 2/2004 |
| WO | WO-2004/038757 | 5/2004 |
| WO | WO-2004/114391 | 12/2004 |
| WO | WO-2006/111766 | 10/2006 |
| WO | WO-2011/013523 | 2/2011 |
| WO | WO-2011/074408 | 6/2011 |
| WO | WO-2011/152254 | 12/2011 |

OTHER PUBLICATIONS

U.S. Appl. No. 13/355,950.
Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technololgy", IEDM 05: Technical Digest of International Electron Devices Meeting, Dec. 5, 2005, pp. 1067-1069.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al, "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTS Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.
Park.J et al "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn]at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshop, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

European Search Report (Application No. 12164941.2) dated Feb. 18, 2016.

Chinese Office Action (Application No. 201210132046.X) dated Mar. 3, 2016.

Keeth.B et al., "Chapter 2 : The DRAM Array", DRAM Circuit Design : Fundamental and High-Speed Topics, 2008, pp. 33-64, IEEE (The Institute of Electrical and Electronics Engineers).

European Search Report (Application No. 12164941.2) dated Jun. 23, 2016.

Korean Office Action (Application No. 2012-0042590) dated Mar. 14, 2018.

* cited by examiner

FIG. 19A  FIG. 19B
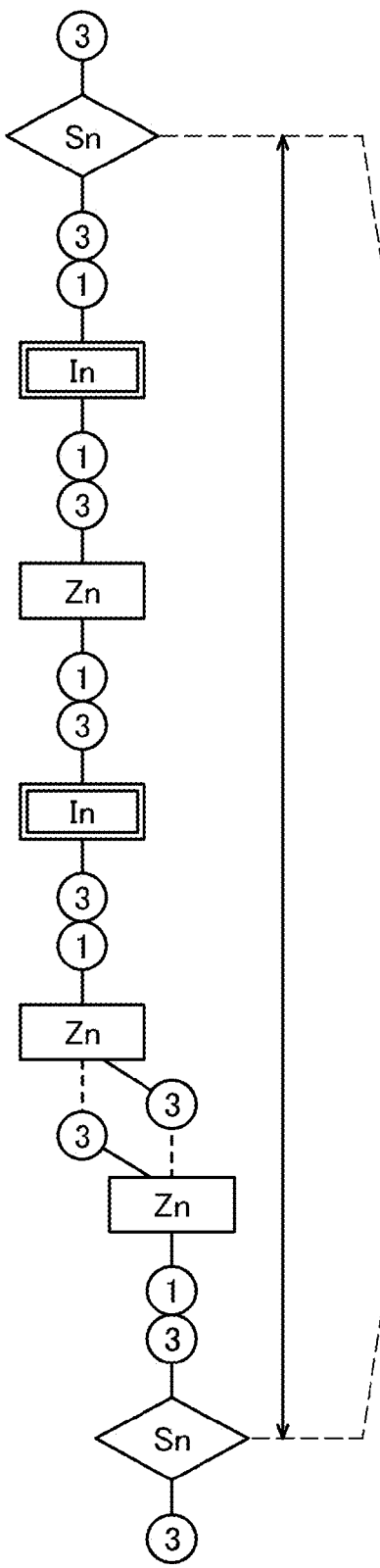
FIG. 19C
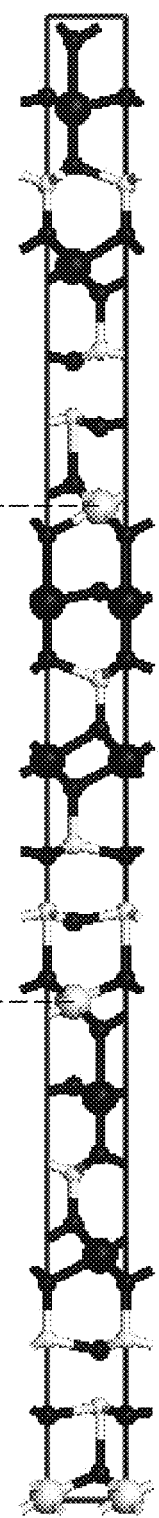
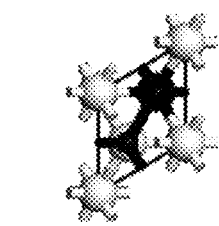
● In
○ Sn
○ Zn
● O

FIG. 20A
FIG. 20B
FIG. 20C
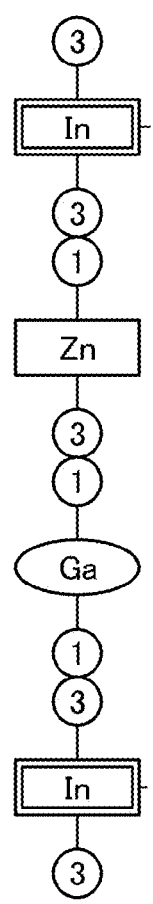
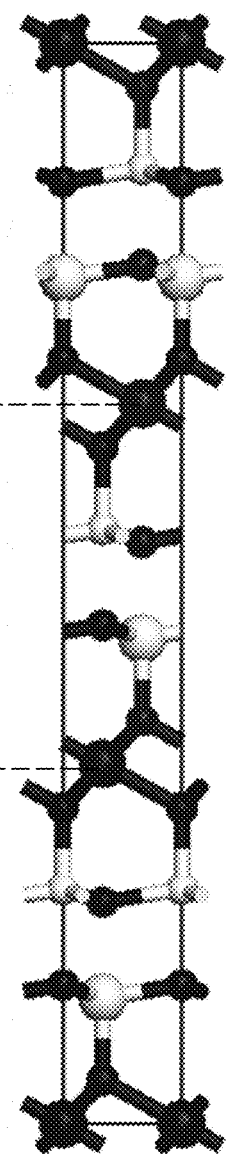
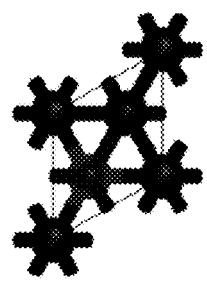
● In
○ Ga
○ Zn
● O

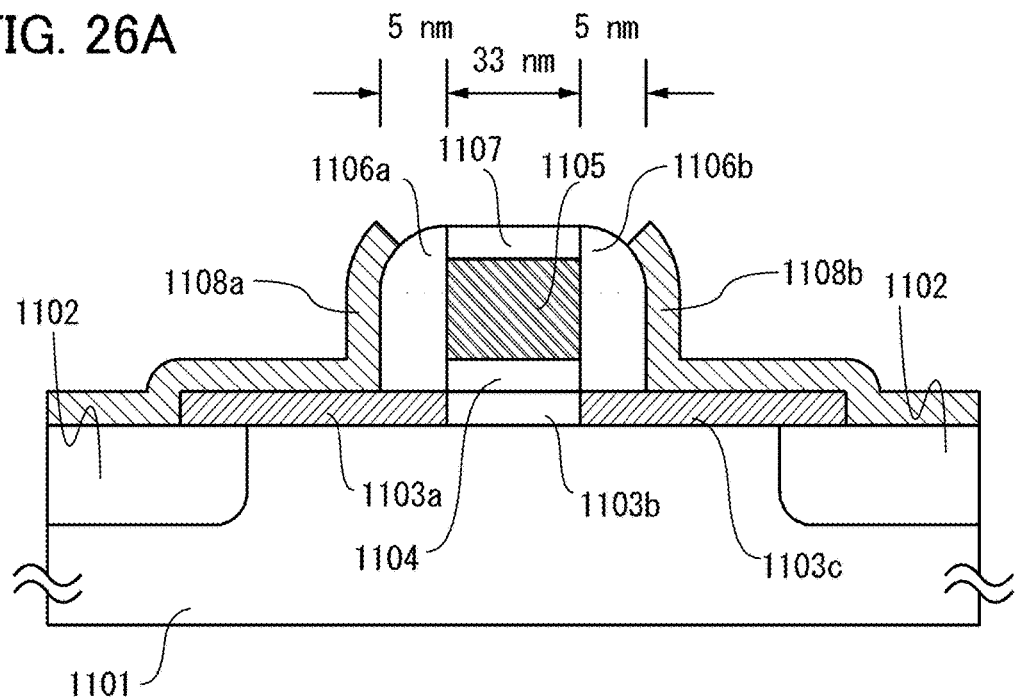
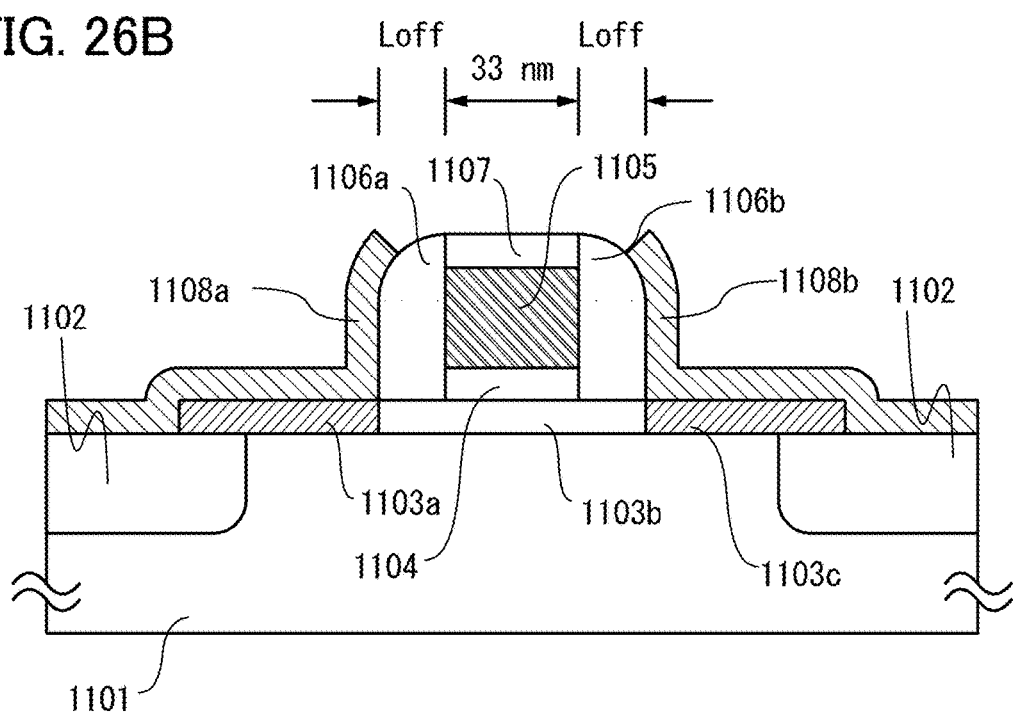

SEMICONDUCTOR DEVICE

BACKGROUND OF THE INVENTION

1. Field of the Invention

The present invention relates to a semiconductor device including a memory device.

2. Description of the Related Art

Semiconductor devices such as central processing units (CPUs) have a variety of configurations depending on their application and are generally provided with buffer memory devices capable of high-speed writing and reading, such as a register and a cache memory, as well as a main memory device for storing data or an instruction. A buffer memory device is provided in a CPU so as to be located between an arithmetic unit and a main memory device for the purpose of reducing low-speed access to the main memory device and speeding up the arithmetic processing.

In general, a flip-flop is used as a register, and a static random access memory (SRAM) is used as a cache. Patent Document 1 discloses a structure in which a volatile memory such as an SRAM and a nonvolatile memory are used in combination as a cache.

REFERENCE

Patent Document

[Patent Document 1] Japanese Published Patent Application No. H7-121444

SUMMARY OF THE INVENTION

By the way, a semiconductor device such as a central processing unit is required to have low power consumption and high integration degree in addition to high-speed operation. Although it depends on the size of the transistor, for example, when a p-channel transistor and an n-channel transistor which are connected in series between a node supplied with a high-level power supply potential and a node supplied with a low-level power supply potential are formed using bulk silicon, an off-state current of approximately 1 pA is generated at room temperature under a condition where voltage between the nodes is approximately 3 V. As the size of a central processing unit or a buffer memory device becomes larger and the number of transistors becomes larger, or as the temperature of an IC chip in the central processing unit or the buffer memory device becomes higher, the total amount of the off-state current becomes larger; accordingly, power consumption is increased. Therefore, it is necessary to design a structure of a transistor included in the central processing unit so that the off-state current of the transistor is small. However, it takes a lot of time and costs a lot to develop a transistor having both high operation speed and small off-state current.

In order to reduce power consumption of a semiconductor device, a method in which supply of power to a buffer memory device is stopped has been proposed. Since a flip-flop or an SRAM which is used in the buffer memory device is volatile, in the above method, a non-volatile memory device is provided around the volatile memory device and data is temporarily transferred to the non-volatile memory device before the supply of power is stopped. However, since such a non-volatile memory device is mainly formed using a magnetic element or a ferroelectric, the manufacturing process is complex.

In the case where the supply of power is stopped for a long time, the data is transferred to a memory device such as a hard disk or a flash memory and then the supply of power can be stopped; however, in the case where the supply of power is stopped for a short time, such a memory device is not suitable because a time for placing the data back is needed.

In view of the above problems, it is an object of the present invention to provide a semiconductor device which can reduce power consumption while high-speed operation is ensured. Further, it is an object of the present invention to provide a semiconductor device which can reduce power consumption and achieve high integration while high-speed operation is ensured.

In order to achieve the above objects, in an embodiment of the present invention, a semiconductor device includes a memory element including a transistor in which a semiconductor such as silicon having crystallinity or germanium having crystallinity is used in a channel formation region, a capacitor which stores data of the memory element, and a switching element which controls supply, storage, and release of charge in the capacitor. Further, in an embodiment of the present invention, a transistor included in the switching element is formed over a layer in which the transistor included in the memory element is formed, and in addition, one of a source electrode and a drain electrode of the transistor included in the memory element serves as one of a source electrode and a drain electrode of the transistor included in the switching element.

Alternatively, in order to achieve the above objects, in an embodiment of the present invention, a semiconductor device includes a memory element including a transistor in which a semiconductor such as silicon having crystallinity or germanium having crystallinity is used in a channel formation region, a capacitor which stores data of the memory element, and a switching element which controls supply, storage, and release of charge in the capacitor. Further, in an embodiment of the present invention, a transistor included in the switching element is formed over a layer in which the transistor included in the memory element is formed.

For the switching element, a transistor in which an oxide semiconductor is used in a channel formation region is used. An oxide semiconductor has a wider band gap and lower intrinsic carrier density than silicon. Therefore, a transistor in which an oxide semiconductor is used in a channel formation region has much smaller off-state current than a transistor formed using a normal semiconductor such as silicon or germanium.

Further, in an embodiment of the present invention, the semiconductor device has the following first structure so that the off-state current of the transistor in which an oxide semiconductor is used in a channel formation region is further reduced. Specifically, in the semiconductor device according to an embodiment of the present invention, the transistor included in the switching element includes an oxide semiconductor film over an insulating film, a gate insulating film over the oxide semiconductor film, a gate electrode which is provided in a portion overlapping with the oxide semiconductor film with the gate insulating film provided therebetween, and a pair of conductive films connected to the oxide semiconductor film. The oxide semiconductor film includes a first region which overlaps with the gate electrode and at least part of which serves as a channel formation region, and a pair of second regions between which the first region is sandwiched. Further, the insulating film includes a first oxide insulating film from which part of oxygen is released by heating and a second oxide insulating film which prevents diffusion of oxygen and is provided in the periphery of the first oxide insulating film. The first region of the oxide semiconductor film is in contact with the first oxide insulating film and the second regions of the oxide semiconductor film are in contact with the first oxide insulating film and the second oxide insulating film.

In the above structure, oxygen released from the first oxide insulating film is prevented from diffusing into the second oxide insulating film, so that the oxygen is effectively supplied to an end portion of the oxide semiconductor film in the first region. Note that oxygen deficiency due to release of oxygen is easily caused at an end portion of an oxide semiconductor film in a transistor in which the oxide semiconductor is used in a channel formation region because of etching treatment for etching the oxide semiconductor film into a desired shape, exposure of the end portion of the oxide semiconductor film to a reduced-pressure atmosphere, or the like. Since oxygen deficiency becomes a path through which carriers move, a parasitic channel is formed when oxygen deficiency is formed at the end portion of the oxide semiconductor film and thus the off-state current of the transistor is increased. However, in an embodiment of the present invention, with the above structure, oxygen deficiency is prevented from being formed at the end portion of the oxide semiconductor film in the first region and thus the off-state current can be reduced.

Alternatively, in an embodiment of the present invention, the semiconductor device may have the following second structure instead of the first structure so that the off-state current of the transistor in which an oxide semiconductor is used in a channel formation region is further reduced. Specifically, in the semiconductor device according to an embodiment of the present invention, the transistor included in the switching element includes an oxide semiconductor film, a gate insulating film over the oxide semiconductor film, a gate electrode which is provided in a portion overlapping with the oxide semiconductor film with the gate insulating film provided therebetween, and a pair of conductive films connected to the oxide semiconductor film. Further, the semiconductor device includes a first oxide insulating film which is provided in the periphery of the oxide semiconductor film so as to be in contact with an end portion of the oxide semiconductor film and releases part of oxygen by heating, a second oxide insulating film which is provided in the periphery of the oxide semiconductor film with the first oxide insulating film provided therebetween and prevents diffusion of oxygen, and a third oxide insulating film which is provided below the oxide semiconductor film and releases part of oxygen by heating. The oxide semiconductor film includes a first region which overlaps with the gate electrode and at least part of which serves as a channel formation region, and a pair of second regions between which the first region is sandwiched.

In the above structure, oxygen released from the first oxide insulating film is prevented from diffusing into the second oxide insulating film, so that the oxygen is effectively supplied to an end portion of the oxide semiconductor film. Further, oxygen released from the third oxide insulating film is supplied to a lower portion of the oxide semiconductor film. As described above, oxygen deficiency due to release of oxygen is easily caused at an end portion of an oxide semiconductor film in a transistor in which the oxide semiconductor is used in a channel formation region because of etching treatment for etching the oxide semiconductor film into an desired shape, exposure of the end portion of the oxide semiconductor film to a reduced-pressure atmosphere, or the like. Since oxygen deficiency becomes a path through which carriers move, a parasitic channel is formed when oxygen deficiency is formed at the end portion of the oxide semiconductor film and thus the off-state current of the transistor is increased. However, in an embodiment of the present invention, since oxygen is effectively supplied to the end portion of the oxide semiconductor film, particularly to the end portion of the oxide semiconductor film in the first region, oxygen deficiency is prevented from being formed at the end portion of the oxide semiconductor film in the first region and thus the off-state current can be reduced.

Note that in the semiconductor device having the first structure or the second structure, the second regions of the oxide semiconductor film may contain a dopant. Alternatively, in the oxide semiconductor film, the second regions may include a pair of third regions containing a dopant and a pair of fourth regions which have the dopant concentration higher than that of the third regions. Specifically, the oxide semiconductor film may include a first region and a pair of second regions between which the first region is sandwiched, and the second region may include a pair of third regions between which the first region is sandwiched and a pair of fourth regions between which the first region and the pair of third regions are sandwiched. The third regions serve as electric-field relaxation regions.

Various experiments can prove small off-state current of the transistor including an oxide semiconductor film as an active layer. For example, even with an element with a channel width of $1 \times 10^6$ μm and a channel length of 10 μm, in a range of from 1 V to 10 V of voltage (drain voltage) between a source terminal and a drain terminal, off-state current can be smaller than or equal to the measurement limit of a semiconductor parameter analyzer, that is, smaller than or equal to $1 \times 10^{-13}$ A. In this case, it can be found that an off-state current density corresponding to a value obtained by dividing the off-state current by the channel width of the transistor is lower than or equal to 100 zA/μm.

An oxide semiconductor to be used preferably contains at least indium (In) or zinc (Zn). In particular, In and Zn are preferably contained. As a stabilizer for reducing variation in electric characteristics of a transistor including the oxide semiconductor, gallium (Ga) is preferably additionally included. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_3SnO_5(ZnO)_n$ (n>0 is satisfied, and n is an integer) may be used.

For example, an In—Ga—Zn-based oxide with an atomic ratio of In:Ga:Zn=1:1:1 (=⅓:⅓:⅓) or In:Ga:Zn=2:2:1 (=⅖:⅖:⅕), or any of oxides whose composition is in the neighborhood of the above compositions can be used.

Alternatively, an In—Sn—Zn-based oxide with an atomic ratio of In:Sn:Zn=1:1:1 (=⅓:⅓:⅓), In:Sn:Zn=2:1:3 (=⅓:⅙:½), or In:Sn:Zn=2:1:5 (=¼:⅛:⅝), or any of oxides whose composition is in the neighborhood of the above compositions may be used.

However, the composition is not limited to those described above, and a material having an appropriate composition may be used in accordance with necessary electrical characteristics (such as mobility, threshold voltage, and variation). In order to obtain needed electrical characteristics, it is preferable that the carrier density, the impurity concentration, the defect density, the atomic ratio of a metal element to oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that Ra is obtained by expanding centerline average roughness, which is defined by JIS B 0601, into three dimensions so as to be applicable to a surface. Moreover, Ra can be expressed as average value of the absolute values of deviations from a reference surface to a specific surface and is defined by the following Formula 1.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Further, Ra can be measured using an atomic force microscope (AFM).

In an embodiment of the present invention, a transistor included in a memory element includes a semiconductor such as silicon having crystallinity or germanium having crystallinity in a channel formation region, so that the semiconductor device can operate at high speed. Further, in an embodiment of the present invention, a switching element includes a transistor having extremely small off-state current, so that the amount of charge leaking from a capacitor through the switching element can be reduced. In other words, in an embodiment of the present invention, transistors having structures most suitable for characteristics needed for the memory element and the switching element can be separately manufactured easily. Further, in an embodiment of the present invention, a transistor included in a memory element and a transistor included in a switching element are stacked, so that high integration of a semiconductor device can be achieved.

Accordingly, in an embodiment of the present invention, with the above structure, a semiconductor device which can reduce power consumption while high-speed operation is ensured can be provided. Further, in an embodiment of the present invention, a semiconductor device which can reduce power consumption and achieve high integration while high-speed operation is ensured can be provided.

BRIEF DESCRIPTION OF THE DRAWINGS

In the accompanying drawings:

FIGS. 19A to 19C are diagrams illustrating a structure of an oxide semiconductor according to an embodiment of the present invention;

FIGS. 20A to 20C are diagrams illustrating a structure of an oxide semiconductor according to an embodiment of the present invention;

FIGS. 26A and 26B illustrate cross-sectional structures of transistors used for calculation;

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that the present invention includes, in its category, all the semiconductor devices in which memory devices can be used: for example, integrated circuits, RF tags, and semiconductor display devices. The integrated circuit includes, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). In addition, the semiconductor display devices include, in its category, semiconductor display devices in which a circuit element including a semiconductor film is included in a driver circuit, such as liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and the like.

Embodiment 1

Figure 1:
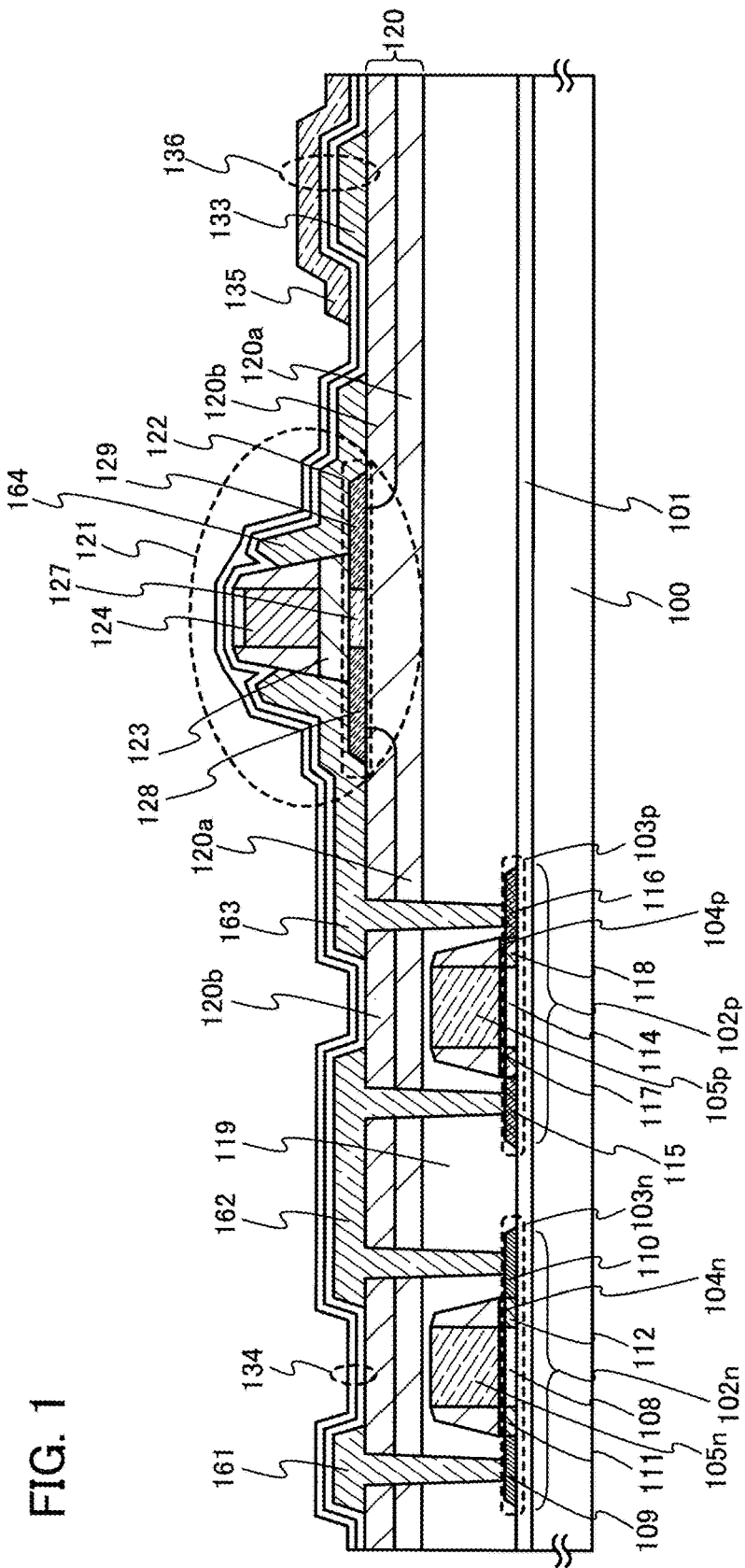
FIG. 1 is a cross-sectional view of a semiconductor device.

A semiconductor device according to an embodiment of the present invention includes a memory element including a transistor in which a semiconductor such as silicon having crystallinity or germanium having crystallinity is used in a channel formation region, a capacitor which stores data of the memory element, and a switching element which controls supply, storage, and release of charge in the capacitor. FIG. 1 is an example of a cross-sectional view of structures of an n-channel transistor 102n and a p-channel transistor 102p included in the memory element, a capacitor 136, and a transistor 121 included in the switching element.

The semiconductor device illustrated in FIG. 1 includes the n-channel transistor 102n and the p-channel transistor 102p over a substrate 100. An insulating film 101 is formed over a surface of the substrate 100.

The n-channel transistor 102n includes a semiconductor film 103n including silicon having crystallinity, a gate insulating film 104n over the semiconductor film 103n, a gate electrode 105n provided in a portion overlapping with the semiconductor film 103n with the gate insulating film 104n provided therebetween, and a conductive film 161 and a conductive film 162 which are connected to the semiconductor film 103n and serve as a source electrode and a drain electrode. The semiconductor film 103n includes a first region 108 serving as a channel formation region and second regions 109 and 110 serving as a source and a drain. The first region 108 is sandwiched between the second regions 109 and 110. FIG. 1 illustrates an example of the case where the semiconductor film 103n includes third regions 111 and 112 serving as lightly doped drain (LDD) regions between the first region 108 and the second region 109 and between the first region 108 and the second region 110.

The p-channel transistor 102p includes a semiconductor film 103p including silicon having crystallinity, a gate insulating film 104p over the semiconductor film 103p, a gate electrode 105p provided in a portion overlapping with the semiconductor film 103p with the gate insulating film 104p provided therebetween, and the conductive film 162 and a conductive film 163 which are connected to the semiconductor film 103p and serve as a source electrode and a drain electrode. The semiconductor film 103p includes a first region 114 serving as a channel formation region and second regions 115 and 116 serving as a source and a drain. The first region 114 is sandwiched between the second regions 115 and 116. FIG. 1 illustrates an example of the case where the semiconductor film 103p includes third regions 117 and 118 serving as LDD regions between the first region 114 and the second region 115 and between the first region 114 and the second region 116.

Note that FIG. 1 illustrates the case where the n-channel transistor 102n and the p-channel transistor 102p share the conductive film 162; however, the two transistors may include separate conductive films.

Further, FIG. 1 illustrates the case where the n-channel transistor 102n and the p-channel transistor 102p each include a thin semiconductor film; however, the n-channel transistor 102n and the p-channel transistor 102p may each have a channel formation region in a bulk semiconductor substrate.

Further, in the semiconductor device illustrated in FIG. 1, an insulating film 119 is provided to cover the semiconductor film 103n, the gate insulating film 104n, and the gate electrode 105n which are included in the n-channel transistor 102n and the semiconductor film 103p, the gate insulating film 104p, and the gate electrode 105p which are included in the p-channel transistor 102p. An insulating film 120 including a first oxide insulating film 120a and a second oxide insulating film 120b is provided over the insulating film 119.

The conductive film 161 is provided over the insulating film 120 to be in contact with the second region 109 in an opening portion provided in the insulating film 119 and the insulating film 120. The conductive film 162 is provided over the insulating film 120 to be in contact with the second region 110 and the second region 115 in opening portions provided in the insulating film 119 and the insulating film 120. The conductive film 163 is provided over the insulating film 120 to be in contact with the second region 116 in an opening portion provided in the insulating film 119 and the insulating film 120.

The first oxide insulating film 120a is formed using an oxide insulating film from which part of oxygen is released by heating. As such an oxide insulating film from which part of oxygen is released by heating, an insulating film which contains oxygen at a proportion exceeding the stoichiometric proportion is preferably used. Silicon oxide, silicon oxynitride, silicon nitride oxide, gallium oxide, hafnium oxide, yttrium oxide, or the like can be used for the first oxide insulating film 120a.

The second oxide insulating film 120b is formed using an oxide insulating film which prevents diffusion of oxygen. The second oxide insulating film 120b is formed using aluminum oxide, aluminum oxynitride, or the like, for example. As for aluminum oxide, aluminum oxide containing oxygen at a proportion satisfying the stoichiometric proportion or aluminum oxide containing oxygen at a proportion exceeding the stoichiometric proportion (AlOx, x is greater than or equal to 3/2) is preferably used. In addition, in aluminum oxynitride, part of oxygen in aluminum oxide containing oxygen at a proportion satisfying the stoichiometric proportion is replaced with nitrogen.

Note that "to release oxygen by heating" means that the amount of released oxygen is greater than or equal to $1.0 \times 10^{18}$ atoms/cm$^3$, preferably greater than or equal to $3.0 \times 10^{20}$ atoms/cm$^3$ in thermal desorption spectroscopy (TDS) on an oxygen atom basis.

Here, a measurement method of the amount of released oxygen converted into oxygen atoms in TDS analysis is described as below.

The desorption amount of gas in the TDS analysis is proportional to an integral value of spectrum. Therefore, the amount of released gas can be calculated from the ratio of the integral value of a spectrum of an insulating film to the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula 2 with the TDS analysis results of a silicon wafer containing hydrogen at a predetermined density which is the standard sample and the TDS analysis results of the insulating film. CH$_3$OH, which is given as a gas having a mass number of 32, is unlikely to be present in the insulating film. Therefore, all spectra having a mass number of 32 which are obtained by the TDS analysis are assumed to originate from an oxygen molecule. Further, an oxygen molecule including an oxygen atom having a mass number of 17 or 18 which is an isotope of oxygen is assumed not to be present because the proportion of such a molecule in the natural world is minimal.

$$N_{O2} = N_{H2}/S_{H2} \times S_{O2} \times \alpha$$ [Formula 2]

$N_{H2}$ is the value obtained by conversion of the number of hydrogen molecules released from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the Formula 2. Note that the amount of released oxygen from the above insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, some amount of oxygen is detected as an oxygen atom. The ratio between oxygen molecules and oxygen atoms can be calculated from the ionization rate of the oxygen molecules. Note that, since the above α includes the ionization rate of oxygen molecules, the number of the released oxygen atoms can also be estimated through the evaluation of the number of the released oxygen molecules.

Note that $N_{O2}$ is the number of released oxygen molecules. The amount of released oxygen on an oxygen atom basis is twice the number of the released oxygen molecules.

In the above structure, the insulating film from which oxygen is released by heating may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

The transistor 121 included in the switching element is provided over the insulating film 120. Specifically, the transistor 121 includes an oxide semiconductor film 122 over the insulating film 120, a gate insulating film 123 over the oxide semiconductor film 122, a gate electrode 124 which is provided in a portion overlapping with the oxide semiconductor film 122 with the gate insulating film 123 provided therebetween, and the conductive film 163 and a conductive film 164 which are connected to the oxide semiconductor film 122 and serve as a source electrode and a drain electrode. The oxide semiconductor film 122 includes a first region 127 which overlaps with the gate electrode 124 and at least part of which serves as a channel formation region, and second regions 128 and 129 which serve as a source and a drain and between which the first region 127 is sandwiched. Specifically, the conductive film 163 is connected to the second region 128 included in the oxide semiconductor film 122. Further, the conductive film 164 is connected to the second region 129 included in the oxide semiconductor film 122.

As one example of a semiconductor material which has a wider band gap than a silicon semiconductor and has a lower intrinsic carrier density than silicon, a compound semiconductor such as silicon carbide (SiC) or gallium nitride (GaN) can be given in addition to an oxide semiconductor. The oxide semiconductor has an advantage of high mass productivity because the oxide semiconductor can be formed by a sputtering method or a wet process, unlike silicon carbide or gallium nitride. Further, unlike silicon carbide or gallium nitride, the oxide semiconductor can be formed even at room temperature; thus, the oxide semiconductor can be formed over a glass substrate or over an integrated circuit using silicon. Further, a larger substrate can be used. Accordingly, among the semiconductors with wide band gaps, the oxide semiconductor particularly has an advantage of high mass productivity. Further, in the case where an oxide semiconductor with crystallinity is used in order to improve the property (e.g., mobility) of a transistor, the oxide semiconductor with crystallinity can be easily obtained by heat treatment at 200° C. to 800° C.

Next, a positional relation of the first region 127 and the second regions 128 and 129 included in the oxide semiconductor film 122 and the first oxide insulating film 120a and the second oxide insulating film 120b included in the insulating film 120 will be described with reference to FIGS. 2A to 2C.

Figure 2A:
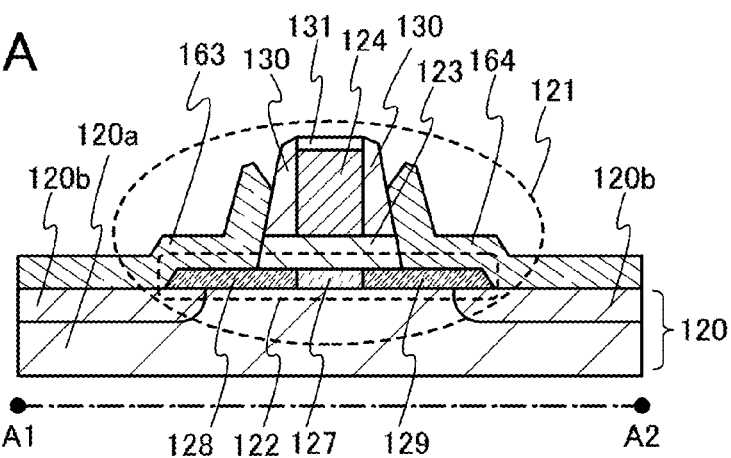
FIGS. 2A and 2C are cross-sectional views of a transistor and FIG. 2B is a top view of the transistor.
Figure 2B:
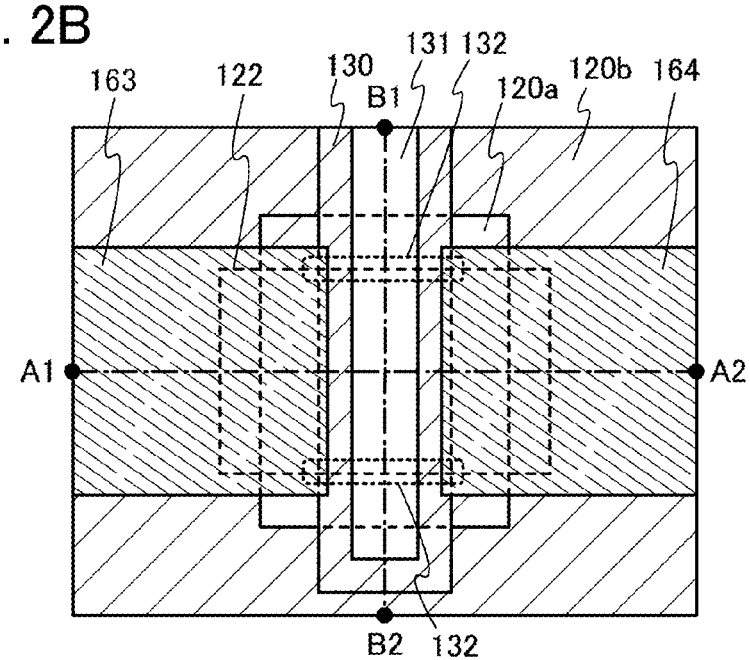
Figure 2C:
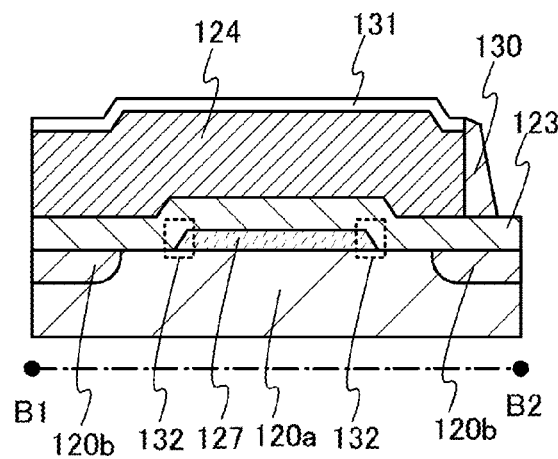

FIG. 2A is a cross-sectional view of the insulating film 120 and the transistor 121 and FIG. 2B is a top view of the insulating film 120 and the transistor 121. FIG. 2A is the cross-sectional view taken along dashed-dotted line A1-A2 in FIG. 2B. FIG. 2C is a cross-sectional view of the insulating film 120 and the transistor 121, taken along dashed-dotted line B1-B2 in FIG. 2B.

In the transistor 121, a sidewall 130 including an insulating film is provided on side portions of the gate electrode 124, and an insulating film 131 is provided over the gate electrode 124. Further, part of the conductive film 163 and part of the conductive film 164 are in contact with the sidewall 130. The conductive film 163 and the conductive film 164 are not necessarily in contact with the sidewall 130. However, when the conductive film 163 and the conductive film 164 are formed in contact with the sidewall 130, the size of the area where the oxide semiconductor film 122 is in contact with the conductive film 163 and the conductive film 164 can be prevented from changing even in the case where the conductive film 163 and the conductive film 164 deviate from appropriate positions. Accordingly, variation in on-state current of the transistor 121 due to deviation of positions of the conductive film 163 and the conductive film 164 can be prevented.

Note that the insulating film 131 over the gate electrode 124 is not necessarily provided. However, when the insulating film 131 is provided, electrical conduction between the conductive film 163 and the gate electrode 124 and between the conductive film 164 and the gate electrode 124 can be prevented even in the case where the conductive film 163 or the conductive film 164 is formed on the gate electrode 124.

Further, in the insulating film 120, the second oxide insulating film 120b is provided in the periphery of the first oxide insulating film 120a. The first region 127 of the oxide semiconductor film 122 is in contact with the first oxide insulating film 120a and the second regions 128 and 129 of the oxide semiconductor film 122 are in contact with the first oxide insulating film 120a and the second oxide insulating film 120b.

In the above structure, oxygen released from the first oxide insulating film 120a by heating can be prevented from passing through the second oxide insulating film 120b; thus, the oxygen is effectively supplied to end portions 132 of the oxide semiconductor film 122 in the first region 127. Note that oxygen deficiency due to release of oxygen is easily caused at an end portion of the oxide semiconductor film 122 in the transistor 121 in which the oxide semiconductor is used in a channel formation region because of etching treatment for etching the oxide semiconductor film 122 into a desired shape, exposure of the end portion of the oxide semiconductor film 122 to a reduced-pressure atmosphere, or the like. Since oxygen deficiency becomes a path through which carriers move, a parasitic channel is formed when oxygen deficiency is formed at the end portion of the oxide semiconductor film 122 and thus the off-state current of the transistor 121 is increased. However, in an embodiment of the present invention, with the above structure, oxygen deficiency is prevented from being formed at the end portions 132 of the oxide semiconductor film 122 in the first region 127 and thus the off-state current can be reduced.

Unless otherwise specified, in the case of an n-channel transistor, an off-state current in this specification is a current which flows between a source and a drain when a potential of the drain is higher than that of the source or that of a gate electrode while the potential of the gate electrode is less than or equal to zero when a reference potential is the potential of the source. Alternatively, in the case of a p-channel transistor, off-state current in this specification is current which flows between a source and a drain when a potential of the drain is lower than that of the source and that of a gate electrode while the potential of the gate electrode is greater than or equal to zero when a reference potential is the potential of the source.

Further, as illustrated in FIG. 1, the capacitor 136 includes a conductive film 133 over the insulating film 120, an insulating film 134 over the conductive film 133, and a conductive film 135 which is provided in a position overlapping with the conductive film 133 with the insulating film 134 provided therebetween. The insulating film 134 is also provided over the transistor 121. The conductive film 133 and the conductive film 164 may be electrically connected to each other, or the conductive film 133 and the conductive film 164 may be one conductive film.

Note that FIG. 1 illustrates the case where the capacitor 136, as well as the transistor 121, is formed over the insulating film 120; however, the capacitor 136, as well as the n-channel transistor 102n and the p-channel transistor 102p, may be formed below the insulating film 120.

Further, the transistor 121 includes the gate electrode 124 on at least one side of the oxide semiconductor film 122. Alternatively, a pair of gate electrodes may be provided with the oxide semiconductor film 122 provided therebetween.

Figure 3:
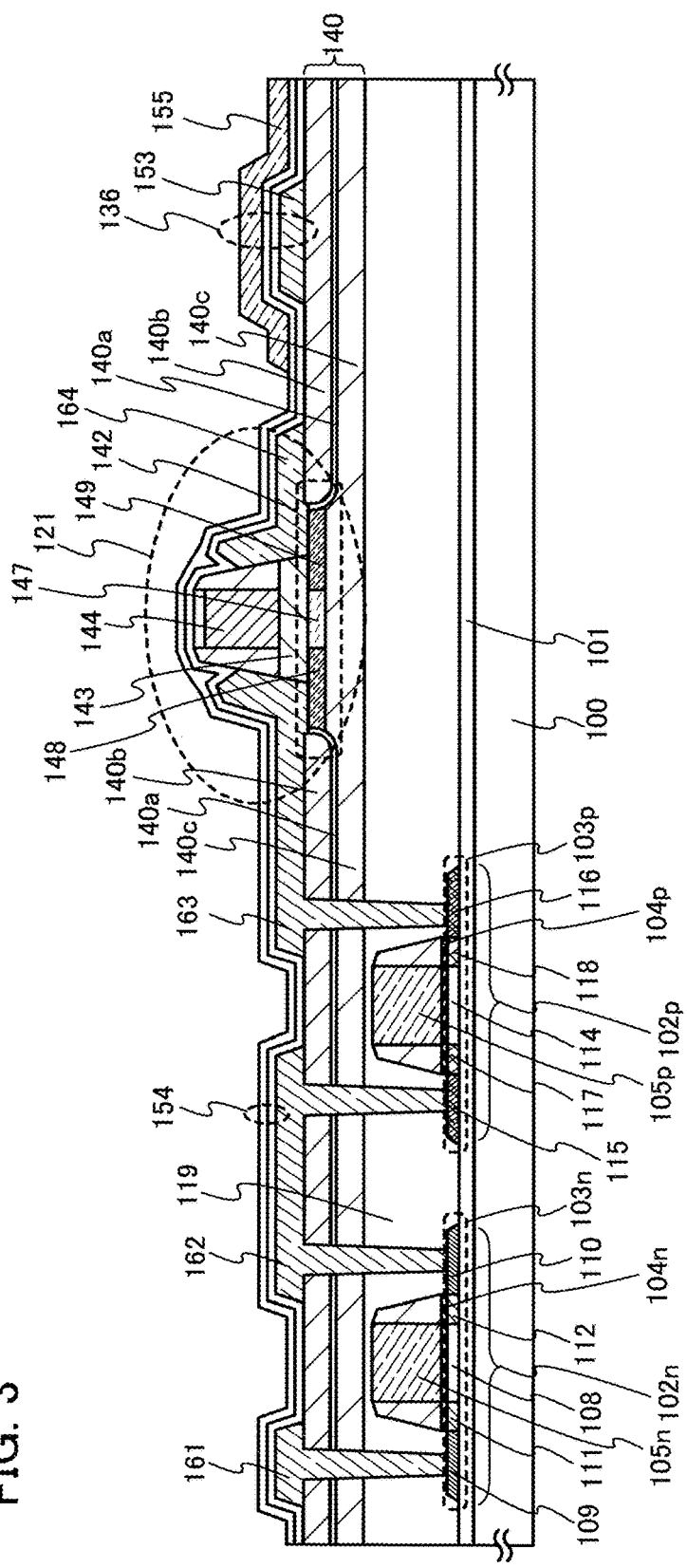
FIG. 3 is a cross-sectional view of a semiconductor device.

Next, a structure of a semiconductor device according to an embodiment of the present invention, which is different from the structure illustrated in FIG. 1, will be described. FIG. 3 is an example of a cross-sectional view of structures of the n-channel transistor 102n and the p-channel transistor 102p included in the memory element, the capacitor 136, and the transistor 121 included in the switching element.

As in the semiconductor device illustrated in FIG. 1, the semiconductor device illustrated in FIG. 3 includes the n-channel transistor 102n and the p-channel transistor 102p over the substrate 100. The insulating film 101 is formed over the surface of the substrate 100. Specific structures of the n-channel transistor 102n and the p-channel transistor 102p are similar to those in FIG. 1.

As in FIG. 1, in the semiconductor device illustrated in FIG. 3, the insulating film 119 is formed to cover the semiconductor film 103n, the gate insulating film 104n, and the gate electrode 105n which are included in the n-channel transistor 102n and the semiconductor film 103p, the gate insulating film 104p, and the gate electrode 105p which are included in the p-channel transistor 102p. An insulating film 140 including a first oxide insulating film 140a, a second oxide insulating film 140b, and a third oxide insulating film 140c is provided over the insulating film 119. The transistor 121 included in the switching element is provided over the insulating film 140.

The conductive film 161 is provided over the insulating film 140 to be in contact with the second region 109 in an opening portion provided in the insulating film 119 and the insulating film 140. The conductive film 162 is provided over the insulating film 140 to be in contact with the second region 110 and the second region 115 in opening portions provided in the insulating film 119 and the insulating film 140. The conductive film 163 is provided over the insulating film 140 to be in contact with the second region 115 in an opening portion provided in the insulating film 119 and the insulating film 140.

The first oxide insulating film 140a and the third oxide insulating film 140c are each formed using an oxide insulating film from which part of oxygen is released by heating. As such an oxide insulating film from which part of oxygen is released by heating, an insulating film which contains oxygen at a proportion exceeding the stoichiometric proportion is preferably used. Silicon oxide, silicon oxynitride, silicon nitride oxide, gallium oxide, hafnium oxide, yttrium oxide, or the like can be used for the first oxide insulating film 140a.

The second oxide insulating film 140b is formed using an oxide insulating film which prevents diffusion of oxygen. The second oxide insulating film 140b is formed using aluminum oxide, aluminum oxynitride, or the like, for example. As for aluminum oxide, aluminum oxide containing oxygen at a proportion satisfying the stoichiometric proportion or aluminum oxide containing oxygen at a proportion exceeding the stoichiometric proportion (AlOx, x is greater than or equal to 3/2) is preferably used. In addition, in aluminum oxynitride, part of oxygen in aluminum oxide containing oxygen at a proportion satisfying the stoichiometric proportion is replaced with nitrogen.

Specifically, the transistor 121 includes an oxide semiconductor film 142, a gate insulating film 143 over the oxide semiconductor film 142, a gate electrode 144 which is provided in a portion overlapping with the oxide semiconductor film 142 with the gate insulating film 143 provided therebetween, and the conductive film 163 and the conductive film 164 which are connected to the oxide semiconductor film 142 and serve as a source electrode and a drain electrode. The oxide semiconductor film 142 includes a first region 147 which overlaps with the gate electrode 144 and at least part of which serves as a channel formation region, and second regions 148 and 149 which serve as a source and a drain and between which the first region 147 is sandwiched.

Next, a specific cross-sectional structure of the transistor 121 illustrated in FIG. 3 will be described with reference to FIGS. 4A to 4C.

Figure 4A:
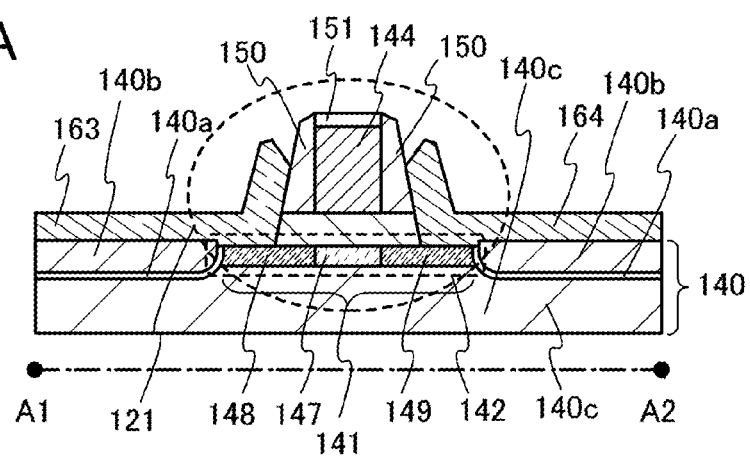
FIGS. 4A and 4C are cross-sectional views of a transistor and FIG. 4B is a top view of the transistor.
Figure 4B:
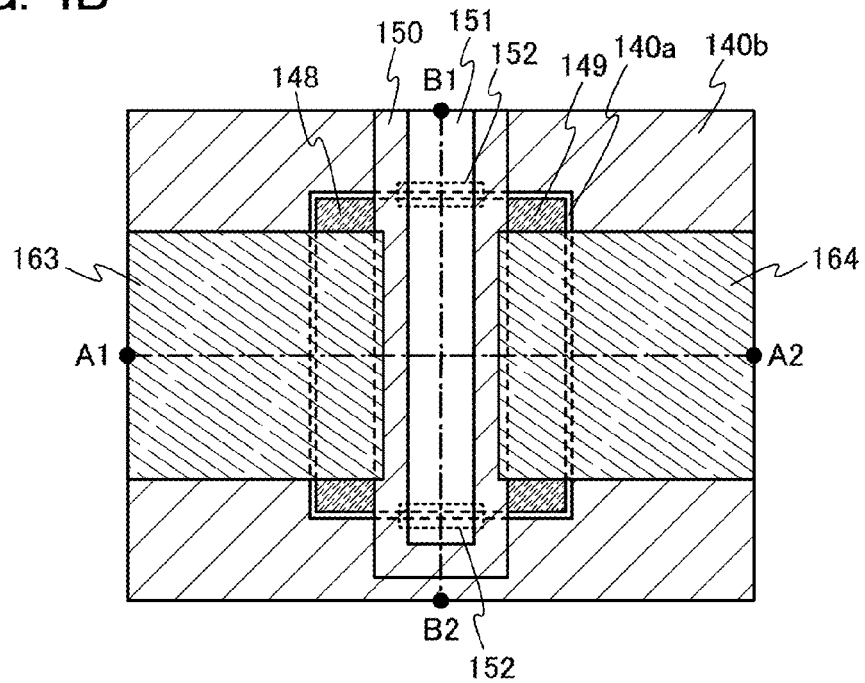
Figure 4C:
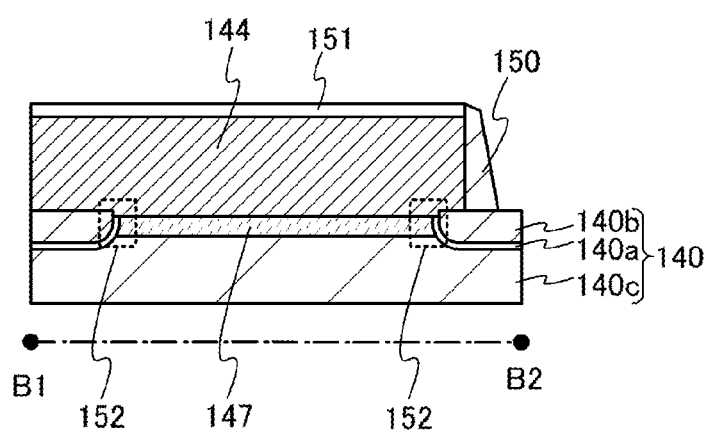

FIG. 4A is a cross-sectional view of the insulating film 140 and the transistor 121 and FIG. 4B is a top view of the insulating film 140 and the transistor 121. FIG. 4A is the cross-sectional view taken along dashed-dotted line A1-A2 in FIG. 4B. FIG. 4C is a cross-sectional view of the insulating film 140 and the transistor 121, taken along dashed-dotted line B1-B2 in FIG. 4B.

In the transistor 121, a sidewall 150 including an insulating film is provided on side portions of the gate electrode 144, and an insulating film 151 is provided over the gate electrode 144. Further, part of the conductive film 163 and part of the conductive film 164 are in contact with the sidewall 150. The conductive film 163 and the conductive film 164 are not necessarily in contact with the sidewall 150. However, when the conductive film 163 and the conductive film 164 are formed in contact with the sidewall 150, the size of the area where the oxide semiconductor film 142 is in contact with the conductive film 163 and the conductive film 164 can be prevented from changing even in the case where the conductive film 163 and the conductive film 164 deviate from appropriate positions. Accordingly, variation in on-state current of the transistor 121 due to deviation of positions of the conductive film 163 and the conductive film 164 can be prevented.

Note that the insulating film 151 over the gate electrode 144 is not necessarily provided. However, when the insulating film 151 is provided, electrical conduction between the conductive film 163 and the gate electrode 144 and between the conductive film 164 and the gate electrode 144 can be prevented even in the case where the conductive film 163 or the conductive film 164 is formed on the gate electrode 144.

In the insulating film 140, the first oxide insulating film 140a and the second oxide insulating film 140b are stacked in this order over the third oxide insulating film 140c positioned in the lowermost layer. An opening portion 141 is formed in the first oxide insulating film 140a and the second oxide insulating film 140b, and the oxide semiconductor film 142 of the transistor 121 is provided in the opening portion 141. The first oxide insulating film 140a is provided in the periphery of the oxide semiconductor film 142 so as to be in contact with an end portion of the oxide semiconductor film 142. The second oxide insulating film 140b is provided in the periphery of the oxide semiconductor film 142 with the first oxide insulating film 140a provided therebetween. The third oxide insulating film 140c is provided below the oxide semiconductor film 142.

In the above structure, oxygen released from the first oxide insulating film 140a by heating can be prevented from passing through the second oxide insulating film 140b; thus, the oxygen is effectively supplied to end portions 152 of the oxide semiconductor film 142 in the first region 147. In addition, oxygen released from the third oxide insulating film 140c is supplied to a lower portion of the oxide semiconductor film 142. Note that oxygen deficiency due to release of oxygen is easily caused at an end portion of the oxide semiconductor film 142 in the transistor 121 in which the oxide semiconductor is used in a channel formation region because of etching treatment for etching the oxide semiconductor film 142 into a desired shape, exposure of the end portion of the oxide semiconductor film 142 to a reduced-pressure atmosphere, or the like. Since oxygen deficiency becomes a path through which carriers move, a parasitic channel is formed when oxygen deficiency is formed at the end portion of the oxide semiconductor film 142 and thus the off-state current of the transistor 121 is increased. However, in an embodiment of the present invention, with the above structure, oxygen deficiency is prevented from being formed at the end portions 152 of the oxide semiconductor film 142 in the first region 147 and thus the off-state current can be reduced.

Further, as illustrated in FIG. 3, the capacitor 136 includes a conductive film 153 over the insulating film 140, an insulating film 154 over the conductive film 153, and a conductive film 155 which is provided in a position overlapping with the conductive film 153 with the insulating film 154 provided therebetween. The insulating film 154 is also provided over the transistor 121. The conductive film 153 and the conductive film 164 may be electrically connected to each other, or the conductive film 153 and the conductive film 164 may be one conductive film.

Note that FIG. 3 illustrates the case where the capacitor 136, as well as the transistor 121, is formed over the insulating film 140; however, the capacitor 136, as well as the n-channel transistor 102n and the p-channel transistor 102p, may be formed below the insulating film 140.

Further, the transistor 121 includes the gate electrode 144 on at least one side of the oxide semiconductor film 142. Alternatively, a pair of gate electrodes may be provided with the oxide semiconductor film 142 provided therebetween.

In an embodiment of the present invention, the n-channel transistor 102n and the p-channel transistor 102p included in a memory element each include a semiconductor such as silicon having crystallinity or germanium having crystallinity in a channel formation region, so that the semiconductor device can operate at high speed. Further, in an embodiment of the present invention, a switching element includes the transistor 121 having extremely small off-state current, so that the amount of charge leaking from the capacitor 136 through the switching element can be reduced. In other words, in an embodiment of the present invention, transistors having structures most suitable for characteristics needed for the memory element and the switching element can be separately manufactured easily. Further, in an embodiment of the present invention, the n-channel transistor 102n and the p-channel transistor 102p included in the memory element and the transistor 121 included in the switching element are stacked, so that high integration of the semiconductor device can be achieved.

Accordingly, in an embodiment of the present invention, with the above structure, a semiconductor device which can reduce power consumption while high-speed operation is ensured can be provided. Further, in an embodiment of the present invention, a semiconductor device which can reduce power consumption and achieve high integration while high-speed operation is ensured can be provided.

Figure 36:
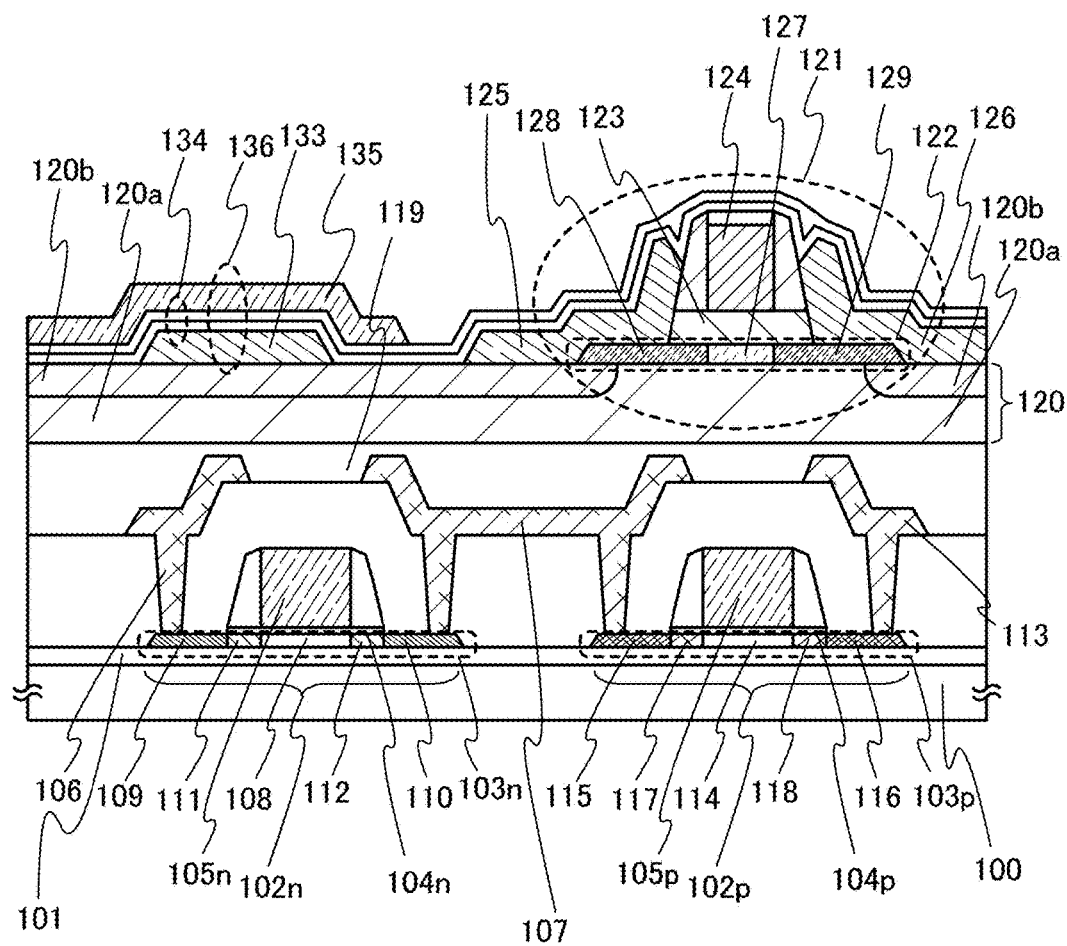
FIG. 36 is a cross-sectional view of a semiconductor device.

FIG. 36 is an example of a cross-sectional view of structures of the n-channel transistor 102n and the p-channel transistor 102p included in the memory element, the capacitor 136, and the transistor 121 included in the switching element.

A semiconductor device illustrated in FIG. 36 includes the n-channel transistor 102n and the p-channel transistor 102p over the substrate 100. The insulating film 101 is formed over the surface of the substrate 100.

The n-channel transistor 102n includes the semiconductor film 103n including silicon having crystallinity, the gate insulating film 104n over the semiconductor film 103n, the gate electrode 105n provided in a portion overlapping with the semiconductor film 103n with the gate insulating film 104n provided therebetween, and a conductive film 106 and a conductive film 107 which are connected to the semiconductor film 103n. The semiconductor film 103n includes the first region 108 serving as a channel formation region and the second regions 109 and 110 serving as a source and a drain. The first region 108 is sandwiched between the second regions 109 and 110. FIG. 36 illustrates an example of the case where the semiconductor film 103n includes the third regions 111 and 112 serving as lightly doped drain (LDD) regions between the first region 108 and the second region 109 and between the first region 108 and the second region 110.

The p-channel transistor 102p includes the semiconductor film 103p including silicon having crystallinity, the gate insulating film 104p over the semiconductor film 103p, the gate electrode 105p provided in a portion overlapping with the semiconductor film 103p with the gate insulating film 104p provided therebetween, and the conductive film 107 and a conductive film 113 which are connected to the semiconductor film 103p. The semiconductor film 103p includes the first region 114 serving as a channel formation region and the second regions 115 and 116 serving as a source and a drain. The first region 114 is sandwiched between the second regions 115 and 116. FIG. 36 illustrates an example of the case where the semiconductor film 103p includes the third regions 117 and 118 serving as LDD regions between the first region 114 and the second region 115 and between the first region 114 and the second region 116.

Note that FIG. 36 illustrates the case where the n-channel transistor 102n and the p-channel transistor 102p share the conductive film 107; however, the two transistors may include separate conductive films.

Further, FIG. 36 illustrates the case where the n-channel transistor 102n and the p-channel transistor 102p each include a thin semiconductor film; however, the n-channel transistor 102n and the p-channel transistor 102p may each have a channel formation region in a bulk semiconductor substrate.

Further, in the semiconductor device illustrated in FIG. 36, the insulating film 119 is provided over the conductive film 106, the conductive film 107, and the conductive film 113. The insulating film 120 including the first oxide insulating film 120a and the second oxide insulating film 120b is provided over the insulating film 119.

The first oxide insulating film 120a is formed using an oxide insulating film from which part of oxygen is released by heating. As such an oxide insulating film from which part of oxygen is released by heating, an insulating film which contains oxygen at a proportion exceeding the stoichiometric proportion is preferably used. Silicon oxide, silicon oxynitride, silicon nitride oxide, gallium oxide, hafnium oxide, yttrium oxide, or the like can be used for the first oxide insulating film 120a.

The second oxide insulating film 120b is formed using an oxide insulating film which prevents diffusion of oxygen. The second oxide insulating film 120b is formed using aluminum oxide, aluminum oxynitride, or the like, for example. As for aluminum oxide, aluminum oxide containing oxygen at a proportion satisfying the stoichiometric proportion or aluminum oxide containing oxygen at a proportion exceeding the stoichiometric proportion (AlOx, x is greater than or equal to 3/2) is preferably used. In addition, in aluminum oxynitride, part of oxygen in aluminum oxide containing oxygen at a proportion satisfying the stoichiometric proportion is replaced with nitrogen.

The transistor 121 included in the switching element is provided over the insulating film 120. Specifically, the transistor 121 includes the oxide semiconductor film 122 over the insulating film 120, the gate insulating film 123 over the oxide semiconductor film 122, the gate electrode 124 which is provided in a portion overlapping with the oxide semiconductor film 122 with the gate insulating film 123 provided therebetween, and a conductive film 125 and a conductive film 126 which are connected to the oxide semiconductor film 122. The oxide semiconductor film 122 includes the first region 127 which overlaps with the gate electrode 124 and at least part of which serves as a channel formation region, and the second regions 128 and 129 which serve as a source and a drain and between which the first region 127 is sandwiched.

Next, a positional relation of the first region 127 and the second regions 128 and 129 included in the oxide semiconductor film 122 and the first oxide insulating film 120a and the second oxide insulating film 120b included in the insulating film 120 will be described with reference to FIGS. 37A to 37C.

Figure 37A:
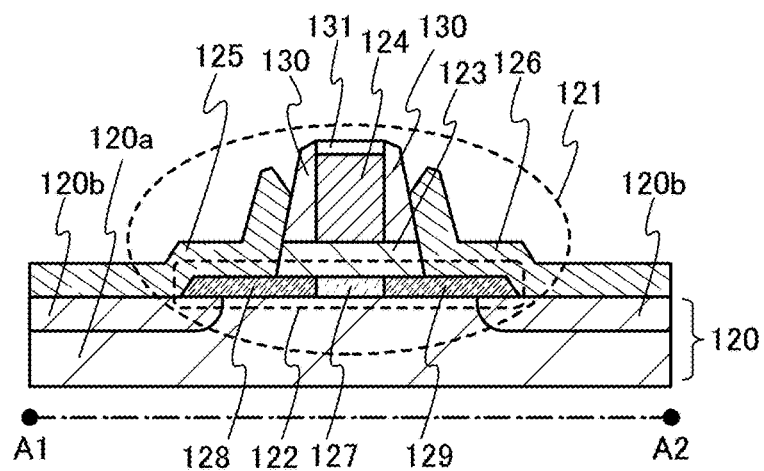
FIGS. 37A and 37C are cross-sectional views of a transistor and FIG. 37B is a top view of the transistor.
Figure 37B:
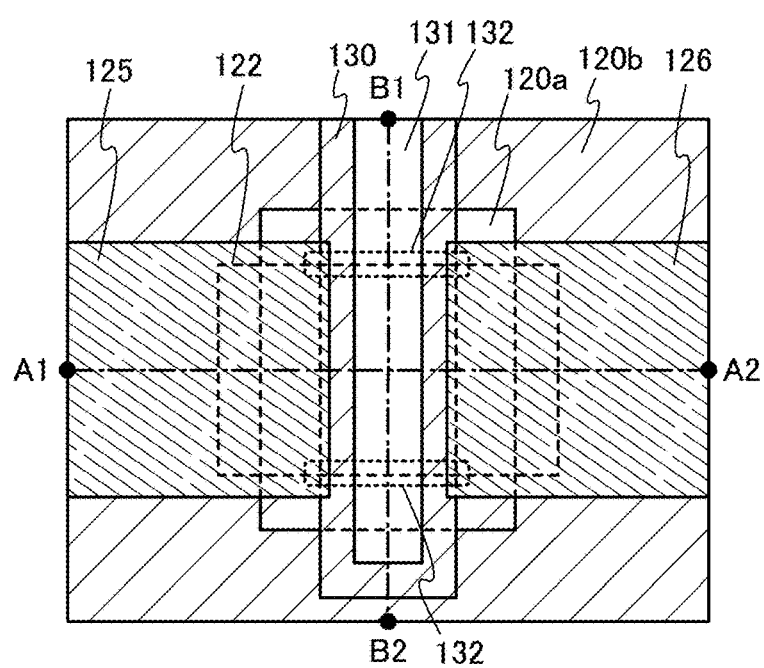
Figure 37C:
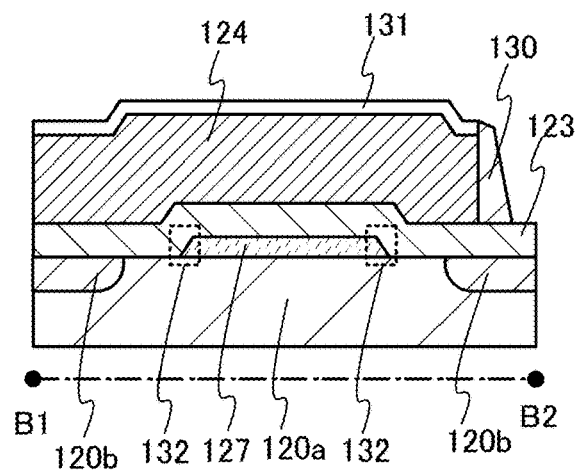

FIG. 37A is a cross-sectional view of the insulating film 120 and the transistor 121 and FIG. 37B is a top view of the insulating film 120 and the transistor 121. FIG. 37A is the cross-sectional view taken along dashed-dotted line A1-A2 in FIG. 37B. FIG. 37C is a cross-sectional view of the insulating film 120 and the transistor 121, taken along dashed-dotted line B1-B2 in FIG. 37B.

In the transistor 121, the sidewall 130 including an insulating film is provided on the side portions of the gate electrode 124, and the insulating film 131 is provided over the gate electrode 124. Further, part of the conductive film 125 and part of the conductive film 126 are in contact with the sidewall 130. The conductive film 125 and the conductive film 126 are not necessarily in contact with the sidewall 130. However, when the conductive film 125 and the conductive film 126 are formed in contact with the sidewall 130, the size of the area where the oxide semiconductor film 122 is in contact with the conductive film 125 and the conductive film 126 can be prevented from changing even in the case where the conductive film 125 and the conductive film 126 deviate from appropriate positions. Accordingly, variation in on-state current of the transistor 121 due to deviation of positions of the conductive film 125 and the conductive film 126 can be prevented.

Note that the insulating film 131 over the gate electrode 124 is not necessarily provided. However, when the insulating film 131 is provided, electrical conduction between the conductive film 125 and the gate electrode 124 and between the conductive film 126 and the gate electrode 124 can be prevented even in the case where the conductive film 125 or the conductive film 126 is formed on the gate electrode 124.

Further, in the insulating film 120, the second oxide insulating film 120b is provided in the periphery of the first oxide insulating film 120a. The first region 127 of the oxide semiconductor film 122 is in contact with the first oxide insulating film 120a and the second regions 128 and 129 of the oxide semiconductor film 122 are in contact with the first oxide insulating film 120a and the second oxide insulating film 120b.

In the above structure, oxygen released from the first oxide insulating film 120a by heating can be prevented from passing through the second oxide insulating film 120b; thus, the oxygen is effectively supplied to the end portions 132 of the oxide semiconductor film 122 in the first region 127. Note that oxygen deficiency due to release of oxygen is easily caused at an end portion of the oxide semiconductor film 122 in the transistor 121 in which the oxide semiconductor is used in a channel formation region because of etching treatment for etching the oxide semiconductor film 122 into a desired shape, exposure of the end portion of the oxide semiconductor film 122 to a reduced-pressure atmosphere, or the like. Since oxygen deficiency becomes a path through which carriers move, a parasitic channel is formed when oxygen deficiency is formed at the end portion of the oxide semiconductor film 122 and thus the off-state current of the transistor 121 is increased. However, in an embodiment of the present invention, with the above structure, oxygen deficiency is prevented from being formed at the end portions 132 of the oxide semiconductor film 122 in the first region 127 and thus the off-state current can be reduced.

Further, as illustrated in FIG. 36, the capacitor 136 includes the conductive film 133 over the insulating film 120, the insulating film 134 over the conductive film 133, and the conductive film 135 which is provided in a position overlapping with the conductive film 133 with the insulating film 134 provided therebetween. The insulating film 134 is also provided over the transistor 121. The conductive film 133 and the conductive film 125 may be electrically connected to each other, or the conductive film 133 and the conductive film 125 may be one conductive film.

Note that FIG. 36 illustrates the case where the capacitor 136, as well as the transistor 121, is formed over the insulating film 120; however, the capacitor 136, as well as the n-channel transistor 102n and the p-channel transistor 102p, may be formed below the insulating film 120.

FIG. 36 illustrates the case where the insulating film 119 is provided between the insulating film 120 and the n-channel transistor 102n and between the insulating film 120 and the p-channel transistor 102p. However, the insulating film 119 is not necessarily provided. In the case where the insulating film 119 is not provided, the insulating film 120 is provided in contact with the conductive film 106, the conductive film 107, and the conductive film 113.

Further, the transistor 121 includes the gate electrode 124 on at least one side of the oxide semiconductor film 122. Alternatively, a pair of gate electrodes may be provided with the oxide semiconductor film 122 provided therebetween.

Figure 38:
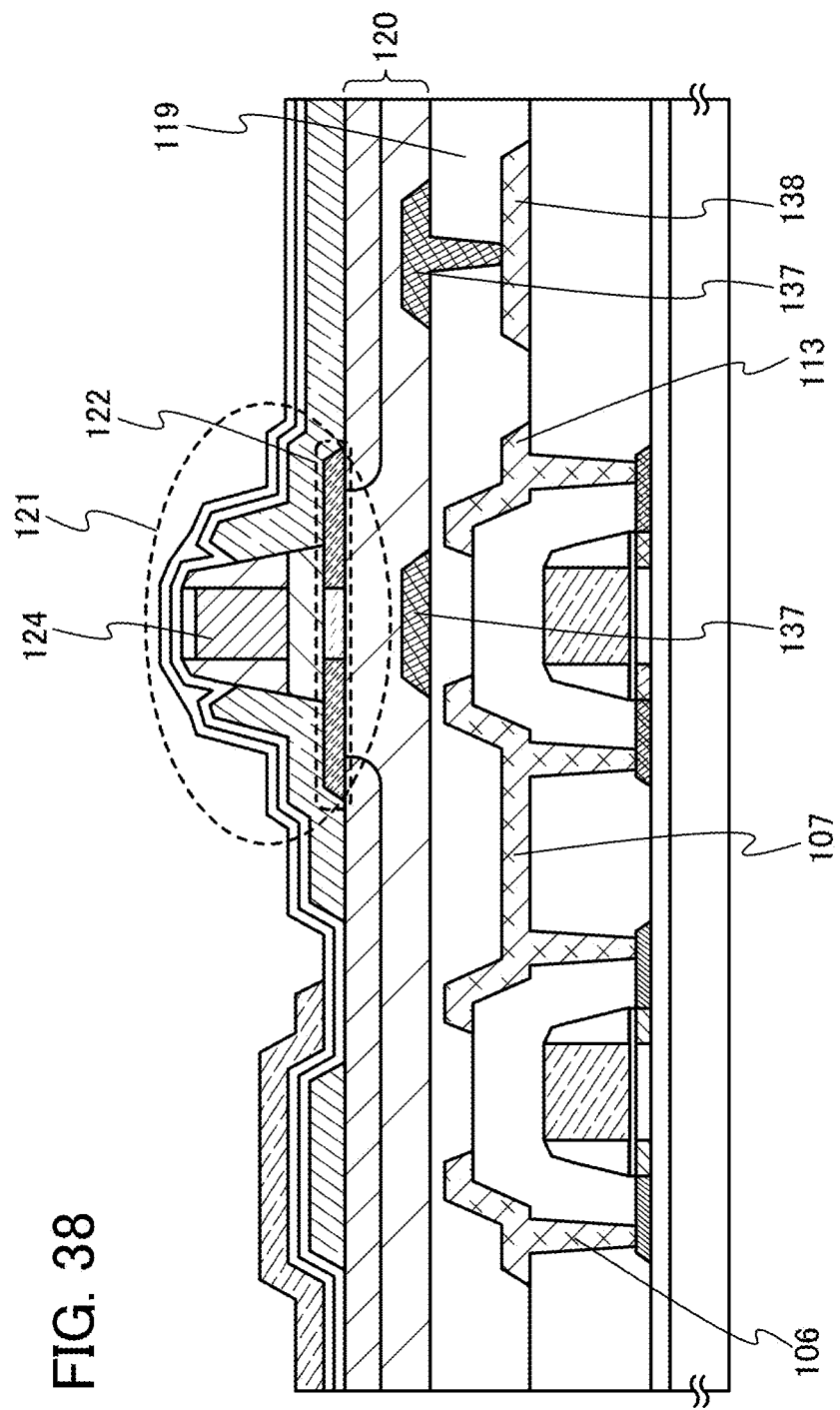
FIG. 38 is a cross-sectional view of a semiconductor device.

FIG. 38 illustrates an example of the case where the transistor 121 in the semiconductor device illustrated in FIG. 36 includes, in addition to the gate electrode 124, a back gate electrode 137 between the insulating film 119 and the insulating film 120. The back gate electrode 137 is provided in a position overlapping with the oxide semiconductor film 122 with the insulating film 120 provided therebetween.

The back gate electrode 137 may be electrically insulated to be in a floating state, or may be in a state where a potential is supplied from another element. In the latter case, a potential at the same level as the gate electrode 124 may be applied to the back gate electrode 137, or a fixed potential such as a ground potential may be applied only to the back gate electrode 137. The level of the potential applied to the back gate electrode 137 is controlled, so that the threshold voltage of the transistor 121 can be controlled. FIG. 38 illustrates an example of the case where the back gate electrode 137 is connected to a conductive film 138 in the same layer as the conductive film 106, the conductive film 107, and the conductive film 113 through an opening portion formed in the insulating film 119.

Figure 39:
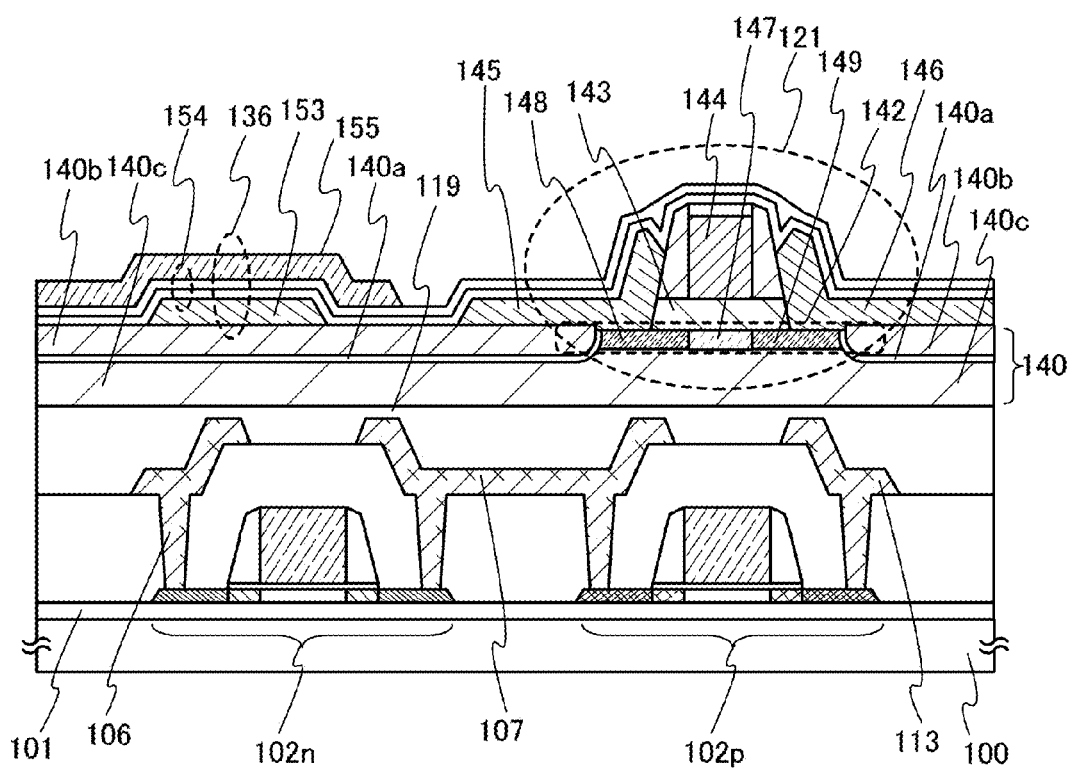
FIG. 39 is a cross-sectional view of a semiconductor device.

Next, a structure of a semiconductor device according to an embodiment of the present invention, which is different from the structure illustrated in FIG. 36, will be described. FIG. 39 is an example of a cross-sectional view of structures of the n-channel transistor 102n and the p-channel transistor 102p included in the memory element, the capacitor 136, and the transistor 121 included in the switching element.

As in the semiconductor device illustrated in FIG. 36, the semiconductor device illustrated in FIG. 39 includes the n-channel transistor 102n and the p-channel transistor 102p over the substrate 100. The insulating film 101 is formed over the surface of the substrate 100. Specific structures of the n-channel transistor 102n and the p-channel transistor 102p are similar to those in FIG. 36.

As in FIG. 36, in the semiconductor device illustrated in FIG. 39, the insulating film 119 is provided over the conductive film 106, the conductive film 107, and the conductive film 113. The insulating film 140 including the first oxide insulating film 140a, the second oxide insulating film 140b, and the third oxide insulating film 140c is provided over the insulating film 119. The transistor 121 included in the switching element is provided over the insulating film 140.

The first oxide insulating film 140a and the third oxide insulating film 140c are each formed using an oxide insulating film from which part of oxygen is released by heating. As such an oxide insulating film from which part of oxygen is released by heating, an insulating film which contains oxygen at a proportion exceeding the stoichiometric proportion is preferably used. Silicon oxide, silicon oxynitride, silicon nitride oxide, gallium oxide, hafnium oxide, yttrium oxide, or the like can be used for the first oxide insulating film 140a.

The second oxide insulating film 140b is formed using an oxide insulating film which prevents diffusion of oxygen. The second oxide insulating film 140b is formed using aluminum oxide, aluminum oxynitride, or the like, for example. As for aluminum oxide, aluminum oxide containing oxygen at a proportion satisfying the stoichiometric proportion or aluminum oxide containing oxygen at a proportion exceeding the stoichiometric proportion (AlOx, x is greater than or equal to 3/2) is preferably used. In addition, in aluminum oxynitride, part of oxygen in aluminum oxide containing oxygen at a proportion satisfying the stoichiometric proportion is replaced with nitrogen.

Specifically, the transistor 121 includes the oxide semiconductor film 142, the gate insulating film 143 over the oxide semiconductor film 142, the gate electrode 144 which is provided in a portion overlapping with the oxide semiconductor film 142 with the gate insulating film 143 provided therebetween, and a conductive film 145 and a conductive film 146 which are connected to the oxide semiconductor film 142. The oxide semiconductor film 142 includes the first region 147 which overlaps with the gate electrode 144 and at least part of which serves as a channel formation region, and the second regions 148 and 149 which serve as a source and a drain and between which the first region 147 is sandwiched.

Next, a specific cross-sectional structure of the transistor 121 illustrated in FIG. 39 will be described with reference to FIGS. 40A to 40C.

Figure 40A:
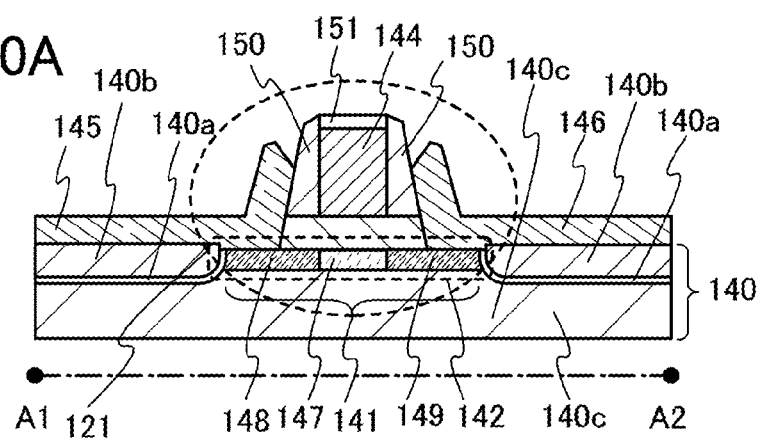
FIGS. 40A and 40C are cross-sectional views of a transistor and FIG. 40B is a top view of the transistor.
Figure 40B:
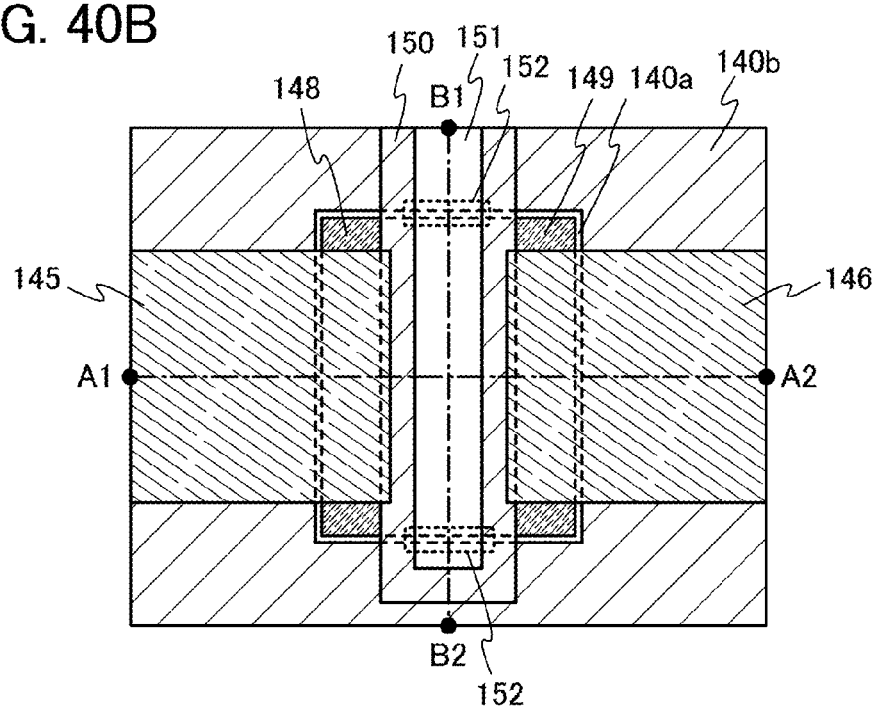
Figure 40C:
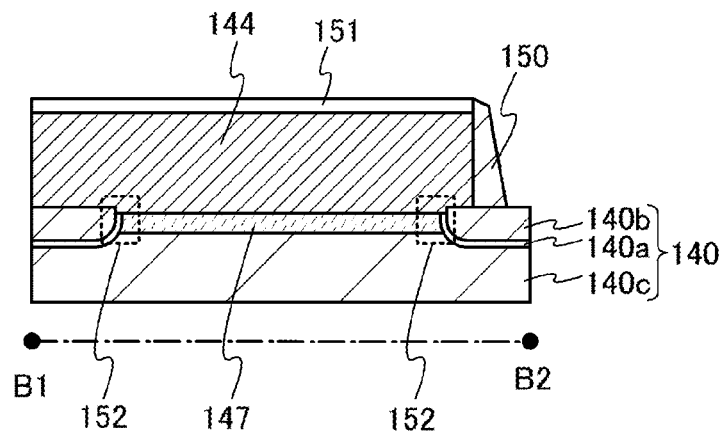

FIG. 40A is a cross-sectional view of the insulating film 140 and the transistor 121 and FIG. 40B is a top view of the insulating film 140 and the transistor 121. FIG. 40A is the cross-sectional view taken along dashed-dotted line A1-A2 in FIG. 40B. FIG. 40C is a cross-sectional view of the insulating film 140 and the transistor 121, taken along dashed-dotted line B1-B2 in FIG. 40B.

In the transistor 121, the sidewall 150 including an insulating film is provided on the side portions of the gate electrode 144, and the insulating film 151 is provided over the gate electrode 144. Further, part of the conductive film 145 and part of the conductive film 146 are in contact with the sidewall 150. The conductive film 145 and the conductive film 146 are not necessarily in contact with the sidewall 150. However, when the conductive film 145 and the conductive film 146 are formed in contact with the sidewall 150, the size of the area where the oxide semiconductor film 142 is in contact with the conductive film 145 and the conductive film 146 can be prevented from changing even in the case where the conductive film 145 and the conductive film 146 deviate from appropriate positions. Accordingly, variation in on-state current of the transistor 121 due to deviation of positions of the conductive film 145 and the conductive film 146 can be prevented.

Note that the insulating film 151 over the gate electrode 144 is not necessarily provided. However, when the insulating film 151 is provided, electrical conduction between the conductive film 145 and the gate electrode 144 and between the conductive film 146 and the gate electrode 144 can be prevented even in the case where the conductive film 145 or the conductive film 146 is formed on the gate electrode 144.

In the insulating film 140, the first oxide insulating film 140a and the second oxide insulating film 140b are stacked in this order over the third oxide insulating film 140c positioned in the lowermost layer. The opening portion 141 is formed in the first oxide insulating film 140a and the second oxide insulating film 140b, and the oxide semiconductor film 142 of the transistor 121 is provided in the opening portion 141. The first oxide insulating film 140a is provided in the periphery of the oxide semiconductor film 142 so as to be in contact with the end portion of the oxide semiconductor film 142. The second oxide insulating film 140b is provided in the periphery of the oxide semiconductor film 142 with the first oxide insulating film 140a provided therebetween. The third oxide insulating film 140c is provided below the oxide semiconductor film 142.

In the above structure, oxygen released from the first oxide insulating film 140a by heating can be prevented from passing through the second oxide insulating film 140b; thus, the oxygen is effectively supplied to the end portions 152 of the oxide semiconductor film 142 in the first region 147. In addition, oxygen released from the third oxide insulating film 140c is supplied to the lower portion of the oxide semiconductor film 142. Note that oxygen deficiency due to release of oxygen is easily caused at an end portion of the oxide semiconductor film 142 in the transistor 121 in which the oxide semiconductor is used in a channel formation region because of etching treatment for etching the oxide semiconductor film 142 into a desired shape, exposure of the end portion of the oxide semiconductor film 142 to a reduced-pressure atmosphere, or the like. Since oxygen deficiency becomes a path through which carriers move, a parasitic channel is formed when oxygen deficiency is formed at the end portion of the oxide semiconductor film 142 and thus the off-state current of the transistor 121 is increased. However, in an embodiment of the present invention, with the above structure, oxygen deficiency is prevented from being formed at the end portions 152 of the oxide semiconductor film 142 in the first region 147 and thus the off-state current can be reduced.

Further, as illustrated in FIG. 39, the capacitor 136 includes the conductive film 153 over the insulating film 140, the insulating film 154 over the conductive film 153, and the conductive film 155 which is provided in a position overlapping with the conductive film 153 with the insulating film 154 provided therebetween. The insulating film 154 is also provided over the transistor 121. The conductive film 153 and the conductive film 145 may be electrically connected to each other, or the conductive film 153 and the conductive film 145 may be one conductive film.

Note that FIG. 39 illustrates the case where the capacitor 136, as well as the transistor 121, is formed over the insulating film 140; however, the capacitor 136, as well as the n-channel transistor 102n and the p-channel transistor 102p, may be formed below the insulating film 140.

FIG. 39 illustrates the case where the insulating film 119 is provided between the insulating film 140 and the n-channel transistor 102n and between the insulating film 140 and the p-channel transistor 102p. However, the insulating film 119 is not necessarily provided. In the case where the insulating film 119 is not provided, the insulating film 140 is provided in contact with the conductive film 106, the conductive film 107, and the conductive film 113.

Further, the transistor 121 includes the gate electrode 144 on at least one side of the oxide semiconductor film 142. Alternatively, a pair of gate electrodes may be provided with the oxide semiconductor film 142 provided therebetween.

Figure 41:
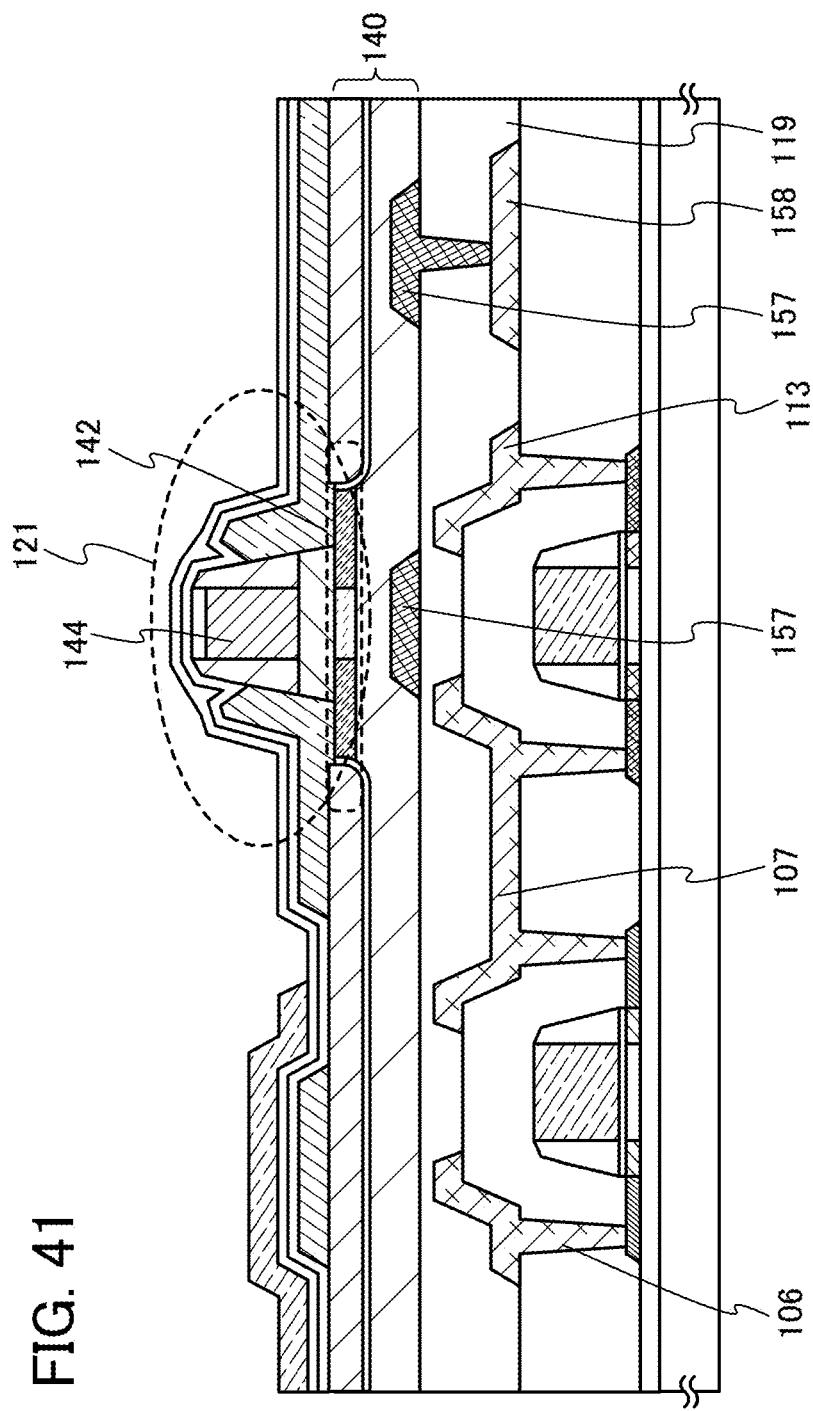
FIG. 41 is a cross-sectional view of a semiconductor device.

FIG. 41 illustrates an example of the case where the transistor 121 in the semiconductor device illustrated in FIG. 39 includes, in addition to the gate electrode 144, a back gate electrode 157 between the insulating film 119 and the insulating film 140. The back gate electrode 157 is provided in a position overlapping with the oxide semiconductor film 142 with the insulating film 140 provided therebetween.

The back gate electrode 157 may be electrically insulated to be in a floating state, or may be in a state where a potential is supplied from another element. In the latter case, a potential at the same level as the gate electrode 144 may be applied to the back gate electrode 157, or a fixed potential such as a ground potential may be applied only to the back gate electrode 157. The level of the potential applied to the back gate electrode 157 is controlled, so that the threshold voltage of the transistor 121 can be controlled. FIG. 41 illustrates an example of the case where the back gate electrode 157 is connected to a conductive film 158 in the same layer as the conductive film 106, the conductive film 107, and the conductive film 113 through an opening portion formed in the insulating film 119.

In an embodiment of the present invention, the n-channel transistor 102n and the p-channel transistor 102p included in a memory element each include a semiconductor such as silicon having crystallinity or germanium having crystallinity in a channel formation region, so that the semiconductor device can operate at high speed. Further, in an embodiment of the present invention, a switching element includes the transistor 121 having extremely small off-state current, so that the amount of charge leaking from the capacitor 136 through the switching element can be reduced. In other words, in an embodiment of the present invention, transistors having structures most suitable for characteristics needed for the memory element and the switching element can be separately manufactured easily. Further, in an embodiment of the present invention, the n-channel transistor 102n and the p-channel transistor 102p included in the memory element and the transistor 121 included in the switching element are stacked, so that high integration of the semiconductor device can be achieved.

Accordingly, in an embodiment of the present invention, with the above structure, a semiconductor device which can reduce power consumption while high-speed operation is ensured can be provided. Further, in an embodiment of the present invention, a semiconductor device which can reduce power consumption and achieve high integration while high-speed operation is ensured can be provided.

Figure 5:
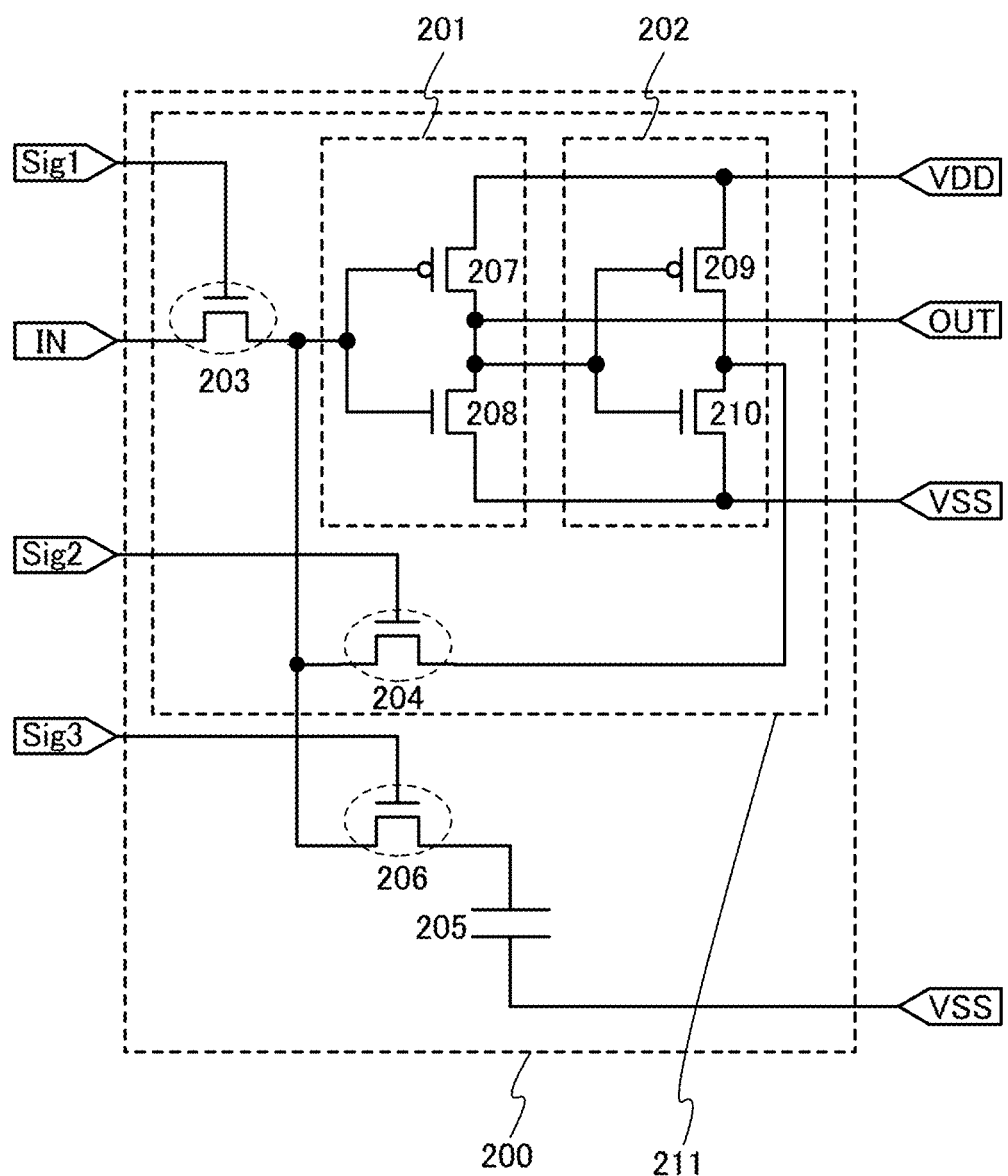
FIG. 5 is a circuit diagram of a memory circuit.

Next, a specific example of a circuit structure of a semiconductor device according to an embodiment of the present invention will be described. In the semiconductor device according to an embodiment of the present invention, a memory device includes one or a plurality of memory circuits each capable of storing one-bit data. FIG. 5 illustrates an example of a circuit diagram of the memory circuit included in the memory device. A memory circuit 200 illustrated in FIG. 5 includes a memory element 211, a capacitor 205, and a switching element 206. The memory element 211 includes a first phase-inversion element 201 and a second phase-inversion element 202 each of which inverts the phase of a signal input and outputs the signal, a transistor 203, and a transistor 204.

A signal IN including data that is input to the memory circuit 200 is supplied to an input terminal of the first phase-inversion element 201 via the transistor 203. An output terminal of the first phase-inversion element 201 is connected to an input terminal of the second phase-inversion element 202. An output terminal of the second phase-inversion element 202 is connected to the input terminal of the first phase-inversion element 201 via the transistor 204. A potential of the output terminal of the first phase-inversion element 201 or the input terminal of the second phase-inversion element 202 is output as a signal OUT to a memory circuit or another circuit of a subsequent stage.

Note that in FIG. 5, an example in which inverters are used as the first phase-inversion element 201 and the second phase-inversion element 202 is illustrated; however, a clocked inverter can also be used as the first phase-inversion element 201 or the second phase-inversion element 202 besides the inverter.

The capacitor 205 is connected to an input terminal of the memory circuit 200, i.e., a node to which a potential of the signal IN is supplied, via the transistor 203 and the switching element 206 so that the data of the signal IN that is input to the memory circuit 200 can be stored as needed. Specifically, the capacitor 205 includes a dielectric between a pair of electrodes. One of the electrodes is connected to the input terminal of the first phase-inversion element 201 via the switching element 206. The other of the electrodes is connected to a node to which a low-level power supply potential VSS or a fixed potential such as a ground potential is supplied.

For the switching element 206, a transistor in which an oxide semiconductor is used in a channel formation region is used. A transistor in which an oxide semiconductor is used in a channel formation region has much smaller off-state current than a transistor which includes a normal semiconductor such as silicon or germanium. Further, in an embodiment of the present invention, the transistor 121 having a structure capable of further reducing off-state current, such as the transistors illustrated in FIGS. 2A to 2C or FIGS. 4A to 4C, is used for the switching element 206. The length of a data holding time of the capacitor 205 depends on the amount of charge, which is accumulated in the capacitor 205, leaking through the switching element 206. Accordingly, when charge accumulated in the capacitor 205 is held by the switching element 206 having extremely small off-state current, such as the transistors described above, leakage of charge from the capacitor 205 can be prevented, and thus, the data holding time can be made longer.

Although FIG. 5 illustrates the example of the case where the transistor included in the switching element 206 has a single-gate structure, the transistor may have a multi-gate structure in which a plurality of electrically connected gate electrodes is included so that a plurality of channel formation regions is included.

Note that in FIG. 5, a structure in which the switching element 206 includes only one transistor is illustrated; however, the present invention is not limited to this structure. In an embodiment of the present invention, the switching element 206 may include a plurality of transistors. In the case where the plurality of transistors which serve as switching elements are included in the switching element 206, the plurality of transistors may be connected to each other in parallel, in series, or in combination of parallel connection and series connection.

Note that in this specification, the state in which transistors are connected to each other in series means the state in which only one of a source and a drain of a first transistor is connected to only one of a source and a drain of a second transistor. In addition, the state in which transistors are connected to each other in parallel means the state in which one of a source and a drain of a first transistor is connected to one of a source and a drain of a second transistor and the other of the source and the drain of the first transistor is connected to the other of the source and the drain of the second transistor.

Note that the terms "source" and "drain" of a transistor interchange with each other depending on the polarity of the transistor or a difference between levels of potentials applied to the source and the drain. In general, as for a source and a drain in an n-channel transistor, one to which a lower potential is applied is called a source, and one to which a higher potential is applied is called a drain. Further, as for a source and a drain in a p-channel transistor, one to which a lower potential is supplied is called a drain, and one to which a higher potential is supplied is called a source. In this specification, although connection relation of the transistor is described assuming that the source and the drain are fixed in some cases for convenience, actually, the names of the source and the drain interchange with each other depending on the relation of the potentials.

Note that the storage circuit 200 may further include another circuit element such as a diode, a resistor, or an inductor, as needed.

The first phase-inversion element 201 has a structure in which a p-channel transistor 207 and an n-channel transistor 208 whose gate electrodes are connected to each other are connected in series between a first node to which a high-level power supply potential VDD is supplied and a second node to which a low-level power supply potential VSS is supplied. Specifically, a source of the p-channel transistor 207 is connected to the first node to which the power supply potential VDD is supplied, and a source of the n-channel transistor 208 is connected to the second node to which the power supply potential VSS is supplied. In addition, a drain of the p-channel transistor 207 is connected to a drain of the n-channel transistor 208, and potentials of the two drains can be regarded as a potential of the output terminal of the first phase-inversion element 201. In addition, potentials of the gate electrode of the p-channel transistor 207 and the gate electrode of the n-channel transistor 208 can be regarded as a potential of the input terminal of the first phase-inversion element 201.

The second phase-inversion element 202 has a structure in which a p-channel transistor 209 and an n-channel transistor 210 whose gate electrodes are connected to each other are connected in series between the first node to which the high-level power supply potential VDD is supplied and the second node to which the low-level power supply potential VSS is supplied. Specifically, a source of the p-channel transistor 209 is connected to the first node to which the power supply potential VDD is supplied, and a source of the n-channel transistor 210 is connected to the second node to which the power supply potential VSS is supplied. In addition, a drain of the p-channel transistor 209 is connected to a drain of the n-channel transistor 210, and potentials of the two drains can be regarded as a potential of the output terminal of the second phase-inversion element 202. In addition, potentials of the gate electrode of the p-channel transistor 209 and the gate electrode of the n-channel transistor 210 can be regarded as a potential of the input terminal of the second phase-inversion element 202.

Switching of the transistor 203 is controlled by a signal Sig 1 applied to a gate electrode thereof. Switching of the transistor 204 is controlled by a signal Sig 2 applied to a gate electrode thereof. Switching of the transistor included in the switching element 206 is controlled by a signal Sig 3 applied to a gate electrode thereof.

In an embodiment of the present invention, the first phase-inversion element 201 and the second phase-inversion element 202 are required to operate at high speed. Therefore, the n-channel transistor 102n and the p-channel transistor 102p each including a semiconductor film including silicon having crystallinity, which are illustrated in FIG. 1, FIG. 3, FIG. 36, or FIG. 39, are used as the n-channel transistor 208 and the p-channel transistor 207 included in the first phase-inversion element 201 or the n-channel transistor 210 and the p-channel transistor 209 included in the second phase-inversion element 202.

Note that as the transistor 203 or the transistor 204, the n-channel transistor 102n or the p-channel transistor 102p including a semiconductor film including silicon having crystallinity, which are illustrated in FIG. 1, FIG. 3, FIG. 36, or FIG. 39, may be used.

Next, an example of the operation of the memory circuit 200 illustrated in FIG. 5 will be described.

First, in writing of data, the transistor 203 is turned on, the transistor 204 is turned off, and the switching element 206 is turned off. Then, the power supply potential VDD is applied to the first node and the power supply potential VSS is applied to the second node, whereby power supply voltage is applied between the first node and the second node. The potential of the signal IN applied to the memory circuit 200 is applied to the input terminal of the first phase-inversion element 201 via the transistor 203, whereby the potential of the output terminal of the first phase-inversion element 201 is a phase-inverted potential of the signal IN. Then, the transistor 204 is turned on and the input terminal of the first phase-inversion element 201 is connected to the output terminal of the second phase-inversion element 202, whereby data is written into the first phase-inversion element 201 and the second phase-inversion element 202.

Next, in the case where the input data is held in the first phase-inversion element 201 and the second phase-inversion element 202, the transistor 204 remains on, the switching element 206 remains off, and the transistor 203 is turned off. By turning off the transistor 203, the input data is held in the first phase-inversion element 201 and the second phase-inversion element 202. At this time, the power supply potential VDD is applied to the first node and the power supply potential VSS is applied to the second node, whereby the state in which the power supply voltage is applied between the first node and the second node is maintained.

The potential of the output terminal of the first phase-inversion element 201 reflects the data held in the first phase-inversion element 201 and the second phase-inversion element 202. Therefore, by reading out the potential, the data can be read out from the memory circuit 200.

In the case where the input data is held in the capacitor 205 in order that power consumption in holding the data is reduced, first, the transistor 203 is turned off, the transistor 204 is turned on, and the switching element 206 is turned on. Then, via the switching element 206, an amount of charge corresponding to the value of the data held in the first phase-inversion element 201 and the second phase-inversion element 202 is accumulated in the capacitor 205, whereby the data is written into the capacitor 205. After the data is stored in the capacitor 205, the switching element 206 is turned off, whereby the data stored in the capacitor 205 is held. After turning off the switching element 206, for example, the power supply potential VSS is supplied to each of the first node and the second node so that the nodes have equal potentials, whereby the application of the power supply voltage between the first node and the second node is stopped. Note that after the data is stored in the capacitor 205, the transistor 204 may be turned off.

In such a manner, in the case where the input data is held in the capacitor 205, the application of the power supply voltage between the first node and the second node is unnecessary; therefore, the off-state current flowing between the first node and the second node via the p-channel transistor 207 and the n-channel transistor 208 which are included in the first phase-inversion element 201, or via the p-channel transistor 209 and the n-channel transistor 210 which are included in the second phase-inversion element 202 can be extremely close to zero. As a result, power consumption due to the off-state current of the memory element in holding the data can be significantly reduced, and the power consumption of the memory device and further the whole semiconductor device including the memory device can be suppressed.

As described above, the transistor included in the switching element 206 has extremely small off-state current. Therefore, when the switching element 206 including the above transistor is in an off state, charge accumulated in the capacitor 205 does not easily leak; thus, the data is held.

In the case where the data stored in the capacitor 205 is read out, the transistor 203 is turned off. Then, the power supply potential VDD is again supplied to the first node and the power supply potential VSS is again supplied to the second node, whereby the power supply voltage is applied between the first node and the second node. Then, by turning on the switching element 206, the signal OUT having a potential that reflects the data can be read out from the memory circuit 200.

Figure 6A:
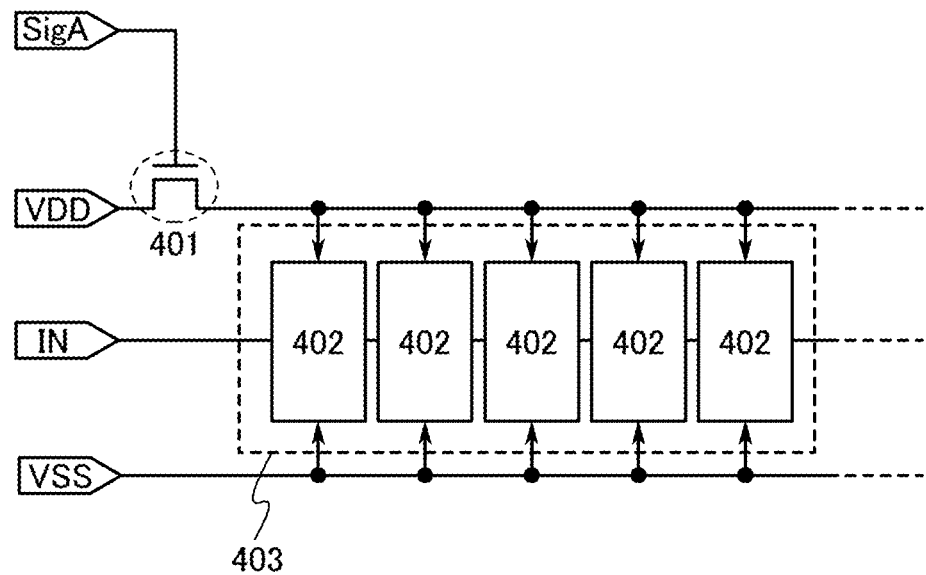
FIGS. 6A and 6B are diagrams illustrating configurations of memory devices.

Note that application of the power supply voltage between the first node and the second node may be controlled by a transistor in which an oxide semiconductor is used in a channel formation region. FIG. 6A illustrates an example of a memory device having such a structure.

The memory device illustrated in FIG. 6A includes a switching element 401 and a memory circuit group 403 including a plurality of memory circuits 402. Specifically, the memory circuit 200 illustrated in FIG. 5 can be used as each of the memory circuits 402. Each of the memory circuits 402 included in the memory circuit group 403 is supplied with the high-level power supply potential VDD via the switching element 401. In addition, the potential of the signal IN and the potential of the low-level power supply potential VSS are applied to each of the memory circuits 402 included in the memory circuit group 403.

In FIG. 6A, a transistor including an oxide semiconductor in a channel formation region is used for the switching element 401, and the switching of the transistor is controlled by a signal Sig A supplied to a gate electrode thereof. Since the transistor used for the switching element 401 includes an oxide semiconductor in a channel formation region, off-state current is extremely small as described above.

Note that in FIG. 6A, a structure in which the switching element 401 includes only one transistor is illustrated; however, the present invention is not limited to this structure. In an embodiment of the present invention, the switching element 401 may include a plurality of transistors. In the case where the plurality of transistors which serve as switching elements are included in the switching element 401, the plurality of transistors may be connected to each other in parallel, in series, or in combination of parallel connection and series connection.

Figure 6B:
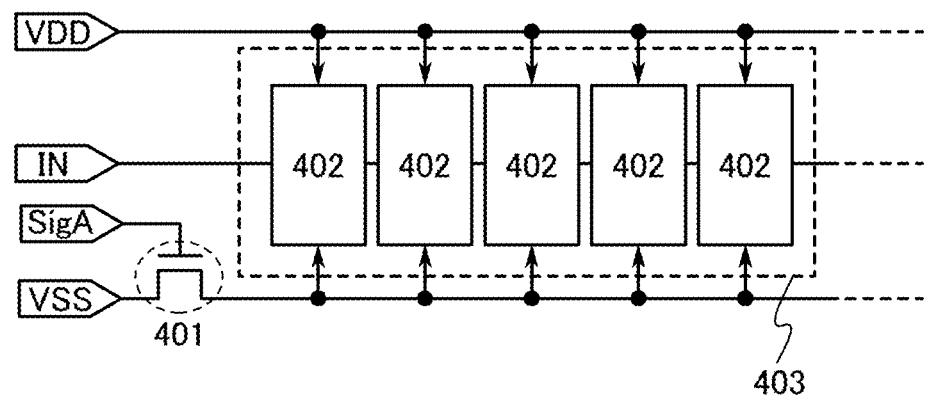

Although the switching element 401 controls the supply of the high-level power supply potential VDD to each of the memory circuits 402 included in the memory circuit group 403 in FIG. 6A, the switching element 401 may control the supply of the low-level power supply potential VSS. In FIG. 6B, an example of a memory device in which each of the memory circuits 402 included in the memory circuit group 403 is supplied with the low-level power supply potential VSS via the switching circuit 401 is illustrated. The supply of the low-level power supply potential VSS to each of the memory circuits 402 included in the memory circuit group 403 can be controlled by the switching element 401.

By the way, a magnetic tunnel junction element (an MTJ element) is known as a nonvolatile random access memory. The MTJ element stores data in a low resistance state when the spin directions in films provided above and below an insulating film are parallel, and stores data in a high resistance state when the spin directions are not parallel. Therefore, the principles of the MTJ element and the memory device including an oxide semiconductor (OS) in this embodiment are completely different from each other. Table 1 shows comparison between the MTJ element and the memory device including an oxide semiconductor in this embodiment.

is formed includes a metal oxide. Further, the transistor including an oxide semiconductor is not affected by a magnetic field, and does not cause soft errors. This shows that the transistor is highly compatible with a silicon integrated circuit.

Next, a specific embodiment of a semiconductor device according to the present invention will be described. An example of a structure of the semiconductor device is illustrated as a block diagram in FIG. 7.

TABLE 1

| | Spintronics (MTJ element) | OS/Si |
|---|---|---|
| Heat Resistance | Curie temperature | Process temperature at 500° C. (reliability at 150° C.) |
| Driving Method | Current driving | Voltage driving |
| Writing Principle | Changing spin direction of magnetic body | Turning on/off FET |
| Si LSI | Suitable for bipolar LSI (MOS LSI is preferable for high integration because bipolar LSI is unsuitable for high integration. Note that W becomes larger.) | Suitable for MOS LSI |
| Overhead | Large (because of high Joule heat) | Smaller than overhead of the MTJ element by 2 to 3 or more orders of magnitude (because of charging and discharging of parasitic capacitance) |
| Nonvolatility | Utilizing spin | Utilizing low off-state current |
| Read Number | Without limitation | Without limitation |
| 3D Conversion | Difficult (at most two layers) | Easy (the number of layers is limitless) |
| Integration Degree ($F^2$) | 4 to 15 $F^2$ | Depends on the number of layers stacked in 3D conversion (it is necessary to ensure heat resistance in process of forming upper OS FET) |
| Material | Magnetic rare-earth element | OS material |
| Cost per Bit | High | Low (might be slightly high depending on OS material) |
| Resistance to Magnetic Field | Low | High |

The MTJ element is disadvantageous in that magnetic properties are lost when the temperature is the Curie temperature or higher because a magnetic material is used. Further, the MTJ element is compatible with a silicon bipolar device because current drive is employed. However, a silicon bipolar device is unsuitable for high integration. Furthermore, the MTJ element has a problem in that power consumption is increased by an increase in memory capacity, though the MTJ element consumes an extremely small amount of current during data writing.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that avoids metal contamination. Further, the material cost per bit of the MTJ element is expensive.

On the other hand, the transistor including an oxide semiconductor in this embodiment has an element structure and an operation principle which are similar to those of a silicon MOSFET except that the region in which the channel A semiconductor device 600 includes a control unit 601, an arithmetic logic unit (ALU) 602 corresponding to an arithmetic unit, a data cache 603, an instruction cache 604, a program counter 605, an instruction register 606, a main memory device 607, and a register file 608.

The control unit 601 has a function of decoding and carrying out an input instruction. The ALU 602 has a function of performing a variety of arithmetic operations such as four arithmetic operations and logic operations. The data cache 603 is a buffer memory device which temporary stores frequently used data. The instruction cache 604 is a buffer memory device which temporary stores frequently used instructions of instructions (programs) sent to the control unit 601. The program counter 605 is a register which stores an address of an instruction to be carried out next. The instruction register 606 is a register which stores an instruction to be carried out next. Data used for the arithmetic operations in the ALU 602 and an instruction which is carried out in the control unit 601 are stored in the main memory device 607. The register file 608 includes a plurality of registers including a general purpose register and can store data which is read out from the main memory device 607, data which is obtained during the arithmetic operations in the ALU 602, data which is obtained as a result of the arithmetic operations in the ALU 602, and the like.

Next, operation of the semiconductor device 600 will be described.

The control unit 601 reads an instruction from an address of the instruction cache 604 corresponding to the address of the instruction to be carried out next which is stored in the program counter 605, and makes the instruction register 606 store the instruction. When the instruction is not stored in the corresponding address of the instruction cache 604, the control unit 601 gets access to a corresponding address of the main memory device 607, reads the instruction from the main memory device 607, and makes the instruction register 606 store the instruction. In this case, the instruction is also stored in the instruction cache 604.

The control unit 601 decodes the instruction stored in the instruction register 606 and carries out the instruction. Specifically, the control unit 601 generates various signals for controlling the operation of the ALU 602 in accordance with the instruction.

When the instruction which is to be carried out is an arithmetic instruction, the control unit 601 makes the ALU 602 perform arithmetic operations using the data stored in the register file 608, and stores a result of the arithmetic operations in the register file 608.

When the instruction which is to be carried out is a loading instruction, the control unit 601, first, gets access to a corresponding address of the data cache 603, and checks whether or not a corresponding data exists in the data cache 603. When the corresponding data exists in the data cache 603, the data is copied from the corresponding address of the data cache 603 to the register file 608. When the corresponding data does not exist in the data cache 603, the data is copied from a corresponding address of the main memory device 607 to the corresponding address of the data cache 603, and then the data is copied from the corresponding address of the data cache 603 to the register file 608. Note that in the case where the corresponding data does not exist, since it is necessary to get access to the low-speed main memory device 607, it takes long time to carry out the instruction as compared to the case where the control unit gets access to only the buffer memory device such as the data cache 603. However, when not only the above data but also the address of the data and data of addresses of the vicinities of the data in the main memory device 607 are copied to the buffer memory device, second and the subsequent accesses to the address of the data and the addresses of the vicinities thereof in the main memory device 607 can be performed at high speed.

When the instruction which is to be carried out is a store instruction, the control unit 601 stores data of the register file 608 in a corresponding address of the data cache 603. In this case, the control unit 601, first, gets access to the corresponding address of the data cache 603 and checks whether or not the corresponding data can be stored in the data cache 603. When the data can be stored in the data cache 603, the data is copied from the register file 608 to the corresponding address of the data cache 603. When the data cannot be stored, a new corresponding address is assigned in part of the data cache 603, and the data is copied from the register file 608 to the corresponding address of the data cache 603. Note that the data may be copied to the main memory device 607 immediately after the data is copied to the data cache 603. Alternatively, some pieces of data may be copied to the data cache 603 and then the pieces of data may be collectively copied to the main memory device 607.

Then, after the control unit 601 carries out the instruction, the control unit 601 gets access to the program counter 605 again, and repeats the above operation in which an instruction read out from the instruction register 606 is decoded and carried out.

Figure 7:
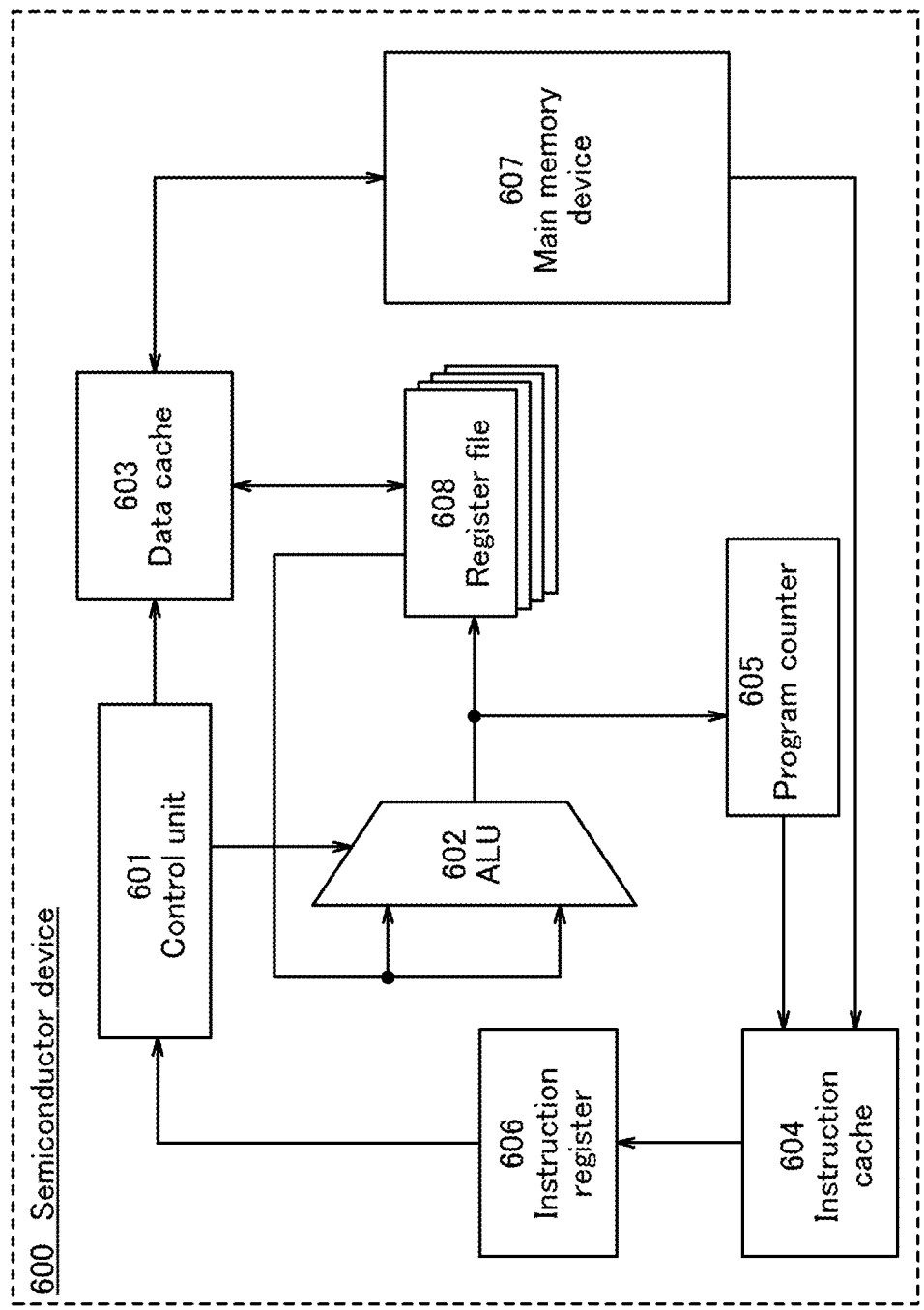
FIG. 7 is a block diagram of a semiconductor device.

Note that in the semiconductor device 600 illustrated in FIG. 7, the memory device having the above structure is provided for a buffer memory device such as the data cache 603 or the instruction cache 604. The ALU 602 selects the holding operation in the buffer memory device such as the data cache 603 or the instruction cache 604. In other words, the ALU 602 selects whether data is held in the memory element or in the capacitor in the data cache 603 and in the instruction cache 604. When data holding in the memory element is selected, power supply voltage is supplied to the memory element in the data cache 603 or the instruction cache 604. When data holding in the capacitor is selected, the data is rewritten in the capacitor and supply of power supply voltage to the memory element in the data cache 603 or the instruction cache 604 is stopped. The stop of supply of power can be performed by a switching element between a memory circuit group and a node to which the power supply potential VDD or the power supply potential VSS is applied, as illustrated in FIG. 6A or FIG. 6B.

In an embodiment of the present invention, a transistor including a semiconductor such as silicon having crystallinity or germanium having crystallinity in a channel formation region is used in a memory element which is required to drive at high speed; thus, high-speed operation of the semiconductor device 600 is achieved. Further, in an embodiment of the present invention, a transistor including an oxide semiconductor in a channel formation region is used as a switching element for holding charge in a capacitor, so that the amount of charge leaking from the capacitor can be suppressed. Therefore, in an embodiment of the present invention, the memory device having the above-described structure is applied to the buffer memory device such as the data cache 603 or the instruction cache 604, whereby erasure of data can be prevented even when supply of power is stopped. Accordingly, supply of power can be stopped even for a short time in the whole of the semiconductor device 600 or in the logic circuit such as the control unit 601 or the ALU 602 included in the semiconductor device 600. Thus, power consumption of the semiconductor device 600 can be reduced. Further, in an embodiment of the present invention, a transistor included in a memory element and a transistor included in a switching element are stacked in a memory device, whereby high integration of the semiconductor device 600 can be achieved.

Note that the actually measured mobility of a transistor is lower than its ideal mobility because of a variety of reasons; this phenomenon occurs in not only a transistor including an oxide semiconductor in a channel formation region but also another type of a transistor. One of the reasons for the actually measured low mobility is a defect inside a semiconductor or a defect at an interface between the semiconductor and an insulating film. When the Levinson model is used, the mobility on the assumption that no defect exists inside the semiconductor can be calculated theoretically. Assuming that the ideal mobility of a semiconductor is $\mu_0$, and a potential barrier (such as a grain boundary) exists in the semiconductor, the measured mobility $\mu$ can be expressed by the following Formula 3.

$$\mu = \mu_0 \exp\left(-\frac{E}{kT}\right) \qquad \text{[Formula 3]}$$

Here, E represents the height of the potential barrier, k represents the Boltzmann constant, and T represents the absolute temperature. When the potential barrier is assumed to be attributed to a defect, E can be expressed as the following Formula 4 according to the Levinson model.

$$E = \frac{e^2 N^2}{8\varepsilon\, n} = \frac{e^3 N^2 t}{8\varepsilon\, C_{ox} V_{gs}} \qquad \text{[Formula 4]}$$

Note that e represents the elementary charge, N represents the average defect density per unit area in a channel formation region, e represents the permittivity of the semiconductor, n represents carrier density per unit area in the channel formation region, $C_{ox}$ represents the capacitance per unit area, $V_{gs}$ represents the gate voltage, and t represents the thickness of the channel formation region. In the case where the thickness of the semiconductor film is less than or equal to 30 nm, the thickness of the channel formation region may be regarded as being the same as the thickness of the semiconductor film.

The drain current $I_{ds}$ in a linear region is expressed as the following Formula 5.

$$I_{ds} = \frac{W \mu V_{gs} V_{ds} C_{ox}}{L} \exp\left(-\frac{E}{kT}\right) \qquad \text{[Formula 5]}$$

Note that L represents the channel length and W represents the channel width, and L and W are each 10 μm. In addition, $V_{ds}$ represents the drain voltage. When dividing both sides of Formula 5 by $V_{gs}$ and then taking logarithms of both sides, the following Formula 6 can be obtained.

$$\ln\left(\frac{I_{ds}}{V_{gs}}\right) = \ln\left(\frac{W \mu V_{ds} C_{ox}}{L}\right) - \frac{E}{kT} = \ln\left(\frac{W \mu V_{ds} C_{ox}}{L}\right) - \frac{e^3 N^2 t}{8 kT \varepsilon C_{ox} V_{gs}} \qquad \text{[Formula 6]}$$

The right side of Formula 6 is a function of $V_{gs}$. From Formula 6, it is found that the defect density N can be obtained from the slope of a line in which $\ln(I_{ds}/V_{gs})$ is the ordinate and $1/V_{gs}$ is the abscissa. That is, the defect density can be evaluated from the $I_{ds}$-$V_{gs}$ characteristics of the transistor.

Figure 21:
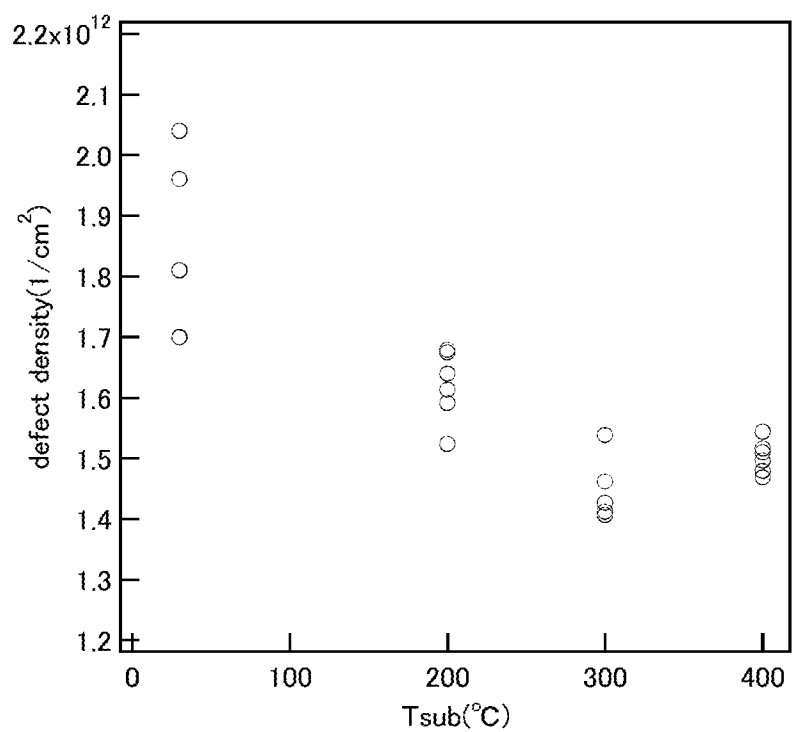
FIG. 21 is a graph showing a relation between substrate heating temperature and defect density.

The defect density depends on substrate temperature in formation of an oxide semiconductor. FIG. 21 shows the relation between substrate heating temperature and the defect density. An oxide semiconductor in which the ratio of indium (In) to gallium (Ga) and zinc (Zn) is 1:1:1 is used. FIG. 21 shows that the defect density is reduced when the substrate is heated at temperature higher than room temperature.

On the basis of the defect density obtained in this manner, or the like, to can be calculated to be 120 cm$^2$/Vs from Formula 3 and Formula 4. The measured mobility of an In—Sn—Zn oxide including a defect is approximately 35 cm$^2$/Vs. However, assuming that no defect exists inside the semiconductor and at the interface between the semiconductor and an insulating film, the mobility to of the oxide semiconductor is expected to be 120 cm$^2$/Vs.

Note that even when no defect exists inside a semiconductor, scattering at the interface between a channel formation region and a gate insulating film adversely affects the mobility of the transistor. In other words, the mobility $\mu_1$ at a position that is distance x away from the interface between the channel formation region and the gate insulating film can be expressed as the following Formula 7.

$$\frac{1}{\mu_1} = \frac{1}{\mu_0} + \frac{D}{B}\exp\left(-\frac{x}{G}\right) \qquad \text{[Formula 7]}$$

Here, D represents the electric field in the gate direction, and B and G are constants. Note that B and G can be obtained from actual measurement results; according to the above measurement results, B is 4.75×10$^7$ cm/s and G is 10 nm (the depth to which the influence of interface scattering reaches). When D is increased (i.e., when the gate voltage is increased), the second term of Formula 7 is increased and accordingly the mobility $\mu_1$ is decreased.

Figure 22:
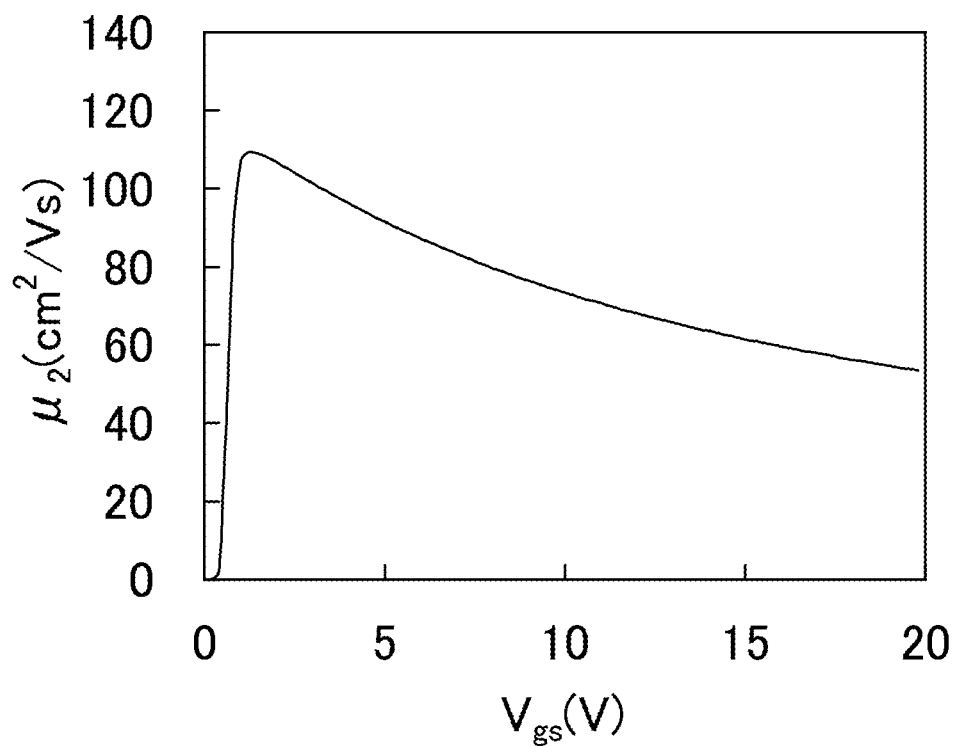
FIG. 22 is a graph showing gate voltage dependence of mobility obtained by calculation.

FIG. 22 shows calculation results of the mobility $\mu_2$ of a transistor whose channel formation region is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage Vas was assumed to be 0.1 V.

As shown in FIG. 22, the mobility has a peak of 100 cm$^2$/Vs or more at a gate voltage that is a little over 1 V, and is decreased as the gate voltage becomes higher because the influence of interface scattering is increased. Note that in order to reduce interface scattering, it is desirable that a surface of the semiconductor film be flat at the atomic level (atomic layer flatness).

Calculation results of characteristics of minute transistors formed using an oxide semiconductor having such a mobility are shown in FIGS. 23A to 23C, FIGS. 24A to 24C, and FIGS. 25A to 25C. FIGS. 26A and 26B illustrate cross-sectional structures of the transistors used for the calculation. The transistors illustrated in FIGS. 26A and 26B each include a semiconductor region 1103a and a semiconductor region 1103c that have n$^+$-type conductivity in an oxide semiconductor layer. The resistivity of the semiconductor regions 1103a and 1103c is 2×10$^{-3}$ Ωcm.

The transistor in FIG. 26A is formed over a base insulating layer 1101 and an embedded insulator 1102 that is embedded in the base insulating layer 1101 and formed of aluminum oxide. The transistor includes the semiconductor region 1103a, the semiconductor region 1103c, an intrinsic semiconductor region 1103b that is placed between the semiconductor regions 1103a and 1103c and serves as a channel formation region, and a gate electrode 1105. The width of the gate electrode 1105 is 33 nm.

A gate insulating film 1104 is formed between the gate electrode 1105 and the semiconductor region 1103b. A sidewall insulator 1106a and a sidewall insulator 1106b are formed on both side surfaces of the gate electrode 1105, and an insulator 1107 is formed over the gate electrode 1105 so as to prevent a short circuit between the gate electrode 1105 and another wiring. The sidewall insulator has a width of 5 nm. A source electrode 1108a and a drain electrode 1108b are provided in contact with the semiconductor region 1103a and the semiconductor region 1103c, respectively. Note that the channel width of this transistor is 40 nm.

The transistor in FIG. 26B is the same as the transistor in FIG. 26A in that it is formed over the base insulating film 1101 and the embedded insulator 1102 formed of aluminum oxide and that it includes the semiconductor region 1103a, the semiconductor region 1103c, the intrinsic semiconductor region 1103b provided therebetween, the gate electrode 1105 having a width of 33 nm, the gate insulating film 1104, the sidewall insulator 1106a, the sidewall insulator 1106b, the insulator 1107, the source electrode 1108a, and the drain electrode 1108b.

The difference between the transistor in FIG. 26A and the transistor in FIG. 26B is the conductivity type of semiconductor regions under the sidewall insulators 1106a and 1106b. In the transistor in FIG. 26A, the semiconductor regions under the sidewall insulator 1106a and the sidewall insulator 1106b are part of the semiconductor region 1103a having n$^+$-type conductivity and part of the semiconductor region 1103c having n$^+$-type conductivity, whereas in the transistor in FIG. 26B, the semiconductor regions under the sidewall insulator 1106a and the sidewall insulator 1106b are part of the intrinsic semiconductor region 1103b. In other words, in the semiconductor layer of FIG. 26B, a region which overlaps with neither the semiconductor region 1103a (the semiconductor region 1103c) nor the gate electrode 1105 is provided. This region is called an offset region and has a width Loff called an offset length. As is seen from the drawing, the offset length is equal to the width of the sidewall insulator 1106a (the sidewall insulator 1106b).

Figure 23A:
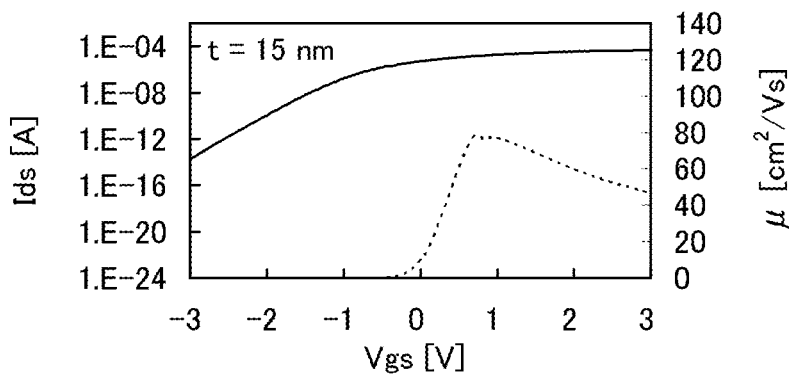
FIGS. 23A to 23C are graphs each showing gate voltage dependence of drain current and mobility obtained by calculation.
Figure 23B:
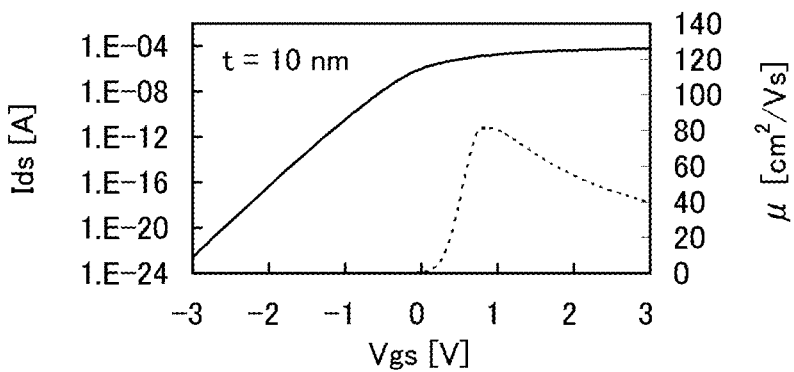
Figure 23C:
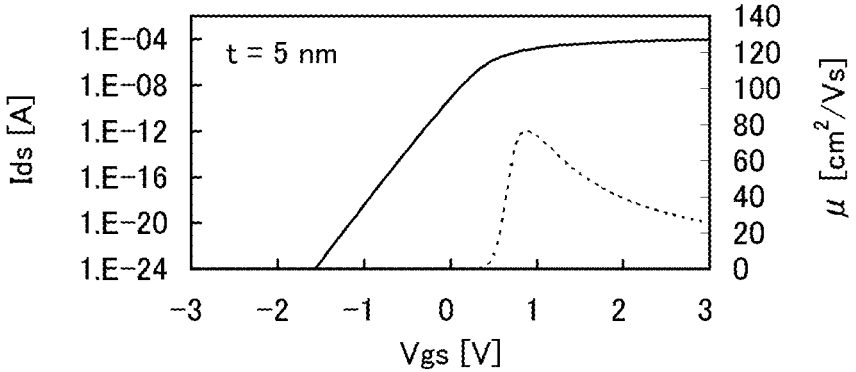

The other parameters used in calculation are as described above. For the calculation, device simulation software Sentaurus Device manufactured by Synopsys, Inc. was used. FIGS. 23A to 23C show the gate voltage ($V_{gs}$: a potential difference between the gate and the source) dependence of the drain current ($I_{ds}$, a solid line) and the mobility ($\mu$, a dotted line) of the transistor having the structure illustrated in FIG. 26A. The drain current $I_{ds}$ is obtained by calculation under the assumption that the drain voltage (a potential difference between the drain and the source) is +1 V, and the mobility $\mu$ is obtained by calculation under the assumption that the drain voltage is +0.1 V.

FIG. 23A shows the gate voltage dependence of the transistor in the case where the thickness of the gate insulating film is 15 nm, FIG. 23B shows that of the transistor in the case where the thickness of the gate insulating film is 10 nm, and FIG. 23C shows that of the transistor in the case where the thickness of the gate insulating film is 5 nm. As the gate insulating film is thinner, the drain current $I_{ds}$ in an off state (the off-state current) in particular is significantly decreased. In contrast, there is no noticeable change in peak value of the mobility $\mu$ and the drain current $I_{ds}$ in an on state (the on-state current). The graphs show that the drain current exceeds 10 μA, which is required in a memory element and the like, at a gate voltage of around 1 V.

Figure 24A:
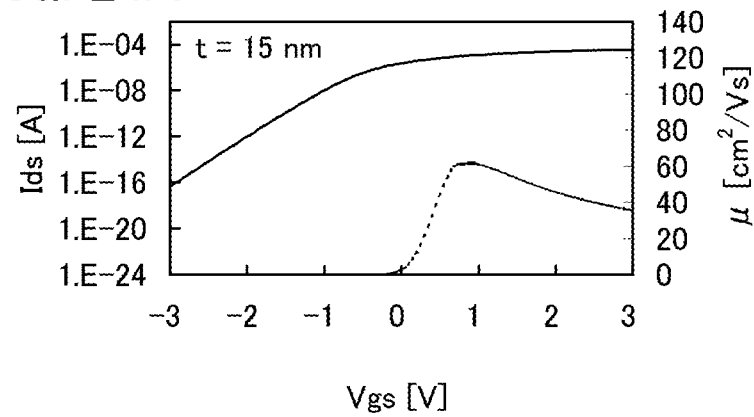
FIGS. 24A to 24C are graphs each showing gate voltage dependence of drain current and mobility obtained by calculation.
Figure 24B:
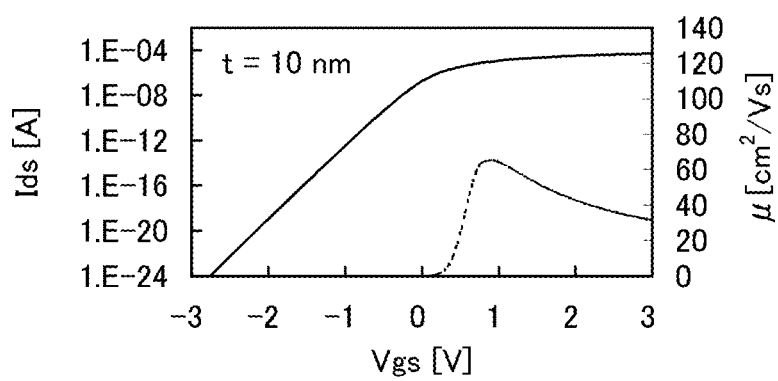
Figure 24C:
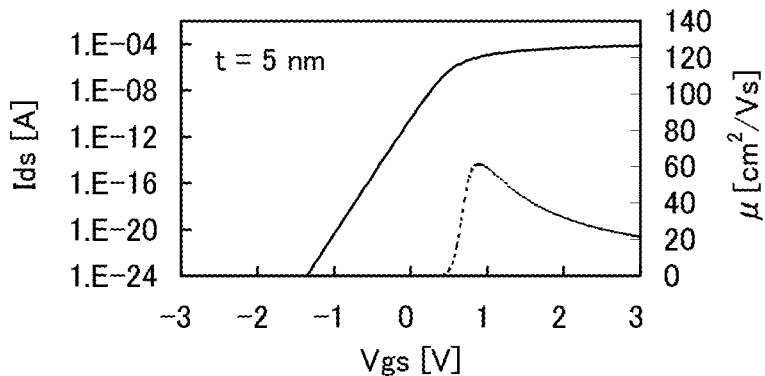

FIGS. 24A to 24C show the gate voltage $V_{gs}$ dependence of the drain current $I_{ds}$ (a solid line) and the mobility $\mu$ (a dotted line) of the transistor having the structure in FIG. 26B and an offset length Loff of 5 nm. The drain current $I_{ds}$ is obtained by calculation under the assumption that the drain voltage is +1 V, and the mobility $\mu$ is obtained by calculation under the assumption that the drain voltage is +0.1 V. FIG. 24A shows the gate voltage dependence of the transistor in the case where the thickness of the gate insulating film is 15 nm, FIG. 24B shows that of the transistor in the case where the thickness of the gate insulating film is 10 nm, and FIG. 24C shows that of the transistor in the case where the thickness of the gate insulating film is 5 nm.

Figure 25A:
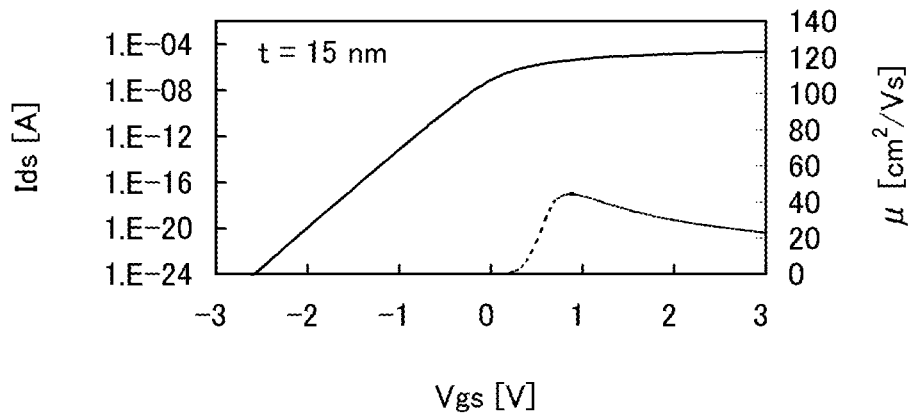
FIGS. 25A to 25C are graphs each showing gate voltage dependence of drain current and mobility obtained by calculation.
Figure 25B:
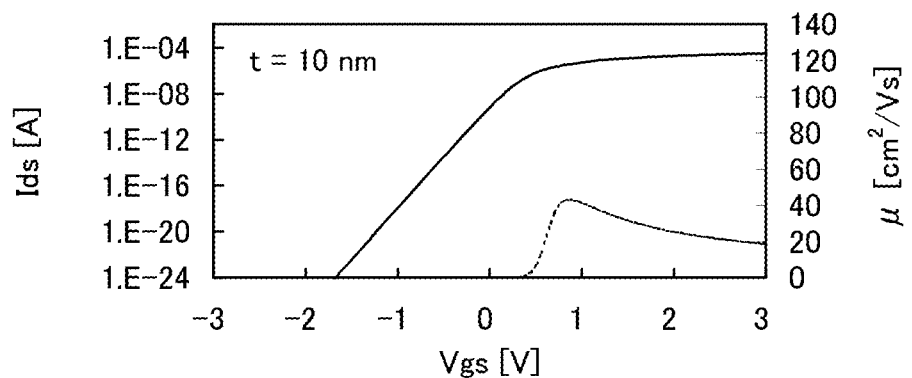
Figure 25C:
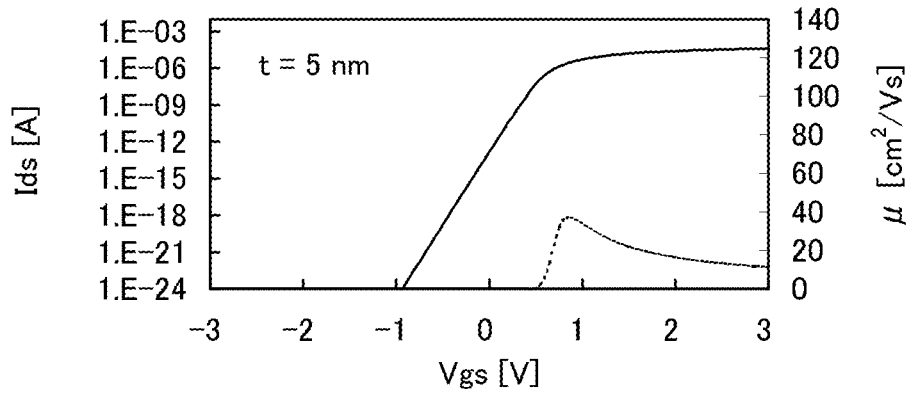

FIGS. 25A to 25C show the gate voltage dependence of the drain current $I_{ds}$ (a solid line) and the mobility $\mu$ (a dotted line) of the transistor having the structure in FIG. 26B and an offset length Loff of 15 nm. The drain current $I_{ds}$ is obtained by calculation under the assumption that the drain voltage is +1 V, and the mobility $\mu$ is obtained by calculation under the assumption that the drain voltage is +0.1 V FIG. 25A shows the gate voltage dependence of the transistor in the case where the thickness of the gate insulating film is 15 nm, FIG. 25B shows that of the transistor in the case where the thickness of the gate insulating film is 10 nm, and FIG. 25C shows that of the transistor in the case where the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 23A to 23C, approximately 60 cm$^2$/Vs in FIGS. 24A to 24C, and approximately 40 cm$^2$/Vs in FIGS. 25A to 25C; thus, the peak of the mobility $\mu$ is decreased as the offset length Loff is increased. Further, the same applies to the off-state current. The on-state current is also decreased as the offset length Loff is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

A transistor in which an oxide semiconductor containing In, Sn, and Zn as main components is used for a channel formation region can have favorable characteristics by depositing the oxide semiconductor while a substrate is heated or by performing heat treatment after the oxide semiconductor film is formed. Note that a main component refers to an element included in a composition at 5 atomic % or more.

By intentionally heating the substrate after formation of the oxide semiconductor film containing In, Sn, and Zn as main components, the mobility of the transistor can be improved. Further, the threshold voltage of the transistor can be positively shifted to make the transistor normally off.

Figure 27A:
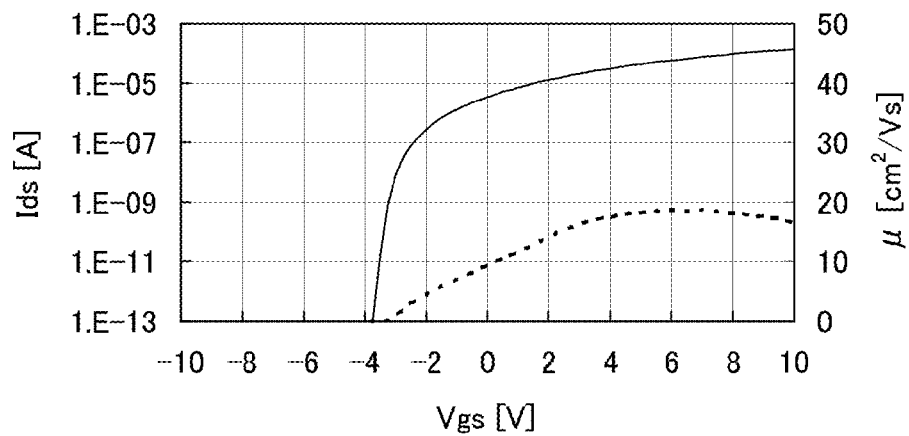
FIGS. 27A to 27C are graphs showing characteristics of transistors each including an oxide semiconductor film.
Figure 27B:
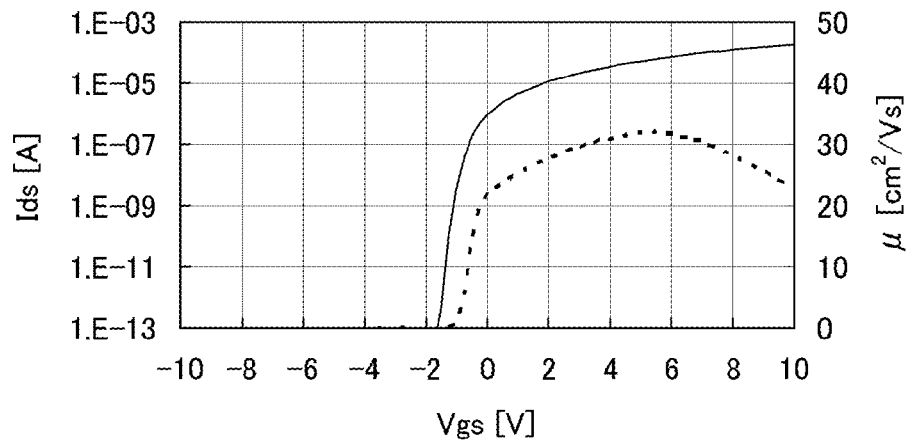
Figure 27C:
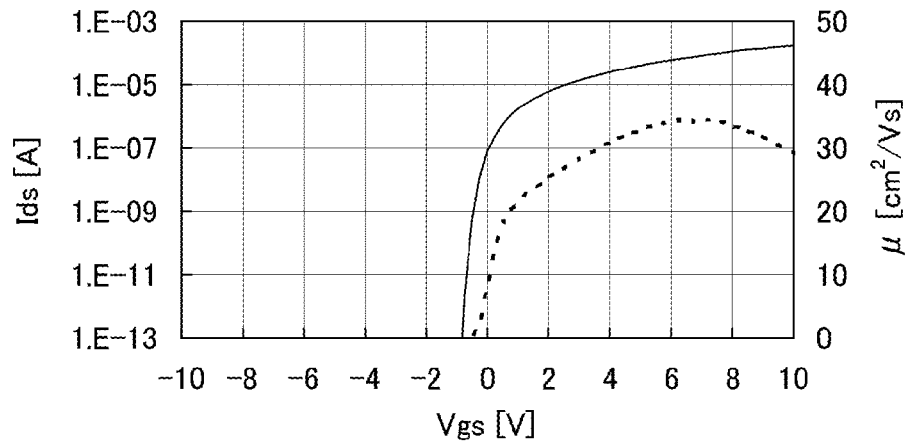

As an example, FIGS. 27A to 27C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_{ds}$ was set to 10 V.

FIG. 27A is a graph showing characteristics of a transistor whose oxide semiconductor film containing In, Sn, and Zn as main components is formed by a sputtering method without heating a substrate intentionally. The mobility of the transistor is 18.8 cm$^2$/Vs. On the other hand, when the oxide semiconductor film containing In, Sn, and Zn as main components is formed while the substrate is intentionally heated, the mobility can be improved. FIG. 27B shows characteristics of a transistor whose oxide semiconductor film containing In, Sn, and Zn as main components is formed while a substrate is heated at 200° C. The mobility of the transistor is 32.2 cm$^2$/Vs.

The mobility can be further improved by performing heat treatment after formation of the oxide semiconductor film containing In, Sn, and Zn as main components. FIG. 27C shows characteristics of a transistor whose oxide semiconductor film containing In, Sn, and Zn as main components is formed by sputtering at 200° C. and then subjected to heat treatment at 650° C. The mobility of the transistor is 34.5 cm$^2$/Vs.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the mobility can be improved. Such an improvement in mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a mobility exceeding 100 cm$^2$/Vs is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while the substrate is intentionally heated is used, the problem of the negative shift of the threshold voltage can be solved. That is, the threshold voltage is shifted so that the transistor becomes normally off; this tendency can be confirmed by comparison between FIGS. 27A and 27B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of 20 V was applied so that the intensity of an electric field applied to the gate insulating film was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of −20 V was applied so that the intensity of an electric field applied to the gate insulating film was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 28A:
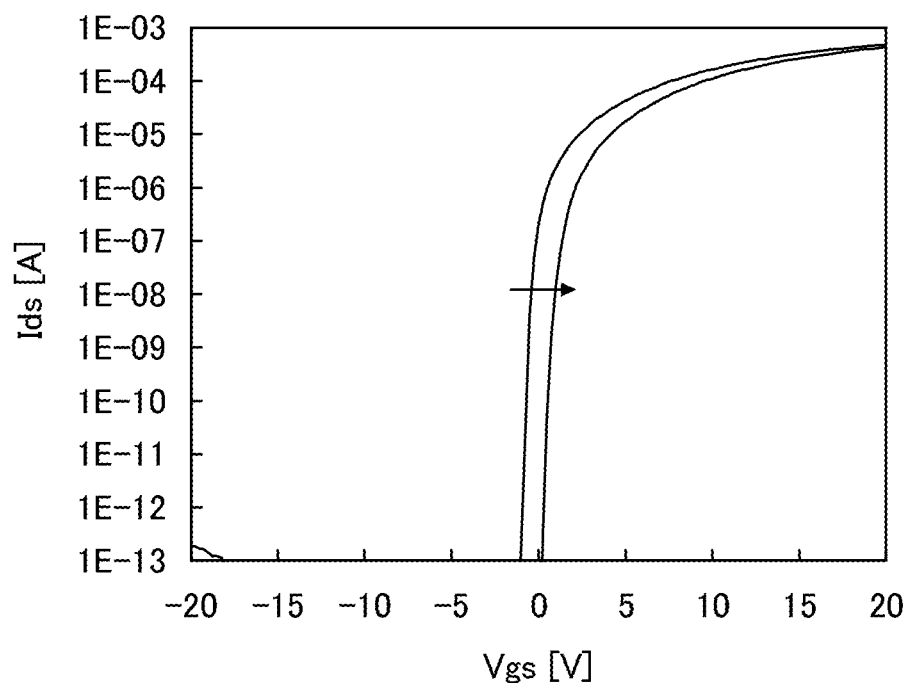
FIGS. 28A and 28B show $V_{gs}$-$I_{ds}$ characteristics after a BT test of a transistor of Sample 1.
Figure 28B:
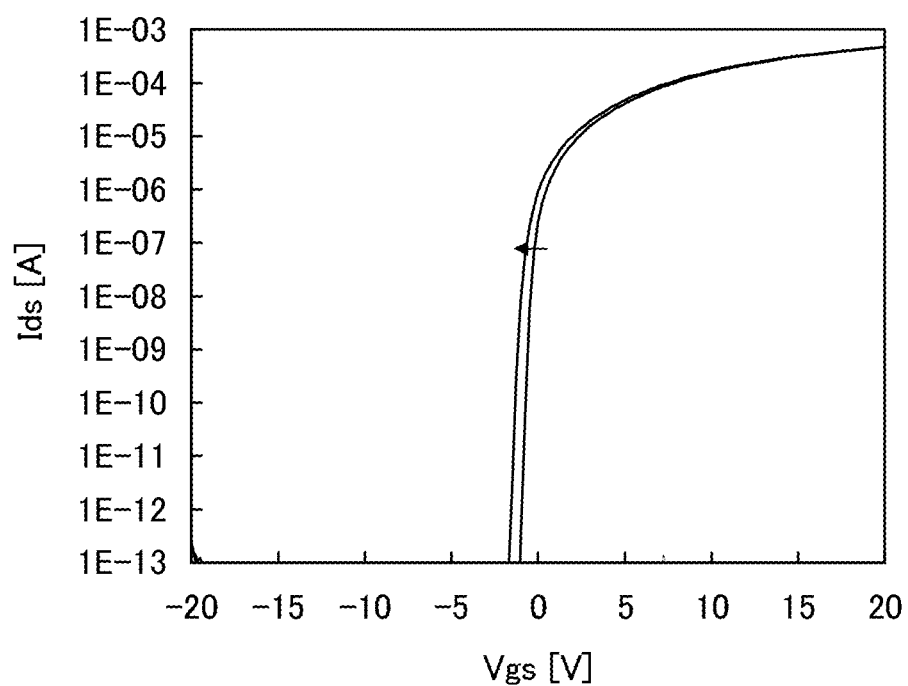
Figure 29A:
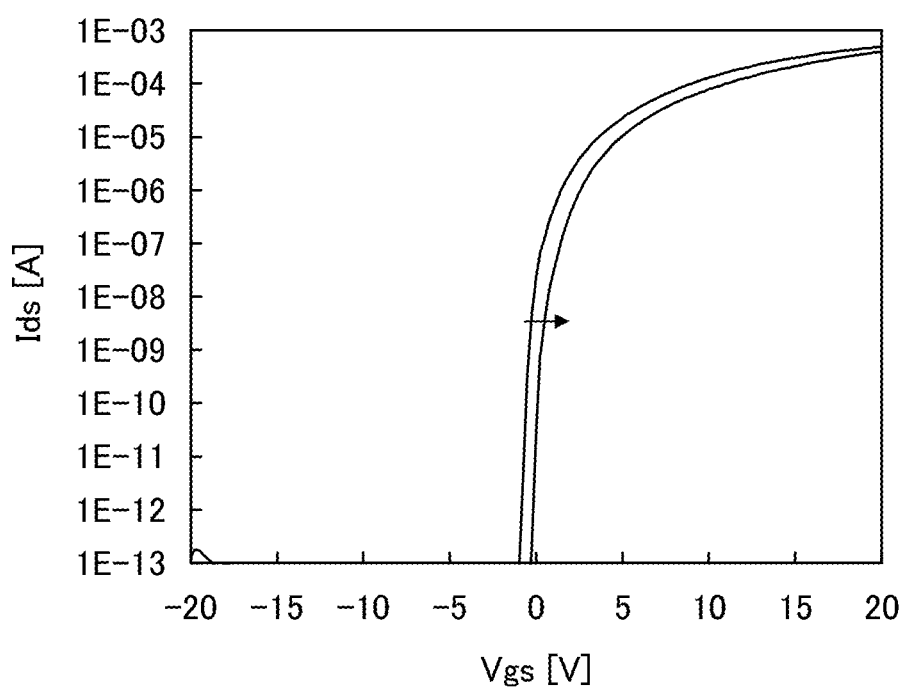
FIGS. 29A and 29B show $V_{gs}$-$I_{ds}$ characteristics after a BT test of a transistor of Sample 2.
Figure 29B:
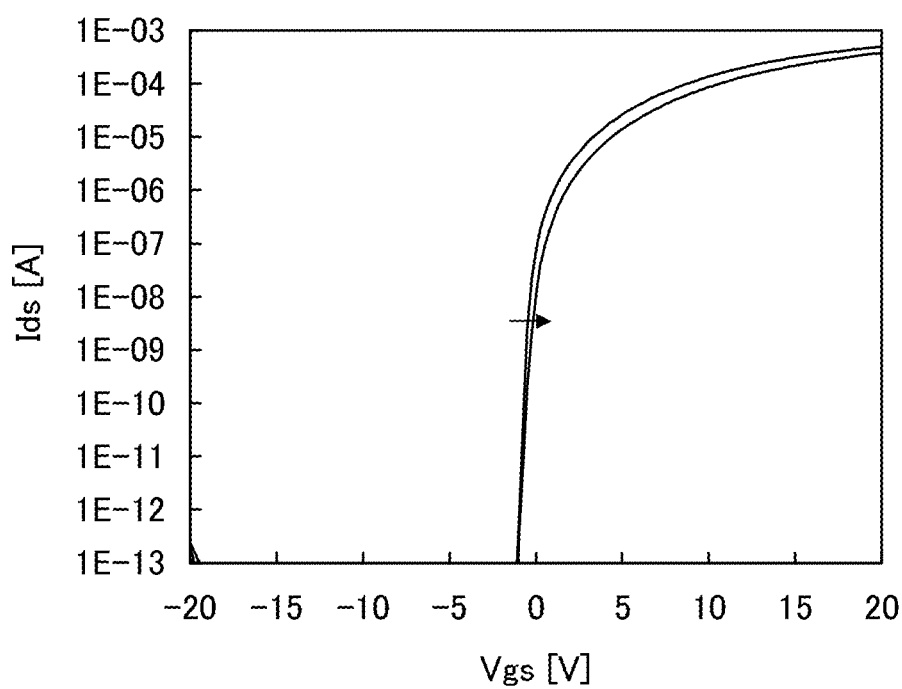

FIGS. 28A and 28B show results of the positive BT test and the negative BT test, respectively, of Sample 1. FIGS. 29A and 29B show results of the positive BT test and the negative BT test, respectively, of Sample 2.

The amount of shift in threshold voltage of Sample 1 due to the positive BT test and that due to the negative BT test were 1.80 V and −0.42 V, respectively. The amount of shift in threshold voltage of Sample 2 due to the positive BT test and that due to the negative BT test were 0.79 V and 0.76 V, respectively. It is found that, in each of Sample 1 and Sample 2, the amount of shift in threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn-based oxide semiconductor film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn-based oxide semiconductor film with a thickness of 100 nm was formed over a quartz substrate that had been subjected to dehydrogenation treatment.

The In—Sn—Zn-based oxide semiconductor film was formed with a sputtering apparatus with a power of 100 W (DC) in an oxygen atmosphere. An In—Sn—Zn-based oxide target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 30:
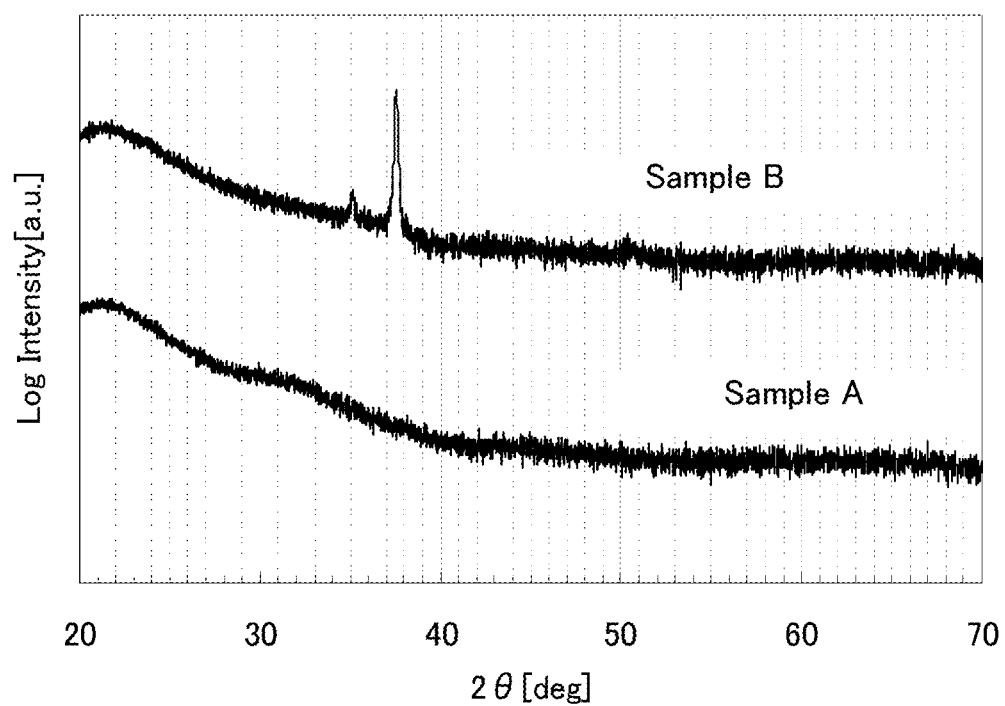
FIG. 30 shows XRD spectra of Sample A and Sample B.

FIG. 30 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or smaller. Here, the unit of the off-state current represents current per micrometer of a channel width.

Figure 31:
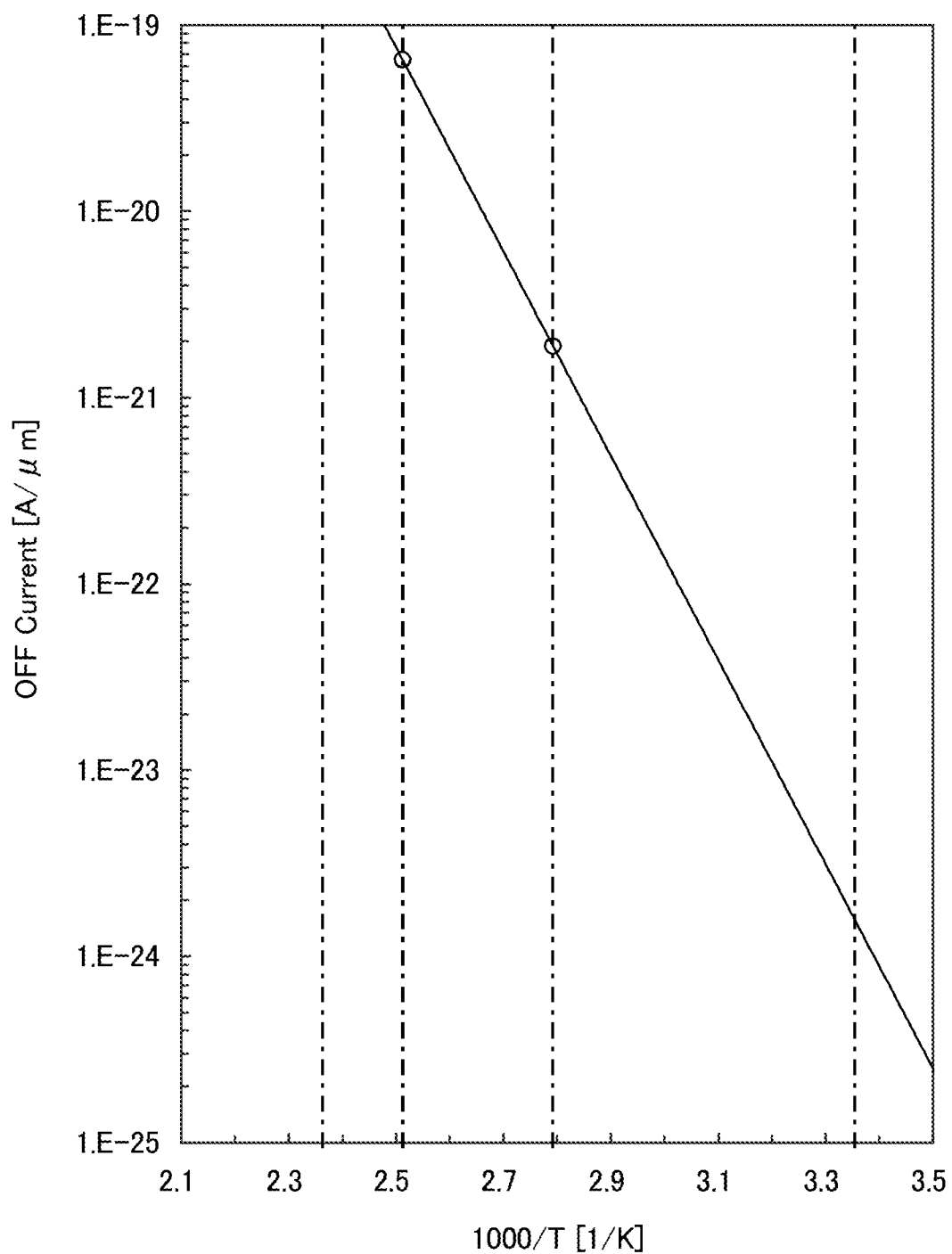
FIG. 31 is a graph showing a relation between off-state current and substrate temperature in measurement of a transistor.

FIG. 31 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 31, the off-state current can be 1 aA/μm ($1\times10^{-18}$ A/μm) or smaller, 100 zA/μm ($1\times10^{-19}$ A/μm) or smaller, and 1 zA/μm ($1\times10^{-21}$ A/μm) or smaller when the substrate temperature is 125° C., 85° C., and room temperature (27° C.), respectively. Preferably, the off-state current can be 0.1 aA/μm ($1\times10^{-19}$ A/μm) or smaller, 10 zA/μm ($1\times10^{-20}$ A/μm) or smaller, and 0.1 zA/μm ($1\times10^{-22}$ A/μm) or smaller at 125° C., 85° C., and room temperature, respectively. The above values of off-state currents are clearly much smaller than that of the transistor using Si for a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electrical characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 32:
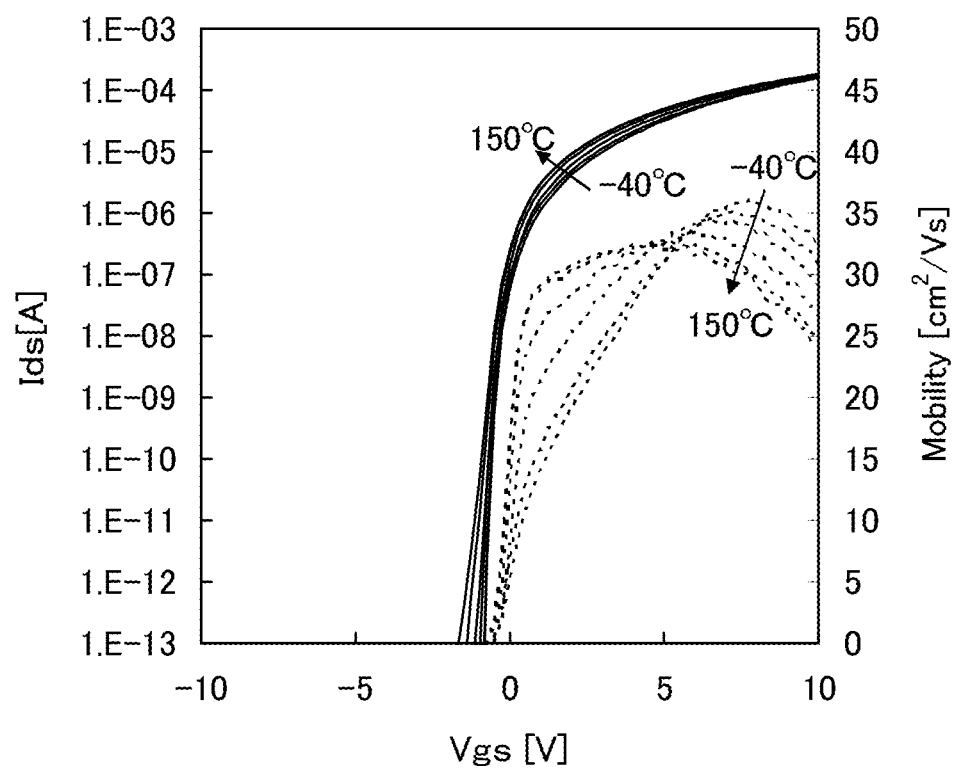
FIG. 32 is a graph showing $V_{gs}$ dependence of $I_{ds}$ and mobility.
Figure 33A:
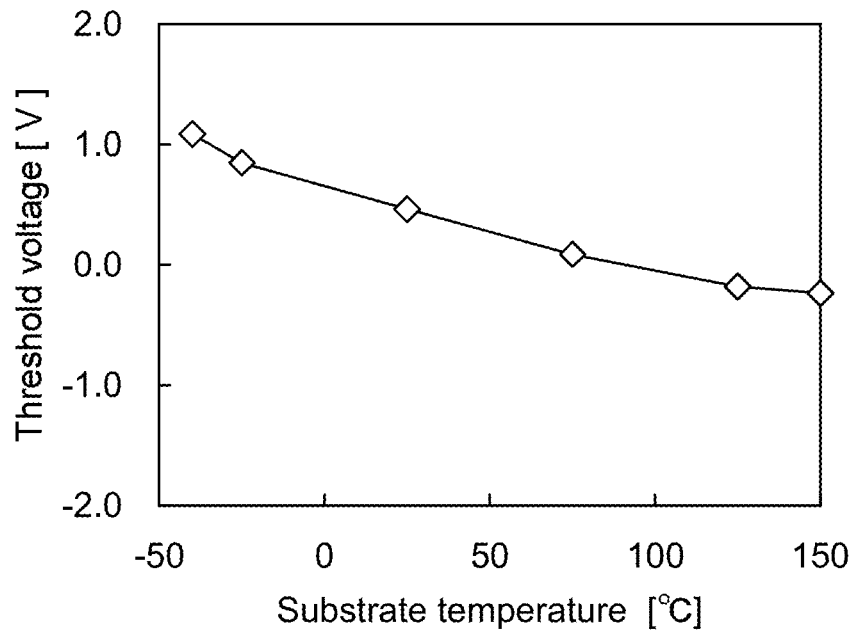
FIG. 33A is a graph showing a relation between substrate temperature and threshold voltage.

FIG. 32 shows the $V_{gs}$ dependence of $I_{ds}$ (a solid line) and mobility (a dotted line). FIG. 33A shows a relation between the substrate temperature and the threshold voltage, and FIG. 33B shows a relation between the substrate temperature and the mobility.

From FIG. 33A, it is found that the threshold voltage gets lower as the substrate temperature increases. Note that the threshold voltage is decreased from 1.09 V to −0.23 V in the range from −40° C. to 150° C.

Figure 33B:
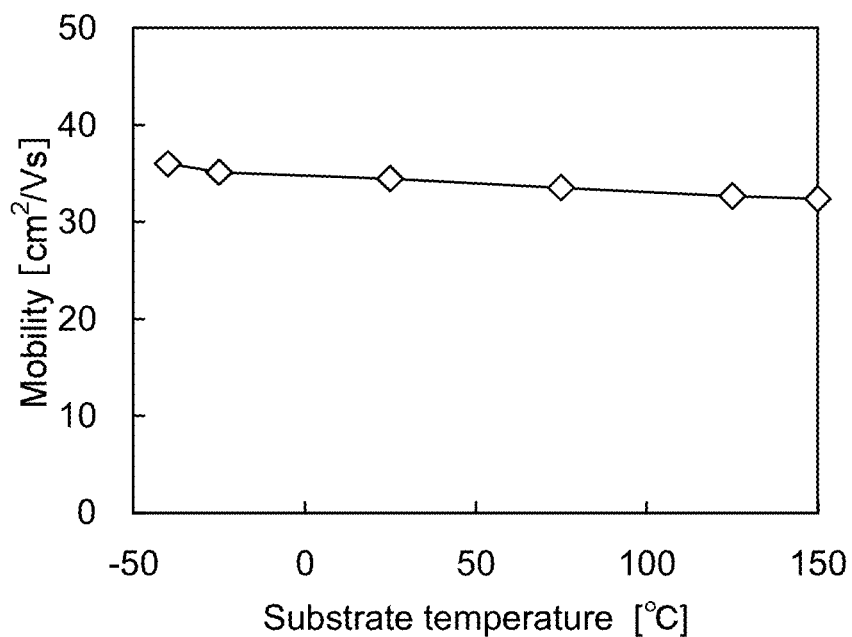
FIG. 33B is a graph showing a relation between substrate temperature and mobility.

From FIG. 33B, it is found that the mobility gets lower as the substrate temperature increases. Note that the mobility is decreased from 36 cm$^2$/Vs to 32 cm$^2$/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a mobility of 30 cm$^2$/Vs or higher, preferably 40 cm$^2$/Vs or higher, further preferably 60 cm$^2$/Vs or higher can be obtained with the off-state current maintained at 1 aA/μm or smaller, which can achieve on-state current needed for an LSI. For example, in an FET where L/W is 33 nm/40 nm, an on-state current of 12 μA or larger can flow when the gate voltage is 2.7 V and the drain voltage is 1.0 V In addition, sufficient electrical characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

Embodiment 2

In this embodiment, an example of a method for manufacturing a semiconductor device part of which has the structure illustrated in FIG. 3 will be described.

Note that a semiconductor material such as germanium, silicon germanium, or single crystal silicon carbide as well as silicon may be used for the n-channel transistor 102n and the p-channel transistor 102p included in the memory element. For example, the n-channel transistor 102n and the p-channel transistor 102p including silicon can be formed using a single crystal semiconductor substrate such as a silicon wafer, a silicon thin film which is formed by an SOI method, a silicon thin film which is formed by a vapor deposition method, or the like.

Figure 8A:
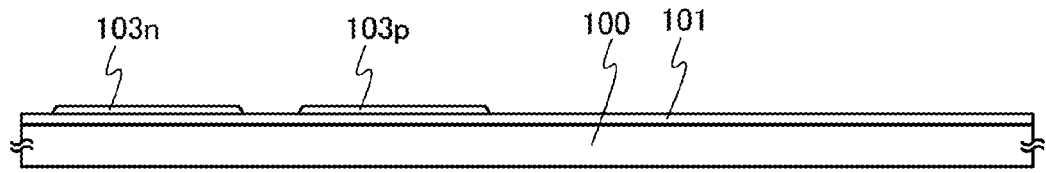
FIGS. 8A to 8E illustrate a method for manufacturing a semiconductor device.

In this embodiment, first, as illustrated in FIG. 8A, the insulating film 101 and the island-shaped single crystal semiconductor films 103n and 103p are formed over the substrate 100.

Although there is no particular limitation on a material which can be used as the substrate 100, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 100. In the case where a glass substrate is used and the temperature of the heat treatment performed later is high, a glass substrate whose strain point is higher than or equal to 730° C. is preferably used.

In this embodiment, a semiconductor substrate of single crystal silicon is used as the substrate 100. A single crystal semiconductor substrate has surface flatness higher than a glass substrate. Accordingly, variation in thickness of an insulating film, a conductive film, or the like due to surface unevenness of the substrate can be prevented; thus, electric characteristics of semiconductor elements can be uniform, even when semiconductor elements such as transistors are miniaturized.

The insulating film 101 is formed using an insulating material such as silicon oxide, silicon nitride oxide, silicon oxynitride, or silicon nitride. The insulating film 101 may be a single insulating film or a stack of plural insulating films.

For example, in the case of using silicon oxide for the insulating film 101, the insulating film 101 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 101 may be subjected to oxygen plasma treatment to increase the density. In the case of using silicon nitride for the insulating film 101, the insulating film 101 can be formed using a mixed gas of silane and ammonia by a vapor deposition method such as a plasma CVD method. Further, when the insulating film 101 is formed using silicon nitride oxide, the insulating film 101 can be formed using a mixed gas of silane and ammonia or a mixed gas of silane and nitrogen oxide by a vapor deposition method such as a plasma CVD method.

Alternatively, a silicon oxide film formed by a chemical vapor deposition method using an organosilane gas may be used as the insulating film 101. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Further alternatively, in the case where a semiconductor substrate of single crystal silicon is used as the substrate 100, the insulating film 101 can be formed using an oxide film formed by oxidizing the surface of the substrate 100. Thermal oxidation treatment for forming this oxide film may be dry oxidation and may be performed in an oxidation atmosphere to which a halogen-containing gas is added. As the gas containing a halogen, one type or plural types of gases selected from HCl, HF, $NF_3$, HBr, Cl, ClF, $BCl_3$, F, $Br_2$, and the like can be used.

For example, in the case where HCl is used, heat treatment is performed at a temperature of 700° C. or higher in an atmosphere containing HCl at 0.5 volume % to 10 volume % (preferably 3 volume %) with respect to oxygen. Thermal oxidation is preferably performed at a heating temperature of greater than or equal to 950° C. and less than or equal to 1100° C. Treatment time may be 0.1 hours to 6 hours, preferably 0.5 hours to 1 hour. The thickness of the insulating film 101 to be formed can be set in the range of 15 nm to 1100 nm (preferably 60 nm to 300 nm), for example 150 nm.

By this thermal oxidation treatment in an atmosphere containing a halogen, the insulating film 101 can contain a halogen. When the insulating film 101 contains a halogen element at a concentration of $1\times10^{17}$ atoms/cm$^3$ to $5\times10^{20}$ atoms/cm$^3$, the insulating film 101 captures an impurity such as metal; therefore, the contamination of the semiconductor films 103n and 103p to be formed later can be prevented. For example, by the action of chlorine, an impurity such as metal turns into a volatile chloride and is released into an air phase, thereby being removed from the semiconductor films 103n and 103p.

In this embodiment, an example in which the semiconductor films 103n and 103p are formed using single crystal silicon is given as a method for forming the transistor included in the memory element. Here, a specific example of a method for forming the single crystal semiconductor films 103n and 103p is briefly described. First, an ion beam including ions which are accelerated by an electric field enters a bond substrate which is the semiconductor substrate of single crystal silicon and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 100 which is provided with the insulating film over the surface are attached to each other so that the insulating film is sandwiched therebetween. After the bond substrate and the substrate 100 overlap with each other, a pressure of approximately 1 N/cm$^2$ to 500 N/cm$^2$, preferably 11 N/cm$^2$ to 20 N/cm$^2$ is applied to part of the bond substrate and part of the substrate 100 so that the substrates are attached to each other. When the pressure is applied, bonding between the bond substrate and the insulating film 101 starts from the parts, which results in bonding of the entire surface where the bond substrate and the insulating film 101 are in close contact with each other. After that, heat treatment is performed, so that microvoids that exist in the fragile layer are combined and the microvoids increase in volume. Accordingly, a single crystal semiconductor film which is part of the bond substrate is separated from the bond substrate along the fragile layer. The heat treatment is performed at a temperature not exceeding the strain point of the substrate 100. Then, the single crystal semiconductor film is processed into a desired shape by etching or the like, so that the semiconductor films 103n and 103p can be formed.

In this embodiment, the substrate 100 which is a semiconductor substrate of single crystal silicon is subjected to heat treatment at 950° C. in an oxygen atmosphere, whereby a silicon oxide film having a thickness of 400 nm is formed on the substrate 100. Next, over the silicon oxide film, a silicon nitride oxide film having a thickness of 50 nm is formed by a plasma CVD method. On the other hand, the bond substrate which is a semiconductor substrate of single crystal silicon is subjected to heat treatment at 950° C. in an atmosphere in which HCl is included in oxygen, whereby a silicon oxide film having a thickness of 100 nm is formed on the bond substrate. Then, the substrate 100 and the bond substrate are attached to each other so that the silicon nitride oxide film over the substrate 100 is in contact with the silicon oxide film on the bond substrate. Then, a single crystal semiconductor film which is part of the bond substrate is separated from the bond substrate along a fragile layer. Accordingly, in this embodiment, the insulating film 101 has a structure in which the silicon oxide film having a thickness of 400 nm, the silicon nitride oxide film having a thickness of 50 nm, and a silicon oxide film having a thickness of 100 nm are stacked in this order from the substrate 100 side.

In order to control the threshold voltage, an impurity element imparting p-type conductivity, such as boron, aluminum, or gallium, or an impurity element imparting n-type conductivity, such as phosphorus or arsenic, may be added to each of the semiconductor films 103n and 103p. An impurity element for controlling the threshold voltage may be added to the semiconductor film which has not been patterned or may be added to the patterned semiconductor films 103n and 103p. Further, the impurity element for controlling the threshold voltage may be added to the bond substrate. Furthermore, the impurity element may be added to the bond substrate in order to roughly control the threshold voltage, and then the impurity element may be further added to the semiconductor film which has not been patterned or the patterned semiconductor films 103n and 103p in order to finely control the threshold voltage.

Although an example in which a single crystal semiconductor film is used is described in this embodiment, the present invention is not limited to this structure. For example, a polycrystalline semiconductor film which is formed over the insulating film 101 by a vapor deposition method may be used. Alternatively, a semiconductor film formed by a vapor deposition method may be crystallized by a known technique to form a polycrystalline semiconductor film. As the known technique of crystallization, a laser crystallization method using a laser beam and a crystallization method using a catalytic element are given. Alternatively, a crystallization method using a catalytic element and a laser crystallization method can be combined. When a heat-resistant substrate such as a quartz substrate is used, it is possible to use a thermal crystallization method using an electrically heated oven, a lamp annealing crystallization method using infrared light, a crystallization method using a catalytic element, or a crystallization method using a high-temperature annealing method at approximately 950° C.

Figure 8B:
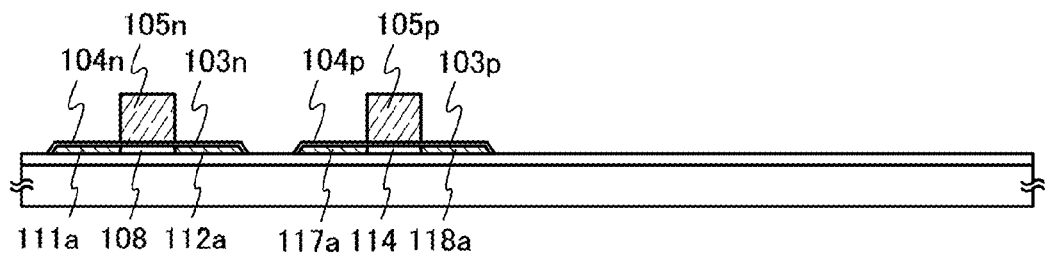

Next, as illustrated in FIG. 8B, the gate insulating film 104n and the gate insulating film 104p are formed over the semiconductor film 103n and the semiconductor film 103p, respectively. Then, the gate electrode 105n is formed over the gate insulating film 104n in a position overlapping with the semiconductor film 103n, and the gate electrode 105p is formed over the gate insulating film 104p in a position overlapping with the semiconductor film 103p. Then, an impurity element imparting one conductivity type is added to each of the semiconductor films 103n and 103p with the use of the gate electrodes 105n and 105p as masks. Specifically, after a mask is formed to cover the semiconductor film 103n, an impurity element imparting p-type conductivity is added to the semiconductor film 103p. Through addition of the impurity element, the first region 114 overlapping with the gate electrode 105p and low-concentration impurity regions 117a and 118a between which the first region 114 is sandwiched are formed in the semiconductor film 103p. Next, after a mask is formed to cover the semiconductor film 103p, an impurity element imparting n-type conductivity is added to the semiconductor film 103n. Through addition of the impurity element, the first region 108 overlapping with the gate electrode 105n and low-concentration impurity regions 111a and 112a between which the first region 108 is sandwiched are formed in the semiconductor film 103n.

The gate insulating films 104n and 104p can be formed by oxidation or nitridation of surfaces of the semiconductor films 103n and 103p by high-density plasma treatment, thermal oxidation treatment, or the like. The thickness of each of the gate insulating films 104n and 104p can be, for example, greater than or equal to 1 nm and less than or equal to 100 nm, preferably greater than or equal to 10 nm and less than or equal to 50 nm.

In this embodiment, heat treatment at 950° C. in an oxygen atmosphere for 25 minutes is performed and then heat treatment at 950° C. in a nitrogen atmosphere for one hour is performed. In this manner, the surfaces of the semiconductor films 103n and 103p are thermally oxidized, whereby the gate insulating films 104n and 104p which are silicon oxide films each having a thickness of 15 nm are formed.

In the case of the high-density plasma treatment, for example, a mixed gas of a rare gas such as He, Ar, Kr, or Xe and oxygen, nitrogen oxide, ammonia, nitrogen, or the like is used. In this case, by exciting plasma by introduction of microwaves, plasma with a low electron temperature and high density can be generated. By oxidation or nitridation of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, the surfaces of the semiconductor films 103n and 103p are oxidized or nitrided using nitrous oxide ($N_2O$) diluted with Ar by 1 time to 3 times (flow ratio) by application of a microwave (2.45 GHz) power of 3 kW to 5 kW at a pressure of 10 Pa to 30 Pa. By this treatment, insulating films each having a thickness of 1 nm to 10 nm (preferably 2 nm to 6 nm) are formed. Further, nitrous oxide ($N_2O$) and silane ($SiH_4$) are introduced, and a microwave (2.45 GHz) power of 3 kW to 5 kW is applied at a pressure of 10 Pa to 30 Pa to form a silicon oxynitride film by a vapor deposition method, whereby the gate insulating films are formed. With a combination of a solid-phase reaction and a reaction by a vapor deposition method, the gate insulating films with low interface state density and excellent withstand voltage can be formed.

The oxidation or nitridation of the semiconductor films by the high-density plasma treatment proceeds by solid-phase reaction. Thus, interface state density between the gate insulating film 104n and the semiconductor film 103n and interface state density between the gate insulating film 104p and the semiconductor film 103p can be extremely low. Further, by direct oxidation or nitridation of the semiconductor films 103n and 103p by high-density plasma treatment, variation in the thickness of the insulating films to be formed can be suppressed. Moreover, in the case where the semiconductor films have crystallinity, the surfaces of the semiconductor films are oxidized with solid reaction by the high-density plasma treatment to restrain fast oxidation only in a crystal grain boundary; therefore, the gate insulating films with uniformity and low interface state density can be formed. A transistor in which the insulating film formed by the high-density plasma treatment is used as part of the gate insulating film or as the whole gate insulating film can have less variation in electric characteristics.

Each of the gate insulating films may be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

In this specification, an oxynitride refers to a material containing a larger amount of oxygen than that of nitrogen, and a nitride oxide refers to a material containing a larger amount of nitrogen than that of oxygen.

A conductive film is formed so as to cover the gate insulating films 104n and 104p and then is processed (patterned) into a predetermined shape, so that the gate electrodes 105n and 105p can be formed. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. Alternatively, an alloy containing any of the aforementioned metals as its main component or a compound containing any of the aforementioned metals may be used. Further alternatively, the conductive film may be formed using a semiconductor such as polycrystalline silicon which is formed by addition of an impurity element such as phosphorus, to a semiconductor film.

Note that each of the gate electrodes 105n and 105p may be formed using a single-layer conductive film or a stack of a plurality of conductive films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment aimed at thermal activation can be performed in subsequent steps after forming the two conductive films. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of using a three-layer structure in which three conductive films are stacked, a stacked structure of a molybdenum film, an aluminum film, and a molybdenum film is preferable.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can be used as each of the gate electrodes 105n and 105p.

In this embodiment, the gate electrodes 105n and 105p each in which tungsten with a thickness of approximately 170 nm is stacked over tantalum nitride with a thickness of approximately 30 nm are used.

Alternatively, the gate electrodes 105n and 105p may be selectively formed by a droplet discharge method without using a mask. A droplet discharge method is a method for forming a predetermined pattern by discharge or ejection of a droplet containing a predetermined composition from an orifice, and includes an inkjet method and the like in its category.

In addition, the gate electrodes 105n and 105p can be formed in the following manner; a conductive film is formed, and then the conductive film is etched into desired a tapered shape by an inductively coupled plasma (ICP) etching method with appropriate control of the etching conditions (e.g., the amount of electric power applied to a coiled electrode, the amount of electric power applied to an electrode on the substrate side, and the electrode temperature on the substrate side). In addition, angles and the like of the tapered shapes may also be controlled by a shape of a mask. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 8C:
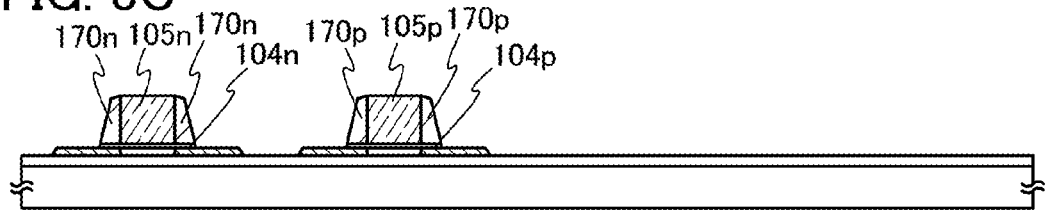

Next, after an insulating film is formed to cover the gate insulating films 104n and 104p and the gate electrodes 105n and 105p, the insulating film is processed by etching or the like; thus, as illustrated in FIG. 8C, a sidewall 170n is formed on side portions of the gate electrode 105n and a sidewall 170p is formed on side portions of the gate electrode 105p. In this embodiment, after the insulating film in which a silicon oxynitride film having a thickness of 100 nm and a silicon oxide film having a thickness of 200 nm are stacked in this order is formed to cover the gate electrodes 105n and 105p, the insulating film is processed by dry etching, so that the sidewall 170n and the sidewall 170p are formed.

Note that through the above etching, a portion of the gate insulating film 104n which is not covered with the sidewall 170n or the gate electrode 105n is removed, and a portion of the gate insulating film 104p which is not covered with the sidewall 170p or the gate electrode 105p is removed.

Figure 8D:
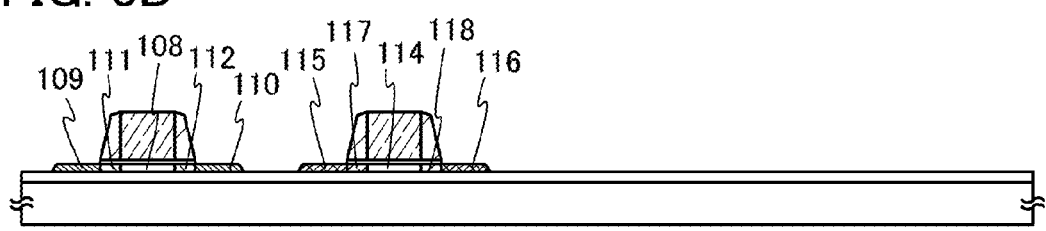

Next, as illustrated in FIG. 8D, an impurity element imparting one conductivity type is added to each of the semiconductor films 103n and 103p with the use of the gate electrodes 105n and 105p and the sidewalls 170n and 170p as masks. Specifically, after a mask is formed to cover the semiconductor film 103n, an impurity element imparting p-type conductivity is added to the semiconductor film 103p. Through addition of the impurity element, the impurity is further added to part of the low-concentration impurity regions 117a and 118a, whereby the first region 114 overlapping with the gate electrode 105p, the third regions 117 and 118 which overlap with the sidewall 170p and between which the first region 114 is sandwiched, and the second regions 115 and 116 between which the first region 114 and the third regions 117 and 118 are sandwiched are formed in the semiconductor film 103p. Next, after a mask is formed to cover the semiconductor film 103p, an impurity element imparting n-type conductivity is added to the semiconductor film 103n. Through addition of the impurity element, the impurity is further added to part of the low-concentration impurity regions 111a and 112a, whereby the first region 108 overlapping with the gate electrode 105n, the third regions 111 and 112 which overlap with the sidewall 170n and between which the first region 108 is sandwiched, and the second regions 109 and 110 between which the first region 108 and the third regions 111 and 112 are sandwiched are formed in the semiconductor film 103n.

Since the third regions 117 and 118 overlap with the sidewall 170p, the third regions 117 and 118 have the concentration of the impurity imparting p-type conductivity lower than the second regions 115 and 116. Further, since the third regions 111 and 112 overlap with the sidewall 170n, the third regions 111 and 112 have the concentration of the impurity imparting n-type conductivity lower than the second regions 109 and 110.

Note that in this embodiment, the low-concentration impurity regions 111a and 112a and the low-concentration impurity regions 117a and 118a are formed through the first addition of the impurities, and then the third regions 111 and 112 and the third regions 117 and 118 serving as LDD regions are formed through the second addition of the impurities; however, an embodiment of the present invention is not limited to this structure. For example, it is possible to form the third regions 111 and 112 and the third regions 117 and 118 serving as LDD regions without performing the first addition of the impurities, when the second addition of the impurities is performed under such a condition that the impurities enter portions under the sidewall 170n and the sidewall 170p. Alternatively, offset regions may be provided between the first region 108 and the second regions 109 and 110 or between the first region 114 and the second regions 115 and 116 in such a manner that, without performing the first addition of the impurities, the second addition of the impurities is performed under a condition that the impurities are less likely to enter portions under the sidewall 170n and the sidewall 170p. The impurity concentration in the offset regions is preferably substantially equal to that in the first region 108 or the first region 114.

Figure 8E:
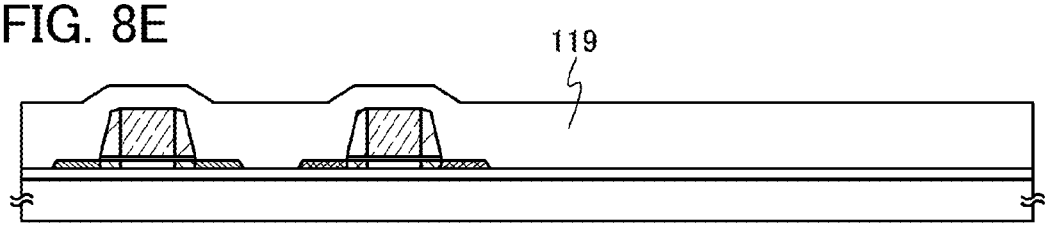

Next, as illustrated in FIG. 8E, the insulating film 119 is formed to cover the semiconductor films 103n and 103p, the gate electrodes 105n and 105p, the sidewalls 170p and 170n, and the insulating film 101.

Specifically, the insulating layer 119 can be an inorganic insulating film of silicon oxide, silicon nitride, silicon nitride oxide, silicon oxynitride, aluminum nitride, aluminum nitride oxide, or the like. In particular, a low dielectric constant (low-k) material is preferably used for the insulating film 119 because capacitance caused by an overlap of electrodes or wirings can be sufficiently reduced. Note that a porous insulating film containing any of the above materials may be used as the insulating film 119. Since the porous insulating film has lower dielectric constant than a dense insulating film, parasitic capacitance due to electrodes or wirings can be further reduced.

For the insulating film 119, a silicon oxide film formed by chemical vapor deposition using organosilane can be used. For organosilane, tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), or the like can be used. It is needless to say that silicon oxide, silicon oxynitride, silicon nitride, silicon nitride oxide, or the like may be formed using inorganic silane such as monosilane, disilane, or trisilane.

In this embodiment, a silicon oxynitride film having a thickness of 500 nm is used as the insulating film 119. Note that the case where the insulating film 119 is formed using a single insulating film is described as an example in this embodiment; however, the insulating film 119 may be formed using a stack of plural insulating films.

Figure 9A:
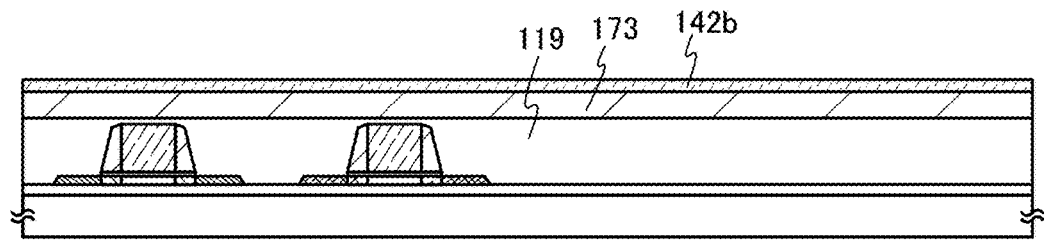
FIGS. 9A to 9D illustrate a method for manufacturing a semiconductor device.

Next, after a surface of the insulating film 119 is subjected to planarization treatment, an insulating film 173 and an oxide semiconductor film 142b are stacked in this order over the insulating film 119 as illustrated in FIG. 9A.

In order to suppress variation of electric characteristics of the transistor 121 to be formed later, a surface of the oxide semiconductor film 142b preferably has high flatness. In order to increase the flatness of the oxide semiconductor film 142b, high flatness of a surface of the insulating film 173 is preferably ensured. However, in order to prevent an impurity such as hydrogen from entering the vicinity of the interface between the insulating film 173 and the oxide semiconductor film 142b, it is preferable to form the oxide semiconductor film 142b successively after formation of the insulating film 173 without exposure of the insulating film 173 to the air. Therefore, when the surface of the insulating film 119 positioned under the insulating film 173 is subjected to planarization treatment as in this embodiment, flatness of the surface of the insulating film 173 can be ensured even when the surface of the insulating film 173 is not subjected to planarization treatment. In addition, the successive formation of the insulating film 173 and the oxide semiconductor film 142b can be achieved while the flatness of the surface of the insulating film 173 is ensured.

The planarization treatment of the insulating film 119 can be performed by polishing treatment such as a chemical mechanical polishing (CMP) method or a liquid jet polishing method, etching treatment such as dry etching or wet etching, or a combination of polishing treatment and etching treatment.

In this embodiment, the case where the insulating film 119 is subjected to CMP treatment as the planarization treatment is described. For example, the insulating film 119 is subjected to planarization treatment under the following conditions: a polyurethane polishing cloth is used; silica slurry (a grain size of 60 nm) is used as slurry; the slurry flow rate is greater than or equal to 100 ml/min and less than or equal to 500 ml/min; the polishing pressure is higher than or equal to 0.005 MPa and lower than or equal to 0.08 MPa; the spindle rotation speed is greater than or equal to 20 rpm and less than or equal to 50 rpm; and the table rotation speed is greater than or equal to 20 rpm and less than or equal to 50 rpm.

In this embodiment, the thickness of the insulating film 119 which has been subjected to polishing by the CMP method is 300 nm.

The insulating film 173 is formed by a sputtering method, a CVD method, or the like. The insulating film 173 is preferably an insulating film from which oxygen is released by application of heat. An insulating film which contains oxygen at a proportion exceeding the stoichiometric proportion is preferably used as the insulating film from which oxygen is released by application of heat. When the insulating film from which oxygen is released by application of heat is subjected to heat treatment, oxygen can be released and the released oxygen can be diffused into (or supplied to) an oxide semiconductor film to be formed later. Examples of the insulating film 173 include films of silicon oxide, silicon oxynitride, silicon nitride oxide, gallium oxide, hafnium oxide, yttrium oxide, and the like. The insulating film 173 formed by a sputtering method can easily release oxygen by application of heat, which is preferable. The insulating film 173 may be formed using a single insulating film or a plurality of stacked insulating films.

The thickness of the insulating film 173 is greater than or equal to 50 nm and less than or equal to 800 nm, preferably greater than or equal to 200 nm and less than or equal to 500 nm. With the use of the thick insulating film 173, the amount of oxygen released from the insulating film 173 can be increased, and the interface state density at the interface between the insulating film 173 and the oxide semiconductor film 142b to be formed later can be reduced.

In this embodiment, a silicon oxide film having a thickness of 200 nm, which is formed by a sputtering method, is used as the insulating film 173. In the case of forming the insulating film 173 by a sputtering method, an oxygen gas, a mixed gas of oxygen and a rare gas, or the like can be used as a deposition gas. Further, when the amount of oxygen in the deposition gas is increased, the amount of oxygen contained in the insulating film 173 can be increased, which is preferable. Typically, the oxygen concentration in the deposition gas is preferably higher than or equal to 6% and lower than or equal to 100%.

In the case where a silicon oxide film is formed as the insulating film 173, an RF sputtering method is preferably used under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the target and the substrate (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of $O_2/(O_2+Ar)$ in the deposition gas is higher than or equal to 1% and lower than or equal to 100% (preferably higher than or equal to 6% and lower than or equal to 100%). Note that a silicon target may be used as the target instead of the quartz (preferably synthetic quartz) target. In addition, oxygen alone may be used as the deposition gas.

The thickness of the oxide semiconductor film 142b is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust on a surface of the insulating film 173 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film, the materials described above can be used. In this embodiment, an In—Ga—Zn-based oxide semiconductor thin film with a thickness of 20 nm, which is obtained by a sputtering method using a target including indium (In), gallium (Ga), and zinc (Zn), is used as the oxide semiconductor film. As the target, a target having a composition ratio of, for example, $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling rate of the target including In, Ga, and Zn is 90% or higher and 100% or lower, and preferably 95% or higher and lower than 100%. With the use of the target with high filling rate, a dense oxide semiconductor film is formed.

In the case where an In—Zn-based oxide semiconductor material is used as an oxide semiconductor, a target therefor has a composition ratio of In:Zn=50:1 to 1:2 in an atomic ratio ($In_2O_3:ZnO=25:1$ to 1:4 in a molar ratio), preferably, In:Zn=20:1 to 1:1 in an atomic ratio ($In_2O_3:ZnO=10:1$ to 1:2 in a molar ratio), further preferably, In:Zn=1.5:1 to 15:1 in an atomic ratio ($In_2O_3:ZnO=3:4$ to 15:2 in a molar ratio). r example, in a target used for formation of an In—Zn-based oxide semiconductor which has an atomic ratio of In:Zn:O=X:Y:Z, the relation of Z>1.5X+Y is satisfied. The mobility can be improved by keeping the ratio of Zn within the above range.

In the case where a material of an In—Sn—Zn-based oxide semiconductor is used as the oxide semiconductor, a composition ratio of the target to be used is preferably In:Sn:Zn=1:2:2, 2:1:3, 1:1:1, or 4:9:7 in an atomic ratio.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the above-described target is used. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. Moreover, damage due to sputtering is reduced. In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

An example of the film formation conditions is as follows: the distance between the substrate and the target is 100 mm, the pressure is 0.4 Pa, the power of the direct-current (DC) power supply is 0.5 kW, and the atmosphere contains argon and oxygen (the flow rate of argon is 30 sccm and the flow rate of oxygen is 15 sccm). Note that a pulsed direct-current (DC) power supply is preferable because dust generated in deposition can be reduced and the film thickness can be made uniform.

When the leakage rate of the treatment chamber of the sputtering apparatus is set at $1 \times 10^{-10}$ Pa·m$^3$/s or less, entry of impurities such as an alkali metal or hydride into the oxide semiconductor film that is being deposited by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like entering the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that as pretreatment for deposition, an impurity such as moisture or hydrogen that is adsorbed on the insulating films and the conductive films formed over the substrate 100 be eliminated and exhausted by preheating of the substrate 100 over which the layer up to the insulating film 173 are formed in a preheating chamber of a sputtering apparatus. The temperature for the preheating is higher than or equal to 100° C. and lower than or equal to 400° C., preferably higher than or equal to 150° C. and lower than or equal to 300° C. As an evacuation unit, a cryopump is preferably provided in the preheating chamber. Note that this preheating treatment can be omitted. This preheating may also be performed in a similar manner before formation of an insulating film 143a to be performed later.

Note that the oxide semiconductor film deposited by a sputtering method or the like contains a large amount of moisture or hydrogen (including a hydroxyl group) as an impurity in some cases. Moisture or hydrogen easily forms a donor level and thus is an impurity in the oxide semiconductor. According to an embodiment of the present invention, in order to reduce an impurity such as moisture or hydrogen in the oxide semiconductor film 142b (dehydrate or dehydrogenate the oxide semiconductor film 142b), the oxide semiconductor film 142b is subjected to heat treatment in a reduced-pressure atmosphere, atmosphere of an inert gas such as nitrogen or a rare gas, an oxygen gas atmosphere, or an ultra dry air atmosphere (the air whose moisture amount is 20 ppm (−55° C. by conversion into a dew point) or less, preferably 1 ppm or less, more preferably 10 ppb or less, in the case where measurement is performed with a dew point meter of a cavity ring down laser spectroscopy (CRDS) method).

Moisture or hydrogen in the oxide semiconductor film 142b can be eliminated when the oxide semiconductor film 142b is subjected to heat treatment. Specifically, heat treatment is performed at temperature higher than or equal to 250° C. and lower than or equal to 750° C., preferably higher than or equal to 400° C. and lower than the strain point of the substrate. For example, heat treatment may be performed at 500° C. for approximately longer than or equal to three minutes and shorter than or equal to six minutes. When an RTA method is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6N (99.9999%), more preferably greater than or equal to 7N (99.99999%) (i.e., the impurity concentration is preferably less than or equal to 1 ppm, more preferably less than or equal to 0.1 ppm).

Note that it has been pointed out that an oxide semiconductor is insensitive to impurities, there is no problem when a considerable amount of metal impurities is contained in the film, and soda-lime glass which contains a large amount of alkali metal such as sodium and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes Na$^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of electric characteristics of the transistor, such as a normally-on state of the transistor due to shift of a threshold voltage in the negative direction, or reduction in mobility, occurs. In addition, variation in electric characteristics also occurs. Such deterioration of electric characteristics of the transistor and variation in electric characteristics due to the impurity remarkably appear when the hydrogen concentration in the oxide semiconductor film is very low. Therefore, when the hydrogen concentration in the oxide semiconductor film is less than or equal to $1 \times 10^{18}$/cm$^3$, preferably less than or equal to $1 \times 10^{17}$/cm$^3$, the concentration of the above impurity is preferably reduced. Specifically, a measurement value of a Na concentration by secondary ion mass spectrometry is preferably less than or equal to $5 \times 10^{16}$/cm$^3$, more preferably less than or equal to $1 \times 10^{16}$/cm$^3$, still more preferably less than or equal to $1 \times 10^{15}$/cm$^3$. In a similar manner, a measurement value of a Li concentration is preferably less than or equal to $5 \times 10^{15}$/cm$^3$, more preferably less than or equal to $1 \times 10^{15}$/cm$^3$. In a similar manner, a measurement value of a K concentration is preferably less than or equal to $5 \times 10^{15}$/cm$^3$, more preferably less than or equal to $1 \times 10^{15}$/cm$^3$.

Through the above steps, the concentration of hydrogen in the oxide semiconductor film 142b can be reduced. In addition, by using the oxide semiconductor film in which the hydrogen concentration is reduced, it is possible to manufacture a transistor with high withstand voltage and an extremely small off-state current. The above heat treatment can be performed at any time after the oxide semiconductor film 142b is formed.

Note that the oxide semiconductor film 142b may be amorphous or may have crystallinity. For the oxide semiconductor film having crystallinity, a crystalline oxide semiconductor including a crystal with c-axis alignment (also referred to as c-axis aligned crystalline oxide semiconductor (CAAC-OS)), which has a triangular or hexagonal atomic arrangement when seen from the direction of an a-b plane, a surface, or an interface, may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). CAAC-OS is preferable because an effect of increasing reliability of a transistor can be obtained.

An oxide semiconductor film composed of CAAC-OS can also be formed by a sputtering method. In order to obtain CAAC-OS by a sputtering method, it is important to form hexagonal crystals in an initial stage of deposition of an oxide semiconductor film and to cause crystal growth from the hexagonal crystals as seeds. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition, the deposited oxide semiconductor film is subjected to heat treatment at a temperature higher than the substrate heating temperature in the deposition. Thus, micro-defects in the film and defects at the interface between stacked layers can be repaired.

Specifically, the CAAC-OS is a non-single-crystal semiconductor that has a triangular, hexagonal, equilateral triangular, or regular hexagonal atomic arrangement when seen from a direction perpendicular to an a-b plane. Moreover, the CAAC-OS has a phase in which metal atoms are arranged in a layered manner or a phase in which metal atoms and oxygen atoms are arranged in a layered manner when seen from the direction perpendicular to the c-axis direction.

The CAAC-OS is not a single crystal, but this does not mean that the CAAC-OS is composed of only an amorphous component. Although the CAAC-OS includes a crystallized portion (crystalline portion), a boundary between crystalline portions is not clear in some cases.

Nitrogen may be substituted for part of oxygen included in the CAAC-OS. The c-axes of individual crystalline portions included in the CAAC-OS may be aligned in one direction (e.g., a direction perpendicular to a surface of a substrate over which the CAAC-OS is formed or a surface of the CAAC-OS). Alternatively, the normals of the a-b planes of the individual crystalline portions included in the CAAC-OS may be aligned in one direction (e.g., a direction perpendicular to a surface of a substrate over which the CAAC-OS is formed or a surface of the CAAC-OS).

The CAAC-OS becomes a conductor, a semiconductor, or an insulator depending on its composition or the like. The CAAC-OS transmits or does not transmit visible light depending on its composition or the like.

As an example of such CAAC-OS, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC-OS will be described in detail with reference to FIGS. 18A to 18E, FIGS. 19A to 19C, and FIGS. 20A to 20C. In FIGS. 18A to 18E, FIGS. 19A to 19C, and FIGS. 20A to 20C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 18A to 18E, O surrounded by a circle represents tetracoordinate O and O surrounded by a double circle represents tricoordinate O.

Figure 18A:
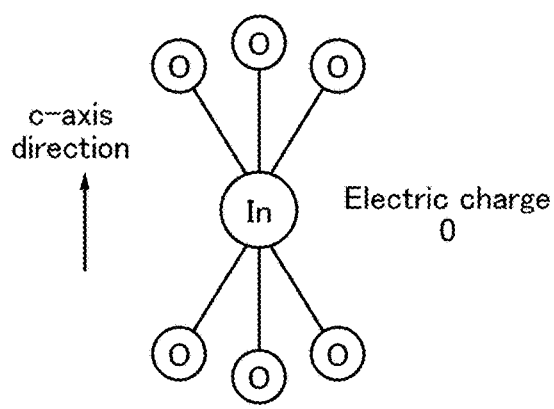
FIGS. 18A to 18E are diagrams illustrating structures of oxide semiconductor according to an embodiment of the present invention.

FIG. 18A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0.

Figure 18D:
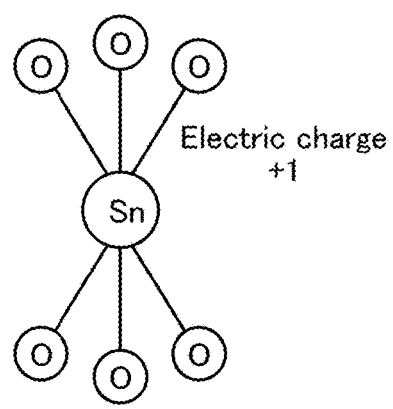
Figure 18B:
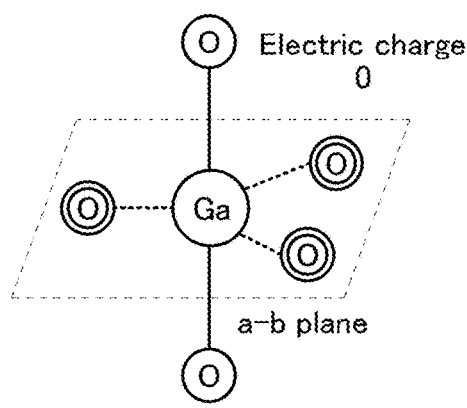

FIG. 18B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
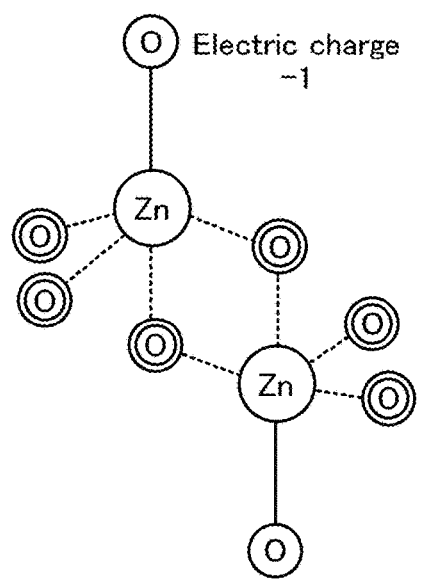
Figure 18C:
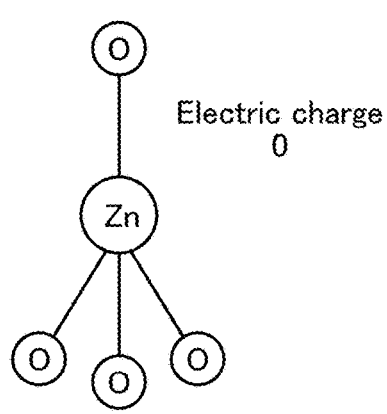

FIG. 18C illustrates a structure including one tetracoordinate Zn atom and four tetracoordinate O atoms proximate to the Zn atom. In FIG. 18C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 18C. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half In the small group illustrated in FIG. 18D, electric charge is +1.

FIG. 18E illustrates a small group including two Zn atoms. In FIG. 18E, one tetracoordinate O atom exists in each of an upper half and a lower half In the small group illustrated in FIG. 18E, electric charge is −1.

Note that a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 18A each have three proximate In atoms in the downward direction, and the three O atoms in the lower half each have three proximate In atoms in the upward direction. The one O atom in the upper half with respect to the pentacoordinate Ga atom in FIG. 18B has one proximate Ga atom in the downward direction, and the one O atom in the lower half has one proximate Ga atom in the upward direction. The one O atom in the upper half with respect to the tetracoordinate Zn atom in FIG. 18C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 19A illustrates a model of a medium group included in a layered structure of an In—Sn—Zn-based oxide semiconductor. FIG. 19B illustrates a large group including three medium groups. Note that FIG. 19C illustrates an atomic arrangement in the case where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide semiconductor in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

When the large group illustrated in FIG. 19B is repeated, an In—Sn—Zn-based oxide semiconductor crystal ($In_2SnZn_3O_8$) can be obtained. Note that a layered structure of the obtained In—Sn—Zn-based oxide semiconductor crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

As an example, FIG. 20A illustrates a model of a medium group included in a layered structure of an In—Ga—Zn-based oxide semiconductor.

In the medium group included in the layered structure of the In—Ga—Zn-based oxide semiconductor in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide semiconductor, a large group can be formed using not only the medium group illustrated in FIG. 20A but also a medium group in which the arrangement of the In atom, the Ga atom, and the Zn atom is different from that in FIG. 20A.

Figure 9B:
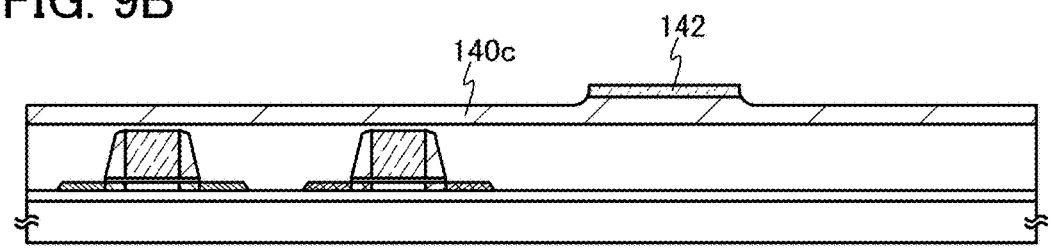

Next, as illustrated in FIG. 9B, the oxide semiconductor film 142b and the insulating film 173 are processed by etching or the like, so that the island-shaped oxide semiconductor film 142 and the third oxide insulating film 140c which is part of the insulating film 140 to be formed later are formed. A region of the third oxide insulating film 140c, which does not overlap with the island-shaped oxide semiconductor film 142, is partly etched.

Note that etching for forming the oxide semiconductor film 142 may be wet etching, dry etching, or both dry etching and wet etching. As the etching gas for dry etching, a gas including chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used.

A resist mask used for forming the oxide semiconductor film 142 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attach onto surfaces of the oxide semiconductor film 142b and the insulating film 173 are removed.

In this embodiment, the oxide semiconductor film 142b and the insulating film 173 are processed by dry etching. For example, dry etching is performed under the following conditions: the ICP power is 45 W; the bias power is 100 W; the pressure is 1.9 Pa; the etching gas is a mixed gas of $BCl_3$ and $Cl_2$; the flow rate of $BCl_3$ is 60 sccm; and the flow rate of $Cl_2$ is 20 sccm. When dry etching is performed under such conditions, after the island-shaped oxide semiconductor film 142 is formed, the third oxide insulating film 140c can be formed from the insulating film 173. It is preferable that an impurity including hydrogen not be included in the etching.

In the case where the oxide semiconductor film 142 is formed by dry etching, when the vicinities of side surfaces of the oxide semiconductor film 142, i.e., end portions of the oxide semiconductor film 142 are exposed to plasma including chlorine radicals, fluorine radicals, or the like, metal atoms exposed at the end portions of the oxide semiconductor film 142 are bonded to the chlorine radicals, fluorine radicals, or the like. At this time, the metal atoms bonded to the chlorine atoms or the fluorine atoms are released and consequently oxygen atoms whose bonds to the metal atoms are broken in the oxide semiconductor film 142 become active. The active oxygen atoms are easily reacted and released. Thus, oxygen deficiency is likely to be caused at the end portions of the oxide semiconductor film 142.

When the end portions of the oxide semiconductor film exposed in the etching step are active, oxygen is extracted in a reduced-pressure atmosphere or a reducing atmosphere, or in heat treatment in a reduced-pressure atmosphere, and oxygen deficiency is caused at the end portions of the oxide semiconductor film. Some of the oxygen deficiency becomes donor and generates an electron which is a carrier, so that the end portions of the oxide semiconductor film 142 have n-type conductivity.

In the case where the conductive films 163 and 164 to be formed later are in contact with the end portions of the oxide semiconductor film 142 having n-type conductivity, leakage current is generated between the conductive films 163 and 164 through the end portions. The leakage current causes the off-state current of the transistor to be increased.

Figure 9C:
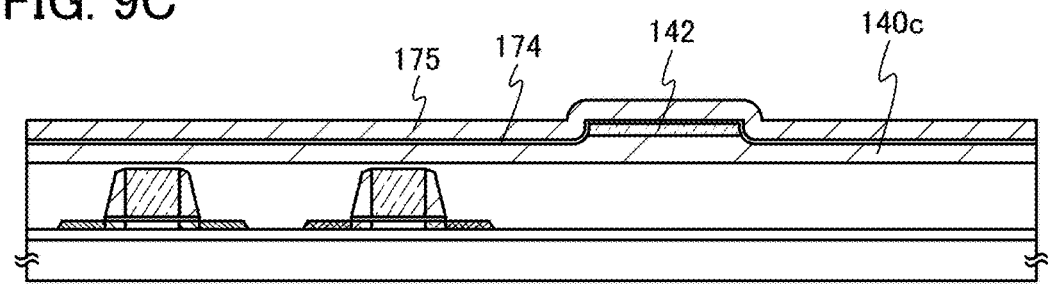

Next, as illustrated in FIG. 9C, an insulating film 174 and an insulating film 175 are formed over the third oxide insulating film 140c and the oxide semiconductor film 142. The insulating film 174 is preferably formed using an insulating film from which oxygen is released by application of heat, like the insulating film 173. The insulating film 175 is formed using an insulating film which prevents diffusion of oxygen. An aluminum oxide film, an aluminum oxynitride film, or the like can be given as an example of the insulating film 175.

The insulating film 174 and the insulating film 175 can be formed by a deposition method similar to the deposition method of the insulating film 173 as appropriate. It is preferable that the insulating film 174 and the insulating film 175 be formed at temperature as low as possible, preferably at room temperature, in order to reduce the amount of oxygen released from the end portions of the oxide semiconductor film 142 when the insulating film 174 and the insulating film 175 are formed.

Even when oxygen deficiency is caused at the end portions of the oxide semiconductor film 142, the insulating film 174 from which oxygen is released by application of heat is in contact with the end portions of the oxide semiconductor film 142 and the insulating film 175 which prevents diffusion of oxygen overlaps with the end portions of the oxide semiconductor film 142 with the insulating film 174 interposed therebetween, so that oxygen can be supplied to the end portions of the oxide semiconductor film 142 from the insulating film 174 by later heat treatment. Therefore, oxygen deficiency at the end portions of the oxide semiconductor film 142 can be reduced.

In this embodiment, a silicon oxide film having a thickness of approximately 20 nm is used as the insulating film 174, and an aluminum oxide film having a thickness of approximately 100 nm is used as the insulating film 175.

Figure 9D:
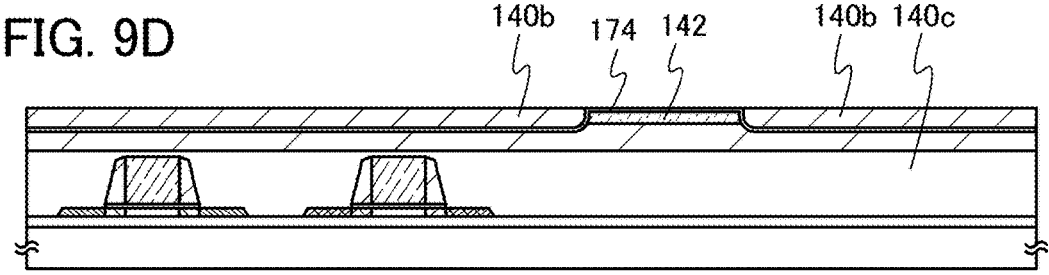

Next, as illustrated in FIG. 9D, the insulating film 175 is subjected to planarization treatment, so that the second oxide insulating film 140b is formed from the insulating film 175. The planarization treatment can be performed by polishing treatment such as a chemical mechanical polishing (CMP) method or a liquid jet polishing method, etching treatment such as dry etching or wet etching, or a combination of polishing treatment and etching treatment. In this embodiment, the insulating film 175 is subjected to a CMP method as planarization treatment. The planarization treatment is performed on the insulating film 175 until the insulating film 174 is exposed. In the case where the oxide semiconductor film 142 is as thin as several nanometers to several tens of nanometers, it is preferable that the oxide semiconductor film 142 not be removed by the planarization treatment.

For example, the insulating film 175 is subjected to CMP treatment under the following conditions: a polyurethane polishing cloth is used; silica slurry (a grain size of 60 nm) is used as slurry; the slurry flow rate is greater than or equal to 100 ml/min and less than or equal to 500 ml/min; the polishing pressure is higher than or equal to 0.005 MPa and lower than or equal to 0.08 MPa; the spindle rotation speed is greater than or equal to 20 rpm and less than or equal to 50 rpm; and the table rotation speed is greater than or equal to 20 rpm and less than or equal to 50 rpm.

Figure 10A:
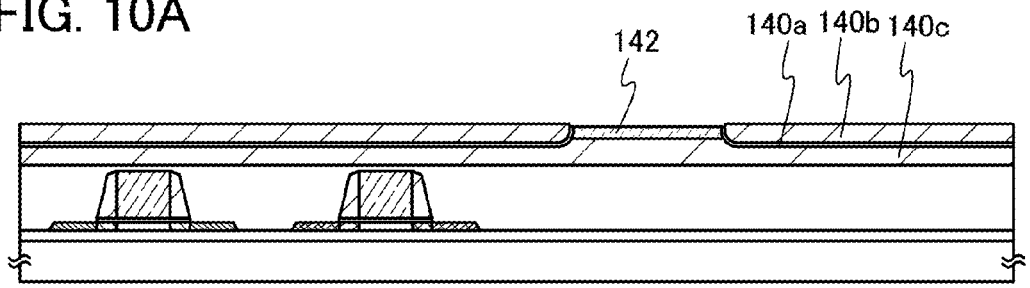
FIGS. 10A to 10D illustrate a method for manufacturing a semiconductor device.

Next, as illustrated in FIG. 10A, the exposed portion of the insulating film 174 is removed, so that a surface of the oxide semiconductor film 142 is exposed. Through the above steps, the first oxide semiconductor film 140a is formed from the insulating film 174. The exposed portion of the insulating film 174 is removed by etching treatment. Note that it is necessary to employ the etching condition where a selectivity ratio of the insulating film 174 with respect to the oxide semiconductor film 142 is high. The surface of the oxide semiconductor film 142 is planarized after the exposed portion of the insulating film 174 is removed, so that electric characteristics of the transistor 121 to be completed later can be improved.

For example, dry etching is performed under the following conditions: the ICP power is 500 W; the bias power is 50 W; the pressure is 1.5 Pa; the etching gas is a mixed gas of $CF_4$ and $O_2$; the flow rate of $CF_4$ is 70 sccm; and the flow rate of $O_2$ is 30 sccm. When dry etching is performed under such conditions, the insulating film 174 can be selectively removed to form the first oxide insulating film 140a. Further, the oxide semiconductor film 142 can be prevented from being removed. It is preferable that an impurity including hydrogen not be included in the etching.

Heat treatment may be performed after the first oxide insulating film 140a is formed. Through the heat treatment, an impurity including hydrogen in the oxide semiconductor film 142 can be removed. Further, oxygen is released from the first oxide insulating film 140a and the third oxide insulating film 140c, so that oxygen can be supplied to the end portions and the lower portion of the oxide semiconductor film 142 and thus oxygen deficiency can be reduced.

Figure 10B:
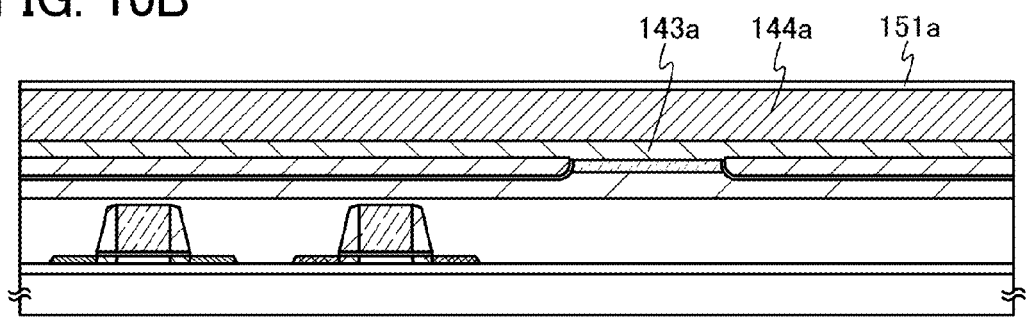

Next, as illustrated in FIG. 10B, the insulating film 143a, a conductive film 144a, and an insulating film 151a are stacked in this order to cover the first oxide insulating film 140a, the second oxide insulating film 140b, and the oxide semiconductor film 142.

The insulating film 143a and the insulating film 151a can be formed using any of the materials and the stacked structure similar to those of the gate insulating film 104n or the gate insulating film 104p. The insulating film 143a to be the gate insulating film 143 later preferably includes impurities such as moisture or hydrogen as little as possible, and may be a single-layer insulating film or a plurality of stacked insulating films. When hydrogen is contained in the gate insulating film 143, hydrogen enters the oxide semiconductor film 142 or oxygen in the oxide semiconductor film 142 is extracted by hydrogen, whereby the oxide semiconductor film 142 has lower resistance (n-type conductivity); thus, a parasitic channel might be formed. Therefore, it is important that a film formation method in which hydrogen is not used be employed in order to form the gate insulating film 143 containing hydrogen as little as possible. A material having a high barrier property is preferably used for the gate insulating film 143. For example, a silicon nitride film, a silicon nitride oxide film, an aluminum nitride film, an aluminum nitride oxide film, or the like can be used as the insulating film having a high barrier property. In the case where a plurality of stacked insulating films is used, an insulating film having a low proportion of nitrogen, such as a silicon oxide film or a silicon oxynitride film, is formed on the side closer to the oxide semiconductor film 142 than the insulating film having a high barrier property. Then, the insulating film having a high barrier property is formed to overlap with the oxide semiconductor film 142 with the insulating film having a low proportion of nitrogen interposed therebetween. When the insulating film having a high bather property is used, impurities such as moisture or hydrogen can be prevented from entering the oxide semiconductor film 142, the gate insulating film 143, or the interface between the oxide semiconductor film 142 and another insulating film and the vicinity thereof. In addition, the insulating film having a low proportion of nitrogen, such as a silicon oxide film or a silicon oxynitride film, is formed in contact with the oxide semiconductor film 142, so that the insulating film formed using a material having a high barrier property can be prevented from being directly in contact with the oxide semiconductor film 142.

In this embodiment, a silicon oxynitride film having a thickness of 20 nm which is formed by a plasma CVD method is used as the insulating film 143a, and a silicon oxide film having a thickness of 100 nm which is formed by a sputtering method is used as the insulating film 151a.

After the insulating film 143a is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less.

Alternatively, heat treatment may be performed on the oxide semiconductor film 142 in an oxygen atmosphere to add oxygen to the oxide semiconductor so that the oxygen deficiency that serves as a donor in the oxide semiconductor film 142 is reduced. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%), further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor film 142 by an ion implantation method, an ion doping method, or the like so that oxygen deficiency that serves as a donor is reduced. For example, oxygen made to be plasma with a microwave of 2.45 GHz may be added to the oxide semiconductor film 142.

The conductive film 144a can be formed by a sputtering method or a vacuum evaporation method. As the conductive film for forming the conductive film 144a, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

A conductive film to be the conductive film 144a may have a single-layer structure or a layered structure of two or more layers. As the conductive film 144a, a film containing an element selected from aluminum, chromium, copper, tantalum, titanium, molybdenum, and tungsten; an alloy film containing any of these elements as a component; an alloy film containing any of these elements in combination; or the like can be used. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used. A Cu—Mg—Al alloy, a Mo—Ti alloy, Ti, and Mo have high adhesiveness with an oxide film. Therefore, in the case where the insulating film 143a includes an oxide, any of the above-described materials having high adhesiveness with an oxide film is preferably used for the conductive film 144a over the insulating film 143a. For example, as the conductive film 144a, a conductive film including Cu having low resistance is stacked over a conductive film including a Cu—Mg—Al alloy, a Mo—Ti alloy, Ti, or Mo, whereby adhesiveness between the conductive film 144a and the insulating film 143a including an oxide can be increased and resistance of the conductive film 144a can be lowered.

Alternatively, the conductive film to be the conductive film 144a may be formed using a conductive metal oxide. As the conductive metal oxide, indium oxide, tin oxide, zinc oxide, a mixture of indium oxide and tin oxide, a mixture of indium oxide and zinc oxide, or any of the metal oxide materials to which silicon or silicon oxide is added can be used.

In the case where heat treatment is performed after formation of the conductive film, the conductive film preferably has heat resistance high enough to withstand the heat treatment.

In this embodiment, as the conductive film 144a, a stack of a tantalum nitride film having a thickness of 30 nm and a tungsten film having a thickness of 135 nm thereover is used.

Figure 10C:
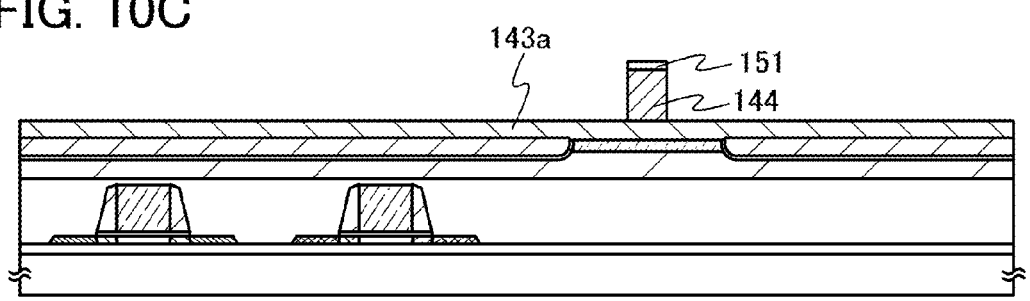

Next, a mask is formed over the insulating film 151a and the conductive film 144a and the insulating film 151a are etched; thus, as illustrated in FIG. 10C, the gate electrode 144 and the insulating film 151 over the gate electrode 144 are formed.

Wet etching or dry etching can be used in etching of the conductive film 144a and the insulating film 151a, or wet etching and dry etching may be used in combination. The etching conditions (e.g., an etching gas or an etchant, etching time, and temperature) are set as appropriate in accordance with the materials so that the conductive film 144a and the insulating film 151a can be etched into a desired shape. Note that, in order to process the channel length (L) of the transistor 121 minutely, dry etching is preferably used.

As an etching gas used for etching the insulating film 151a, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas. As an etching gas for etching the conductive film 144a, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 10D:
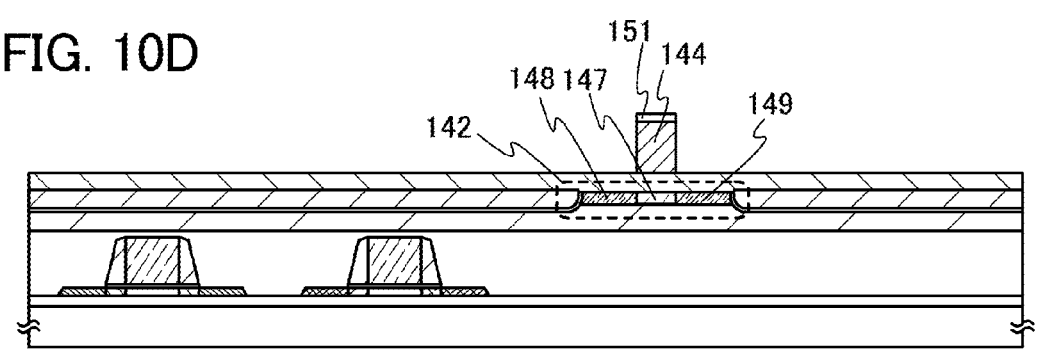

Next, as illustrated in FIG. 10D, with the use of the gate electrode 144 and the insulating film 151 as masks, a dopant is added to the oxide semiconductor film 142, so that the first region 147 which overlaps with the gate electrode 144 and at least part of which serves as a channel formation region, and the second regions 148 and 149 which serve as a source and a drain and between which the first region 147 is sandwiched are formed.

The dopant can be added to the oxide semiconductor film 142 by an ion doping method or an ion implantation method. As the dopant to be added, for example, at least one of a rare gas such as helium, argon, or xenon, an element belonging to a Group 15, such as nitrogen, phosphorus, arsenic, or antimony, and the like can be used.

For example, in the case where nitrogen is used as the dopant, the concentration of nitrogen atoms in the second regions 148 and 149 is preferably higher than or equal to $5 \times 10^{19}/cm^3$ and lower than or equal to $1 \times 10^{22}/cm^3$.

Further, the addition of the dopant may also be conducted using a method other than an ion doping method and an ion implantation method. For example, a dopant can be added in the following manner: plasma is generated in an atmosphere of a gas containing an element to be added and plasma treatment is performed on an object to which the dopant is added. As an apparatus for generating plasma, a dry etching apparatus, a plasma CVD apparatus, a high-density plasma CVD apparatus, or the like can be used.

As for the condition of doping, for example, the acceleration voltage is set to 20 kV in the case where the dopant is nitrogen. In the case where the dopant is phosphorus, the acceleration voltage is set to 40 kV. Heat treatment is preferably performed at a temperature lower than 450° C. in the case where the dose of nitrogen or phosphorus is less than or equal to $1 \times 10^{14}/cm^2$. Thus, the sheet resistance of the second regions 148 and 149 containing the dopant can be lower than or equal to $1 \times 10^7$ Ω/sq. In the case where the dose is greater than or equal to $5 \times 10^{14}/cm^2$ and less than $5 \times 10^{15}/cm^2$, the heat treatment is preferably performed at a temperature higher than or equal to 450° C. and lower than or equal to 600° C. Thus, the sheet resistance of the second regions 148 and 149 can be lower than or equal to $1 \times 10^5$ Ω/sq. In the case where the dose is greater than or equal to $5 \times 10^{15}/cm^2$, the heat treatment is preferably performed at a temperature higher than or equal to 600° C. Thus, the sheet resistance of the second regions 148 and 149 containing the dopant can be lower than or equal to $1 \times 10^5$ Ω/sq.

The sheet resistance of the second regions 148 and 149 is reduced, so that resistance between the second region 148 and the conductive film 163 to be formed later and between the second region 149 and the conductive film 164 to be formed later can be reduced. Thus, even when the transistor 121 is miniaturized, large on-state current and high-speed operation can be ensured. Further, the miniaturization of the transistor 121 makes it possible to increase memory capacity per unit area of a memory device.

Figure 11A:
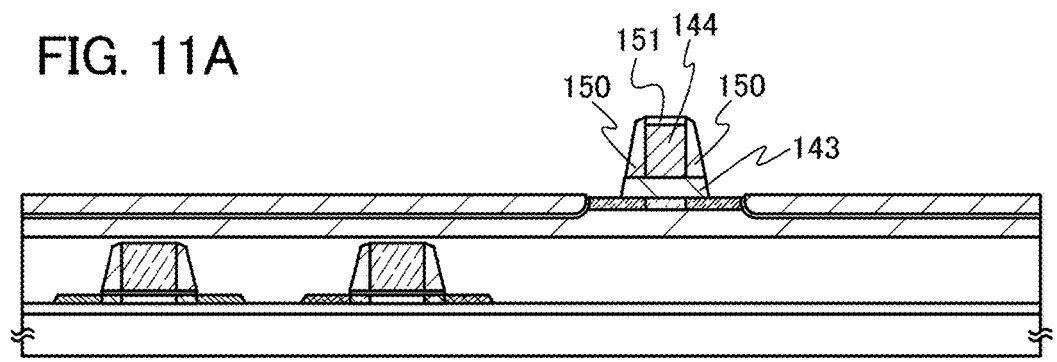
FIGS. 11A to 11D illustrate a method for manufacturing a semiconductor device.

Next, an insulating film is formed to cover the insulating film 143a, the gate electrode 144, the insulating film 151, and the like, and the insulating film and the insulating film 143a are processed by etching or the like. Through this step, as illustrated in FIG. 11A, the sidewall 150 provided on the side portions of the gate electrode 144 is formed from the insulating film, and the gate insulating film 143 provided below the gate electrode 144 and the sidewall 150 is formed from the insulating film 143a. The insulating film to be the sidewall 150 can be formed using a material and a film formation method similar to those of the insulating film 173. For example, a stacked structure in which a silicon oxide film is formed over a silicon nitride film can be employed. In this embodiment, a silicon oxide film is formed as the insulating film to be the sidewall 150.

Next, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

When the heat treatment is performed, oxygen is diffused into the oxide semiconductor film 142 from the insulating film in contact with the oxide semiconductor film 142, so that oxygen deficiency in the surface of the oxide semiconductor film 142, which is in contact with the insulating film, and in the vicinity thereof can be reduced. Further, resistance of the second regions 148 and 149 containing the dopant can be reduced.

Figure 11B:
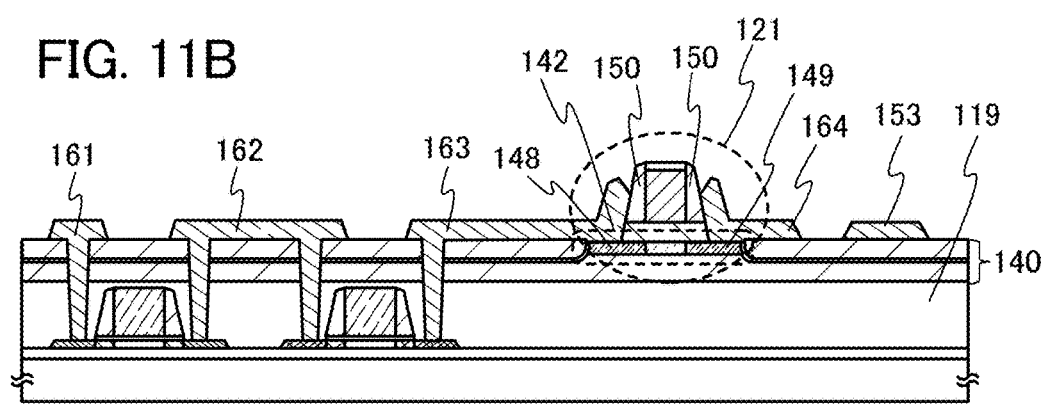

Next, opening portions are formed in the insulating film 119 and the insulating film 140 by etching or the like; thus, part of the second regions 109 and 110 and part of the second regions 115 and 116 are exposed. Then, a conductive film is formed and is processed by etching or the like; thus, as illustrated in FIG. 11B, the conductive film 161 in contact with the second region 109, the conductive film 162 in contact with the second region 110 and the second region 115, the conductive film 163 in contact with the second region 116 and the second region 148, the conductive film 164 in contact with the second region 149, and the conductive film 153 are formed over the insulating film 140. The conductive films 161 to 164 and the conductive film 153 can be formed using a material and a layered structure similar to those of the conductive film 144a.

The etching for forming the conductive films 161 to 164 and the conductive film 153 may be either wet etching or dry etching. Alternatively, wet etching and dry etching may be used in combination. The etching conditions (e.g., an etching gas or an etchant, etching time, and temperature) are set as appropriate in accordance with the material so that the conductive films 161 to 164 and the conductive film 153 can be etched to have a desired shape. Note that dry etching is preferably used for finely processing the transistor. As an etching gas used for dry etching, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas.

In this embodiment, a tungsten film having a thickness of approximately 100 nm is used as the conductive films 161 to 164 and the conductive film 153. In the case where a tungsten film is used as the conductive films 161 to 164 and the conductive film 153, etching is performed under the following conditions, for example: the ICP power is 500 W; the bias power is 150 W; the pressure is 1.0 Pa; the etching gas is a mixed gas of $CF_4$, $Cl_2$, and $O_2$; the flow rate of $CF_4$ is 25 sccm; the flow rate of $Cl_2$ is 25 sccm; and the flow rate of $O_2$ is 10 sccm.

Note that in this embodiment, the conductive film 163 and the conductive film 164 are provided in contact with the sidewall 150. With the structure, even when a mask for forming the conductive films 163 and 164 is misaligned to some extent, the size of the area where the conductive films 163 and 164 are in contact with the oxide semiconductor film 142 can be prevented from changing. Accordingly, variation in resistance between the oxide semiconductor film 142 and the conductive films 163 and 164 due to deviation of the positions of the conductive films 163 and 164 can be suppressed, and thus, variation in on-state current of the transistor 121 can be prevented. Further, the oxide semiconductor film 142 is less likely to be exposed to the etching gas in the etching for forming the conductive films 163 and 164, which is preferable.

Through the above steps, the n-channel transistor 102n and the p-channel transistor 102p included in the memory element and the transistor 121 can be manufactured.

Figure 11C:
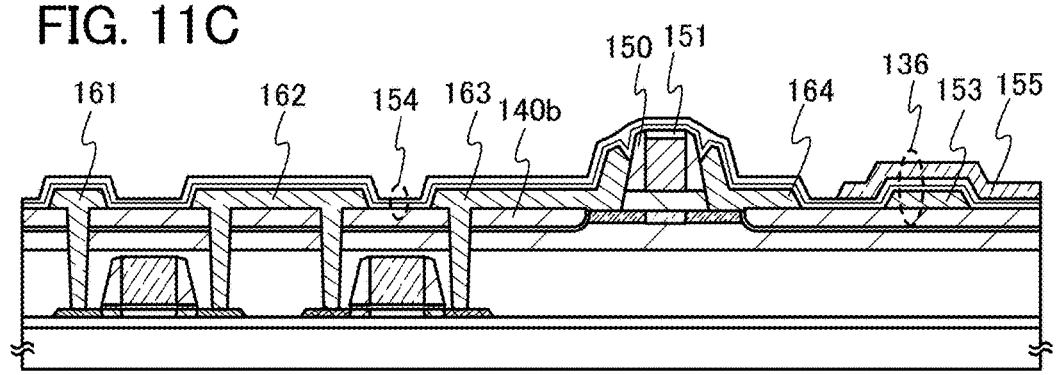

Next, as illustrated in FIG. 11C, the insulating film 154 is formed over the second oxide insulating film 140b, the conductive films 161 to 164, the conductive film 153, the sidewall 150, and the insulating film 151, and then, over the insulating film 154, the conductive film 155 is formed in a position overlapping with the conductive film 153.

The insulating film 154 can be formed using a material including an inorganic insulating material such as silicon oxide, silicon nitride oxide, silicon nitride, hafnium oxide, aluminum oxide, or tantalum oxide. Moreover, the insulating film 154 can be formed using an organic insulating material such as polyimide or acrylic.

In this embodiment, the insulating film 154 has a structure in which an aluminum oxide film having a thickness of 50 nm which is formed by a sputtering method and a silicon oxynitride film having a thickness of 300 nm which is formed by a plasma CVD method are stacked in this order. The insulating film 154 may be a single insulating film or a stack of three or more insulating films.

The conductive film 155 can be formed using a material and a stacked structure similar to those of the conductive film 144a. In this embodiment, the conductive film 155 is formed in such a manner that a titanium film having a thickness of 20 nm, a tungsten film having a thickness of 50 nm, an aluminum film having a thickness of 200 nm, and a titanium film having a thickness of 5 nm are formed by a sputtering method in this order.

Through the above steps, the capacitor 136 can be manufactured.

Figure 11D:
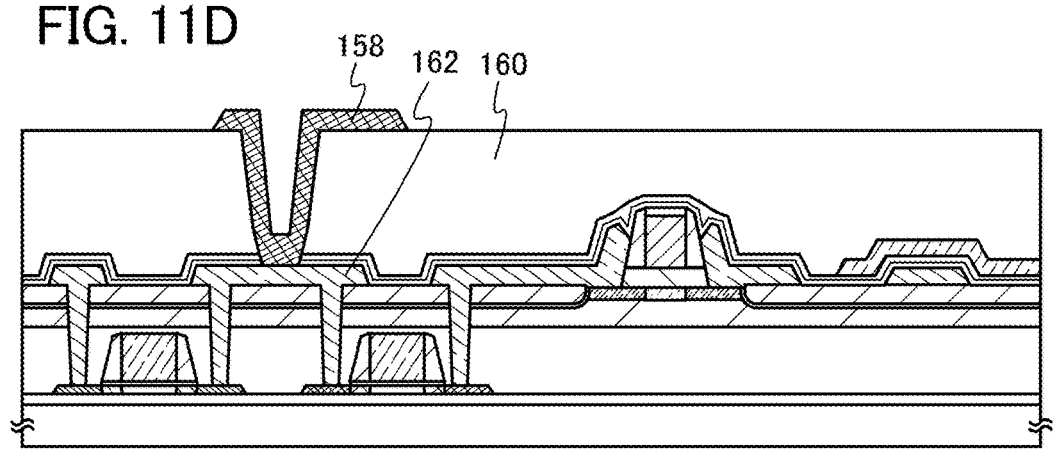

Next, as illustrated in FIG. 11D, an insulating film 160 is formed to cover the conductive film 155 and the insulating film 154, and then, an opening portion is formed in the insulating film 160 by etching or the like to expose part of the conductive film 162. Next, the conductive film 158 in contact with the conductive film 162 in the opening portion is formed over the insulating film 160.

A surface of the insulating film 160 is preferably planarized. The insulating film 160 can be formed using a material including an inorganic insulating material such as silicon oxide, silicon nitride oxide, silicon nitride, hafnium oxide, aluminum oxide, or tantalum oxide. Alternatively, the insulating film 160 can be formed using an organic insulating material such as polyimide or acrylic. In this embodiment, a polyimide film having a thickness of 1500 nm is used as the insulating film 160.

The conductive film 158 can be formed using a material and a stacked structure similar to those of the conductive film 144a. In this embodiment, the conductive film 158 is formed in such a manner that a titanium film having a thickness of 20 nm, a tungsten film having a thickness of 50 nm, an aluminum film having a thickness of 300 nm, and a titanium film having a thickness of 5 nm are formed in this order by a sputtering method.

Through the above steps, the semiconductor device according to an embodiment of the present invention, such as the one illustrated in FIG. 11D, can be manufactured.

Note that in this embodiment, the dopant is added to the oxide semiconductor film 142 with the use of the gate electrode 144 and the insulating film 151 as masks; however, the dopant may be added to the oxide semiconductor film 142 after the sidewall 150 is formed before the conductive films 163 and 164 are formed.

Figure 15A:
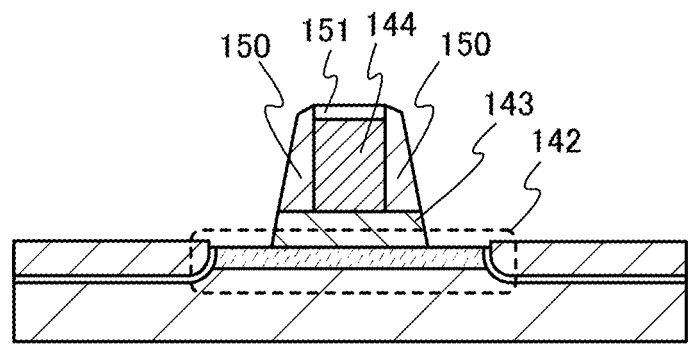
FIGS. 15A and 15B illustrate a method for manufacturing a semiconductor device.
Figure 15B:
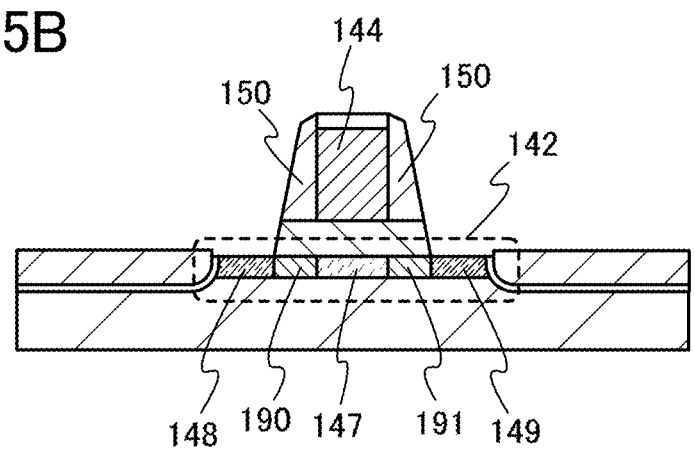

In FIG. 15A, the oxide semiconductor film 142 before the dopant is added, the gate insulating film 143 over the oxide semiconductor film 142, the gate electrode 144 over the gate insulating film 143, the insulating film 151 over the gate electrode 144, and the sidewall 150 provided on the side portions of the gate electrode 144 over the gate insulating film 143 are illustrated. In the above state, the dopant is added to the oxide semiconductor film 142 with the use of the gate electrode 144, the insulating film 151, and the sidewall 150 as masks, so that as illustrated in FIG. 15B, the first region 147 which overlaps with the gate electrode 144 and at least part of which serves as a channel formation region, third regions 190 and 191 which serve as LDD regions and overlap with the sidewall 150 and between which the first region 147 is sandwiched, and the second regions 148 and 149 which serve as a source and a drain and between which the first region 147 and the third regions 190 and 191 are sandwiched can be formed in the oxide semiconductor film 142.

For example, in the case where nitrogen is used as the dopant, the concentration of nitrogen atoms in the second regions 148 and 149 is preferably higher than or equal to $5\times10^{19}/cm^3$ and lower than or equal to $1\times10^{22}/cm^3$. Further, for example, in the case where nitrogen is used as the dopant, the concentration of nitrogen atoms in the third regions 190 and 191 is preferably higher than or equal to $5\times10^{18}/cm^3$ and lower than $5\times10^{19}/cm^3$. The third regions 190 and 191 having the dopant concentration lower than the second regions 148 and 149 are provided, so that a negative shift of the threshold voltage due to a short-channel effect can be reduced.

This embodiment can be implemented by being combined as appropriate with the above-described embodiment.

Embodiment 3

In this embodiment, an example of a method for manufacturing a semiconductor device part of which has the structure illustrated in FIG. 1 will be described.

Note that a semiconductor material such as germanium, silicon germanium, or single crystal silicon carbide as well as silicon may be used for the n-channel transistor 102n and the p-channel transistor 102p included in the memory element. For example, the n-channel transistor 102n and the p-channel transistor 102p including silicon can be formed using a single crystal semiconductor substrate such as a silicon wafer, a silicon thin film which is formed by an SOI method, a silicon thin film which is formed by a vapor deposition method, or the like.

Note that the n-channel transistor 102n and the p-channel transistor 102p can be manufactured in a manner similar to that described in Embodiment 2. Therefore, in this embodiment, description of Embodiment 2 can be referred to for the steps up to the step illustrated in FIG. 8D.

Figure 12A:
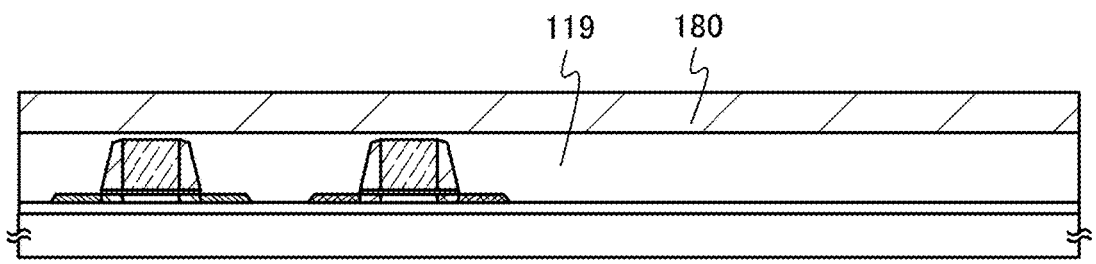
FIGS. 12A to 12D illustrate a method for manufacturing a semiconductor device.

After the step illustrated in FIG. 8E, planarization treatment is performed on the surface of the insulating film 119, and an insulating film 180 is formed over the insulating film 119 as illustrated in FIG. 12A.

Embodiment 2 can be referred to for the material, the structure, the manufacturing method, and the planarization treatment of the insulating film 119. Further, a material, a stacked structure, and a manufacturing method of the insulating film 180 can be similar to those of the insulating film 173 described in Embodiment 2.

Figure 12B:
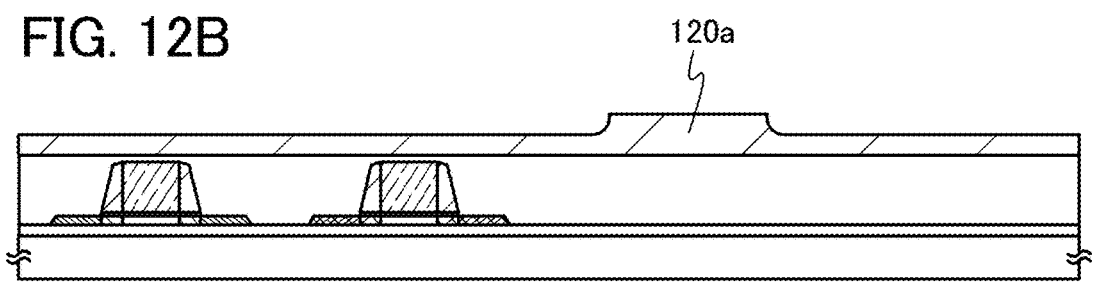

Next, as illustrated in FIG. 12B, part of the insulating film 180 is removed by etching or the like, so that the first oxide insulating film 120a having a projecting portion is formed. The first oxide insulating film 120a is to be part of the insulating film 120 formed later. Etching of the insulating film 180 can be performed by dry etching, wet etching, or both of them. It is preferable that an impurity including hydrogen not be included in the etching.

Figure 12C:
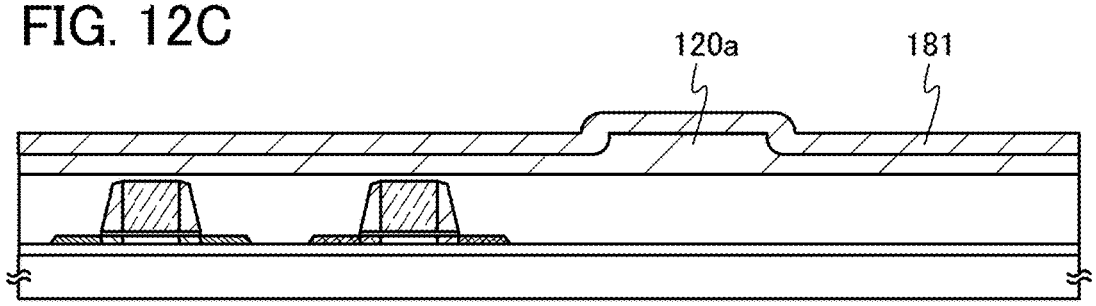

Next, as illustrated in FIG. 12C, an insulating film 181 is formed to cover the first oxide insulating film 120a. A material, a stacked structure, and a manufacturing method of the insulating film 181 can be similar to those of the insulating film 175 described in Embodiment 2. Note that the insulating film 181 is formed so that the thickness thereof is larger than the height of the projecting portion of the first oxide insulating film 120a. With the structure, the first oxide insulating film 120a and the second oxide insulating film 120b both having high flatness can be formed in a later planarization step.

Figure 12D:
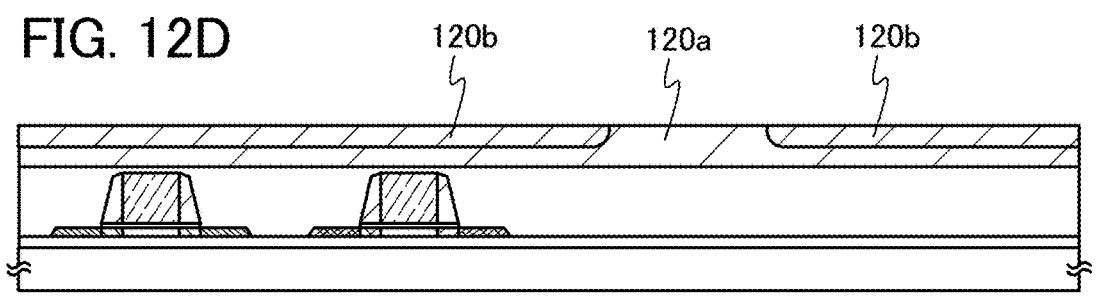

Next, as illustrated in FIG. 12D, the insulating film 181 is subjected to planarization treatment, so that the second oxide insulating film 120b is formed from the insulating film 181. The planarization treatment can be performed in a manner similar to that of the planarization treatment performed on the insulating film 175 described in Embodiment 2. The projecting portion of the first oxide insulating film 120a is exposed by the planarization treatment performed on the insulating film 181. Note that part of the projecting portion of the first oxide insulating film 120a may be removed in this planarization treatment.

Figure 13A:
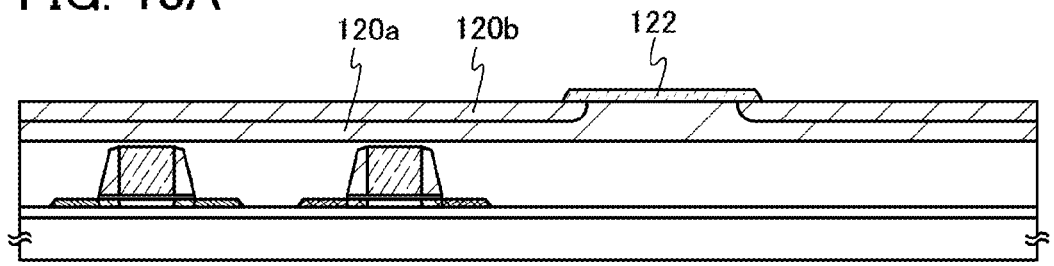
FIGS. 13A to 13D illustrate a method for manufacturing a semiconductor device.

Next, as illustrated in FIG. 13A, the island-shaped oxide semiconductor film 122 is formed over the first oxide insulating film 120a and the second oxide insulating film 120b. A material, a stacked structure, and a manufacturing method of the oxide semiconductor film 122 can be similar to those of the oxide semiconductor film 142 described in Embodiment 2. Note that the position of the oxide semiconductor film 122 is determined so that the first region 127 to be formed later in the oxide semiconductor film 122 is in contact with the first oxide insulating film 120a and that the second region 128 to be formed later in the oxide semiconductor film 122 is in contact with the first oxide insulating film 120a and the second oxide insulating film 120b.

Figure 13B:
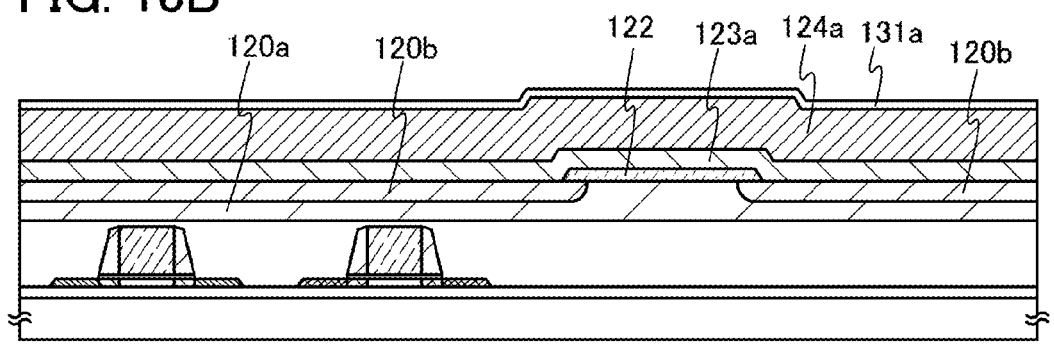

Next, as illustrated in FIG. 13B, an insulating film 123a, a conductive film 124a, and an insulating film 131a are stacked in this order to cover the first oxide insulating film 120a, the second oxide insulating film 120b, and the oxide semiconductor film 122.

The insulating film 123a can be formed using a material and a stacked structure similar to those of the insulating film 143a in Embodiment 2, and the insulating film 131a can be formed using a material and a stacked structure similar to those of the insulating film 151a in Embodiment 2. Note that heat treatment may be performed after the insulating film 123a is formed. The heat treatment can be performed under conditions similar to those of the heat treatment performed after formation of the insulating film 143a in Embodiment 2.

The conductive film 124a can be formed using a material and a stacked structure similar to those of the conductive film 144a in Embodiment 2.

Figure 13C:
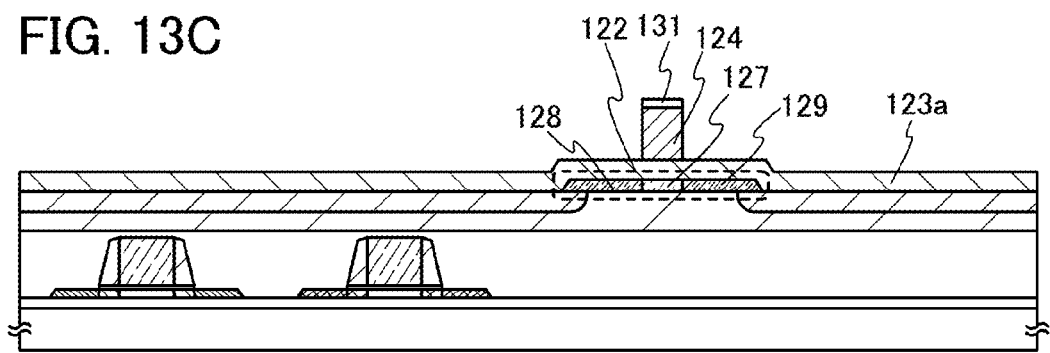

Next, a mask is formed over the insulating film 131a and the conductive film 124a and the insulating film 131a are etched; thus, the gate electrode 124 and the insulating film 131 over the gate electrode 124 are formed. Next, as illustrated in FIG. 13C, a dopant is added to the oxide semiconductor film 122 with the use of the gate electrode 124 and the insulating film 131 as masks, so that the first region 127 which overlaps with the gate electrode 124 and at least part of which serves as a channel formation region, and the second regions 128 and 129 which serve as a source and a drain and between which the first region 127 is sandwiched are formed. Etching of the conductive film 124a and the insulating film 131a can be performed under conditions similar to those of etching of the conductive film 144a and the insulating film 151a in Embodiment 2.

Addition of the dopant to the oxide semiconductor film 122 and the following heat treatment can be performed in a manner similar to that of addition of the dopant to the oxide semiconductor film 142 and the heat treatment in Embodiment 2. The sheet resistance of the second regions 128 and 129 can be reduced by addition of the dopant and the heat treatment. Accordingly, resistance between the second region 128 and the conductive film 163 to be formed later and between the second region 129 and the conductive film 164 to be formed later can be reduced. Thus, even when the transistor 121 is miniaturized, large on-state current and high-speed operation can be ensured. Further, the miniaturization of the transistor 121 makes it possible to increase memory capacity per unit area of a memory device.

Figure 13D:
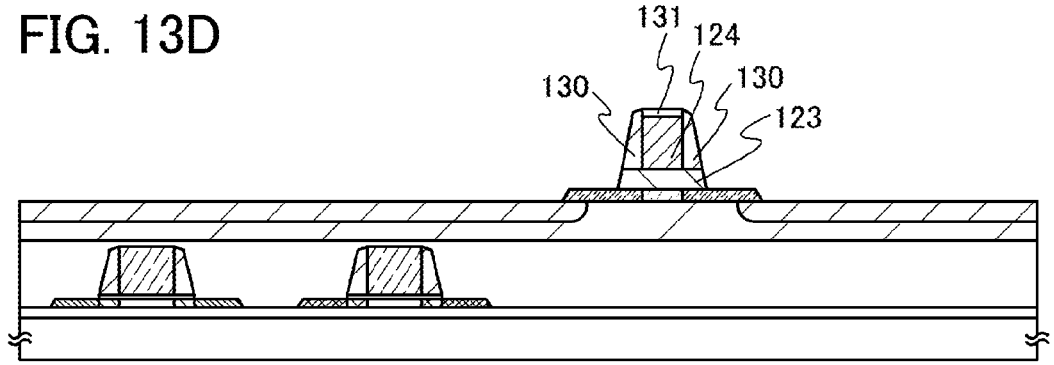

Next, an insulating film is formed to cover the insulating film 123a, the gate electrode 124, the insulating film 131, and the like, and the insulating film and the insulating film 123a are processed by etching or the like. Through this step, as illustrated in FIG. 13D, the sidewall 130 provided on the side portions of the gate electrode 124 is formed from the insulating film, and the gate insulating film 123 provided below the gate electrode 124 and the sidewall 130 is formed from the insulating film 123a. The insulating film to be the sidewall 130 can be formed using a material, a stacked structure, and a film formation method similar to those of the insulating film 180.

Next, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

When the heat treatment is performed, oxygen is diffused into the oxide semiconductor film 122 from the insulating film in contact with the oxide semiconductor film 122, so that oxygen deficiency in the surface of the oxide semiconductor film 122, which is in contact with the insulating film, and in the vicinity thereof can be reduced. Further, resistance of the second regions 128 and 129 containing the dopant can be reduced.

Figure 14A:
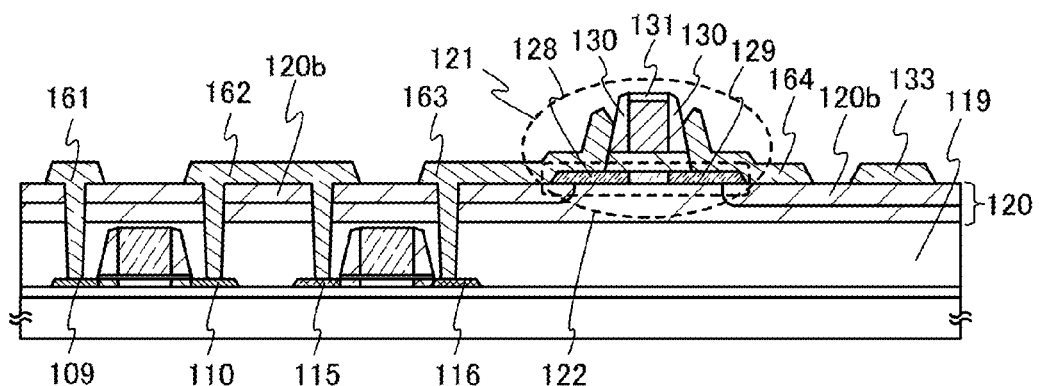
FIGS. 14A to 14C illustrate a method for manufacturing a semiconductor device.

Next, opening portions are formed in the insulating film 119 and the insulating film 120 by etching or the like; thus, part of the second regions 109 and 110 and part of the second regions 115 and 116 are exposed. Then, a conductive film is formed and is processed by etching or the like; thus, as illustrated in FIG. 14A, the conductive film 161 in contact with the second region 109, the conductive film 162 in contact with the second region 110 and the second region 115, the conductive film 163 in contact with the second region 116 and the second region 128, the conductive film 164 in contact with the second region 129, and the conductive film 133 are formed over the insulating film 120. The conductive films 161 to 164 and the conductive film 133 can be formed using a material and a layered structure similar to those of the conductive film 124a.

Etching for forming the conductive films 161 to 164 and the conductive film 133 can be performed under conditions similar to those of etching for forming the conductive films 161 to 164 and the conductive film 153 in Embodiment 2.

Note that in this embodiment, the conductive film 163 and the conductive film 164 are provided in contact with the sidewall 130. With the structure, even when a mask for forming the conductive films 163 and 164 is misaligned to some extent, the size of the area where the conductive films 163 and 164 are in contact with the oxide semiconductor film 122 can be prevented from changing. Accordingly, variation in resistance between the oxide semiconductor film 122 and the conductive films 163 and 164 due to deviation of the positions of the conductive films 163 and 164 can be suppressed, and thus, variation in on-state current of the transistor 121 can be prevented. Further, the oxide semiconductor film 122 is less likely to be exposed to the etching gas in the etching for forming the conductive films 163 and 164, which is preferable.

Through the above steps, the n-channel transistor 102n and the p-channel transistor 102p included in the memory element and the transistor 121 can be manufactured.

Figure 14B:
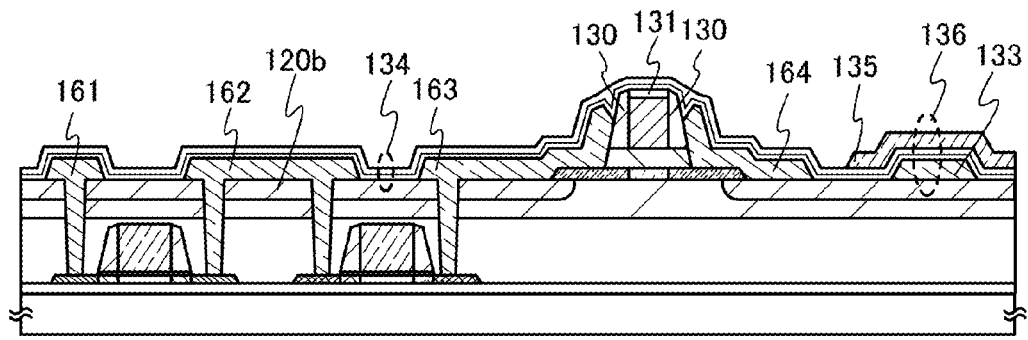

Next, as illustrated in FIG. 14B, the insulating film 134 is formed over the second oxide insulating film 120b, the conductive films 161 to 164, the conductive film 133, the sidewall 130, and the insulating film 131, and then, over the insulating film 134, the conductive film 135 is formed in a position overlapping with the conductive film 133.

The insulating film 134 can be formed using a material, a stacked structure, and a manufacturing method similar to those of the insulating film 154 in Embodiment 2. Further, the conductive film 135 can be formed using a material and a stacked structure similar to those of the conductive film 124a.

Through the above steps, the capacitor 136 can be manufactured.

Figure 14C:
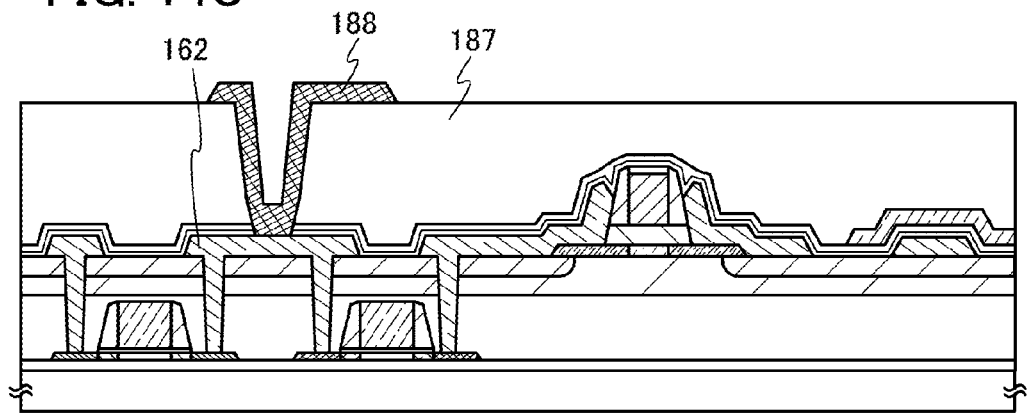

Next, as illustrated in FIG. 14C, an insulating film 187 is formed to cover the conductive film 135 and the insulating film 134, and then, an opening portion is formed in the insulating film 187 by etching or the like to expose part of the conductive film 162. Next, a conductive film 188 in contact with the conductive film 162 in the opening portion is formed over the insulating film 187.

The insulating film 187 can be formed using a material, a stacked structure, and a manufacturing method similar to those of the insulating film 160 in Embodiment 2. Further, the conductive film 188 can be formed using a material and a stacked structure similar to those of the conductive film 124a.

Through the above steps, the semiconductor device according to an embodiment of the present invention, such as the one illustrated in FIG. 14C, can be manufactured.

Note that in this embodiment, the dopant is added to the oxide semiconductor film 122 with the use of the gate electrode 124 and the insulating film 131 as masks; however, the dopant may be added to the oxide semiconductor film 122 after the sidewall 130 is formed before the conductive films 163 and 164 are formed.

Figure 16A:
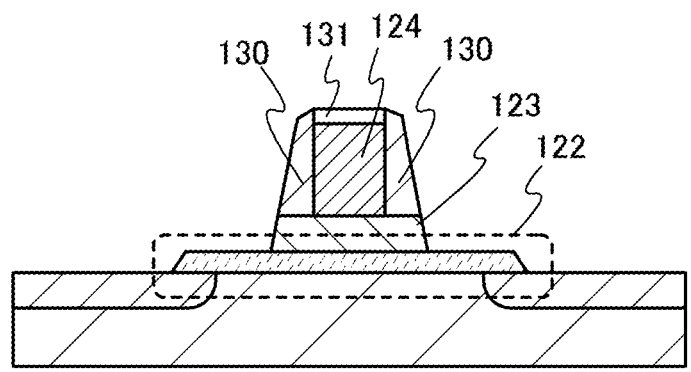
FIGS. 16A and 16B illustrate a method for manufacturing a semiconductor device.
Figure 16B:
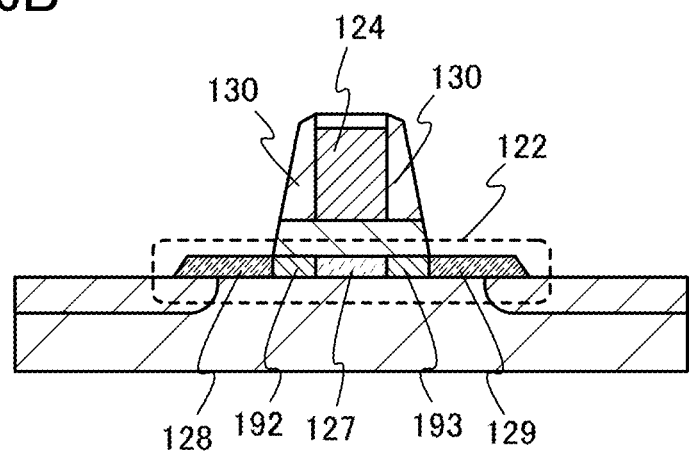

In FIG. 16A, the oxide semiconductor film 122 before the dopant is added, the gate insulating film 123 over the oxide semiconductor film 122, the gate electrode 124 over the gate insulating film 123, the insulating film 131 over the gate electrode 124, and the sidewall 130 provided on the side portions of the gate electrode 124 over the gate insulating film 123 are illustrated. In the above state, the dopant is added to the oxide semiconductor film 122 with the use of the gate electrode 124, the insulating film 131, and the sidewall 130 as masks, so that as illustrated in FIG. 16B, the first region 127 which overlaps with the gate electrode 124 and at least part of which serves as a channel formation region, third regions 192 and 193 which serve as LDD regions and overlap with the sidewall 130 and between which the first region 127 is sandwiched, and the second regions 128 and 129 which serve as a source and a drain and between which the first region 127 and the third regions 192 and 193 are sandwiched can be formed in the oxide semiconductor film 122.

For example, in the case where nitrogen is used as the dopant, the concentration of nitrogen atoms in the second regions 128 and 129 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the third regions 192 and 193 is preferably higher than or equal to $5 \times 10^{18}/cm^3$ and lower than $5 \times 10^{19}/cm^3$. The third regions 192 and 193 having the dopant concentration lower than the second regions 128 and 129 are provided, so that a negative shift of the threshold voltage due to a short-channel effect can be reduced.

This embodiment can be implemented by being combined as appropriate with any of the above-described embodiments.

Embodiment 4

In this embodiment, an example of a method for manufacturing a semiconductor device part of which has the structure illustrated in FIG. 39 will be described.

Note that a semiconductor material such as germanium, silicon germanium, or single crystal silicon carbide as well as silicon may be used for the n-channel transistor 102$n$ and the p-channel transistor 102$p$ included in the memory element. For example, the n-channel transistor 102$n$ and the p-channel transistor 102$p$ including silicon can be formed using a single crystal semiconductor substrate such as a silicon wafer, a silicon thin film which is formed by an SOI method, a silicon thin film which is formed by a vapor deposition method, or the like.

Figure 42A:
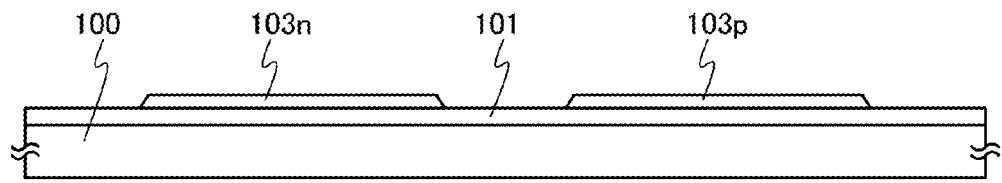
FIGS. 42A to 42D illustrate a method for manufacturing a semiconductor device.

In this embodiment, first, as illustrated in FIG. 42A, the insulating film 101 and the island-shaped single crystal semiconductor films 103$n$ and 103$p$ are formed over the substrate 100.

Although there is no particular limitation on a material which can be used as the substrate 100, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 100. In the case where a glass substrate is used and the temperature of the heat treatment performed later is high, a glass substrate whose strain point is higher than or equal to 730° C. is preferably used.

In this embodiment, a semiconductor substrate of single crystal silicon is used as the substrate 100. A single crystal semiconductor substrate has surface flatness higher than a glass substrate. Accordingly, variation in thickness of an insulating film, a conductive film, or the like due to surface unevenness of the substrate can be prevented; thus, electric characteristics of semiconductor elements can be uniform, even when semiconductor elements such as transistors are miniaturized.

The insulating film 101 is formed using an insulating material such as silicon oxide, silicon nitride oxide, silicon oxynitride, or silicon nitride. The insulating film 101 may be a single insulating film or a stack of plural insulating films.

For example, in the case of using silicon oxide for the insulating film 101, the insulating film 101 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 101 may be subjected to oxygen plasma treatment to increase the density. In the case of using silicon nitride for the insulating film 101, the insulating film 101 can be formed using a mixed gas of silane and ammonia by a vapor deposition method such as a plasma CVD method. Further, when the insulating film 101 is formed using silicon nitride oxide, the insulating film 101 can be formed using a mixed gas of silane and ammonia or a mixed gas of silane and nitrogen oxide by a vapor deposition method such as a plasma CVD method.

Alternatively, a silicon oxide film formed by a chemical vapor deposition method using an organosilane gas may be used as the insulating film 101. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Further alternatively, in the case where a semiconductor substrate of single crystal silicon is used as the substrate 100, the insulating film 101 can be formed using an oxide film formed by oxidizing the surface of the substrate 100. Thermal oxidation treatment for forming this oxide film may be dry oxidation and may be performed in an oxidation atmosphere to which a halogen-containing gas is added. As the gas containing a halogen, one type or plural types of gases selected from HCl, HF, $NF_3$, HBr, Cl, ClF, $BCl_3$, F, $Br_2$, and the like can be used.

For example, in the case where HCl is used, heat treatment is performed at a temperature of 700° C. or higher in an atmosphere containing HCl at 0.5 volume % to 10 volume % (preferably 3 volume %) with respect to oxygen. Thermal oxidation is preferably performed at a heating temperature of greater than or equal to 950° C. and less than or equal to 1100° C. Treatment time may be 0.1 hours to 6 hours, preferably 0.5 hours to 1 hour. The thickness of the insulating film 101 to be formed can be set in the range of 15 nm to 1100 nm (preferably 60 nm to 300 nm), for example 150 nm.

By this thermal oxidation treatment in an atmosphere containing a halogen, the insulating film 101 can contain a halogen. When the insulating film 101 contains a halogen element at a concentration of $1\times10^{17}$ atoms/cm$^3$ to $5\times10^{20}$ atoms/cm$^3$, the insulating film 101 captures an impurity such as metal; therefore, the contamination of the semiconductor films 103n and 103p to be formed later can be prevented. For example, by the action of chlorine, an impurity such as metal turns into a volatile chloride and is released into an air phase, thereby being removed from the semiconductor films 103n and 103p.

In this embodiment, an example in which the semiconductor films 103n and 103p are formed using single crystal silicon is given as a method for forming the transistor included in the memory element. Here, a specific example of a method for forming the single crystal semiconductor films 103n and 103p is briefly described. First, an ion beam including ions which are accelerated by an electric field enters a bond substrate which is the semiconductor substrate of single crystal silicon and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 100 which is provided with the insulating film over the surface are attached to each other so that the insulating film is sandwiched therebetween. After the bond substrate and the substrate 100 overlap with each other, a pressure of approximately 1 N/cm$^2$ to 500 N/cm$^2$, preferably 11 N/cm$^2$ to 20 N/cm$^2$ is applied to part of the bond substrate and part of the substrate 100 so that the substrates are attached to each other. When the pressure is applied, bonding between the bond substrate and the insulating film 101 starts from the parts, which results in bonding of the entire surface where the bond substrate and the insulating film 101 are in close contact with each other. After that, heat treatment is performed, so that microvoids that exist in the fragile layer are combined and the microvoids increase in volume. Accordingly, a single crystal semiconductor film which is part of the bond substrate is separated from the bond substrate along the fragile layer. The heat treatment is performed at a temperature not exceeding the strain point of the substrate 100. Then, the single crystal semiconductor film is processed into a desired shape by etching or the like, so that the semiconductor films 103n and 103p can be formed.

In this embodiment, the substrate 100 which is a semiconductor substrate of single crystal silicon is subjected to heat treatment at 950° C. in an oxygen atmosphere, whereby a silicon oxide film having a thickness of 400 nm is formed on the substrate 100. Next, over the silicon oxide film, a silicon nitride oxide film having a thickness of 50 nm is formed by a plasma CVD method. On the other hand, the bond substrate which is a semiconductor substrate of single crystal silicon is subjected to heat treatment at 950° C. in an atmosphere in which HCl is included in oxygen, whereby a silicon oxide film having a thickness of 100 nm is formed on the bond substrate. Then, the substrate 100 and the bond substrate are attached to each other so that the silicon nitride oxide film over the substrate 100 is in contact with the silicon oxide film on the bond substrate. Then, a single crystal semiconductor film which is part of the bond substrate is separated from the bond substrate along a fragile layer. Accordingly, in this embodiment, the insulating film 101 has a structure in which the silicon oxide film having a thickness of 400 nm, the silicon nitride oxide film having a thickness of 50 nm, and a silicon oxide film having a thickness of 100 nm are stacked in this order from the substrate 100 side.

In order to control the threshold voltage, an impurity element imparting p-type conductivity, such as boron, aluminum, or gallium, or an impurity element imparting n-type conductivity, such as phosphorus or arsenic, may be added to each of the semiconductor films 103n and 103p. An impurity element for controlling the threshold voltage may be added to the semiconductor film which has not been patterned or may be added to the patterned semiconductor films 103n and 103p. Further, the impurity element for controlling the threshold voltage may be added to the bond substrate. Furthermore, the impurity element may be added to the bond substrate in order to roughly control the threshold voltage, and then the impurity element may be further added to the semiconductor film which has not been patterned or the patterned semiconductor films 103n and 103p in order to finely control the threshold voltage.

Although an example in which a single crystal semiconductor film is used is described in this embodiment, the present invention is not limited to this structure. For example, a polycrystalline semiconductor film which is formed over the insulating film 101 by a vapor deposition method may be used. Alternatively, a semiconductor film formed by a vapor deposition method may be crystallized by a known technique to form a polycrystalline semiconductor film. As the known technique of crystallization, a laser crystallization method using a laser beam and a crystallization method using a catalytic element are given. Alternatively, a crystallization method using a catalytic element and a laser crystallization method can be combined. When a heat-resistant substrate such as a quartz substrate is used, it is possible to use a thermal crystallization method using an electrically heated oven, a lamp annealing crystallization method using infrared light, a crystallization method using a catalytic element, or a crystallization method using a high-temperature annealing method at approximately 950° C.

Figure 42B:
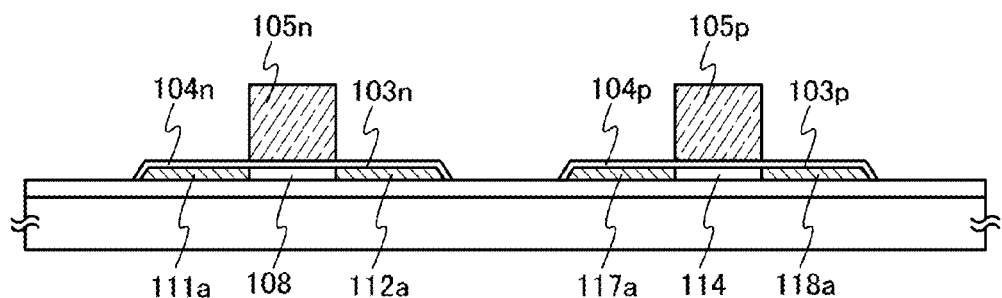

Next, as illustrated in FIG. 42B, the gate insulating film 104n and the gate insulating film 104p are formed over the semiconductor film 103n and the semiconductor film 103p, respectively. Then, the gate electrode 105n is formed over the gate insulating film 104n in a position overlapping with the semiconductor film 103n, and the gate electrode 105p is formed over the gate insulating film 104p in a position overlapping with the semiconductor film 103p. Then, an impurity element imparting one conductivity type is added to each of the semiconductor films 103n and 103p with the use of the gate electrodes 105n and 105p as masks. Specifically, after a mask is formed to cover the semiconductor film 103n, an impurity element imparting p-type conductivity is added to the semiconductor film 103p. Through addition of the impurity element, the first region 114 overlapping with the gate electrode 105p and the low-concentration impurity regions 117a and 118a between which the first region 114 is sandwiched are formed in the semiconductor film 103p. Next, after a mask is formed to cover the semiconductor film 103p, an impurity element imparting n-type conductivity is added to the semiconductor film 103n. Through addition of the impurity element, the first region 108 overlapping with the gate electrode 105n and the low-concentration impurity regions 111a and 112a between which the first region 108 is sandwiched are formed in the semiconductor film 103n.

The gate insulating films 104n and 104p can be formed by oxidation or nitridation of surfaces of the semiconductor films 103n and 103p by high-density plasma treatment, thermal oxidation treatment, or the like. The thickness of each of the gate insulating films 104n and 104p can be, for example, greater than or equal to 1 nm and less than or equal to 100 nm, preferably greater than or equal to 10 nm and less than or equal to 50 nm.

In this embodiment, heat treatment at 950° C. in an oxygen atmosphere for 25 minutes is performed and then heat treatment at 950° C. in a nitrogen atmosphere for one hour is performed. In this manner, the surfaces of the semiconductor films 103n and 103p are thermally oxidized, whereby the gate insulating films 104n and 104p which are silicon oxide films each having a thickness of 15 nm are formed.

In the case of the high-density plasma treatment, for example, a mixed gas of a rare gas such as He, Ar, Kr, or Xe and oxygen, nitrogen oxide, ammonia, nitrogen, or the like is used. In this case, by exciting plasma by introduction of microwaves, plasma with a low electron temperature and high density can be generated. By oxidation or nitridation of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, the surfaces of the semiconductor films 103n and 103p are oxidized or nitrided using nitrous oxide ($N_2O$) diluted with Ar by 1 time to 3 times (flow ratio) by application of a microwave (2.45 GHz) power of 3 kW to 5 kW at a pressure of 10 Pa to 30 Pa. By this treatment, insulating films each having a thickness of 1 nm to 10 nm (preferably 2 nm to 6 nm) are formed. Further, nitrous oxide ($N_2O$) and silane ($SiH_4$) are introduced, and a microwave (2.45 GHz) power of 3 kW to 5 kW is applied at a pressure of 10 Pa to 30 Pa to form a silicon oxynitride film by a vapor deposition method, whereby the gate insulating films are formed. With a combination of a solid-phase reaction and a reaction by a vapor deposition method, the gate insulating films with low interface state density and excellent withstand voltage can be formed.

The oxidation or nitridation of the semiconductor films by the high-density plasma treatment proceeds by solid-phase reaction. Thus, interface state density between the gate insulating film 104n and the semiconductor film 103n and interface state density between the gate insulating film 104p and the semiconductor film 103p can be extremely low. Further, by direct oxidation or nitridation of the semiconductor films 103n and 103p by high-density plasma treatment, variation in the thickness of the insulating films to be formed can be suppressed. Moreover, in the case where the semiconductor films have crystallinity, the surfaces of the semiconductor films are oxidized with solid reaction by the high-density plasma treatment to restrain fast oxidation only in a crystal grain boundary; therefore, the gate insulating films with uniformity and low interface state density can be formed. A transistor in which the insulating film formed by the high-density plasma treatment is used as part of the gate insulating film or as the whole gate insulating film can have less variation in electric characteristics.

Each of the gate insulating films may be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

In this specification, an oxynitride refers to a material containing a larger amount of oxygen than that of nitrogen, and a nitride oxide refers to a material containing a larger amount of nitrogen than that of oxygen.

A conductive film is formed so as to cover the gate insulating films 104n and 104p and then is processed (patterned) into a predetermined shape, so that the gate electrodes 105n and 105p can be formed. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. Alternatively, an alloy containing any of the aforementioned metals as its main component or a compound containing any of the aforementioned metals may be used. Further alternatively, the conductive film may be formed using a semiconductor such as polycrystalline silicon which is formed by addition of an impurity element such as phosphorus, to a semiconductor film.

Note that each of the gate electrodes 105n and 105p may be formed using a single-layer conductive film or a stack of a plurality of conductive films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment aimed at thermal activation can be performed in subsequent steps after forming the two conductive films. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of using a three-layer structure in which three conductive films are stacked, a stacked structure of a molybdenum film, an aluminum film, and a molybdenum film is preferable.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can be used as each of the gate electrodes 105n and 105p.

In this embodiment, the gate electrodes 105n and 105p each in which tungsten with a thickness of approximately 170 nm is stacked over tantalum nitride with a thickness of approximately 30 nm are used.

Alternatively, the gate electrodes 105n and 105p may be selectively formed by a droplet discharge method without using a mask. A droplet discharge method is a method for forming a predetermined pattern by discharge or ejection of a droplet containing a predetermined composition from an orifice, and includes an inkjet method and the like in its category.

In addition, the gate electrodes 105n and 105p can be formed in the following manner; a conductive film is formed, and then the conductive film is etched into desired a tapered shape by an inductively coupled plasma (ICP) etching method with appropriate control of the etching conditions (e.g., the amount of electric power applied to a coiled electrode, the amount of electric power applied to an electrode on the substrate side, and the electrode temperature on the substrate side). In addition, angles and the like of the tapered shapes may also be controlled by a shape of a mask. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 42C:
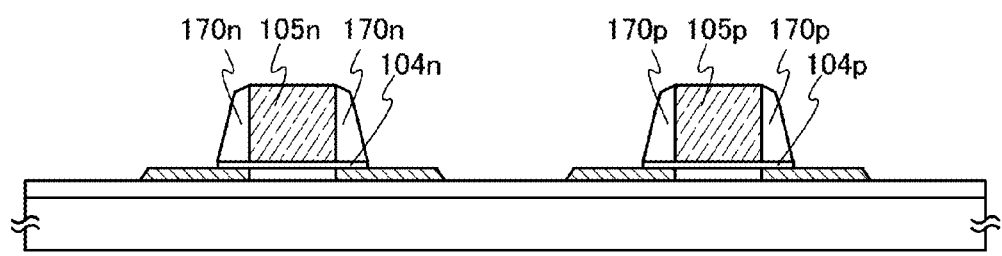

Next, after an insulating film is formed to cover the gate insulating films 104n and 104p and the gate electrodes 105n and 105p, the insulating film is processed by etching or the like; thus, as illustrated in FIG. 42C, the sidewall 170n is formed on side portions of the gate electrode 105n and the sidewall 170p is formed on side portions of the gate electrode 105p. In this embodiment, after the insulating film in which a silicon oxynitride film having a thickness of 100 nm and a silicon oxide film having a thickness of 200 nm are stacked in this order is formed to cover the gate electrodes 105n and 105p, the insulating film is processed by dry etching, so that the sidewall 170n and the sidewall 170p are formed.

Note that through the above etching, a portion of the gate insulating film 104n which is not covered with the sidewall 170n or the gate electrode 105n is removed, and a portion of the gate insulating film 104p which is not covered with the sidewall 170p or the gate electrode 105p is removed.

Figure 42D:
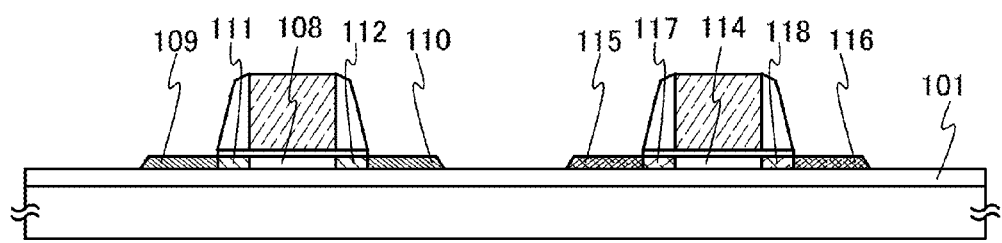

Next, as illustrated in FIG. 42D, an impurity element imparting one conductivity type is added to each of the semiconductor films 103n and 103p with the use of the gate electrodes 105n and 105p and the sidewalls 170n and 170p as masks. Specifically, after a mask is formed to cover the semiconductor film 103n, an impurity element imparting p-type conductivity is added to the semiconductor film 103p. Through addition of the impurity element, the impurity is further added to part of the low-concentration impurity regions 117a and 118a, whereby the first region 114 overlapping with the gate electrode 105p, the third regions 117 and 118 which overlap with the sidewall 170p and between which the first region 114 is sandwiched, and the second regions 115 and 116 between which the first region 114 and the third regions 117 and 118 are sandwiched are formed in the semiconductor film 103p. Next, after a mask is formed to cover the semiconductor film 103p, an impurity element imparting n-type conductivity is added to the semiconductor film 103n. Through addition of the impurity element, the impurity is further added to part of the low-concentration impurity regions 111a and 112a, whereby the first region 108 overlapping with the gate electrode 105n, the third regions 111 and 112 which overlap with the sidewall 170n and between which the first region 108 is sandwiched, and the second regions 109 and 110 between which the first region 108 and the third regions 111 and 112 are sandwiched are formed in the semiconductor film 103n.

Since the third regions 117 and 118 overlap with the sidewall 170p, the third regions 117 and 118 have the concentration of the impurity imparting p-type conductivity lower than the second regions 115 and 116. Further, since the third regions 111 and 112 overlap with the sidewall 170n, the third regions 111 and 112 have the concentration of the impurity imparting n-type conductivity lower than the second regions 109 and 110.

Note that in this embodiment, the low-concentration impurity regions 111a and 112a and the low-concentration impurity regions 117a and 118a are formed through the first addition of the impurities, and then the third regions 111 and 112 and the third regions 117 and 118 serving as LDD regions are formed through the second addition of the impurities; however, an embodiment of the present invention is not limited to this structure. For example, it is possible to form the third regions 111 and 112 and the third regions 117 and 118 serving as LDD regions without performing the first addition of the impurities, when the second addition of the impurities is performed under such a condition that the impurities enter portions under the sidewall 170n and the sidewall 170p. Alternatively, offset regions may be provided between the first region 108 and the second regions 109 and 110 or between the first region 114 and the second regions 115 and 116 in such a manner that, without performing the first addition of the impurities, the second addition of the impurities is performed under a condition that the impurities are less likely to enter portions under the sidewall 170n and the sidewall 170p. The impurity concentration in the offset regions is preferably substantially equal to that in the first region 108 or the first region 114.

Figure 43A:
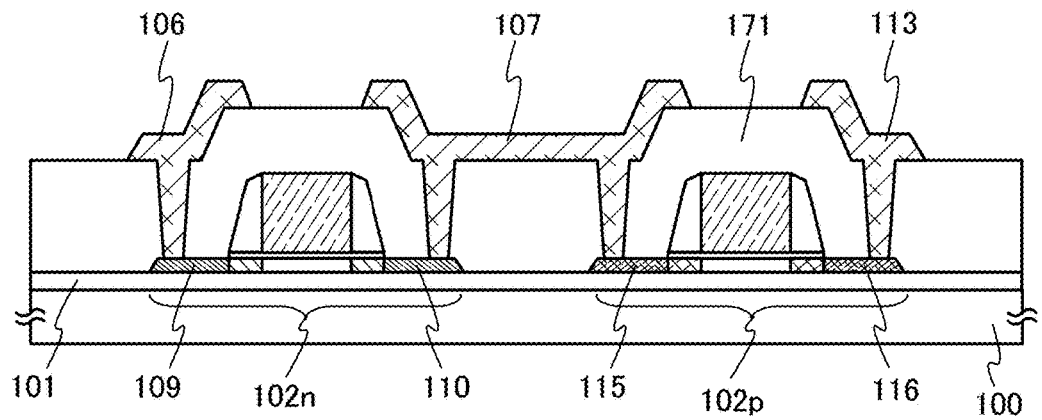
FIGS. 43A to 43C illustrate a method for manufacturing a semiconductor device.

Next, as illustrated in FIG. 43A, an insulating film 171 is formed to cover the semiconductor films 103n and 103p, the gate electrodes 105n and 105p, the sidewalls 170p and 170n, and the insulating film 101. Then, opening portions are formed in the insulating film 171 by etching or the like; thus, part of the second regions 109 and 110 and part of the second regions 115 and 116 are exposed. Then, the conductive film 106 in contact with the second region 109, the conductive film 107 in contact with the second region 110 and the second region 115, and the conductive film 113 in contact with the second region 116 are formed over the insulating film 171.

Specifically, the insulating layer 171 can be an inorganic insulating film of silicon oxide, silicon nitride, silicon nitride oxide, silicon oxynitride, aluminum nitride, aluminum nitride oxide, or the like. In particular, a low dielectric constant (low-k) material is preferably used for the insulating film 171 because capacitance caused by an overlap of electrodes or wirings can be sufficiently reduced. Note that a porous insulating film containing any of the above materials may be used as the insulating film 171. Since the porous insulating film has lower dielectric constant than a dense insulating film, parasitic capacitance due to electrodes or wirings can be further reduced.

In this embodiment, a silicon oxynitride film having a thickness of 500 nm is used as the insulating film 171. Note that the case where the insulating film 171 is a single insulating film is described as an example in this embodiment; however, the insulating film 171 may be a stack of a plurality of insulating films.

As the conductive film to be the conductive films 106, 107, and 113, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film to be the conductive films 106, 107, and 113 may have a single-layer structure or a stacked structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given.

Alternatively, the conductive film to be the conductive films 106, 107, and 113 may be formed using a conductive metal oxide. As the conductive metal oxide, indium oxide, tin oxide, zinc oxide, a mixture of indium oxide and tin oxide, a mixture of indium oxide and zinc oxide, or the metal oxide material to which silicon or silicon oxide is added can be used. In this embodiment, a tungsten film having a thickness of approximately 300 nm is used as the conductive film 106, the conductive film 107, and the conductive film 113.

Through the above steps, the n-channel transistor 102$n$ and the p-channel transistor 102$p$ included in the memory element can be manufactured.

Figure 43B:
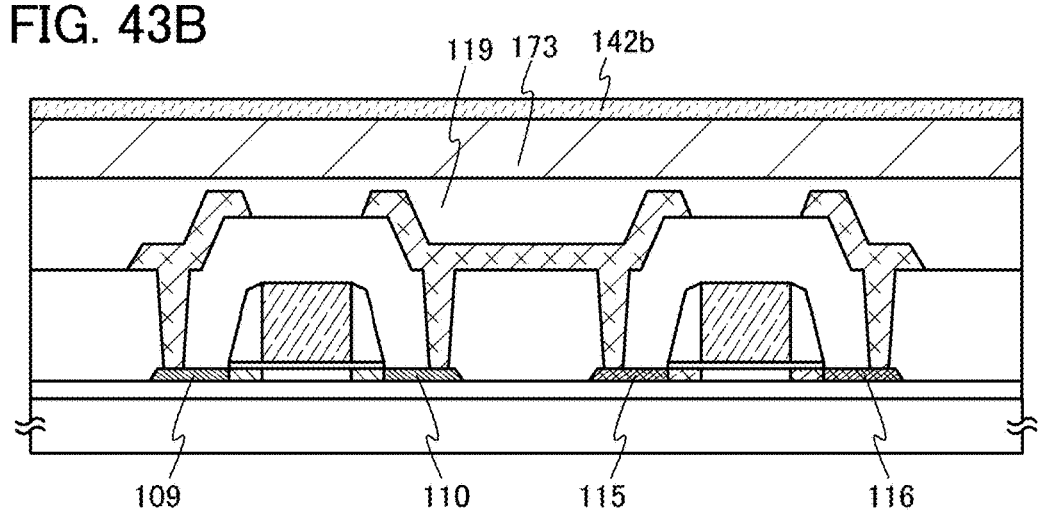

Next, as illustrated in FIG. 43B, the insulating film 119 and the insulating film 173 are formed in this order over the insulating film 171 to cover the conductive films 106, 107, and 113, and then, the oxide semiconductor film 142$b$ is formed over the insulating film 173.

The insulating film 119 may have either a single layer structure or a stacked structure of two or more layers, and preferably has a highly planar surface. For example, silicon oxide, silicon nitride, silicon oxynitride, silicon nitride oxide, or the like can be used for the insulating film 119. The insulating film 119 can be formed by a CVD method such as an LPCVD method, a plasma CVD method, a photo CVD method, or a thermal CVD method.

For the insulating film 119, a silicon oxide film formed by chemical vapor deposition using organosilane can be used. For organosilane, tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), or the like can be used. It is needless to say that silicon oxide, silicon oxynitride, silicon nitride, silicon nitride oxide, or the like may be formed using inorganic silane such as monosilane, disilane, or trisilane.

In this embodiment, the insulating film 119 including silicon oxide is formed by an LPCVD method.

In order to suppress variation of electric characteristics of the transistor 121 to be formed later, a surface of the oxide semiconductor film 142$b$ preferably has high flatness. In order to increase the flatness of the oxide semiconductor film 142$b$, high flatness of a surface of the insulating film 173 is preferably ensured. However, in order to prevent an impurity such as hydrogen from entering the vicinity of the interface between the insulating film 173 and the oxide semiconductor film 142$b$, it is preferable to form the oxide semiconductor film 142$b$ successively after formation of the insulating film 173 without exposure of the insulating film 173 to the air. Therefore, in this embodiment, the surface of the insulating film 119 positioned under the insulating film 173 is subjected to planarization treatment. With the structure, flatness of the surface of the insulating film 173 can be ensured even when the surface of the insulating film 173 is not subjected to planarization treatment. In addition, the successive formation of the insulating film 173 and the oxide semiconductor film 142$b$ can be achieved while the flatness of the surface of the insulating film 173 is ensured.

The planarization treatment of the insulating film 119 can be performed by polishing treatment such as a chemical mechanical polishing (CMP) method or a liquid jet polishing method, etching treatment such as dry etching or wet etching, or a combination of polishing treatment and etching treatment.

In this embodiment, the case where the insulating film 119 is subjected to CMP treatment as the planarization treatment is described. For example, the insulating film 119 is subjected to planarization treatment under the following conditions: a polyurethane polishing cloth is used; silica slurry (a grain size of 60 nm) is used as slurry; the slurry flow rate is greater than or equal to 100 ml/min and less than or equal to 500 ml/min; the polishing pressure is higher than or equal to 0.005 MPa and lower than or equal to 0.08 MPa; the spindle rotation speed is greater than or equal to 20 rpm and less than or equal to 50 rpm; and the table rotation speed is greater than or equal to 20 rpm and less than or equal to 50 rpm.

In this embodiment, the thickness of the insulating film 119 which has been subjected to polishing by the CMP method is 300 nm.

The insulating film 173 is formed by a sputtering method, a CVD method, or the like. The insulating film 173 is preferably an insulating film from which oxygen is released by application of heat. An insulating film which contains oxygen at a proportion exceeding the stoichiometric proportion is preferably used as the insulating film from which oxygen is released by application of heat. When the insulating film from which oxygen is released by application of heat is subjected to heat treatment, oxygen can be released and the released oxygen can be diffused into (or supplied to) an oxide semiconductor film to be formed later. Examples of the insulating film 173 include films of silicon oxide, silicon oxynitride, silicon nitride oxide, gallium oxide, hafnium oxide, yttrium oxide, and the like. The insulating film 173 formed by a sputtering method can easily release oxygen by application of heat, which is preferable. The insulating film 173 may be formed using a single insulating film or a plurality of stacked insulating films.

The thickness of the insulating film 173 is greater than or equal to 50 nm and less than or equal to 800 nm, preferably greater than or equal to 200 nm and less than or equal to 500 nm. With the use of the thick insulating film 173, the amount of oxygen released from the insulating film 173 can be increased, and the interface state density at the interface between the insulating film 173 and the oxide semiconductor film 142$b$ to be formed later can be reduced.

In this embodiment, a silicon oxide film having a thickness of 200 nm, which is formed by a sputtering method, is used as the insulating film 173. In the case of forming the insulating film 173 by a sputtering method, an oxygen gas, a mixed gas of oxygen and a rare gas, or the like can be used as a deposition gas. Further, when the amount of oxygen in the deposition gas is increased, the amount of oxygen contained in the insulating film 173 can be increased, which is preferable. Typically, the oxygen concentration in the deposition gas is preferably higher than or equal to 6% and lower than or equal to 100%.

In the case where a silicon oxide film is formed as the insulating film 173, an RF sputtering method is preferably used under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the target and the substrate (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of $O_2/(O_2+Ar)$ in the deposition gas is higher than or equal to 1% and lower than or equal to 100% (preferably higher than or equal to 6% and lower than or equal to 100%). Note that a silicon target may be used as the target instead of the quartz (preferably synthetic quartz) target. In addition, oxygen alone may be used as the deposition gas.

The thickness of the oxide semiconductor film 142b is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust on a surface of the insulating film 173 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film, the materials described above can be used. In this embodiment, an In—Ga—Zn-based oxide semiconductor thin film with a thickness of 20 nm, which is obtained by a sputtering method using a target including indium (In), gallium (Ga), and zinc (Zn), is used as the oxide semiconductor film. As the target, a target having a composition ratio of, for example, $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling rate of the target including In, Ga, and Zn is 90% or higher and 100% or lower, and preferably 95% or higher and lower than 100%. With the use of the target with high filling rate, a dense oxide semiconductor film is formed.

In the case where an In—Zn-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=1.5:1 to 15:1 in an atomic ratio ($In_2O_3$:ZnO=3:4 to 15:2 in a molar ratio). r example, in a target used for formation of an In—Zn-based oxide semiconductor which has an atomic ratio of In:Zn:O=X:Y:Z, the relation of Z>1.5X+Y is satisfied. The mobility can be improved by keeping the ratio of Zn within the above range.

In the case where an In—Sn—Zn-based material is used as the oxide semiconductor, a composition ratio of the target to be used is preferably In:Sn:Zn=1:2:2, 2:1:3, 1:1:1, or 4:9:7 in an atomic ratio.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the above-described target is used. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. Moreover, damage due to sputtering is reduced. In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

An example of the film formation conditions is as follows: the distance between the substrate and the target is 100 mm, the pressure is 0.4 Pa, the power of the direct-current (DC) power supply is 0.5 kW, and the atmosphere contains argon and oxygen (the flow rate of argon is 30 sccm and the flow rate of oxygen is 15 sccm). Note that a pulsed direct-current (DC) power supply is preferable because dust generated in deposition can be reduced and the film thickness can be made uniform.

When the leakage rate of the treatment chamber of the sputtering apparatus is set at $1\times10^{-10}$ Pa·m$^3$/s or less, entry of impurities such as an alkali metal or hydride into the oxide semiconductor film that is being deposited by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like entering the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that as pretreatment for deposition, an impurity such as moisture or hydrogen that is adsorbed on the insulating films and the conductive films formed over the substrate 100 be eliminated and exhausted by preheating of the substrate 100 over which the layer up to the insulating film 173 are formed in a preheating chamber of a sputtering apparatus. The temperature for the preheating is higher than or equal to 100° C. and lower than or equal to 400° C., preferably higher than or equal to 150° C. and lower than or equal to 300° C. As an evacuation unit, a cryopump is preferably provided in the preheating chamber. Note that this preheating treatment can be omitted. This preheating may also be performed in a similar manner before formation of an insulating film 143a to be performed later.

Note that the oxide semiconductor film deposited by a sputtering method or the like contains a large amount of moisture or hydrogen (including a hydroxyl group) as an impurity in some cases. Moisture or hydrogen easily forms a donor level and thus is an impurity in the oxide semiconductor. According to an embodiment of the present invention, in order to reduce an impurity such as moisture or hydrogen in the oxide semiconductor film 142*b* (dehydrate or dehydrogenate the oxide semiconductor film 142*b*), the oxide semiconductor film 142*b* is subjected to heat treatment in a reduced-pressure atmosphere, an atmosphere of an inert gas such as nitrogen or a rare gas, an oxygen gas atmosphere, or an ultra dry air atmosphere (the air whose moisture amount is 20 ppm (−55° C. by conversion into a dew point) or less, preferably 1 ppm or less, more preferably 10 ppb or less, in the case where measurement is performed with a dew point meter of a cavity ring down laser spectroscopy (CRDS) method).

Moisture or hydrogen in the oxide semiconductor film 142*b* can be eliminated when the oxide semiconductor film 142*b* is subjected to heat treatment. Specifically, heat treatment is performed at temperature higher than or equal to 250° C. and lower than or equal to 750° C., preferably higher than or equal to 400° C. and lower than the strain point of the substrate. For example, heat treatment may be performed at 500° C. for approximately longer than or equal to three minutes and shorter than or equal to six minutes. When an RTA method is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6N (99.9999%), more preferably greater than or equal to 7N (99.99999%) (i.e., the impurity concentration is preferably less than or equal to 1 ppm, more preferably less than or equal to 0.1 ppm).

Through the above steps, the concentration of hydrogen in the oxide semiconductor film 142*b* can be reduced. In addition, by using the oxide semiconductor film in which the hydrogen concentration is reduced, it is possible to manufacture a transistor with high withstand voltage and an extremely small off-state current. The above heat treatment can be performed at any time after the oxide semiconductor film 142*b* is formed.

Note that the oxide semiconductor film 142*b* may be amorphous or may have crystallinity. For the oxide semiconductor film having crystallinity, a crystalline oxide semiconductor including a crystal with c-axis alignment (also referred to as c-axis aligned crystalline oxide semiconductor (CAAC-OS)), which has a triangular or hexagonal atomic arrangement when seen from the direction of an a-b plane, a surface, or an interface, may be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). CAAC-OS is preferable because an effect of increasing reliability of a transistor can be obtained.

Figure 43C:
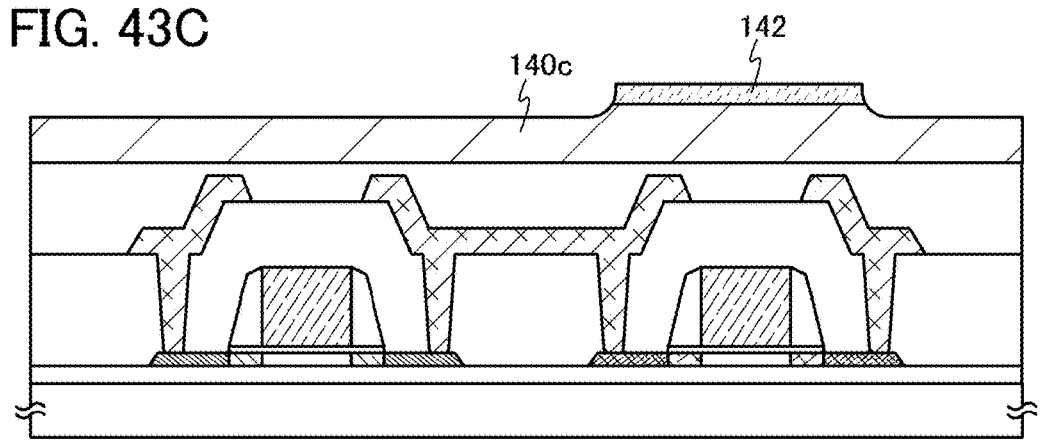

Next, as illustrated in FIG. 43C, the oxide semiconductor film 142*b* and the insulating film 173 are processed by etching or the like, so that the island-shaped oxide semiconductor film 142 and the third oxide insulating film 140*c* which is part of the insulating film 140 to be formed later are formed. A region of the third oxide insulating film 140*c*, which does not overlap with the island-shaped oxide semiconductor film 142, is partly etched.

Note that etching for forming the oxide semiconductor film 142 may be wet etching, dry etching, or both dry etching and wet etching. As the etching gas for dry etching, a gas including chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used.

A resist mask used for forming the oxide semiconductor film 142 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attach onto surfaces of the oxide semiconductor film 142*b* and the insulating film 173 are removed.

In this embodiment, the oxide semiconductor film 142*b* and the insulating film 173 are processed by dry etching. For example, dry etching is performed under the following conditions: the ICP power is 45 W; the bias power is 100 W; the pressure is 1.9 Pa; the etching gas is a mixed gas of $BCl_3$ and $Cl_2$; the flow rate of $BCl_3$ is 60 sccm; and the flow rate of $Cl_2$ is 20 sccm. When dry etching is performed under such conditions, after the island-shaped oxide semiconductor film 142 is formed, the third oxide insulating film 140*c* can be formed from the insulating film 173. It is preferable that an impurity including hydrogen not be included in the etching.

In the case where the oxide semiconductor film 142 is formed by dry etching, when the vicinities of side surfaces of the oxide semiconductor film 142, i.e., end portions of the oxide semiconductor film 142 are exposed to plasma including chlorine radicals, fluorine radicals, or the like, metal atoms exposed at the end portions of the oxide semiconductor film 142 are bonded to the chlorine radicals, fluorine radicals, or the like. At this time, the metal atoms bonded to the chlorine atoms or the fluorine atoms are released and consequently oxygen atoms whose bonds to the metal atoms are broken in the oxide semiconductor film 142 become active. The active oxygen atoms are easily reacted and released. Thus, oxygen deficiency is likely to be caused at the end portions of the oxide semiconductor film 142.

When the end portions of the oxide semiconductor film exposed in the etching step are active, oxygen is extracted in a reduced-pressure atmosphere or a reducing atmosphere, or in heat treatment in a reduced-pressure atmosphere, and oxygen deficiency is caused at the end portions of the oxide semiconductor film. Some of the oxygen deficiency becomes donor and generates an electron which is a carrier, so that the end portions of the oxide semiconductor film 142 have n-type conductivity.

In the case where the conductive films 145 and 146 to be formed later are in contact with the end portions of the oxide semiconductor film 142 having n-type conductivity, leakage current is generated between the conductive films 145 and 146 through the end portions. The leakage current causes the off-state current of the transistor to be increased.

Figure 44A:
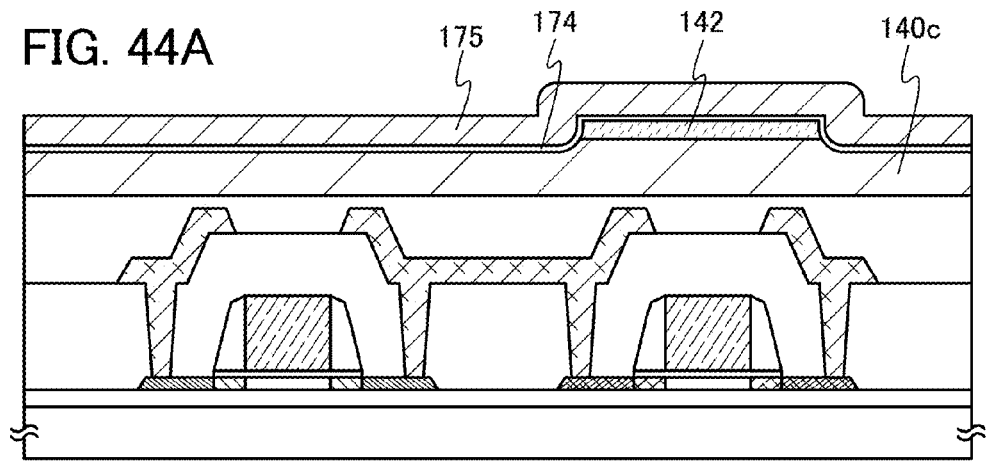
FIGS. 44A to 44C illustrate a method for manufacturing a semiconductor device.

Next, as illustrated in FIG. 44A, the insulating film 174 and the insulating film 175 are formed over the third oxide insulating film 140*c* and the oxide semiconductor film 142. The insulating film 174 is preferably formed using an insulating film from which oxygen is released by application of heat, like the insulating film 173. The insulating film 175 is formed using an insulating film which prevents diffusion of oxygen. An aluminum oxide film, an aluminum oxynitride film, or the like can be given as an example of the insulating film 175.

The insulating film 174 and the insulating film 175 can be formed by a deposition method similar to the deposition method of the insulating film 173 as appropriate. It is preferable that the insulating film 174 and the insulating film 175 be formed at temperature as low as possible, preferably at room temperature, in order to reduce the amount of oxygen released from the end portions of the oxide semiconductor film 142 when the insulating film 174 and the insulating film 175 are formed.

Even when oxygen deficiency is caused at the end portions of the oxide semiconductor film 142, the insulating film 174 from which oxygen is released by application of heat is in contact with the end portions of the oxide semiconductor film 142 and the insulating film 175 which prevents diffusion of oxygen overlaps with the end portions of the oxide semiconductor film 142 with the insulating film 174 interposed therebetween, so that oxygen can be supplied to the end portions of the oxide semiconductor film 142 from the insulating film 174 by later heat treatment. Therefore, oxygen deficiency at the end portions of the oxide semiconductor film 142 can be reduced.

In this embodiment, a silicon oxide film having a thickness of approximately 20 nm is used as the insulating film 174, and an aluminum oxide film having a thickness of approximately 100 nm is used as the insulating film 175.

Figure 44B:
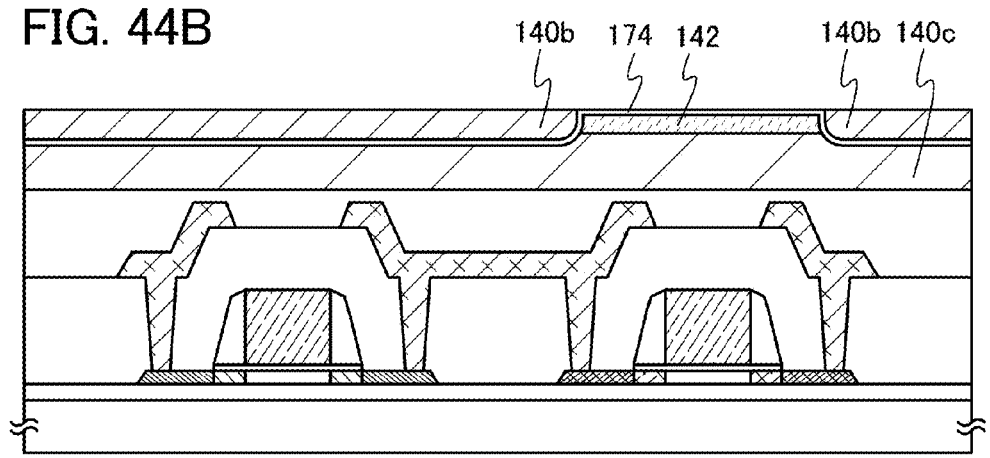

Next, as illustrated in FIG. 44B, the insulating film 175 is subjected to planarization treatment, so that the second oxide insulating film 140*b* is formed from the insulating film 175. The planarization treatment can be performed by polishing treatment such as a chemical mechanical polishing (CMP) method or a liquid jet polishing method, etching treatment such as dry etching or wet etching, or a combination of polishing treatment and etching treatment. In this embodiment, the insulating film 175 is subjected to a CMP method as planarization treatment. The planarization treatment is performed on the insulating film 175 until the insulating film 174 is exposed. In the case where the oxide semiconductor film 142 is as thin as several nanometers to several tens of nanometers, it is preferable that the oxide semiconductor film 142 not be removed by the planarization treatment.

For example, the insulating film 175 is subjected to CMP treatment under the following conditions: a polyurethane polishing cloth is used; silica slurry (a grain size of 60 nm) is used as slurry; the slurry flow rate is greater than or equal to 100 ml/min and less than or equal to 500 ml/min; the polishing pressure is higher than or equal to 0.005 MPa and lower than or equal to 0.08 MPa; the spindle rotation speed is greater than or equal to 20 rpm and less than or equal to 50 rpm; and the table rotation speed is greater than or equal to 20 rpm and less than or equal to 50 rpm.

Figure 44C:
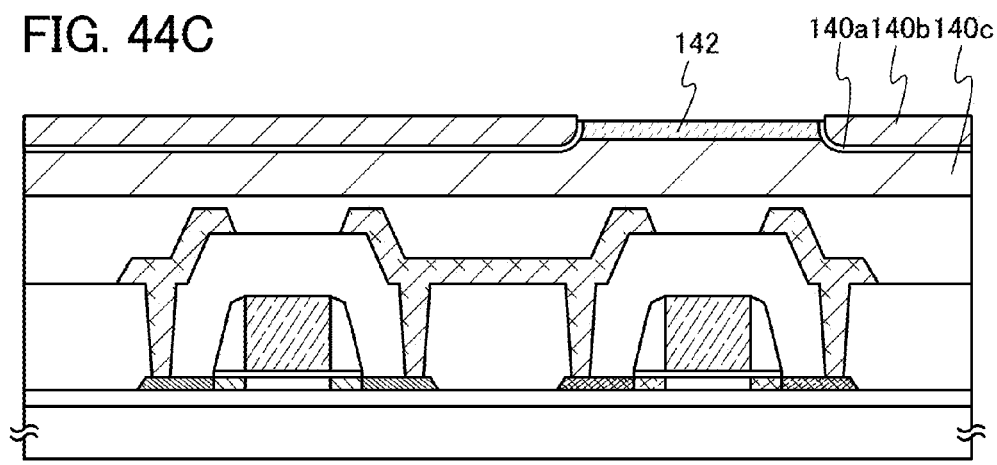

Next, as illustrated in FIG. 44C, the exposed portion of the insulating film 174 is removed, so that a surface of the oxide semiconductor film 142 is exposed. Through the above steps, the first oxide semiconductor film 140*a* is formed from the insulating film 174. The exposed portion of the insulating film 174 is removed by etching treatment. Note that it is necessary to employ the etching condition where a selectivity ratio of the insulating film 174 with respect to the oxide semiconductor film 142 is high. The surface of the oxide semiconductor film 142 is planarized after the exposed portion of the insulating film 174 is removed, so that electric characteristics of the transistor 121 to be completed later can be improved.

For example, dry etching is performed under the following conditions: the ICP power is 500 W; the bias power is 50 W; the pressure is 1.5 Pa; the etching gas is a mixed gas of $CF_4$ and $O_2$; the flow rate of $CF_4$ is 70 sccm; and the flow rate of $O_2$ is 30 sccm. When dry etching is performed under such conditions, the insulating film 174 can be selectively removed to form the first oxide insulating film 140*a*. Further, the oxide semiconductor film 142 can be prevented from being removed. It is preferable that an impurity including hydrogen not be included in the etching.

Heat treatment may be performed after the first oxide insulating film 140*a* is formed. Through the heat treatment, an impurity including hydrogen in the oxide semiconductor film 142 can be removed. Further, oxygen is released from the first oxide insulating film 140*a* and the third oxide insulating film 140*c*, so that oxygen can be supplied to the end portions and the lower portion of the oxide semiconductor film 142 and thus oxygen deficiency can be reduced.

Figure 45A:
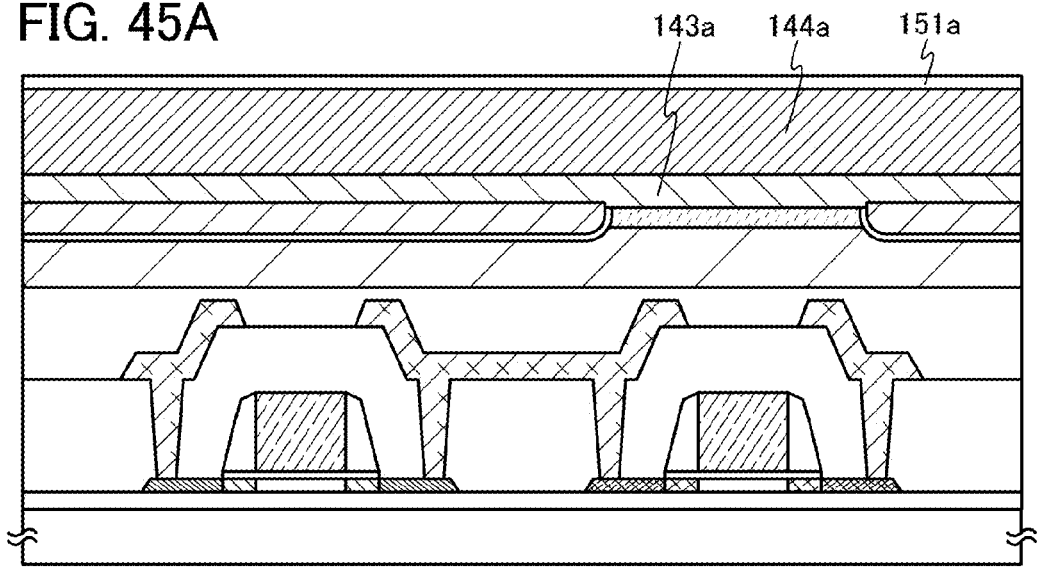
FIGS. 45A to 45C illustrate a method for manufacturing a semiconductor device.

Next, as illustrated in FIG. 45A, the insulating film 143*a*, the conductive film 144*a*, and the insulating film 151*a* are stacked in this order to cover the first oxide insulating film 140*a*, the second oxide insulating film 140*b*, and the oxide semiconductor film 142.

The insulating film 143*a* and the insulating film 151*a* can be formed using any of the materials and the stacked structure similar to those of the gate insulating film 104*n* or the gate insulating film 104*p*. The insulating film 143*a* to be the gate insulating film 143 later preferably includes impurities such as moisture or hydrogen as little as possible, and may be a single-layer insulating film or a plurality of stacked insulating films. When hydrogen is contained in the gate insulating film 143, hydrogen enters the oxide semiconductor film 142 or oxygen in the oxide semiconductor film 142 is extracted by hydrogen, whereby the oxide semiconductor film 142 has lower resistance (n-type conductivity); thus, a parasitic channel might be formed. Therefore, it is important that a film formation method in which hydrogen is not used be employed in order to form the gate insulating film 143 containing hydrogen as little as possible. A material having a high barrier property is preferably used for the gate insulating film 143. For example, a silicon nitride film, a silicon nitride oxide film, an aluminum nitride film, an aluminum nitride oxide film, or the like can be used as the insulating film having a high barrier property. In the case where a plurality of stacked insulating films is used, an insulating film having a low proportion of nitrogen, such as a silicon oxide film or a silicon oxynitride film, is formed on the side closer to the oxide semiconductor film 142 than the insulating film having a high barrier property. Then, the insulating film having a high barrier property is formed to overlap with the oxide semiconductor film 142 with the insulating film having a low proportion of nitrogen interposed therebetween. When the insulating film having a high barrier property is used, impurities such as moisture or hydrogen can be prevented from entering the oxide semiconductor film 142, the gate insulating film 143, or the interface between the oxide semiconductor film 142 and another insulating film and the vicinity thereof. In addition, the insulating film having a low proportion of nitrogen, such as a silicon oxide film or a silicon oxynitride film, is formed in contact with the oxide semiconductor film 142, so that the insulating film formed using a material having a high barrier property can be prevented from being directly in contact with the oxide semiconductor film 142.

In this embodiment, a silicon oxynitride film having a thickness of 20 nm which is formed by a plasma CVD method is used as the insulating film 143*a*, and a silicon oxide film having a thickness of 100 nm which is formed by a sputtering method is used as the insulating film 151*a*.

After the insulating film 143*a* is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less.

Alternatively, heat treatment may be performed on the oxide semiconductor film 142 in an oxygen atmosphere to add oxygen to the oxide semiconductor so that the oxygen deficiency that serves as a donor in the oxide semiconductor film 142 is reduced. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%), further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor film 142 by an ion implantation method, an ion doping method, or the like so that oxygen deficiency that serves as a donor is reduced. For example, oxygen made to be plasma with a microwave of 2.45 GHz may be added to the oxide semiconductor film 142.

The conductive film 144*a* can be formed by a sputtering method or a vacuum evaporation method. As the conductive film for forming the conductive film 144*a*, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

A conductive film to be the conductive film 144*a* may have a single-layer structure or a layered structure of two or more layers. As the conductive film 144*a*, a film containing an element selected from aluminum, chromium, copper, tantalum, titanium, molybdenum, and tungsten; an alloy film containing any of these elements as a component; an alloy film containing any of these elements in combination; or the like can be used. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used. A Cu—Mg—Al alloy, a Mo—Ti alloy, Ti, and Mo have high adhesiveness with an oxide film. Therefore, in the case where the insulating film 143*a* includes an oxide, any of the above-described materials having high adhesiveness with an oxide film is preferably used for the conductive film 144*a* over the insulating film 143*a*. For example, as the conductive film 144*a*, a conductive film including Cu having low resistance is stacked over a conductive film including a Cu—Mg—Al alloy, a Mo—Ti alloy, Ti, or Mo, whereby adhesiveness between the conductive film 144*a* and the insulating film 143*a* including an oxide can be increased and resistance of the conductive film 144*a* can be lowered.

Alternatively, the conductive film to be the conductive film 144*a* may be formed using a conductive metal oxide. As the conductive metal oxide, indium oxide, tin oxide, zinc oxide, a mixture of indium oxide and tin oxide, a mixture of indium oxide and zinc oxide, or any of the metal oxide materials to which silicon or silicon oxide is added can be used.

In the case where heat treatment is performed after formation of the conductive film, the conductive film preferably has heat resistance high enough to withstand the heat treatment.

In this embodiment, as the conductive film 144*a*, a stack of a tantalum nitride film having a thickness of 30 nm and a tungsten film having a thickness of 135 nm thereover is used.

Figure 45B:
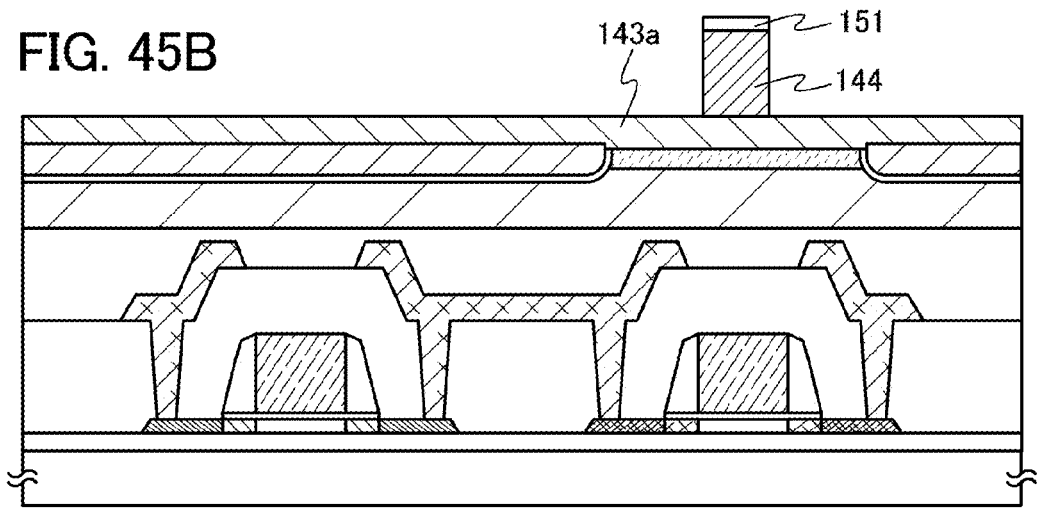

Next, a mask is formed over the insulating film 151*a* and the conductive film 144*a* and the insulating film 151*a* are etched; thus, as illustrated in FIG. 45B, the gate electrode 144 and the insulating film 151 over the gate electrode 144 are formed.

Wet etching or dry etching can be used in etching of the conductive film 144*a* and the insulating film 151*a*, or wet etching and dry etching may be used in combination. The etching conditions (e.g., an etching gas or an etchant, etching time, and temperature) are set as appropriate in accordance with the materials so that the conductive film 144a and the insulating film 151a can be etched into a desired shape. Note that, in order to process the channel length (L) of the transistor 121 minutely, dry etching is preferably used.

As an etching gas used for etching the insulating film 151a, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas. As an etching gas for etching the conductive film 144a, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 45C:
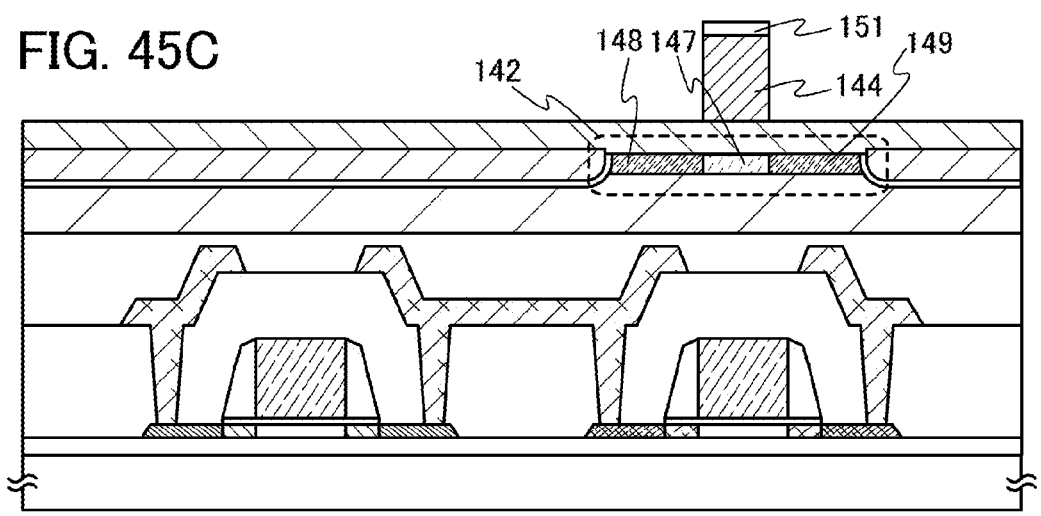

Next, as illustrated in FIG. 45C, with the use of the gate electrode 144 and the insulating film 151 as masks, a dopant is added to the oxide semiconductor film 142, so that the first region 147 which overlaps with the gate electrode 144 and at least part of which serves as a channel formation region, and the second regions 148 and 149 which serve as a source and a drain and between which the first region 147 is sandwiched are formed.

The dopant can be added to the oxide semiconductor film 142 by an ion doping method or an ion implantation method. As the dopant to be added, for example, at least one of a rare gas such as helium, argon, or xenon, an element belonging to a Group 15, such as nitrogen, phosphorus, arsenic, or antimony, and the like can be used.

For example, in the case where nitrogen is used as the dopant, the concentration of nitrogen atoms in the second regions 148 and 149 is preferably higher than or equal to $5 \times 10^{19}/cm^3$ and lower than or equal to $1 \times 10^{22}/cm^3$.

Further, the addition of the dopant may also be conducted using a method other than an ion doping method and an ion implantation method. For example, a dopant can be added in the following manner: plasma is generated in an atmosphere of a gas containing an element to be added and plasma treatment is performed on an object to which the dopant is added. As an apparatus for generating plasma, a dry etching apparatus, a plasma CVD apparatus, a high-density plasma CVD apparatus, or the like can be used.

As for the condition of doping, for example, the acceleration voltage is set to 20 kV in the case where the dopant is nitrogen. In the case where the dopant is phosphorus, the acceleration voltage is set to 40 kV. Heat treatment is preferably performed at a temperature lower than 450° C. in the case where the dose of nitrogen or phosphorus is less than or equal to $1 \times 10^{14}/cm^2$. Thus, the sheet resistance of the second regions 148 and 149 containing the dopant can be lower than or equal to $1 \times 10^7$ Ω/sq. In the case where the dose is greater than or equal to $5 \times 10^{14}/cm^2$ and less than $5 \times 10^{15}/cm^2$, the heat treatment is preferably performed at a temperature higher than or equal to 450° C. and lower than or equal to 600° C. Thus, the sheet resistance of the second regions 148 and 149 can be lower than or equal to $1 \times 10^5$ Ω/sq. In the case where the dose is greater than or equal to $5 \times 10^{15}/cm^2$, the heat treatment is preferably performed at a temperature higher than or equal to 600° C. Thus, the sheet resistance of the second regions 148 and 149 containing the dopant can be lower than or equal to $1 \times 10^5$ Ω/sq.

The sheet resistance of the second regions 148 and 149 is reduced, so that resistance between the second region 148 and the conductive film 145 to be formed later and between the second region 149 and the conductive film 146 to be formed later can be reduced. Thus, even when the transistor 121 is miniaturized, large on-state current and high-speed operation can be ensured. Further, the miniaturization of the transistor 121 makes it possible to increase memory capacity per unit area of a memory device.

Figure 46A:
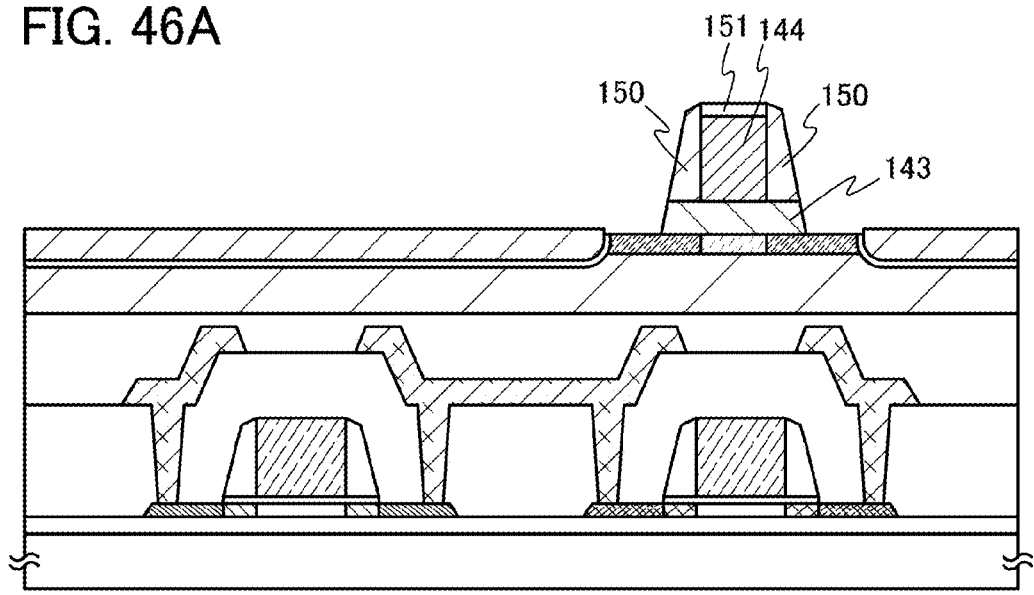
FIGS. 46A and 46B illustrate a method for manufacturing a semiconductor device.

Next, an insulating film is formed to cover the insulating film 143a, the gate electrode 144, the insulating film 151, and the like, and the insulating film and the insulating film 143a are processed by etching or the like. Through this step, as illustrated in FIG. 46A, the sidewall 150 provided on the side portions of the gate electrode 144 is formed from the insulating film, and the gate insulating film 143 provided below the gate electrode 144 and the sidewall 150 is formed from the insulating film 143a. The insulating film to be the sidewall 150 can be formed using a material and a film formation method similar to those of the insulating film 173. For example, a stacked structure in which a silicon oxide film is formed over a silicon nitride film can be employed. In this embodiment, a silicon oxide film is formed as the insulating film to be the sidewall 150.

Next, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

When the heat treatment is performed, oxygen is diffused into the oxide semiconductor film 142 from the insulating film in contact with the oxide semiconductor film 142, so that oxygen deficiency in the surface of the oxide semiconductor film 142, which is in contact with the insulating film, and in the vicinity thereof can be reduced. Further, resistance of the second regions 148 and 149 containing the dopant can be reduced.

Figure 46B:
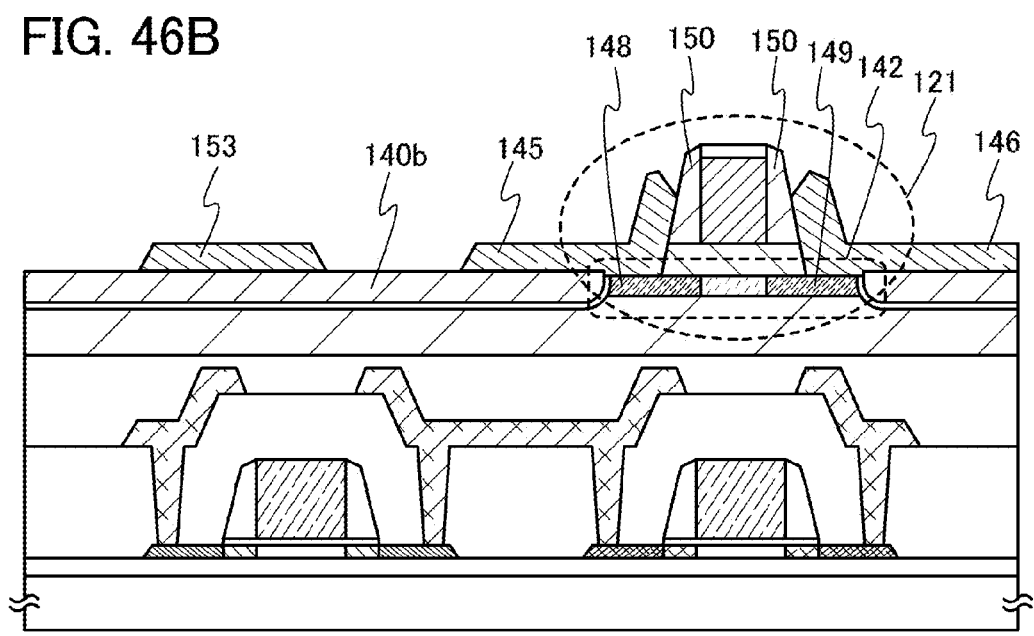

Next, a conductive film is formed and is processed by etching or the like; thus, as illustrated in FIG. 46B, the conductive film 145, the conductive film 146, and the conductive film 153 are formed. The conductive film 145 is in contact with the second region 148 and the conductive film 146 is in contact with the second region 149. Further, the conductive film 153 is formed over the second oxide insulating film 140b. The conductive film 145, the conductive film 146, and the conductive film 153 can be formed using a material and a stacked structure similar to those of the conductive film 144a.

The etching for forming the conductive films 145 and 146 and the conductive film 153 may be either wet etching or dry etching. Alternatively, wet etching and dry etching may be used in combination. The etching conditions (e.g., an etching gas or an etchant, etching time, and temperature) are set as appropriate in accordance with the material so that the conductive films 145 and 146 and the conductive film 153 can be etched to have a desired shape. Note that dry etching is preferably used for finely processing the transistor. As an etching gas used for dry etching, for example, a gas containing fluorine, such as sulfur hexafluoride ($SF_6$), nitrogen trifluoride ($NF_3$), or trifluoromethane ($CHF_3$), a mixed gas of carbon tetrafluoride ($CF_4$) and hydrogen, or the like can be used. A rare gas (helium (He), argon (Ar), or xenon (Xe)), carbon monoxide, carbon dioxide, or the like may be added to the etching gas.

In this embodiment, a tungsten film having a thickness of approximately 100 nm is used as the conductive films 145 and 146 and the conductive film 153. In the case where a tungsten film is used as the conductive films 145 and 146 and the conductive film 153, etching is performed under the following conditions, for example: the ICP power is 500 W; the bias power is 150 W; the pressure is 1.0 Pa; the etching gas is a mixed gas of $CF_4$, $Cl_2$, and $O_2$; the flow rate of $CF_4$ is 25 sccm; the flow rate of $Cl_2$ is 25 sccm; and the flow rate of $O_2$ is 10 sccm.

Note that in this embodiment, the conductive films 145 and 146 are provided in contact with the sidewall 150. With the structure, even when a mask for forming the conductive films 145 and 146 is misaligned to some extent, the size of the area where the conductive films 145 and 146 are in contact with the oxide semiconductor film 142 can be prevented from changing. Accordingly, variation in resistance between the oxide semiconductor film 142 and the conductive films 145 and 146 due to deviation of the positions of the conductive films 145 and 146 can be suppressed, and thus, variation in on-state current of the transistor 121 can be prevented. Further, the oxide semiconductor film 142 is less likely to be exposed to the etching gas in the etching for forming the conductive films 145 and 146, which is preferable.

Through the above steps, the transistor 121 can be manufactured.

Figure 47A:
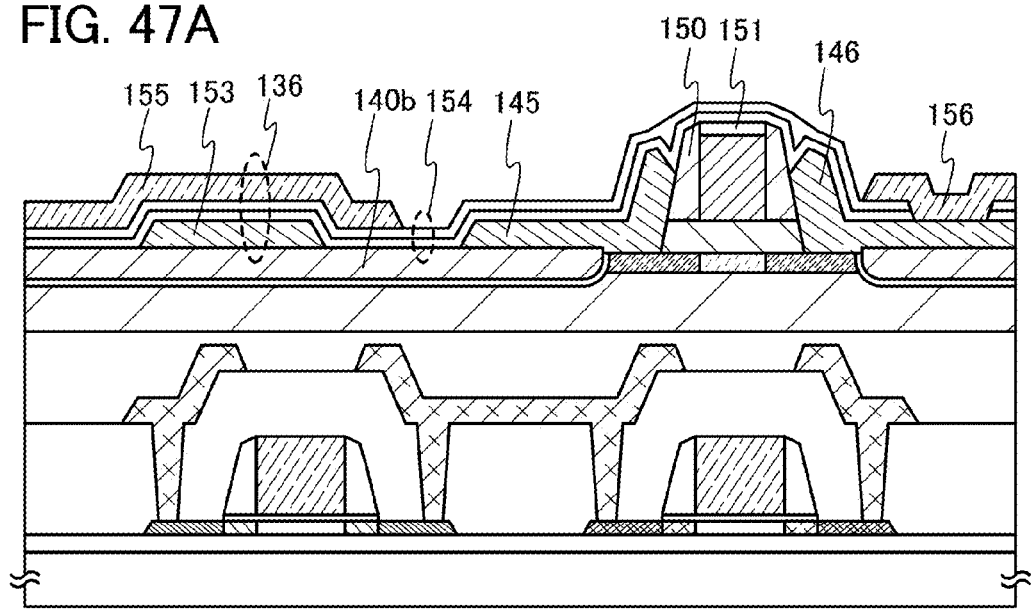
FIGS. 47A and 47B illustrate a method for manufacturing a semiconductor device.

Next, as illustrated in FIG. 47A, the insulating film 154 is formed over the second oxide insulating film 140b, the conductive film 145, the conductive film 146, the conductive film 153, the sidewall 150, and the insulating film 151, and then, an opening portion is formed in the insulating film 154 by etching or the like to expose part of the conductive film 146. After that, over the insulating film 154, the conductive film 155 is formed in a position overlapping with the conductive film 153 and a conductive film 156 in contact with the conductive film 146 in the opening portion is formed.

The insulating film 154 can be formed using a material including an inorganic insulating material such as silicon oxide, silicon nitride oxide, silicon nitride, hafnium oxide, aluminum oxide, or tantalum oxide. Moreover, the insulating film 154 can be formed using an organic insulating material such as polyimide or acrylic.

In this embodiment, the insulating film 154 has a structure in which an aluminum oxide film having a thickness of 50 nm which is formed by a sputtering method and a silicon oxynitride film having a thickness of 300 nm which is formed by a plasma CVD method are stacked in this order. The insulating film 154 may be a single insulating film or a stack of three or more insulating films.

Each of the conductive film 155 and the conductive film 156 can be formed using a material and a stacked structure similar to those of the conductive film 144a. In this embodiment, each of the conductive film 155 and the conductive film 156 is formed in such a manner that a titanium film having a thickness of 20 nm, a tungsten film having a thickness of 50 nm, an aluminum film having a thickness of 200 nm, and a titanium film having a thickness of 5 nm are formed by a sputtering method in this order.

Through the above steps, the capacitor 136 can be manufactured.

Figure 47B:
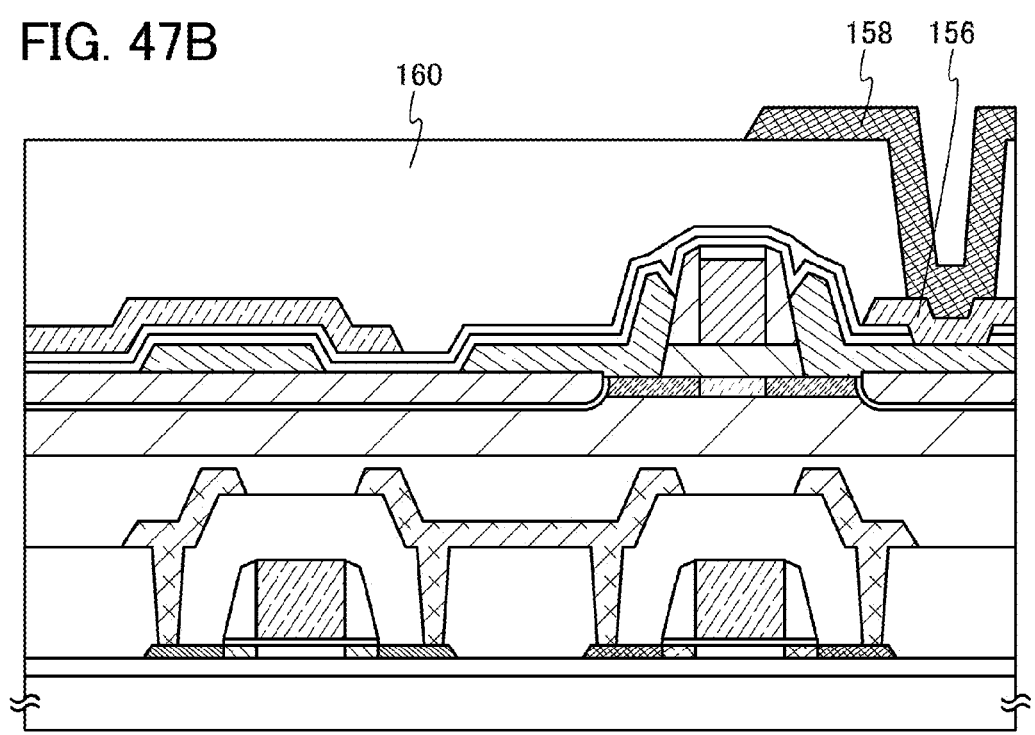

Next, as illustrated in FIG. 47B, the insulating film 160 is formed to cover the conductive film 155, the conductive film 156, and the insulating film 154, and then, an opening portion is formed in the insulating film 160 by etching or the like to expose part of the conductive film 156. Next, the conductive film 158 in contact with the conductive film 156 in the opening portion is formed over the insulating film 160.

A surface of the insulating film 160 is preferably planarized. The insulating film 160 can be formed using a material including an inorganic insulating material such as silicon oxide, silicon nitride oxide, silicon nitride, hafnium oxide, aluminum oxide, or tantalum oxide. Alternatively, the insulating film 160 can be formed using an organic insulating material such as polyimide or acrylic. In this embodiment, a polyimide film having a thickness of 1500 nm is used as the insulating film 160.

The conductive film 158 can be formed using a material and a stacked structure similar to those of the conductive film 144a. In this embodiment, the conductive film 158 is formed in such a manner that a titanium film having a thickness of 20 nm, a tungsten film having a thickness of 50 nm, an aluminum film having a thickness of 300 nm, and a titanium film having a thickness of 5 nm are formed in this order by a sputtering method.

Through the above steps, the semiconductor device according to an embodiment of the present invention, such as the one illustrated in FIG. 47B, can be manufactured.

Note that in this embodiment, the dopant is added to the oxide semiconductor film 142 with the use of the gate electrode 144 and the insulating film 151 as masks; however, the dopant may be added to the oxide semiconductor film 142 after the sidewall 150 is formed before the conductive films 145 and 146 are formed.

This embodiment can be implemented by being combined as appropriate with the above-described embodiment.

Embodiment 5

In this embodiment, an example of a method for manufacturing a semiconductor device part of which has the structure illustrated in FIG. 36 will be described.

Note that a semiconductor material such as germanium, silicon germanium, or single crystal silicon carbide as well as silicon may be used for the n-channel transistor 102n and the p-channel transistor 102p included in the memory element. For example, the n-channel transistor 102n and the p-channel transistor 102p including silicon can be formed using a single crystal semiconductor substrate such as a silicon wafer, a silicon thin film which is formed by an SOI method, a silicon thin film which is formed by a vapor deposition method, or the like.

Note that the n-channel transistor 102n and the p-channel transistor 102p can be manufactured in a manner similar to that described in Embodiment 4. Therefore, in this embodiment, description of Embodiment 4 can be referred to for the steps up to the step illustrated in FIG. 43A.

Figure 48A:
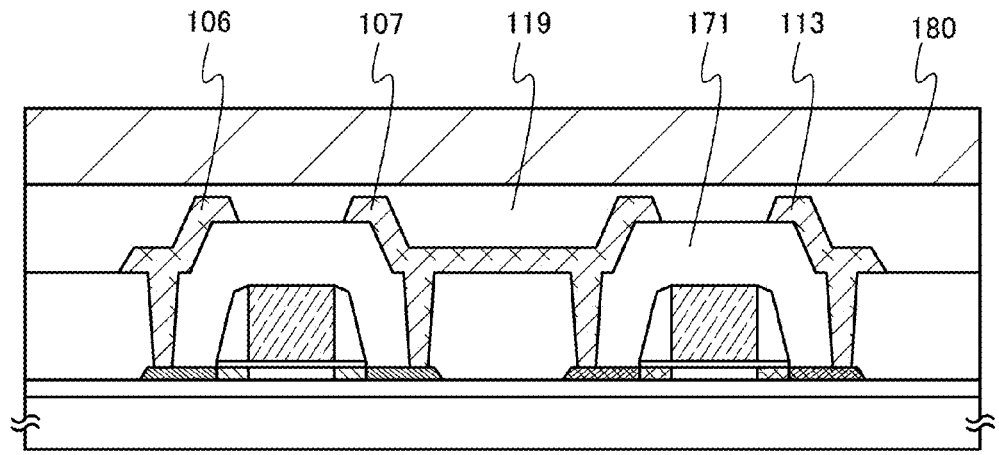
FIGS. 48A to 48C illustrate a method for manufacturing a semiconductor device.

After the step illustrated in FIG. 43A, as illustrated in FIG. 48A, the insulating film 119 and the insulating film 180 are stacked in this order over the insulating film 171 to cover the conductive film 106, the conductive film 107, and the conductive film 113.

Embodiment 4 can be referred to for the material, the structure, and the manufacturing method of the insulating film 119. Further, a material, a stacked structure, and a manufacturing method of the insulating film 180 can be similar to those of the insulating film 173 described in Embodiment 4.

Figure 48B:
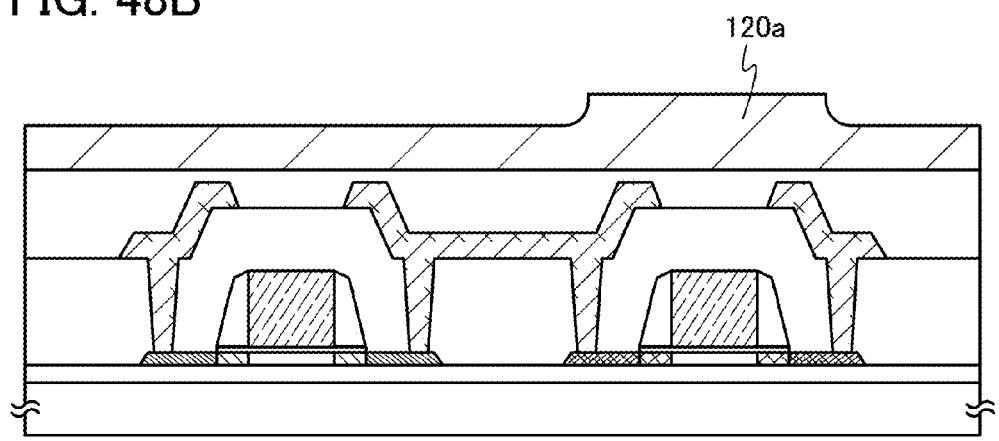

Next, as illustrated in FIG. 48B, part of the insulating film 180 is removed by etching or the like, so that the first oxide insulating film 120a having a projecting portion is formed. The first oxide insulating film 120a is to be part of the insulating film 120 formed later. Etching of the insulating film 180 can be performed by dry etching, wet etching, or both of them. It is preferable that an impurity including hydrogen not be included in the etching.

Figure 48C:
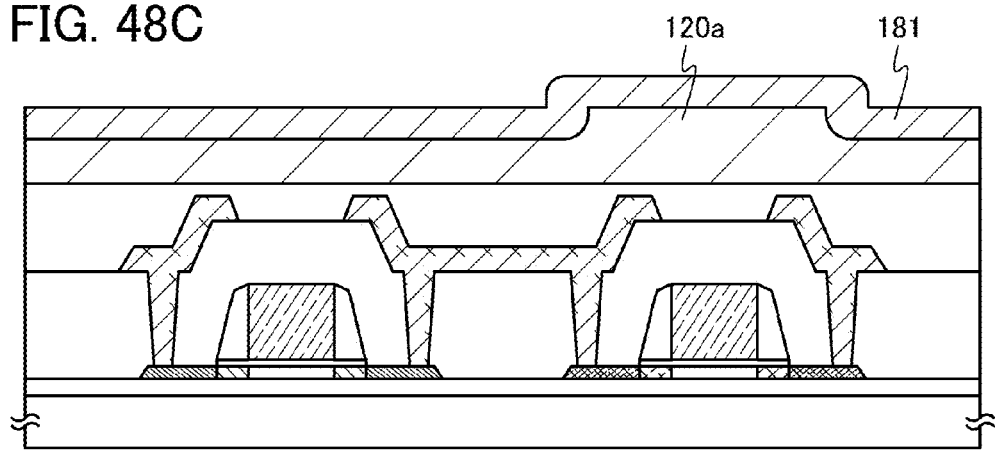

Next, as illustrated in FIG. 48C, the insulating film 181 is formed to cover the first oxide insulating film 120a. A material, a stacked structure, and a manufacturing method of the insulating film 181 can be similar to those of the insulating film 175 described in Embodiment 4. Note that the insulating film 181 is formed so that the thickness thereof is larger than the height of the projecting portion of the first oxide insulating film 120a. With the structure, the first oxide insulating film 120a and the second oxide insulating film 120b both having high flatness can be formed in a later planarization step.

Figure 49A:
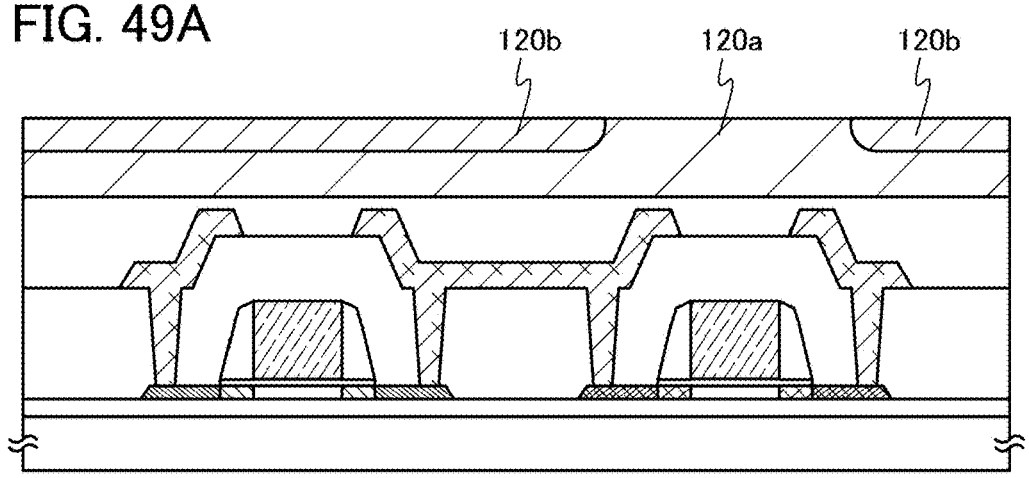
FIGS. 49A to 49C illustrate a method for manufacturing a semiconductor device.

Next, as illustrated in FIG. 49A, the insulating film 181 is subjected to planarization treatment, so that the second oxide insulating film 120b is formed from the insulating film 181. The planarization treatment can be performed in a manner similar to that of the planarization treatment performed on the insulating film 175 described in Embodiment 4. The projecting portion of the first oxide insulating film 120a is exposed by the planarization treatment performed on the insulating film 181. Note that part of the projecting portion of the first oxide insulating film 120a may be removed in this planarization treatment.

Figure 49B:
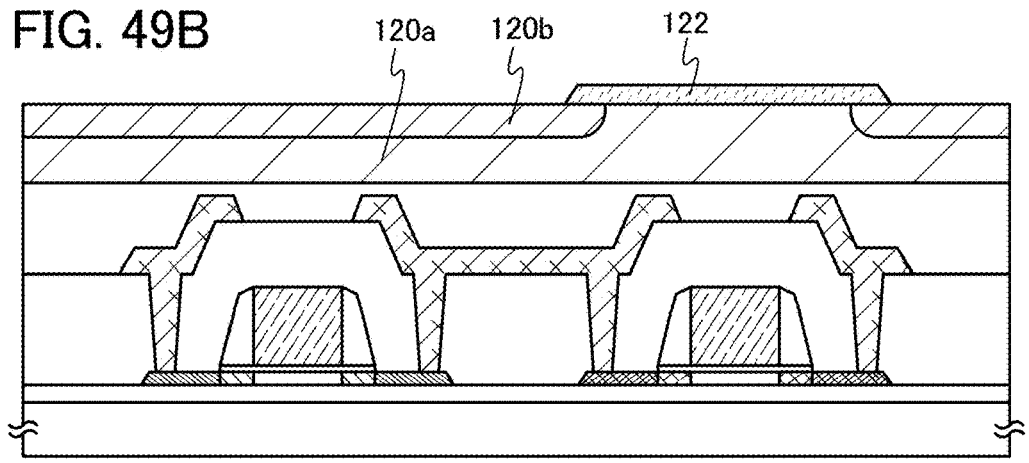

Next, as illustrated in FIG. 49B, the island-shaped oxide semiconductor film 122 is formed over the first oxide insulating film 120a and the second oxide insulating film 120b. A material, a stacked structure, and a manufacturing method of the oxide semiconductor film 122 can be similar to those of the oxide semiconductor film 142 described in Embodiment 4. Note that the position of the oxide semiconductor film 122 is determined so that the first region 127 to be formed later in the oxide semiconductor film 122 is in contact with the first oxide insulating film 120a and that the second region 128 to be formed later in the oxide semiconductor film 122 is in contact with the first oxide insulating film 120a and the second oxide insulating film 120b.

Figure 49C:
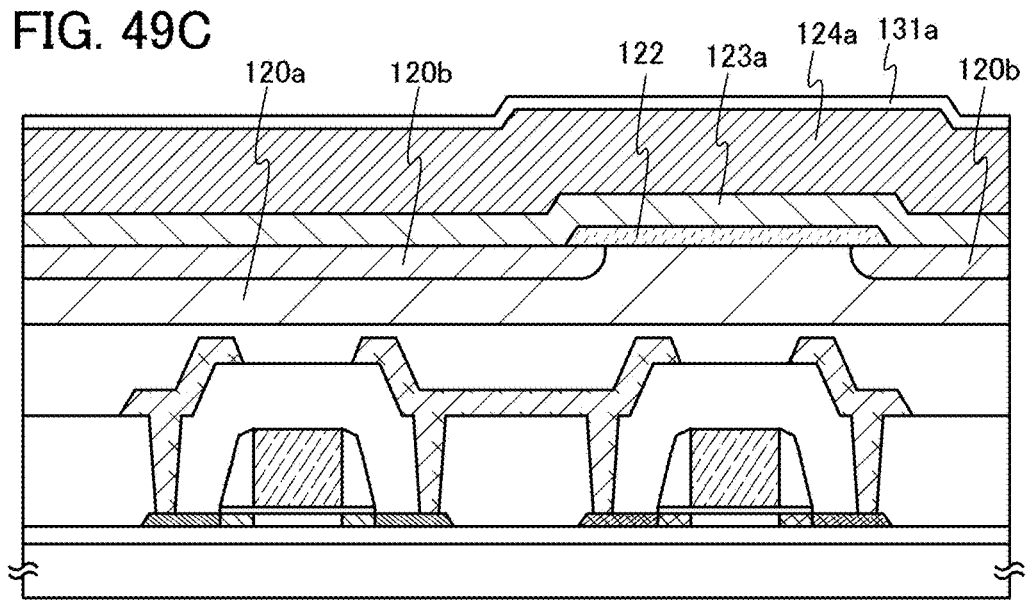

Next, as illustrated in FIG. 49C, the insulating film 123a, the conductive film 124a, and the insulating film 131a are stacked in this order to cover the first oxide insulating film 120a, the second oxide insulating film 120b, and the oxide semiconductor film 122.

The insulating film 123a can be formed using a material and a stacked structure similar to those of the insulating film 143a in Embodiment 4, and the insulating film 131a can be formed using a material and a stacked structure similar to those of the insulating film 151a in Embodiment 4. Note that heat treatment may be performed after the insulating film 123a is formed. The heat treatment can be performed under conditions similar to those of the heat treatment performed after formation of the insulating film 143a in Embodiment 4.

The conductive film 124a can be formed using a material and a stacked structure similar to those of the conductive film 144a in Embodiment 4.

Figure 50A:
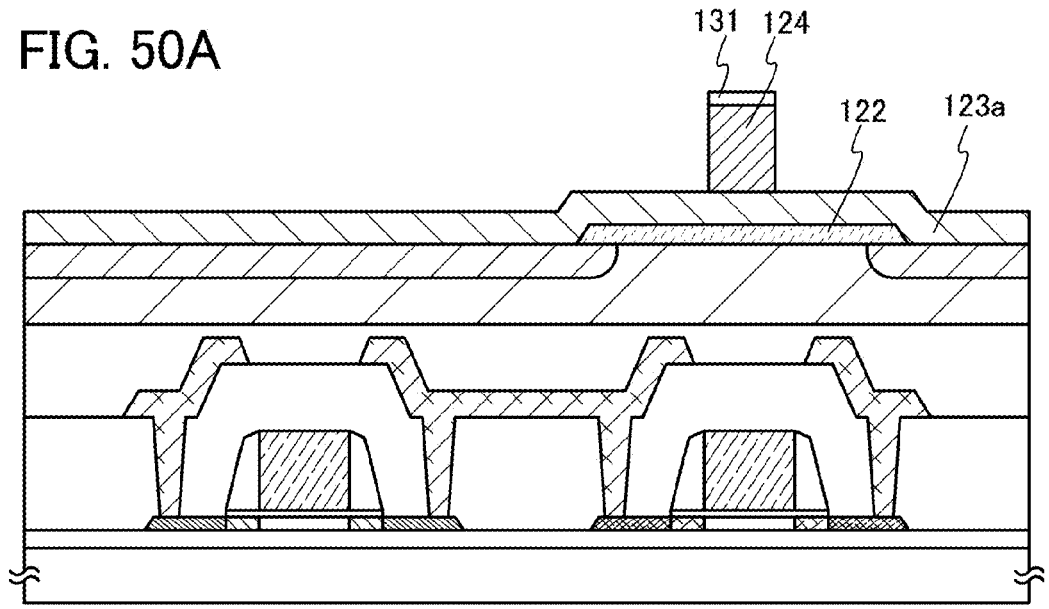
FIGS. 50A and 50B illustrate a method for manufacturing a semiconductor device.

Next, a mask is formed over the insulating film 131a and the conductive film 124a and the insulating film 131a are etched; thus, as illustrated in FIG. 50A, the gate electrode 124 and the insulating film 131 over the gate electrode 124 are formed. Etching of the conductive film 124a and the insulating film 131a can be performed under conditions similar to those of etching of the conductive film 144a and the insulating film 151a in Embodiment 4.

Figure 50B:
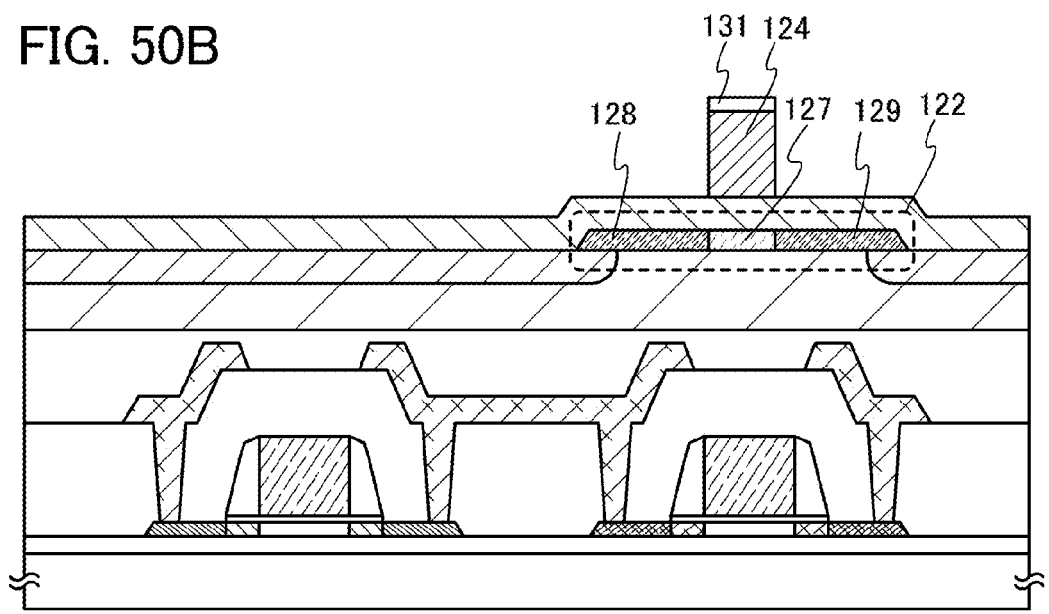

Next, as illustrated in FIG. 50B, with the use of the gate electrode 124 and the insulating film 131 as masks, a dopant is added to the oxide semiconductor film 122, so that the first region 127 which overlaps with the gate electrode 124 and at least part of which serves as a channel formation region, and the second regions 128 and 129 which serve as a source and a drain and between which the first region 127 is sandwiched are formed.

Addition of the dopant to the oxide semiconductor film 122 and the following heat treatment can be performed in a manner similar to that of addition of the dopant to the oxide semiconductor film 142 and the heat treatment in Embodiment 4. The sheet resistance of the second regions 128 and 129 can be reduced by addition of the dopant and the heat treatment. Accordingly, resistance between the second region 128 and the conductive film 125 to be formed later and between the second region 129 and the conductive film 126 to be formed later can be reduced. Thus, even when the transistor 121 is miniaturized, large on-state current and high-speed operation can be ensured. Further, the miniaturization of the transistor 121 makes it possible to increase memory capacity per unit area of a memory device.

Figure 51A:
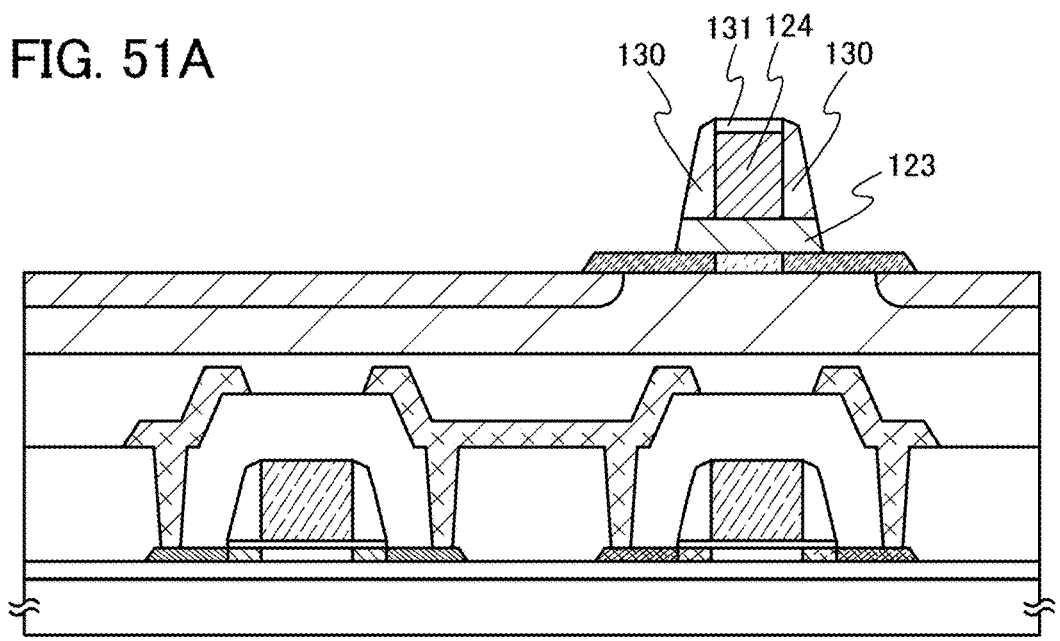
FIGS. 51A and 51B illustrate a method for manufacturing a semiconductor device.

Next, an insulating film is formed to cover the insulating film 123a, the gate electrode 124, the insulating film 131, and the like, and the insulating film and the insulating film 123a are processed by etching or the like. Through this step, as illustrated in FIG. 51A, the sidewall 130 provided on the side portions of the gate electrode 124 is formed from the insulating film, and the gate insulating film 123 provided below the gate electrode 124 and the sidewall 130 is formed from the insulating film 123a. The insulating film to be the sidewall 130 can be formed using a material, a stacked structure, and a film formation method similar to those of the insulating film 180.

Next, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

When the heat treatment is performed, oxygen is diffused into the oxide semiconductor film 122 from the insulating film in contact with the oxide semiconductor film 122, so that oxygen deficiency in the surface of the oxide semiconductor film 122, which is in contact with the insulating film, and in the vicinity thereof can be reduced. Further, resistance of the second regions 128 and 129 containing the dopant can be reduced.

Figure 51B:
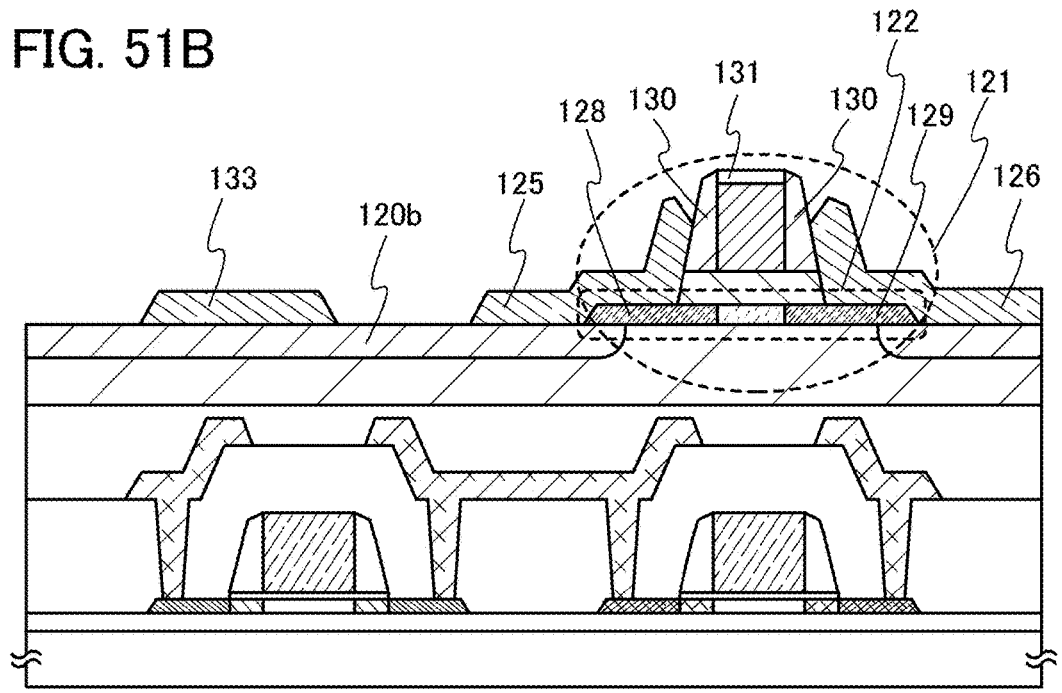

Next, a conductive film is formed and is processed by etching or the like; thus, as illustrated in FIG. 51B, the conductive film 125, the conductive film 126, and the conductive film 133 are formed. The conductive film 125 is in contact with the second region 128 and the conductive film 126 is in contact with the second region 129. Further, the conductive film 133 is formed over the second oxide insulating film 120b. The conductive film 125, the conductive film 126, and the conductive film 133 can be formed using a material and a stacked structure similar to those of the conductive film 124a.

Etching for forming the conductive films 125 and 126 and the conductive film 133 can be performed under conditions similar to those of etching for forming the conductive films 145 and 146 and the conductive film 153 in Embodiment 4.

Note that in this embodiment, the conductive film 125 and the conductive film 126 are provided in contact with the sidewall 130. With the structure, even when a mask for forming the conductive films 125 and 126 is misaligned to some extent, the size of the area where the conductive films 125 and 126 are in contact with the oxide semiconductor film 122 can be prevented from changing. Accordingly, variation in resistance between the oxide semiconductor film 122 and the conductive films 125 and 126 due to deviation of the positions of the conductive films 125 and 126 can be suppressed, and thus, variation in on-state current of the transistor 121 can be prevented. Further, the oxide semiconductor film 122 is less likely to be exposed to the etching gas in the etching for forming the conductive films 125 and 126, which is preferable.

Through the above steps, the transistor 121 can be manufactured.

Figure 52A:
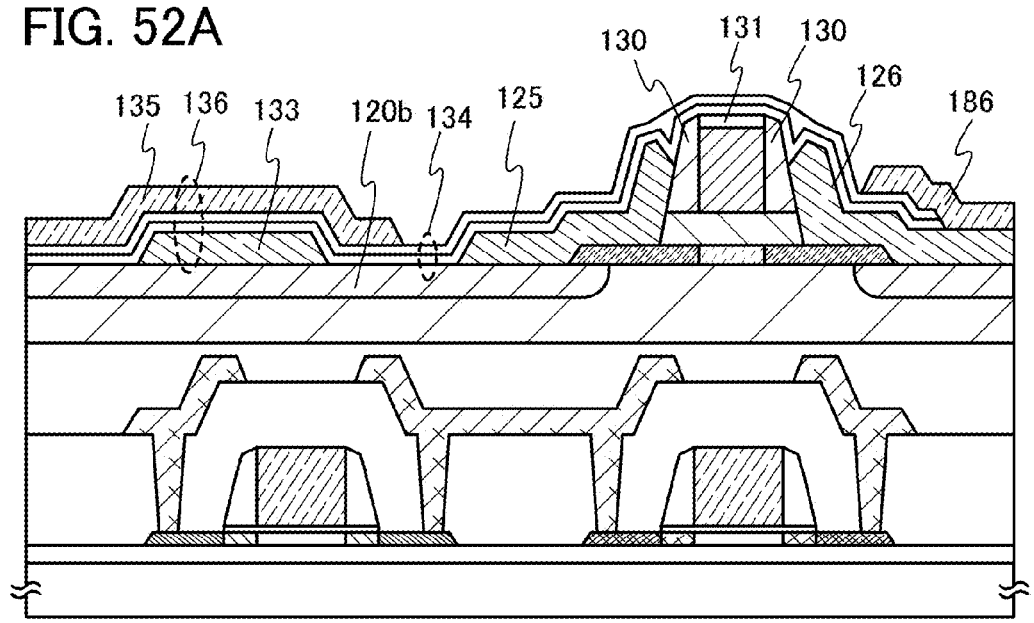
FIGS. 52A and 52B illustrate a method for manufacturing a semiconductor device.

Next, as illustrated in FIG. 52A, the insulating film 134 is formed over the second oxide insulating film 120b, the conductive film 125, the conductive film 126, the conductive film 133, the sidewall 130, and the insulating film 131, and then, an opening portion is formed in the insulating film 134 by etching or the like to expose part of the conductive film 126. After that, over the insulating film 134, the conductive film 135 is formed in a position overlapping with the conductive film 133 and a conductive film 186 in contact with the conductive film 126 in the opening portion is formed.

The insulating film 134 can be formed using a material, a stacked structure, and a manufacturing method similar to those of the insulating film 154 in Embodiment 4. Further, the conductive film 135 and the conductive film 186 can be formed using a material and a stacked structure similar to those of the conductive film 124a.

Through the above steps, the capacitor 136 can be manufactured.

Figure 52B:
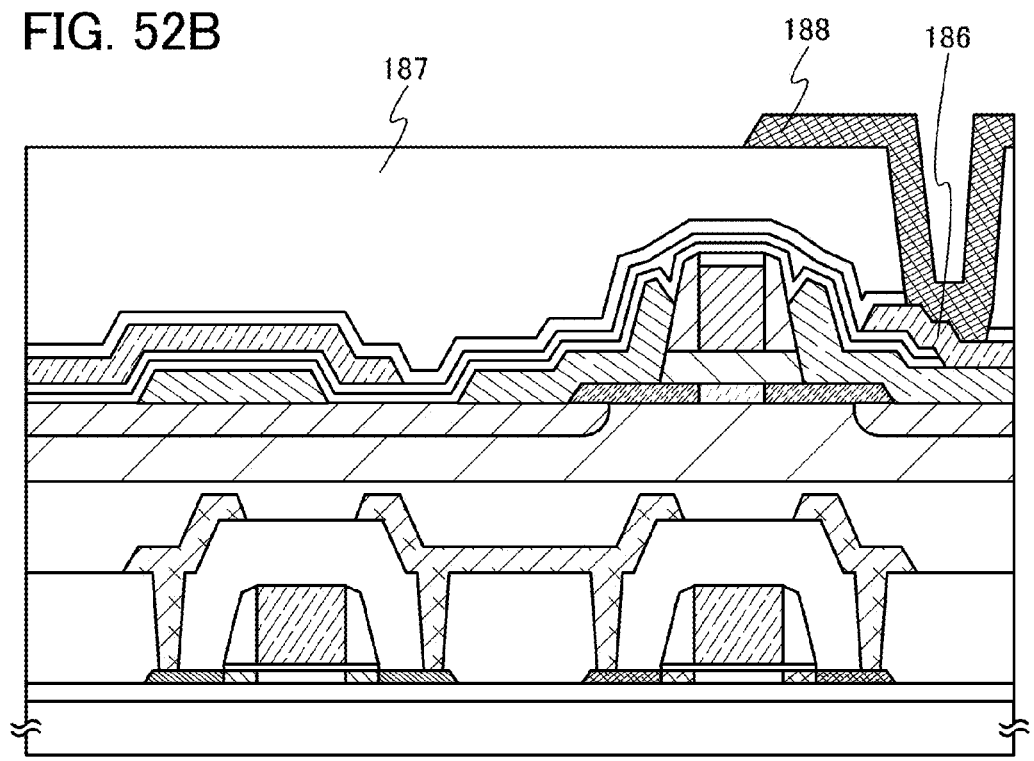

Next, as illustrated in FIG. 52B, the insulating film 187 is formed to cover the conductive film 135, the conductive film 186, and the insulating film 134, and then, an opening portion is formed in the insulating film 187 by etching or the like to expose part of the conductive film 186. Next, the conductive film 188 in contact with the conductive film 186 in the opening portion is formed over the insulating film 187.

The insulating film 187 can be formed using a material, a stacked structure, and a manufacturing method similar to those of the insulating film 160 in Embodiment 4. Further, the conductive film 188 can be formed using a material and a stacked structure similar to those of the conductive film 124a.

Through the above steps, the semiconductor device according to an embodiment of the present invention, such as the one illustrated in FIG. 52B, can be manufactured.

Note that in this embodiment, the dopant is added to the oxide semiconductor film 142 with the use of the gate electrode 144 and the insulating film 151 as masks; however, the dopant may be added to the oxide semiconductor film 142 after the sidewall 150 is formed before the conductive films 145 and 146 are formed.

This embodiment can be implemented by being combined as appropriate with any of the above-described embodiments.

Example 1

In this example, an example of a transistor in which an In—Sn—Zn-based oxide semiconductor film is used will be described with reference to FIGS. 34A and 34B and the like.

Figure 34A:
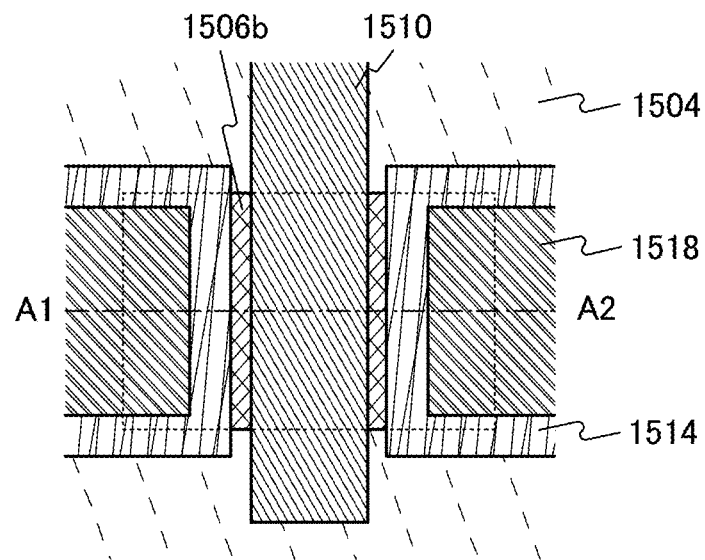
FIGS. 34A and 34B are a top view and a cross-sectional view of a semiconductor device.
Figure 34B:
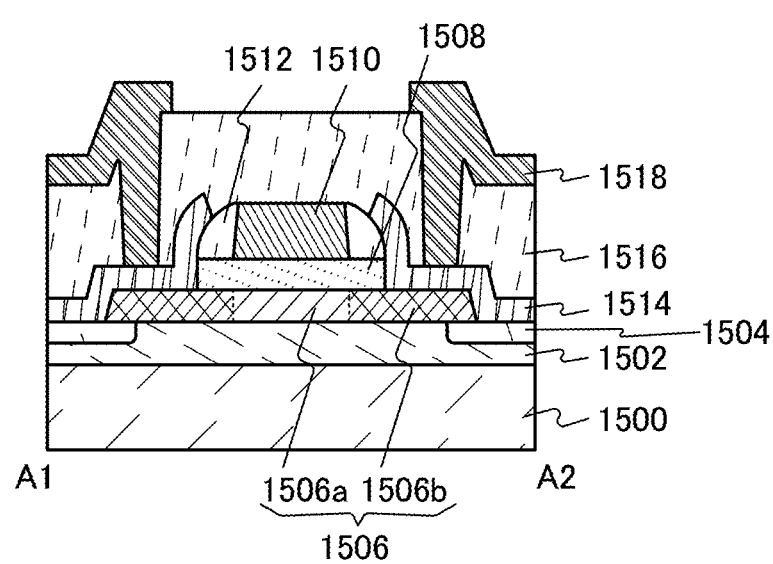

FIGS. 34A and 34B are a top view and a cross-sectional view of a coplanar transistor having a top-gate top-contact structure. FIG. 34A is the top view of the transistor. FIG. 34B is the cross-sectional view taken along dashed-dotted line A1-A2 in FIG. 34A.

The transistor illustrated in FIG. 34B includes a substrate 1500; a base insulating film 1502 provided over the substrate 1500; a protective insulating film 1504 provided in the periphery of the base insulating film 1502; an oxide semiconductor film 1506 provided over the base insulating film 1502 and the protective insulating film 1504 and including a high-resistance region 1506a and low-resistance regions 1506b; a gate insulating film 1508 provided over the oxide semiconductor film 1506; a gate electrode 1510 provided to overlap with the oxide semiconductor film 1506 with the gate insulating film 1508 positioned therebetween; a sidewall insulating film 1512 provided in contact with a side surface of the gate electrode 1510; a pair of electrodes 1514 provided in contact with at least the low-resistance regions 1506b; an interlayer insulating film 1516 provided to cover at least the oxide semiconductor film 1506, the gate electrode 1510, and the pair of electrodes 1514; and a wiring 1518 provided to be connected to at least one of the pair of electrodes 1514 through an opening portion formed in the interlayer insulating film 1516.

Although not illustrated, a protective film may be provided to cover the interlayer insulating film 1516 and the wiring 1518. With the protective film, a minute amount of leakage current generated due to surface conduction of the interlayer insulating film 1516 can be reduced and thus the off-state current of the transistor can be reduced.

Example 2

In this example, another example of a transistor in which an In—Sn—Zn-based oxide semiconductor film is used as an oxide semiconductor film will be described below.

Figure 35A:
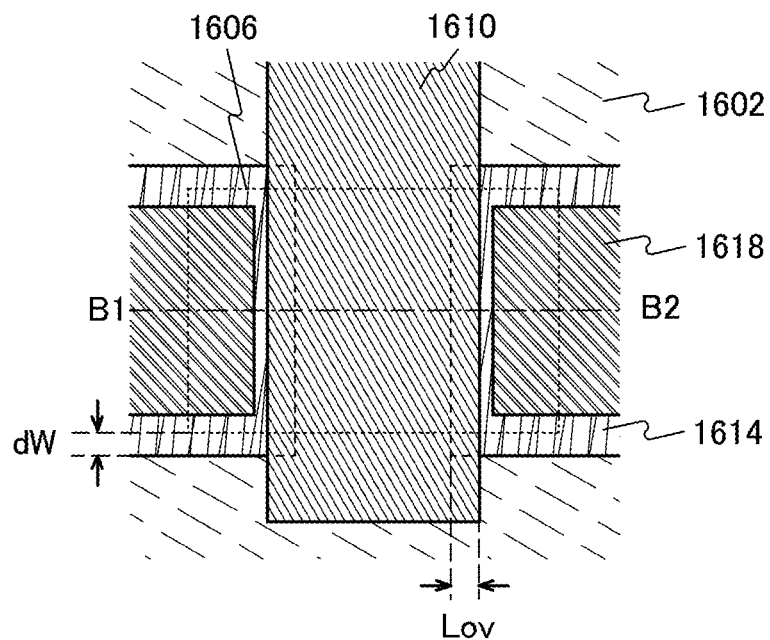
FIGS. 35A and 35B are a top view and a cross-sectional view of a semiconductor device.
Figure 35B:
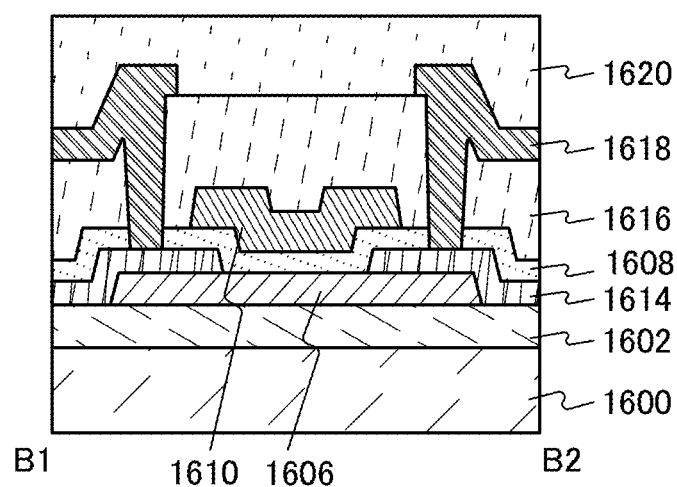

FIGS. 35A and 35B are a top view and a cross-sectional view illustrating a structure of a transistor manufactured in this example. FIG. 35A is the top view of the transistor. FIG. 35B is the cross-sectional view taken along dashed-dotted line B1-B2 in FIG. 35A.

The transistor illustrated in FIG. 35B includes a substrate 1600; a base insulating film 1602 provided over the substrate 1600; an oxide semiconductor film 1606 provided over the base insulating film 1602; a pair of electrodes 1614 in contact with the oxide semiconductor film 1606; a gate insulating film 1608 provided over the oxide semiconductor film 1606 and the pair of electrodes 1614; a gate electrode 1610 provided to overlap with the oxide semiconductor film 1606 with the gate insulating film 1608 positioned therebetween; an interlayer insulating film 1616 provided to cover the gate insulating film 1608 and the gate electrode 1610; wirings 1618 connected to the pair of electrodes 1614 through opening portions formed in the interlayer insulating film 1616; and a protective film 1620 provided to cover the interlayer insulating film 1616 and the wirings 1618.

As the substrate 1600, a glass substrate was used. As the base insulating film 1602, a silicon oxide film was used. As the oxide semiconductor film 1606, an In—Sn—Zn-based oxide semiconductor film was used. As the pair of electrodes 1614, a tungsten film was used. As the gate insulating film 1608, a silicon oxide film was used. The gate electrode 1610 had a stacked structure of a tantalum nitride film and a tungsten film. The interlayer insulating film 1616 had a stacked structure of a silicon oxynitride film and a polyimide film. The wirings 1618 had a stacked structure in which a titanium film, an aluminum film, and a titanium film were formed in this order. As the protective film 1620, a polyimide film was used.

Note that in the transistor having the structure illustrated in FIG. 35A, the width of a portion where the gate electrode 1610 overlaps with one of the pair of electrodes 1614 is referred to as Lov. Similarly, the width of a portion of the pair of electrodes 1614, which does not overlap with the oxide semiconductor film 1606, is referred to as dW.

Example 3

A semiconductor device according to an embodiment of the present invention can ensure a high-speed operation, suppress power consumption, and achieve high integration.

A sophisticated electronic device can be provided with the use of a semiconductor device capable of a high-speed operation or a highly integrated semiconductor device. Further, an electronic device with low power consumption can be provided with the use of a semiconductor device with low power consumption. In particular, in the case of a portable electronic device which has difficulty in continuously receiving power, an advantage of an increase in continuous operating time can be obtained when a semiconductor device with low power consumption according to an embodiment of the present invention is added as a component of the device.

The semiconductor device according to an embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can include the semiconductor device according to an embodiment of the present invention are mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 17A to 17C.

Figure 17A:
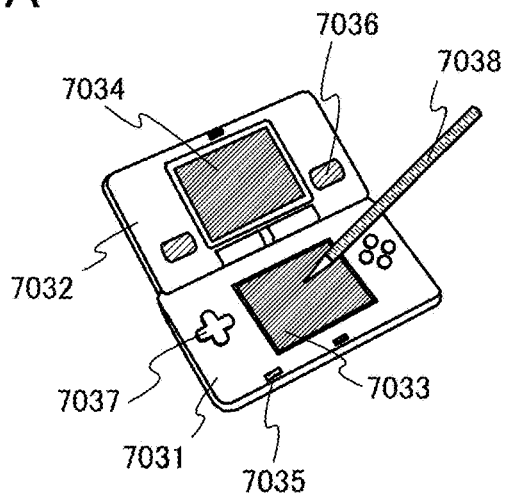
FIGS. 17A to 17C are views of electronic devices.

FIG. 17A illustrates a portable game machine including a housing 7031, a housing 7032, a display portion 7033, a display portion 7034, a microphone 7035, speakers 7036, an operation key 7037, a stylus 7038, and the like. The semiconductor device according to an embodiment of the present invention can be used for an integrated circuit for controlling driving of the portable game machine. The semiconductor device according to an embodiment of the present invention is used for an integrated circuit for controlling driving of the portable game machine, so that a sophisticated portable game machine and a portable game machine with low power consumption can be provided. Note that although the portable game machine illustrated in FIG. 17A includes two display portions 7033 and 7034, the number of display portions included in the portable game machine is not limited to two.

Figure 17B:
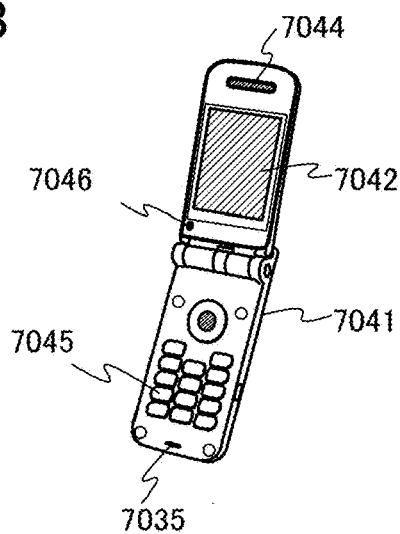

FIG. 17B illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The semiconductor device according to an embodiment of the present invention can be used for an integrated circuit for controlling driving of the mobile phone. The semiconductor device according to an embodiment of the present invention is used for an integrated circuit for controlling driving of the mobile phone, so that a sophisticated mobile phone and a mobile phone with low power consumption can be provided.

Figure 17C:
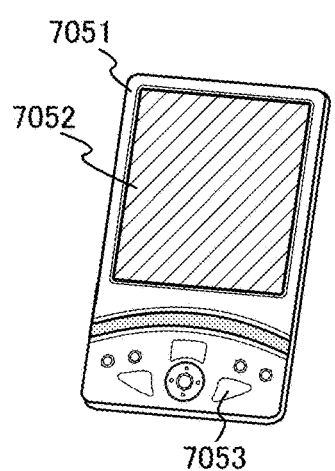

FIG. 17C illustrates a portable information terminal including a housing 7051, a display portion 7052, operation keys 7053, and the like. A modem may be incorporated in the housing 7051 of the portable information terminal illustrated in FIG. 17C. The semiconductor device according to an embodiment of the present invention can be used for an integrated circuit for controlling driving of the portable information terminal. The semiconductor device according to an embodiment of the present invention is used for an integrated circuit for controlling driving of the portable information terminal, so that a sophisticated portable information terminal and a portable information terminal with low power consumption can be provided.

This example can be implemented by being combined as appropriate with any of the above-described embodiments.

This application is based on Japanese Patent Application serial no. 2011-102569 filed with Japan Patent Office on Apr. 29, 2011, Japanese Patent Application serial no. 2011-102571 filed with Japan Patent Office on Apr. 29, 2011, Japanese Patent Application serial no. 2011-113237 filed with Japan Patent Office on May 20, 2011, and Japanese Patent Application serial no. 2011-113238 filed with Japan Patent Office on May 20, 2011, the entire contents of which are hereby incorporated by reference.

What is claimed is:

1. A semiconductor device comprising:
   a substrate;
   a first transistor over the substrate, the first transistor comprising:
      a first semiconductor body comprising silicon having crystallinity or germanium having crystallinity;
      a first gate electrode overlapping the first semiconductor body;
      a first gate insulating film between the first semiconductor body and the first gate electrode; and
      a first source electrode and a first drain electrode electrically connected to the first semiconductor body;
   a first insulating film over the first semiconductor body, the first gate electrode, and the first gate insulating film; and
   a second transistor comprising:
      a back gate electrode over the first insulating film;
      an oxide semiconductor film over the back gate electrode;
      a second gate electrode overlapping the oxide semiconductor film;
      a second gate insulating layer between the oxide semiconductor film and the second gate electrode;
      a second source electrode and a second drain electrode each in electric contact with the oxide semiconductor film; and
      a side wall in direct contact with the second gate electrode,
   wherein the oxide semiconductor film overlaps with the back gate electrode and the second gate electrode.

2. The semiconductor device according to claim 1, further comprising:
   a fourth insulating film comprising a projection, a top surface of the projection being in direct contact with a bottom surface of the oxide semiconductor film; and
   a fifth insulating film on the fourth insulating film and around the projection,
   wherein the back gate electrode is under the fourth insulating film.

3. The semiconductor device according to claim 2,
   wherein the fifth insulating film covers a side edge of the oxide semiconductor film.

4. The semiconductor device according to claim 1, further comprising:
   a third insulating film covering the oxide semiconductor film, the second gate electrode, and the second gate insulating layer,
   wherein the first insulating film and the third insulating film each comprise aluminum and oxygen.

5. The semiconductor device according to claim 1, wherein the first semiconductor body is a semiconductor film.

6. A semiconductor device comprising:
- a substrate;
- a first transistor over the substrate, the first transistor comprising:
  - a first semiconductor body comprising silicon having crystallinity or germanium having crystallinity;
  - a first gate electrode overlapping the first semiconductor body;
  - a first gate insulating film between the first semiconductor body and the first gate electrode; and
  - a first source electrode and a first drain electrode electrically connected to the first semiconductor body;
- a first insulating film over the first semiconductor body, the first gate electrode, and the first gate insulating film; and
- a second transistor comprising:
  - a back gate electrode over the first insulating film;
  - an oxide semiconductor film over the back gate electrode;
  - a second gate electrode overlapping the oxide semiconductor film;
  - a second gate insulating layer between the oxide semiconductor film and the second gate electrode;
  - a second source electrode and a second drain electrode each in electric contact with the oxide semiconductor film; and
  - a side wall in direct contact with the second gate electrode,
- wherein the oxide semiconductor film overlaps with the back gate electrode and the second gate electrode,
- wherein the back gate electrode is in direct contact with the first insulating film, and
- wherein the first insulating film comprises aluminum and oxygen.

7. The semiconductor device according to claim 6, further comprising:
- a fourth insulating film comprising a projection, a top surface of the projection being in direct contact with a bottom surface of the oxide semiconductor film; and
- a fifth insulating film on the fourth insulating film and around the projection,
- wherein the back gate electrode is under the fourth insulating film.

8. The semiconductor device according to claim 7, wherein the fifth insulating film covers a side edge of the oxide semiconductor film.

9. The semiconductor device according to claim 6, further comprising:
- a third insulating film covering the oxide semiconductor film, the second gate electrode, and the second gate insulating layer,
- wherein the first insulating film and the third insulating film each comprise aluminum and oxygen.

10. The semiconductor device according to claim 6, wherein the first semiconductor body is a semiconductor film.

11. A semiconductor device comprising:
- a substrate;
- a first transistor over the substrate, the first transistor comprising:
  - a first semiconductor body comprising silicon having crystallinity or germanium having crystallinity;
  - a first gate electrode overlapping the first semiconductor body;
  - a first gate insulating film between the first semiconductor body and the first gate electrode; and
  - a first source electrode and a first drain electrode electrically connected to the first semiconductor body;
- a first insulating film over the first semiconductor body, the first gate electrode, and the first gate insulating film;
- a second transistor comprising:
  - an oxide semiconductor film over the first insulating film;
  - a second gate electrode overlapping the oxide semiconductor film;
  - a second gate insulating layer between the oxide semiconductor film and the second gate electrode;
  - a second source electrode and a second drain electrode each in electric contact with the oxide semiconductor film; and
  - a side wall in direct contact with the second gate electrode; and
- a third insulating film on and in contact with the second gate electrode,
- a fourth insulating film comprising a projection, a top surface of the projection being in direct contact with a bottom surface of the oxide semiconductor film; and
- a fifth insulating film on the fourth insulating film and around the projection,
- wherein the third insulating film comprises aluminum and oxygen.

12. The semiconductor device according to claim 11, wherein the fifth insulating film covers a side edge of the oxide semiconductor film.

13. The semiconductor device according to claim 11, wherein the first semiconductor body is a semiconductor film.

* * * * *